United States Patent
Choi et al.

(10) Patent No.: US 9,628,160 B2
(45) Date of Patent: Apr. 18, 2017

(54) CODEBOOK FOR EIGHT TRANSMIT ANTENNAS AND MULTIPLE INPUT MULTIPLE OUTPUT COMMUNICATION SYSTEM USING THE CODEBOOK

(71) Applicant: Samsung Electronics Co., Ltd., Suwon-si, Gyeonggi-do (KR)

(72) Inventors: Jun Il Choi, Seoul (KR); Bruno Clerckx, Seoul (KR); Ki Il Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/177,889

(22) Filed: Feb. 11, 2014

(65) Prior Publication Data

US 2014/0162670 A1  Jun. 12, 2014

Related U.S. Application Data

(63) Continuation of application No. 13/210,775, filed on Aug. 16, 2011, now Pat. No. 8,654,878.

(Continued)

(30) Foreign Application Priority Data

Mar. 16, 2011 (KR) .................. 10-2011-0023690

(51) Int. Cl.
*H04L 1/02* (2006.01)
*H04B 7/04* (2017.01)
(Continued)

(52) U.S. Cl.
CPC ......... *H04B 7/0486* (2013.01); *H04B 7/0639* (2013.01); *H04W 72/04* (2013.01);
(Continued)

(58) Field of Classification Search
CPC ... H04B 3/32; H04L 25/03343; H04L 1/0003; H04L 1/0071; H04L 27/368; H03F 1/3247
See application file for complete search history.

(56) References Cited

U.S. PATENT DOCUMENTS

2009/0034636 A1   2/2009  Kotecha et al.
2009/0190528 A1*  7/2009  Chung et al. ................. 370/328
(Continued)

FOREIGN PATENT DOCUMENTS

CN           101800628 A     8/2010
KR    10-2010-0010893 A     2/2010
(Continued)

OTHER PUBLICATIONS

ZTE; Discussion on Two-component Feedback Framework for 8Tx; 3GPP TSG RAN WG1 Meeting #61; R1-103323; May 10-14, 2010; Montreal, Canada.

Samsung; View on the feedback framework for Rel. 10; 3GPP TSG RAN WG1 Meeting #61; R1-103026; May 10-14, 2010; Montreal, Canada.

Samsung; A feedback framework based on W2W1 for Rel. 10; 3GPP TSG RAN WG1 Meeting #61bis; R1-103664; Jun. 28-Jul. 2, 2010; Dresden, Germany.

(Continued)

*Primary Examiner* — Janice Tieu
(74) *Attorney, Agent, or Firm* — Jefferson IP Law, LLP

(57) ABSTRACT

A transmitter and a receiver of a multiple input multiple output (MIMO) communication system may use two codebooks to share channel information. When the transmitter uses eight transmit antennas, two codebooks may be defined. When the receiver generates two precoding matrix indicators from two codebooks, a combination of the two precoding matrix indicators may indicate a single precoding matrix. Precoding matrix candidates may also be defined.

16 Claims, 5 Drawing Sheets

Related U.S. Application Data

(60) Provisional application No. 61/373,942, filed on Aug. 16, 2010, provisional application No. 61/388,736, filed on Oct. 1, 2010, provisional application No. 61/428,348, filed on Dec. 30, 2010.

(51) Int. Cl.
| | | |
|---|---|---|
| *H04B 7/06* | (2006.01) | |
| *H04W 72/04* | (2009.01) | |
| *H04L 25/03* | (2006.01) | |
| *H04L 1/00* | (2006.01) | |
| *H04B 3/32* | (2006.01) | |
| *H04L 27/36* | (2006.01) | |
| *H03F 1/32* | (2006.01) | |

(52) U.S. Cl.
CPC .............. *H03F 1/3247* (2013.01); *H04B 3/32* (2013.01); *H04L 1/0003* (2013.01); *H04L 25/03343* (2013.01); *H04L 27/368* (2013.01)

(56) References Cited

U.S. PATENT DOCUMENTS

| | | | |
|---|---|---|---|
| 2011/0122968 A1* | 5/2011 | Jongren et al. | 375/296 |
| 2012/0069926 A1* | 3/2012 | Park et al. | 375/267 |
| 2012/0207240 A1 | 8/2012 | Chen et al. | |
| 2013/0156125 A1* | 6/2013 | Ko et al. | 375/267 |

FOREIGN PATENT DOCUMENTS

| | | |
|---|---|---|
| KR | 10-2010-0066298 A | 6/2010 |
| KR | 10-2010-0082894 A | 7/2010 |

OTHER PUBLICATIONS

3GPP TSG RAN WG1 60bis, Texas Instruments: "Possible Refinement on 8Tx Codebook Design", 3GPP Draft; R1-102104, Apr. 12-16, 2010.

3GPP TSG RAN WG1 #59bis, Ericsson et al: "A Flexible Feedback Concept", R1-100051, Jan. 18-22, 2010.

* cited by examiner

CODEBOOK FOR EIGHT TRANSMIT ANTENNAS AND MULTIPLE INPUT MULTIPLE OUTPUT COMMUNICATION SYSTEM USING THE CODEBOOK

CROSS-REFERENCE TO RELATED APPLICATIONS

This application is a continuation application of a prior application Ser. No. 13/210,775, filed on Aug. 16, 2011, which claimed the benefit under 35 U.S.C. §119(e) of U.S. Provisional Application No. 61/373,942, filed on Aug. 16, 2010, U.S. Provisional Application No. 61/388,736, filed on Oct. 1, 2010 and U.S. Provisional Application No. 61/428,348, filed on Dec. 30, 2010, all of which were filed in the United States Patent and Trademark Office, and claims the benefit under 35 U.S.C. §119(a) of Korean Patent Application No. 10-2011-0023690, filed on Mar. 16, 2011, in the Korean Intellectual Property Office, the entire disclosures of which are incorporated herein by reference for all purposes.

BACKGROUND

1. Field of the Invention

The following description relates to a codebook used in a multiple input multiple output (MIMO) communication system, and more particularly, to a codebook used for a transmitter and a receiver when a transmitter of a MIMO communication system includes eight transmit antennas.

2. Description of the Related Art

In a multiple input multiple output (MIMO) communication system, a transmitter and a receiver may use a codebook to share channel information. The channel information may include channel direction information and channel quality information.

The codebook may include a plurality of codewords. The receiver may select a single codeword from the plurality of codewords, and may feed back, to the transmitter, a precoding matrix indicator indicating an index of the selected codeword. The precoding matrix indicator may be an example of channel direction information.

The transmitter may identify the codeword selected by the receiver, based on the precoding matrix indicator, and may generate or determine a precoding matrix based on the selected codeword. The transmitter may precode data based on the precoding matrix, and may transmit the precoded data via a plurality of transmit antennas. The number of transmit antennas may be variously determined, for example, two, four, and eight.

SUMMARY OF THE INVENTION

In one general aspect, there is provided a communication method of a receiver of a multiple input multiple output (MIMO) communication system, including extracting a first precoding matrix indicator corresponding to a first codeword included in a first codebook, and a second precoding matrix indicator corresponding to a second codeword included in a second codebook, and transmitting, to a transmitter, the first precoding matrix indicator and the second precoding matrix indicator.

The receiver may measure a channel formed from the transmitter to the receiver, and may extract the first precoding matrix indicator and the second precoding matrix indicator to indicate a state of the channel.

The receiver may extract the first precoding matrix indicator and the second precoding matrix indicator to recommend a precoding matrix indicator suitable for the state of the channel formed from the transmitter to the receiver.

In another general aspect, there is provided a communication method of a transmitter of a MIMO communication system, including receiving a first precoding matrix indicator corresponding to a first codeword included in a first codebook, and a second precoding matrix indicator corresponding to a second codeword included in a second codebook, and generating or determining a precoding matrix based on the first precoding matrix indicator and the second precoding matrix indicator.

The determining may include determining the precoding matrix by extracting the first codeword from the first codebook and extracting the second codeword from the second codebook.

The transmitter may transmit a well-known signal, for example, a pilot signal to a receiver so that the receiver may measure a channel formed from the transmitter to the receiver.

Other features and aspects may be apparent from the following detailed description, the drawings, and the claims.

Figure 1:
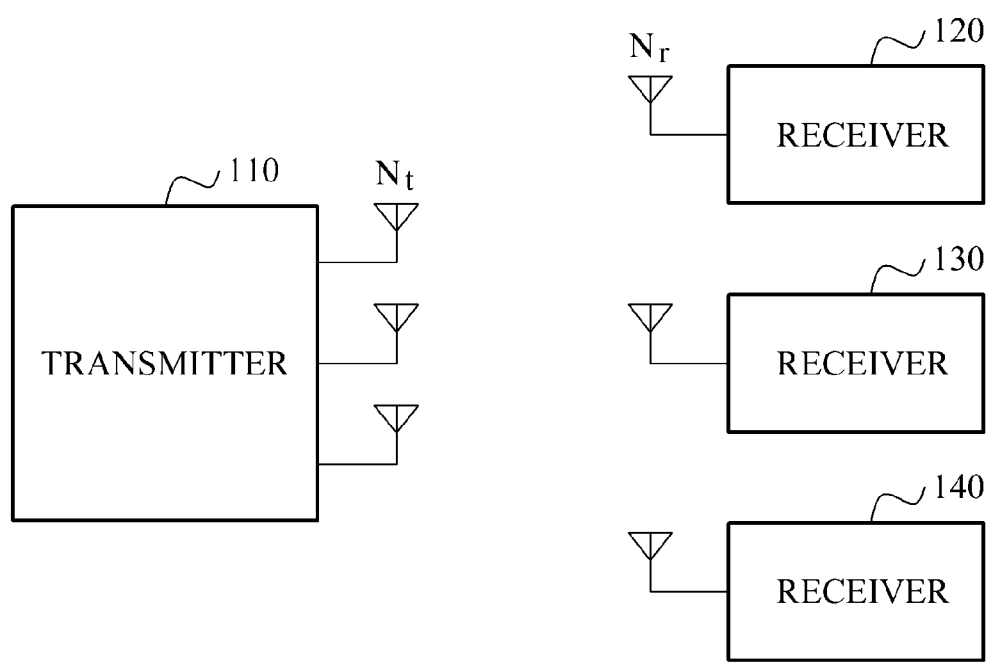
FIG. 1 is a diagram illustrating an example of a multiple input multiple output (MIMO) communication system.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION OF EXEMPLARY EMBODIMENTS

The following detailed description is provided to assist the reader in gaining a comprehensive understanding of the methods, apparatuses, and/or systems described herein. Accordingly, various changes, modifications, and equivalents of the methods, apparatuses, and/or systems described herein may be suggested to those of ordinary skill in the art. Also, description of well-known functions and constructions may be omitted for increased clarity and conciseness.

Hereinafter, embodiments will be described in detail with reference to the accompanying drawings.

FIG. 1 illustrates an example of a multiple input multiple output (MIMO) communication system.

Referring to FIG. 1, the MIMO communication system may include a transmitter 110 and a plurality of receivers 120, 130, and 140.

$N_t$ transmit antennas may be installed in the transmitter 110. The transmitter 110 may function as a base station in a downlink, and may function as a terminal in an uplink. $N_r$ receive antennas may be installed in the receivers 120, 130, and 140. Each of the receivers 120, 130, and 140 may function as a terminal in the downlink, and may function as a base station in the uplink. Hereinafter, embodiments will be described based on an operation of the transmitter 110 and the receivers 120, 130, and 140 in the downlink. The embodiments may be applicable to the uplink.

Channels may be formed between the transmitter 110 and the receivers 120, 130, and 140. Data may be transmitted from the transmitter 110 to the receivers 120, 130, and 140 via the channels. The transmitter 110 may precode at least one data stream using a precoding matrix, enhancing a performance of the MIMO communication system. A data stream may also be referred to as data.

The transmitter 110 may generate or determine a more accurate precoding matrix by verifying information associated with channel direction and information associated with channel quality. Information associated with the channel direction and information associated with the channel quality may be one example of channel information. Information associated with the channel direction may include a precoding matrix indicator.

For example, the transmitter 110 and the receivers 120, 130, and 140 may share the precoding matrix indicator using a codebook. The codebook may include a plurality of codewords. Each of the plurality of codewords may correspond to a vector or a matrix. A size of the codebook may correspond to a number of codewords. For example, a 3-bit codebook may include eight codewords, and a 4-bit codebook may include 16 codewords.

Each of the receivers 120, 130, and 140 may select a single codeword from the plurality of codewords, and may generate an indicator of the selected codeword as a precoding matrix indicator. The precoding matrix indicator may be fed back to the transmitter 110. The transmitter 110 may verify a codeword indicated by the precoding matrix indicator, using the codebook. The transmitter 110 may generate or determine an optimal precoding matrix based on the codeword corresponding to the precoding matrix indicator.

A dimension of a precoding matrix may be dependent on a rank of the transmitter 110. The rank of the transmitter 110 may correspond to a number of data streams desired to be transmitted or a number of layers of the transmitter 110.

Figure 2:
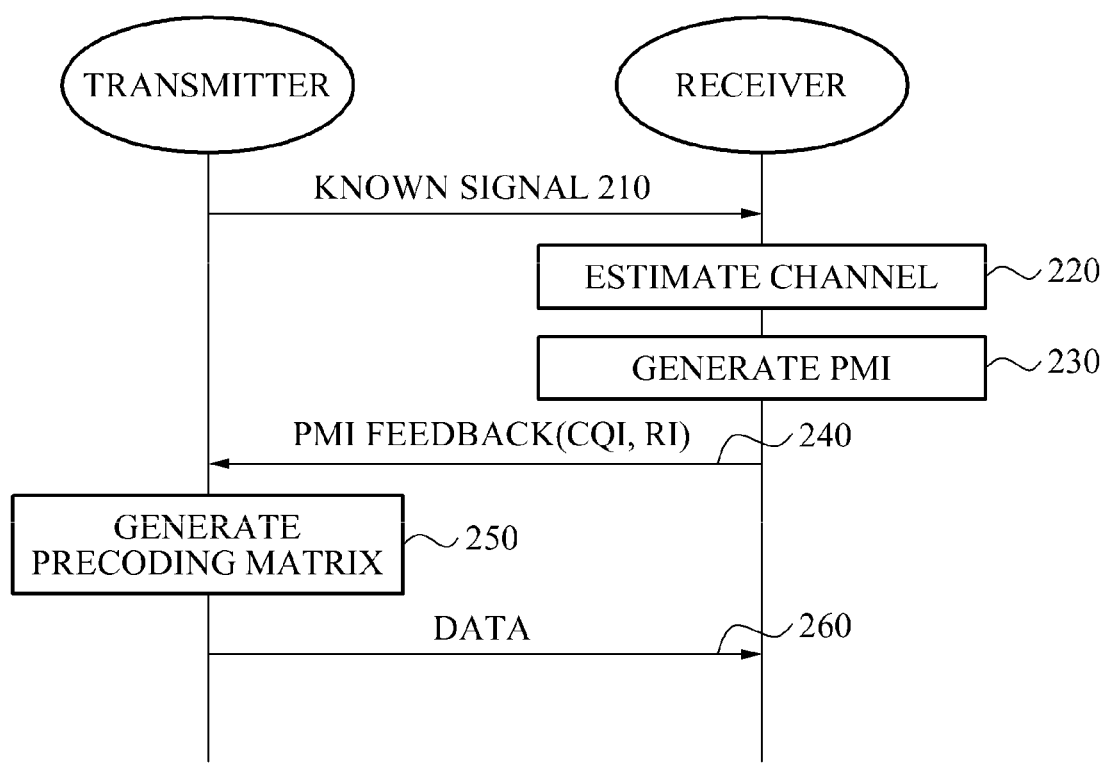
FIG. 2 is a diagram illustrating an example of a communication method of a receiver and a transmitter that share channel information using a single codebook.

FIG. 2 illustrates an example of a communication method of a receiver and a transmitter that share channel information using a single codebook.

Referring to FIG. 2, at 210, the transmitter may transmit a well-known signal to the receiver. The well-known signal may be a pilot signal.

At 220, the receiver may estimate a channel formed from the transmitter to the receiver based on the well-known signal.

At 230, the receiver may select, from a codebook, a codeword suitable for the estimated channel and generate a precoding matrix indicator including an index of the selected codeword. In this example, the same codebook may be stored in both the transmitter and the receiver.

At 240, the receiver may feed back a precoding matrix indicator to the transmitter. The receiver may also feed back channel quality information and a rank indicator.

At 250, the transmitter may generate or determine an optimal precoding matrix based on the fed back precoding matrix indicator. At 260, the transmitter may transmit data using the precoding matrix.

The communication method of the transmitter and the receiver when the transmitter and the receiver use the same single codebook is described above with reference to FIG. 2. According to embodiments, two codebooks may be used for the receiver and the transmitter to share two precoding matrix indicators.

Hereinafter, it is assumed that a first codebook $C_1$ and a second codebook $C_2$ are present, and two codebooks are stored in the receiver and the transmitter, respectively. It is also assumed that a precoding matrix W is finally recommended by the receiver and is used by the transmitter.

Figure 3:
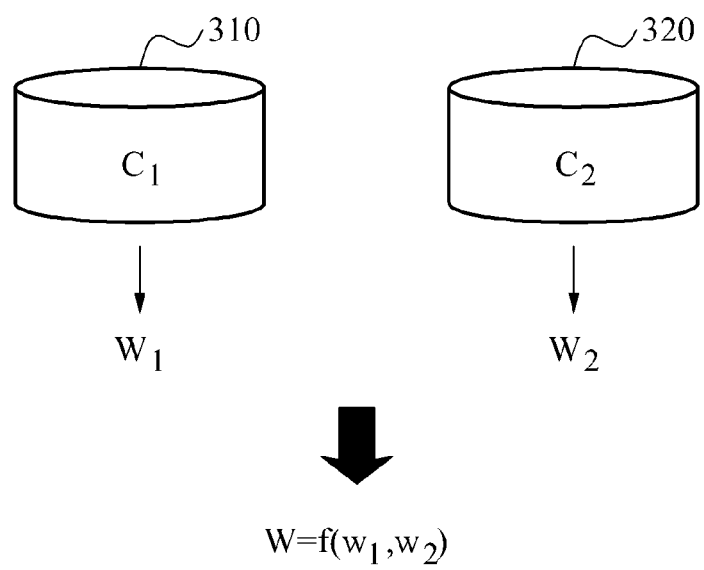
FIG. 3 is a diagram illustrating an example of a relationship between two codebooks and a precoding matrix.

FIG. 3 illustrates an example of a relationship between two codebooks and a precoding matrix.

Referring to FIG. 3, both a transmitter and a receiver may store a first codebook $C_1$ 310 and a second codebook $C_2$ 320. The receiver may select a preferred first codeword $W_1$ from the first codebook $C_1$ 310, and may select a preferred second codeword $W_2$ from the second codebook $C_2$ 320. A first precoding matrix indicator may be fed back to the transmitter as an index of the preferred first codeword $W_1$, and a second precoding matrix indicator may be fed back to the transmitter as an index of the preferred second codeword $W_2$.

Based on the first precoding matrix indicator and the second precoding matrix indicator, the transmitter may find the preferred first codeword $W_1$ from the first codebook $C_1$ 310, and may find the preferred second codeword $W_2$ from the second codebook $C_2$ 320. The transmitter may determine a precoding matrix $W = f(W_1, W_2)$ based on the preferred first codeword $W_1$ and the preferred second codeword $W_2$.

In $W = f(W_1, W_2)$, a function f may be variously defined. For example, $W = f(W_1, W_2) = W_2 W_1$ or $W = f(W_1, W_2) = W_1 W_2$ may be defined.

$W_1$ corresponds to the preferred first codeword of the receiver corresponding to the first precoding matrix indicator selected by the receiver from the first codebook $C_1$. $W_2$ corresponds to the preferred second codeword of the receiver corresponding to the second precoding matrix indicator of the receiver selected from the second codebook $C_2$. The first codebook $C_1$ or the first precoding matrix indicator may be used to indicate a property of a channel in a wideband including a plurality of subbands, or to indicate a long-term property of the channel. The second codebook $C_2$ or the second precoding matrix indicator may be used to indicate a property of a channel in a subband or to indicate a short-term property of the channel.

In $W = f(W_1, W_2) = W_2 W_1$, W may have a dimension of $N_t \times R$ and $W_1$ may have a dimension of $N_t \times R$. W2 may have a dimension of $N_t \times N_t$. In $W = f(W_1, W_2) = W_1 W_2$, W may have a dimension of $N_t \times R$ and $W_1$ and $W_2$ may have a variety of dimensions based on R. Here, R corresponds to a rank and indicates a number of data streams or a number of layers.

Hereinafter, the first codebook $C_1$ including candidates of $W_1$ and the second codebook $C_2$ including candidates of $W_2$ when the transmitter includes eight transmit antennas will be defined with respect to each of various ranks. Since $W_1$ is indicated by a combination of $W_1$ and $W_2$, to define the candidates of $W_1$ and the candidates of $W_2$ may be equivalent to define candidates of W. In addition to the first codebook $C_1$ and the second codebook $C_2$, the candidates of W may also be defined.

Design of Rank 1 Codebook when the Transmitter Includes Eight Transmit Antennas:

In dual polarized channels, a precoding matrix in one subband may be expressed by, $$W = \frac{\sqrt{2}}{2} \begin{bmatrix} \sqrt{2-|\alpha|^2} \, A \\ \alpha B \end{bmatrix}$$

A and B may correspond to unit norm vectors having a dimension of $N_t/2\times 1$ and may independently perform beamforming in each polarization. Each polarization may appear as an effectively single antenna after beamforming is performed in each polarization using A and B. To design codebooks with respect to A and B may be dependent on statistical properties of a channel in each polarization. Without further assumption with respect to properties, A and B may account for subband/short-term information and wideband/long-term information.

Beamforming of polarizations may be performed by vector $$\begin{bmatrix} \sqrt{2-|\alpha|^2} \\ \alpha \end{bmatrix}.$$

Here, $\alpha$ corresponds to a complex scalar and may account for a phase difference and a magnitude difference. The phase difference between the polarizations may typically correspond to a short-term property and the magnitude difference may correspond to a function of the subband/short-term property and wideband/long-term property. A cross-polarization discrimination factor is generally referred to as XPD of a channel. XPD indicates a wideband/long-term property of a dual polarization channel and a mean value with respect to $\alpha$ may vary.

In general, A and B may be selected to be different from each other. However, when an interval between antennas is relatively close and each angle spread is relatively low, a beamforming vector with respect to a first polarization and a beamforming vector with respect to a second polarization may be regarded to be identical to each other. Since beamforming is invariant over a phase shift, $B=e^{j\Phi}A$ may be established. Here, a selection of $\phi$ may not affect the performance of the dual polarization channel. When the interval between antennas is close, A, B, $\phi$ and may be associated with wideband/long-term properties of a channel. Accordingly, a precoding matrix in a subband may be expressed by, $$W = \frac{\sqrt{2}}{2}\begin{bmatrix} \sqrt{2-|\alpha|^2} A \\ \alpha e^{j\phi} A \end{bmatrix} = \frac{\sqrt{2}}{2}\begin{bmatrix} \sqrt{2-|\alpha|^2} I_{n_t/2} \\ & \alpha I_{n_t/2} \end{bmatrix}\begin{bmatrix} A \\ e^{j\phi} A \end{bmatrix}$$

For an appropriate design of A, discrete Fourier transformation (DFT) vectors may be used. In the above equation, a last equal mark may remind a structure of $W_2W_1$. A subband/short-term matrix may be expressed by $$W_2 = \begin{bmatrix} \sqrt{2-|\alpha|^2} I_{n_t/2} \\ & \alpha I_{n_t/2} \end{bmatrix}$$

A wideband/long-term matrix may be expressed by $$W_1 = \frac{\sqrt{2}}{2}\begin{bmatrix} A \\ e^{j\phi} A \end{bmatrix}$$

In a special case where $e^{j\phi}=1$:

$$W \stackrel{(a)}{=} \frac{\sqrt{2}}{2}\begin{bmatrix} \sqrt{2-|\alpha|^2} I_{n_t/2} \\ & \alpha I_{n_t/2} \end{bmatrix}\begin{bmatrix} A \\ A \end{bmatrix}$$

$$\stackrel{(b)}{=} \frac{\sqrt{2}}{2}\begin{bmatrix} \sqrt{2-|\alpha|^2} \\ \alpha \end{bmatrix} \otimes A$$

$$\stackrel{(c)}{=} \frac{\sqrt{2}}{2}\begin{bmatrix} A \\ & A \end{bmatrix}\begin{bmatrix} \sqrt{2-|\alpha|^2} \\ \alpha \end{bmatrix}$$

As shown in the above equation, in the special case where $e^{j\phi}=1$, many equivalent methods may be used to express the same precoding matrix. For example, in the above equation, (a) corresponds to a method of using the structure of $W_2W_1$, (b) corresponds to a method of using Kronecker product, and (c) corresponds to a method of using a structure of $W_1W_2$.

When the interval between antennas is close, the precoding matrix may be expressed using the aforementioned equations in a single polarization channel. In this example, $\alpha=1$, a value of $\phi$ may be A-dependent and be selected to obtain DFT vectors for eight transmit antennas. For example, $W_2$ may correspond to an identity matrix and $W_1$ may provide a wideband precoding matrix of DFT vectors. Contrast to dual polarization channels, the selection of $\phi$ may affect the performance of single polarization channels.

According to the structure of $W_2W_1$ shown in $$W = \frac{\sqrt{2}}{2}\begin{bmatrix} \sqrt{2-|\alpha|^2} A \\ \alpha e^{j\phi} A \end{bmatrix} = \frac{\sqrt{2}}{2}\begin{bmatrix} \sqrt{2-|\alpha|^2} I_{n_t/2} \\ & \alpha I_{n_t/2} \end{bmatrix}\begin{bmatrix} A \\ e^{j\phi} A \end{bmatrix}.$$

the wideband/long-term matrix $$\begin{bmatrix} A \\ e^{j\phi} A \end{bmatrix}$$

may have a significantly robust physical meaning. That is, in its given $N_t\times 1$ dimension, the wideband/long-term matrix may be equivalent to a rank and thus, may provide a direct insight to a rank 1 wideband PMI structure. Also, in the aforementioned $W_2W_1$ structure, a structure $$\begin{bmatrix} A \\ A \end{bmatrix}$$

may not be associated with the rank and may not provide any information associated with a wideband PMI structure.

A full utilization of power amplifiers may be used as an important design criterion. When only a phase shift keying (PSK) is used to decrease the complexity of PMI search, there is a need to constrain a precoding matrix. It may be assumed that the precoding matrix becomes constant modulus and $|\alpha|=1$. In this scenario, $\alpha$ may use a subband/long-term property with respect to a phase shift between polarizations.

Design of Rank 2 Codebook when the Transmitter Includes Eight Transmit Antennas:

A rank 2 precoding matrix may include two orthogonal columns, which may be expressed by $$W^{(1)} = \frac{\sqrt{2}}{2}\begin{bmatrix} \sqrt{2-|\alpha_1|^2}\, I_{n_t/2} & \\ & \alpha_1 I_{n_t/2} \end{bmatrix}\begin{bmatrix} A_1 \\ B_1 \end{bmatrix}$$

$$W^{(2)} = \frac{\sqrt{2}}{2}\begin{bmatrix} \sqrt{2-|\alpha_2|^2}\, I_{n_t/2} & \\ & \alpha_2 I_{n_t/2} \end{bmatrix}\begin{bmatrix} A_2 \\ B_2 \end{bmatrix}$$

The full utilization of power in each antenna may force $|\alpha_1|^2+|\alpha_2|^2=2$, and may establish $\alpha_2=\sqrt{2-|\alpha|^2}e^{j\delta}$ with $\alpha_1=\alpha$. In this example, the following equations may be expressed.

$$W^{(1)} = \frac{\sqrt{2}}{2}\begin{bmatrix} \sqrt{2-|\alpha|^2}\, I_{n_t/2} & \\ & \alpha I_{n_t/2} \end{bmatrix}\begin{bmatrix} A_1 \\ B_1 \end{bmatrix}$$

$$W^{(2)} = \frac{\sqrt{2}}{2}\begin{bmatrix} |\alpha|I_{n_t/2} & \\ & \sqrt{2-|\alpha|^2}\, e^{j\delta} I_{n_t/2} \end{bmatrix}\begin{bmatrix} A_2 \\ B_2 \end{bmatrix}$$

To obtain mutually orthogonal columns, $A_1^H A_2=0$ and $B_1^H B_2=0$ may be sufficient. $A_1$, $A_2$, $B_1$, and $B_2$ may be approximated by two dominant eigenvectors of $N_r \times N_t$ covariance matrix. Many combinations may be used for design of the precoding matrix, which may cause great overhead. In a scenario with a narrow interval between antennas, $A_1=A$, $A_2=A$, $B_1=e^{j\phi_1}A$, and $B_2=e^{j\phi_2}A$. A cross-polarized setup may help achievement of rank 2 transmission in a configuration where the interval between antennas is narrow.

Parameters $\phi_1$ and $\phi_2$ may be selected to guarantee so that $W^{(1)}$ and $W^{(2)}$ may be orthogonal with respect to each other. In this example, $\phi_1=\phi$, and $\phi_2=\phi+\pi$. The rank 2 precoding matrix may be expressed by $$W = \frac{1}{\sqrt{2}}[W^{(1)}\ W^{(2)}]$$

$$= \frac{1}{2}\begin{bmatrix} \sqrt{2-|\alpha|^2}\,A & |\alpha|A \\ \alpha e^{j\phi}A & -\sqrt{2-|\alpha|^2}\,e^{j\delta}e^{j\phi}A \end{bmatrix}$$

The precoding matrix may be expressed using the $W_2 W_1$ structure, as follows:

$$W = \frac{1}{\sqrt{2}}[W^{(1)}\ W^{(2)}]$$

$$= \frac{1}{2}\begin{bmatrix} \sqrt{2-|\alpha|^2}\,A & |\alpha|A \\ \alpha e^{j\phi}A & -\sqrt{2-|\alpha|^2}\,e^{j\delta}e^{j\phi}A \end{bmatrix}$$

$$= \begin{bmatrix} A \\ e^{j\phi}A \end{bmatrix}\begin{bmatrix} \sqrt{2-|\alpha|^2} & |\alpha| \\ \alpha & -\sqrt{2-|\alpha|^2}\,e^{j\delta} \end{bmatrix}$$

In this equation, $$W_1 = \begin{bmatrix} A \\ e^{j\phi}A \end{bmatrix}$$

and $$W_2 = \frac{1}{2}\begin{bmatrix} \sqrt{2-|\alpha|^2} & |\alpha| \\ \alpha & -\sqrt{2-|\alpha|^2}\,e^{j\delta} \end{bmatrix}.$$

The precoding matrix may be expressed using a variety of methods. For example, the precoding matrix may be expressed by $$W = \frac{1}{\sqrt{2}}[W^{(1)}\ W^{(2)}]$$

$$= \frac{1}{2}\begin{bmatrix} \sqrt{2-|\alpha|^2}\,A & |\alpha|A \\ \alpha e^{j\phi}A & -\sqrt{2-|\alpha|^2}\,e^{j\delta}e^{j\phi}A \end{bmatrix}$$

$$= \begin{bmatrix} \sqrt{2-|\alpha|^2} & |\alpha| \\ \alpha & -\sqrt{2-|\alpha|^2}\,e^{j\delta} \end{bmatrix} \cdot \left[\frac{1}{2}\begin{bmatrix} A & A \\ e^{j\phi}A & -e^{j\phi}A \end{bmatrix}\right]$$

In this equation, $\bigcirc$ corresponds to Hardmard product, and $$W_1 = \frac{1}{2}\begin{bmatrix} A & A \\ e^{j\phi}A & -e^{j\phi}A \end{bmatrix},$$

and $$W_2 = \begin{bmatrix} \sqrt{2-|\alpha|^2} & |\alpha| \\ \alpha & -\sqrt{2-|\alpha|^2}\,e^{j\delta} \end{bmatrix}.$$

When $|\alpha|=1$ is assumed to maintain the precoding matrix as constant modulus, and to maintain a PSK alphabet, the rank 2 precoding matrix may include two orthogonal columns $W^{(1)}$ and $W^{(2)}$. Each column may satisfy the structure of the rank 1 precoding matrix, for example, as follows:

$$W^{(1)} = \frac{\sqrt{2}}{2}\begin{bmatrix} \sqrt{2-|\alpha|^2}\, I_{n_t/2} & \\ & \alpha I_{n_t/2} \end{bmatrix}\begin{bmatrix} A \\ e^{j\phi_1}A \end{bmatrix}$$

$$W^{(2)} = \frac{\sqrt{2}}{2}\begin{bmatrix} \sqrt{2-|\alpha|^2}\, I_{n_t/2} & \\ & \alpha I_{n_t/2} \end{bmatrix}\begin{bmatrix} A \\ e^{j\phi_2}A \end{bmatrix}$$

Two rank 1 precoding matrices may be differentiated using only the parameter $\phi$. The parameters $\phi_1$ and $\phi_2$ may be selected to guarantee that $W^{(1)}$ and $W^{(2)}$ are orthogonal to each other. When $\phi_1=\phi$ and $\phi_2=\phi+\pi$, the rank 2 precoding matrix may be expressed by $$W = \frac{1}{\sqrt{2}}[W^{(1)}\ W^{(2)}]$$

$$= \frac{1}{2}\begin{bmatrix} \sqrt{2-|\alpha|^2}\, I_{n_t/2} & \\ & \alpha I_{n_t/2} \end{bmatrix}\begin{bmatrix} A & A \\ e^{j\phi}A & -e^{j\phi}A \end{bmatrix}.$$

Wideband/long-term matrix $W_1$ may correspond to a wideband precoding matrix and may be given as $$W_1 = \frac{1}{2}\begin{bmatrix} A & A \\ e^{j\phi}A & -e^{j\phi}A \end{bmatrix}.$$

A subband matrix $W_2$ may be expressed by $$W_2 = \begin{bmatrix} \sqrt{2-|\alpha|^2}\, I_{n_t/2} & \\ & \alpha I_{n_t/2} \end{bmatrix}.$$

The selection of $\phi$ may not affect the performance of the wideband precoding matrix $W_1$ in dual polarization channels, however, may have a strong influence in single polarization channels. The parameter $\phi$ may be selected so that $W_1$ may have excellent performance even in single polarization channels.

In a special case where $e^{j\phi}=1$:

$$W \stackrel{(a)}{=} \frac{1}{2}\begin{bmatrix} \sqrt{2-|\alpha|^2}\, I_{n_t/2} & \\ & \alpha I_{n_t/2} \end{bmatrix}\begin{bmatrix} A & A \\ A & -A \end{bmatrix}$$

$$\stackrel{(b)}{=} \frac{\sqrt{2}}{2}\begin{bmatrix} \sqrt{2-|\alpha|^2}\, I_{n_t/2} & \\ & \alpha I_{n_t/2} \end{bmatrix} U_{rot}\begin{bmatrix} A & 0 \\ 0 & A \end{bmatrix}$$

$$\stackrel{(c)}{=} \frac{1}{2}\begin{bmatrix} \sqrt{2-|\alpha|^2} & \sqrt{2-|\alpha|^2} \\ \alpha & -\alpha \end{bmatrix} \otimes A$$

$$\stackrel{(d)}{=} \frac{1}{2}\begin{bmatrix} A & \\ & A \end{bmatrix}\begin{bmatrix} \sqrt{2-|\alpha|^2} & \sqrt{2-|\alpha|^2} \\ \alpha & -\alpha \end{bmatrix}$$

In the special case where $e^{j\phi}=1$, many equivalent methods may be used to express the same precoding matrix. For example, in the above equation, (a) corresponds to a method of using the structure of $W_2 W_1$, (b) corresponds to a method of using a rotated block diagonal structure, (c) corresponds to a method of using Kronecker product, and (d) corresponds to a method of using the structure of $W_1 W_2$.

Design of Rank 3 Codebook when the Transmitter Includes Eight Transmit Antennas:

A rank 3 precoding matrix may be obtained by simply extending a structure induced with respect to the rank 1 precoding matrix and the rank 2 precoding matrix. By adding, to the rank 2 precoding matrix, a column orthogonal to the rank 2 precoding matrix, the rank 3 precoding matrix may be obtained as follows:

$$W = \frac{1}{\sqrt{3}}[W^{(1)}\ W^{(2)}\ W^{(3)}]$$

$$= \frac{1}{\sqrt{3}\sqrt{2}}\begin{bmatrix} \sqrt{2-|\alpha|^2}\, I_{n_t/2} & \\ & \alpha I_{n_t/2} \end{bmatrix}\begin{bmatrix} A & A & B \\ e^{j\varphi}A & -e^{j\varphi}A & e^{j\varphi}B \end{bmatrix}$$

or $$W = \frac{1}{\sqrt{3}}[W^{(1)}\ W^{(2)}\ W^{(3)}]$$

$$= \frac{1}{\sqrt{3}\sqrt{2}}\begin{bmatrix} \sqrt{2-|\alpha|^2}\, I_{n_t/2} & \\ & \alpha I_{n_t/2} \end{bmatrix}\begin{bmatrix} A & A & B \\ e^{j\varphi}A & -e^{j\varphi}A & -e^{j\varphi}B \end{bmatrix}$$

In this example, A and B may be orthogonal to each other.

Design of Rank 4 Codebook when the Transmitter Includes Eight Transmit Antennas:

Similarly with respect to rank 4, a rank 4 precoding matrix may be expressed using two rank 2 precoding matrices as follows:

$$W = \frac{1}{\sqrt{4}}[W^{(1)}\ W^{(2)}\ W^{(3)}\ W^{(4)}]$$

$$= \frac{1}{\sqrt{4}\sqrt{2}}\begin{bmatrix} \sqrt{2-|\alpha|^2}\, I_{n_t/2} & \\ & \alpha I_{n_t/2} \end{bmatrix}\begin{bmatrix} A & A & B & B \\ e^{j\varphi}A & -e^{j\varphi}A & e^{j\varphi}B & -e^{j\varphi}B \end{bmatrix}$$

In this example, A and B may be orthogonal to each other.

Design of Rank r Codebook when the Transmitter Includes Eight Transmit Antennas:

With respect to rank r codebook, the precoding matrix may be expressed as follows:

When r is an odd number, $$W = \frac{1}{\sqrt{r}}[W^{(1)}\ W^{(2)}\ \ldots\ W^{(r)}]$$

$$= \frac{1}{\sqrt{r}\sqrt{2}}\begin{bmatrix} \sqrt{2-|\alpha|^2}\, I_{n_t/2} & \\ & \alpha I_{n_t/2} \end{bmatrix}\begin{bmatrix} A & A & \ldots & C \\ e^{j\varphi}A & -e^{j\varphi}A & \ldots & e^{j\varphi}C \end{bmatrix}$$

or $$W = \frac{1}{\sqrt{r}}[W^{(1)}\ W^{(2)}\ \ldots\ W^{(r)}]$$

$$= \frac{1}{\sqrt{r}\sqrt{2}}\begin{bmatrix} \sqrt{2-|\alpha|^2}\, I_{n_t/2} & \\ & \alpha I_{n_t/2} \end{bmatrix}\begin{bmatrix} A & A & \ldots & C \\ e^{j\varphi}A & -e^{j\varphi}A & \ldots & -e^{j\varphi}C \end{bmatrix}$$

When r is an even number, $$W = \frac{1}{\sqrt{r}}[W^{(1)}\ W^{(2)}\ \ldots\ W^{(r-1)}\ W^{(r)}]$$

$$= \frac{1}{\sqrt{r}\sqrt{2}}\begin{bmatrix} \sqrt{2-|\alpha|^2}\, I_{n_t/2} & \\ & \alpha I_{n_t/2} \end{bmatrix}\begin{bmatrix} A & A & \ldots & C & C \\ e^{j\varphi}A & -e^{j\varphi}A & \ldots & e^{j\varphi}C & -e^{j\varphi}C \end{bmatrix}$$

In this example, A, B, . . . , C may be orthogonal to each other.

Observation

The following collusion may be made. That is, the minimum requirement for achieving the excellent performance of a recommended precoding matrix may follow as:

$$W = W_2 W_1$$

Here, an outer matrix $W_1$ corresponds to a unitary precoding matrix that is an element of a first codebook $C_1$ and has a dimension of $N_t \times R$. For each rank, $W_1$ may be expressed as follows:

Rank 1
$$W_1 = \frac{\sqrt{2}}{2}\begin{bmatrix} A \\ e^{j\phi}A \end{bmatrix}$$

Rank 2
$$W_1 = \frac{1}{2}\begin{bmatrix} A & A \\ e^{j\phi}A & -e^{j\phi}A \end{bmatrix}$$

Rank r:
when r is an odd number:

$$W_1 = \frac{1}{\sqrt{r}\sqrt{2}}\begin{bmatrix} A & A & \ldots & C \\ e^{j\phi}A & -e^{j\phi}A & \ldots & e^{j\phi}C \end{bmatrix}$$

or $$W_1 = \frac{1}{\sqrt{r}\sqrt{2}}\begin{bmatrix} A & A & \ldots & C \\ e^{j\phi}A & -e^{j\phi}A & \ldots & -e^{j\phi}C \end{bmatrix}$$

when r is an even number:

$$W_1 = \frac{1}{\sqrt{r}\sqrt{2}}\begin{bmatrix} A & A & \ldots & C & C \\ e^{j\phi}A & -e^{j\phi}A & \ldots & e^{j\phi}C & -e^{j\phi}C \end{bmatrix}$$

A, B, ..., C may be orthogonal to each other, or may be DFT vectors.

An inner matrix $W_2$ may correspond to a diagonal matrix that is an element of a second codebook $C_2$ and has a dimension of $N_t \times N_t$. For example, $$W_2 = \begin{bmatrix} \sqrt{2-|\alpha|^2}\, I_{n_t/2} & \\ & \alpha I_{n_t/2} \end{bmatrix}$$

with $|\alpha| = 1$.

Extension

In the aforementioned observation, highly correlated channels may be assumed. Feedback overhead required for reporting $W_2$ and $W_1$ with a sufficient accuracy may not be used. To provide some design flexibilities, and to provide balanced feedback overheard and high feedback accuracy with respect to $W_2$ and $W_1$, a previous observation may be extended as follows:

$W = W_2 W_1$

In this example, an outer matrix $W_1$ corresponds to a unitary precoding matrix that is an element of a first codebook $C_1$ and has a dimension of $N_t \times R$. For each rank, $W_1$ may be expressed as follows:

Rank 1
$$W_1 = \frac{\sqrt{2}}{2}\begin{bmatrix} A \\ e^{j\phi}A \end{bmatrix}$$

Rank 2
$$W_1 = \frac{1}{2}\begin{bmatrix} A & A \\ e^{j\phi}A & -e^{j\phi}A \end{bmatrix}$$

Rank r:
when r is an odd number:

$$W_1 = \frac{1}{\sqrt{r}\sqrt{2}}\begin{bmatrix} A & A & \ldots & C \\ e^{j\phi}A & -e^{j\phi}A & \ldots & e^{j\phi}C \end{bmatrix}$$

or $$W_1 = \frac{1}{\sqrt{r}\sqrt{2}}\begin{bmatrix} A & A & \ldots & C \\ e^{j\phi}A & -e^{j\phi}A & \ldots & -e^{j\phi}C \end{bmatrix}$$

when r is an even number:

$$W_1 = \frac{1}{\sqrt{r}\sqrt{2}}\begin{bmatrix} A & A & \ldots & C & C \\ e^{j\phi}A & -e^{j\phi}A & \ldots & e^{j\phi}C & -e^{j\phi}C \end{bmatrix}$$

A, B, ..., C may be orthogonal to each other, or may be DFT vectors.

An inner matrix $W_2$ may correspond to a diagonal matrix that is an element of a second codebook $C_2$ and has a dimension of $N_t \times N_t$. For example, $$W_2 = \begin{bmatrix} \sqrt{2-|\alpha|^2}\,\Theta & 0_{4\times 4} \\ 0_{4\times 4} & \alpha\Theta \end{bmatrix}$$

with $|\alpha| = 1$.

In $W_2$, $\Theta$ corresponds to a 4×4 matrix, and may be defined as $\Theta = \text{diag}\{1, e^{j\pi\theta}, e^{j2\pi\theta}, e^{j3\pi\theta}\}$. diag(a, b, c, d) corresponds to a diagonal matrix that includes a, b, c, and d as diagonal elements. $\Theta$ enables tracking of a spatial correlation structure, for example, a DFT structure in a subband level above antennas 0 through 3, and above antennas 4 through 7. In this example, in a dual polarization case, the antennas 0 through 3 may generate one polarization, and the antennas 4 through 7 may generate another polarization. In a single polarization case, all the antennas may generate the same polarization.

α corresponds to a complex scalar and may process dual polarization or single polarization based on a small antennal interval. α may be selected within a subband level, for example, within a set of 1, j, $e^{j4\pi\theta}$. For example, in a single polarization case, $W_2$ may have a structure of $W_2 = \text{diag}\{1, e^{j\pi\theta}, e^{j2\pi\theta}, e^{j3\pi\theta}, e^{j4\pi\theta}, e^{j5\pi\theta}, e^{j6\pi\theta}, e^{j7\pi\theta}\}$. In a dual polarization case, α may be selected as 1 or j.

Codebook Suggestions

Prior to suggesting codebooks, 4×4 DFT matrices may be defined as follows:

$$DFT_1 = \frac{1}{2}\begin{bmatrix} 1 & 1 & 1 & 1 \\ 1 & j & -1 & -j \\ 1 & -1 & 1 & -1 \\ 1 & -j & -1 & j \end{bmatrix},$$

-continued $$DFT_2 = \text{diag}\{1, e^{j\pi/4}, j, e^{j3\pi/4}\}DFT_1$$

$$DFT_3 = \text{diag}\{1, e^{j\pi/8}, e^{j2\pi/8}, e^{j3\pi/8}\}DFT_1$$

$$DFT_4 = \text{diag}\{1, e^{j3\pi/8}, e^{j6\pi/8}, e^{j9\pi/8}\}DFT_1,$$

Suggestion 1: 4-Bit Codebook for Each Rank for $W_1$

In suggestion 1, the first codebook $C_1$ for rank r where r=1, . . . , 6 may include 16 4-bit elements or codewords. The first codebook $C_1$ for rank r where r=7, 8 may include four elements.

Codebook $C_1$

The first codebook $C_1$ for rank r may be expressed as $C_{1,r}$.

A first codebook $C_{1,1}$ for rank 1 may be obtained by employing columns 1 through 16 of the following matrix:

$$V_1 = \frac{\sqrt{2}}{2}\begin{bmatrix} DFT_1 & DFT_2 & DFT_3 & DFT_4 \\ DFT_1 & -DFT_2 & jDFT_3 & -jDFT_4 \end{bmatrix}$$

The 16 column vectors may correspond to DFT vectors for eight transmit antennas.

A first codebook $C_{1,2}$ for rank 2 may include the following 16 matrices:

$$C_{1,2} = \left\{ \frac{1}{2}\begin{bmatrix} D_{1,k} & D_{1,k} \\ D_{1,k} & -D_{1,k} \end{bmatrix}, \frac{1}{2}\begin{bmatrix} D_{2,k} & D_{2,k} \\ D_{2,k} & -D_{2,k} \end{bmatrix}, \frac{1}{2}\begin{bmatrix} D_{3,k} & D_{3,k} \\ jD_{3,k} & -jD_{3,k} \end{bmatrix}, \frac{1}{2}\begin{bmatrix} D_{4,k} & D_{4,k} \\ jD_{4,k} & -jD_{4,k} \end{bmatrix} \right\},\ k=1,\ldots,4 $$

In this example, $D_{m,k}$ corresponds to a $k^{th}$ column of $DFT_m$. For example, $D_{1,k}$ corresponds to a $k^{th}$ column of $DFT_1$, $D_{2,k}$ corresponds to a $k^{th}$ column of $DFT_2$, $D_{3,k}$ corresponds to a $k^{th}$ column of $DFT_3$, and $D_{4,k}$ corresponds to a $k^{th}$ column of $DFT_4$.

The first codebook $C_{1,2}$ may be obtained by using a first codebook for rank 1 and by adding up orthogonal columns based on $$W_1 = \frac{1}{2}\begin{bmatrix} A & A \\ e^{j\phi}A & -e^{j\phi}A \end{bmatrix}.$$

A first codebook $C_{1,3}$ for rank 3 may include the following 16 matrices:

Example 1

$$C_{1,3} = \left\{ \frac{1}{\sqrt{3}\sqrt{2}}\begin{bmatrix} D_{1,k} & D_{1,k} & D_{1,m} \\ D_{1,k} & -D_{1,k} & D_{1,m} \end{bmatrix}, \frac{1}{\sqrt{3}\sqrt{2}}\begin{bmatrix} D_{2,k} & D_{2,k} & D_{2,m} \\ D_{2,k} & -D_{2,k} & D_{2,m} \end{bmatrix}, \frac{1}{\sqrt{3}\sqrt{2}}\begin{bmatrix} D_{3,k} & D_{3,k} & D_{3,m} \\ jD_{3,k} & -jD_{3,k} & jD_{3,m} \end{bmatrix}, \frac{1}{\sqrt{3}\sqrt{2}}\begin{bmatrix} D_{4,k} & D_{4,k} & D_{4,m} \\ jD_{4,k} & -jD_{4,k} & jD_{4,m} \end{bmatrix} \right\}$$

In this example, k=1, . . . 4 and m=k mod 4+1.

Example 2

$$C_{1,3} = \left\{ \frac{1}{\sqrt{3}\sqrt{2}}\begin{bmatrix} D_{1,k} & D_{1,k} & D_{1,m} \\ D_{1,k} & -D_{1,k} & -D_{1,m} \end{bmatrix}, \frac{1}{\sqrt{3}\sqrt{2}}\begin{bmatrix} D_{2,k} & D_{2,k} & D_{2,m} \\ D_{2,k} & -D_{2,k} & -D_{2,m} \end{bmatrix}, \frac{1}{\sqrt{3}\sqrt{2}}\begin{bmatrix} D_{3,k} & D_{3,k} & D_{3,m} \\ jD_{3,k} & -jD_{3,k} & -jD_{3,m} \end{bmatrix}, \frac{1}{\sqrt{3}\sqrt{2}}\begin{bmatrix} D_{4,k} & D_{4,k} & D_{4,m} \\ jD_{4,k} & -jD_{4,k} & -jD_{4,m} \end{bmatrix} \right\}$$

In this example, k=1, . . . 4 and m=k mod 4+1.

Other examples may also be used. For example, m may be given to be different from above, and k may also be given to be different from above. For example, various combinations of k and m may be given as (k,m)={(1,2),(1,3),(1,4),(2,3)}.

A first codebook $C_{1,4}$ for rank 4 may include the following 16 matrices:

Example 1

$$C_{1,4} = \left\{ \frac{1}{\sqrt{4}\sqrt{2}}\begin{bmatrix} D_{1,k} & D_{1,k} & D_{1,m} & D_{1,m} \\ D_{1,k} & -D_{1,k} & D_{1,m} & -D_{1,m} \end{bmatrix}, \frac{1}{\sqrt{4}\sqrt{2}}\begin{bmatrix} D_{2,k} & D_{2,k} & D_{2,m} & D_{2,m} \\ D_{2,k} & -D_{2,k} & D_{2,m} & -D_{2,m} \end{bmatrix}, \frac{1}{\sqrt{4}\sqrt{2}}\begin{bmatrix} D_{3,k} & D_{3,k} & D_{3,m} & D_{3,m} \\ jD_{3,k} & -jD_{3,k} & jD_{3,m} & -jD_{3,m} \end{bmatrix}, \frac{1}{\sqrt{4}\sqrt{2}}\begin{bmatrix} D_{4,k} & D_{4,k} & D_{4,m} & D_{4,m} \\ jD_{4,k} & -jD_{4,k} & jD_{4,m} & -jD_{4,m} \end{bmatrix} \right\}$$

In this example, k=1, . . . 4 and m=k mod 4+1.

Example 2 m may be given to be different from above, and k may also be given to be different from above. For example, various combinations of k and m may be given as (k,m)={(1,2),(1,3),(1,4),(2,3)}. Other examples may also be used.

A first codebook $C_{1,5}$ for rank 5 may include the following 16 matrices:

Example 1

$$C_{1,5} = \left\{ \begin{array}{l} \frac{1}{\sqrt{5}\sqrt{2}} \begin{bmatrix} D_{1,k} & D_{1,k} & D_{1,m} & D_{1,m} & D_{1,n} \\ D_{1,k} & -D_{1,k} & D_{1,m} & -D_{1,m} & D_{1,n} \end{bmatrix}, \\ \frac{1}{\sqrt{5}\sqrt{2}} \begin{bmatrix} D_{2,k} & D_{2,k} & D_{2,m} & D_{2,m} & D_{2,n} \\ D_{2,k} & -D_{2,k} & D_{2,m} & -D_{2,m} & D_{2,n} \end{bmatrix}, \\ \frac{1}{\sqrt{5}\sqrt{2}} \begin{bmatrix} D_{3,k} & D_{3,k} & D_{3,m} & D_{3,m} & D_{3,n} \\ jD_{3,k} & -jD_{3,k} & jD_{3,m} & -jD_{3,m} & jD_{3,n} \end{bmatrix}, \\ \frac{1}{\sqrt{5}\sqrt{2}} \begin{bmatrix} D_{4,k} & D_{4,k} & D_{4,m} & D_{4,m} & D_{4,n} \\ jD_{4,k} & -jD_{4,k} & jD_{4,m} & -jD_{4,m} & jD_{4,n} \end{bmatrix} \end{array} \right\}$$

A combination of k, m, and n may be selected from $\{(1,2,3),(1,2,4),(1,3,4),(2,3,4)\}$.

Example 2

$$C_{1,5} = \left\{ \begin{array}{l} \frac{1}{\sqrt{5}\sqrt{2}} \begin{bmatrix} D_{1,k} & D_{1,k} & D_{1,m} & D_{1,m} & D_{1,n} \\ D_{1,k} & -D_{1,k} & D_{1,m} & -D_{1,m} & -D_{1,n} \end{bmatrix}, \\ \frac{1}{\sqrt{5}\sqrt{2}} \begin{bmatrix} D_{2,k} & D_{2,k} & D_{2,m} & D_{2,m} & D_{2,n} \\ D_{2,k} & -D_{2,k} & D_{2,m} & -D_{2,m} & -D_{2,n} \end{bmatrix}, \\ \frac{1}{\sqrt{5}\sqrt{2}} \begin{bmatrix} D_{3,k} & D_{3,k} & D_{3,m} & D_{3,m} & D_{3,n} \\ jD_{3,k} & -jD_{3,k} & jD_{3,m} & -jD_{3,m} & -jD_{3,n} \end{bmatrix}, \\ \frac{1}{\sqrt{5}\sqrt{2}} \begin{bmatrix} D_{4,k} & D_{4,k} & D_{4,m} & D_{4,m} & D_{4,n} \\ jD_{4,k} & -jD_{4,k} & jD_{4,m} & -jD_{4,m} & -jD_{4,n} \end{bmatrix} \end{array} \right\}$$

A combination of k, m, and n may be selected from $\{(1,2,3),(1,2,4),(1,3,4),(2,3,4)\}$.

A first codebook $C_{1,6}$ for rank 6 may include the following 16 matrices:

$$C_{1,6} = \left\{ \begin{array}{l} \frac{1}{\sqrt{6}\sqrt{2}} \begin{bmatrix} D_{1,k} & D_{1,k} & D_{1,m} & D_{1,m} & D_{1,n} & D_{1,n} \\ D_{1,k} & -D_{1,k} & D_{1,m} & -D_{1,m} & D_{1,n} & -D_{1,n} \end{bmatrix}, \\ \frac{1}{\sqrt{6}\sqrt{2}} \begin{bmatrix} D_{2,k} & D_{2,k} & D_{2,m} & D_{2,m} & D_{2,n} & D_{2,n} \\ D_{2,k} & -D_{2,k} & D_{2,m} & -D_{2,m} & D_{2,n} & -D_{2,n} \end{bmatrix}, \\ \frac{1}{\sqrt{6}\sqrt{2}} \begin{bmatrix} D_{3,k} & D_{3,k} & D_{3,m} & D_{3,m} & D_{3,n} & D_{3,n} \\ jD_{3,k} & -jD_{3,k} & jD_{3,m} & -jD_{3,m} & jD_{3,n} & -jD_{3,n} \end{bmatrix}, \\ \frac{1}{\sqrt{6}\sqrt{2}} \begin{bmatrix} D_{4,k} & D_{4,k} & D_{4,m} & D_{4,m} & D_{4,n} & D_{4,n} \\ jD_{4,k} & -jD_{4,k} & jD_{4,m} & -jD_{4,m} & jD_{4,n} & -jD_{4,n} \end{bmatrix} \end{array} \right\}$$

A combination of k, m, and n may be selected from $\{(1,2,3),(1,2,4),(1,3,4),(2,3,4)\}$.

A first codebook $C_{1,7}$ for rank 7 may include the following four matrices:

Example 1

$$C_{1,7} = \left\{ \begin{array}{l} \frac{1}{\sqrt{7}\sqrt{2}} \begin{bmatrix} D_{1,k} & D_{1,k} & D_{1,m} & D_{1,m} & D_{1,n} & D_{1,n} & D_{1,p} \\ D_{1,k} & -D_{1,k} & D_{1,m} & -D_{1,m} & D_{1,n} & -D_{1,n} & D_{1,p} \end{bmatrix}, \\ \frac{1}{\sqrt{7}\sqrt{2}} \begin{bmatrix} D_{2,k} & D_{2,k} & D_{2,m} & D_{2,m} & D_{2,n} & D_{2,n} & D_{2,p} \\ D_{2,k} & -D_{2,k} & D_{2,m} & -D_{2,m} & D_{2,n} & -D_{2,n} & D_{2,p} \end{bmatrix}, \\ \frac{1}{\sqrt{7}\sqrt{2}} \begin{bmatrix} D_{3,k} & D_{3,k} & D_{3,m} & D_{3,m} & D_{3,n} & D_{3,n} & D_{3,p} \\ jD_{3,k} & -jD_{3,k} & jD_{3,m} & -jD_{3,m} & jD_{3,n} & -jD_{3,n} & jD_{3,p} \end{bmatrix}, \\ \frac{1}{\sqrt{7}\sqrt{2}} \begin{bmatrix} D_{4,k} & D_{4,k} & D_{4,m} & D_{4,m} & D_{4,n} & D_{4,n} & D_{4,p} \\ jD_{4,k} & -jD_{4,k} & jD_{4,m} & -jD_{4,m} & jD_{4,n} & -jD_{4,n} & jD_{4,p} \end{bmatrix} \end{array} \right\}$$

$(k,m,n,p)=(1,2,3,4)$.

Example 2

$$C_{1,7} = \left\{ \begin{array}{l} \frac{1}{\sqrt{7}\sqrt{2}} \begin{bmatrix} D_{1,k} & D_{1,k} & D_{1,m} & D_{1,m} & D_{1,n} & D_{1,n} & D_{1,p} \\ D_{1,k} & -D_{1,k} & D_{1,m} & -D_{1,m} & D_{1,n} & -D_{1,n} & -D_{1,p} \end{bmatrix}, \\ \frac{1}{\sqrt{7}\sqrt{2}} \begin{bmatrix} D_{2,k} & D_{2,k} & D_{2,m} & D_{2,m} & D_{2,n} & D_{2,n} & D_{2,p} \\ D_{2,k} & -D_{2,k} & D_{2,m} & -D_{2,m} & D_{2,n} & -D_{2,n} & -D_{2,p} \end{bmatrix}, \\ \frac{1}{\sqrt{7}\sqrt{2}} \begin{bmatrix} D_{3,k} & D_{3,k} & D_{3,m} & D_{3,m} & D_{3,n} & D_{3,n} & D_{3,p} \\ jD_{3,k} & -jD_{3,k} & jD_{3,m} & -jD_{3,m} & jD_{3,n} & -jD_{3,n} & -jD_{3,p} \end{bmatrix}, \\ \frac{1}{\sqrt{7}\sqrt{2}} \begin{bmatrix} D_{4,k} & D_{4,k} & D_{4,m} & D_{4,m} & D_{4,n} & D_{4,n} & D_{4,p} \\ jD_{4,k} & -jD_{4,k} & jD_{4,m} & -jD_{4,m} & jD_{4,n} & -jD_{4,n} & -jD_{4,p} \end{bmatrix} \end{array} \right\}$$

$(k,m,n,p)=(1,2,3,4)$.

A first codebook $C_{1,8}$ for rank 8 may include the following four matrices:

$$C_{1,8} = \left\{ \begin{array}{l} \frac{1}{\sqrt{8}\sqrt{2}} \begin{bmatrix} D_1 & D_1 \\ D_1 & -D_1 \end{bmatrix}, \frac{1}{\sqrt{8}\sqrt{2}} \begin{bmatrix} D_2 & D_2 \\ D_2 & -D_2 \end{bmatrix}, \\ \frac{1}{\sqrt{8}\sqrt{2}} \begin{bmatrix} D_3 & D_3 \\ jD_3 & -jD_3 \end{bmatrix}, \frac{1}{\sqrt{8}\sqrt{2}} \begin{bmatrix} D_4 & D_4 \\ jD_4 & -jD_4 \end{bmatrix} \end{array} \right\}$$

Codebook $C_2$

A number of codewords to be assigned to $\Theta$ and $\alpha$ may need to be carefully investigated.

Example 1

For example, when a single bit is assigned to $\Theta$ and $\alpha$, the second codebook $C_2$ may be expressed as follows:

For rank 1:

With respect to $\alpha \in \{e^{j4\pi\theta_i}\}$ and $\Theta_i$ where $i=1,2$, when a second codebook for rank 1 including a first codeword and a second codeword is assumed as $C_{2,1\ldots 2}$, $$C_{2,1\ldots 2} = \left\{ \begin{bmatrix} \Theta_1 & 0_{4\times 4} \\ 0_{4\times 4} & e^{j4\pi\theta_1}\Theta_1 \end{bmatrix}, \begin{bmatrix} \Theta_2 & 0_{4\times 4} \\ 0_{4\times 4} & e^{j4\pi\theta_2}\Theta_2 \end{bmatrix} \right\}.$$

In this example, $\theta_1=\frac{1}{16}, \theta_2=-\frac{1}{16}$.

With respect to $\alpha \in \{1,-1\}$ and $\Theta=I$, when the second codebook for rank 1 including a third codeword and a fourth codeword is assumed as $C_{2,3\ldots 4}$, $$C_{2,3\ldots 4} = \left\{ \begin{bmatrix} I_4 & 0_{4\times 4} \\ 0_{4\times 4} & I_4 \end{bmatrix}, \begin{bmatrix} I_4 & 0_{4\times 4} \\ 0_{4\times 4} & -I_4 \end{bmatrix} \right\}.$$

For ranks 2, 3, and 4:

With respect to $\alpha \in \{1\}$ and $\Theta_i$ where $i=1, 2$, when a second codebook for ranks 2, 3, and 4 including a first codeword and a second codeword is assumed as $$C_{2,1\ldots 2} = \left\{ \begin{bmatrix} \Theta_1 & 0_{4\times 4} \\ 0_{4\times 4} & \Theta_1 \end{bmatrix}, \begin{bmatrix} \Theta_2 & 0_{4\times 4} \\ 0_{4\times 4} & \Theta_2 \end{bmatrix} \right\}.$$

Example 2

A size of the second codebook may be extended to three bits by extending the aforementioned example 1).

For rank 1:

With respect to $\alpha \in \{1, e^{j4\pi\theta_i}\}$ and $\Theta_i$ where $i=1, 2$, when the second codebook for rank 1 including four codewords is assumed as $C_{2,1\ldots 4}$ $$C_{2,1\ldots 4} = \left\{ \begin{bmatrix} \Theta_1 & 0_{4\times 4} \\ 0_{4\times 4} & e^{j4\pi\theta_1}\Theta_1 \end{bmatrix}, \begin{bmatrix} \Theta_2 & 0_{4\times 4} \\ 0_{4\times 4} & e^{j4\pi\theta_2}\Theta_2 \end{bmatrix}, \begin{bmatrix} \Theta_1 & 0_{4\times 4} \\ 0_{4\times 4} & \Theta_1 \end{bmatrix}, \begin{bmatrix} \Theta_2 & 0_{4\times 4} \\ 0_{4\times 4} & \Theta_2 \end{bmatrix} \right\}$$

For ranks 2, 3, and 4:

With respect to $\alpha \in \{1\}$ and $\Theta_i$ where $i=1, 2$, when the second codebook for ranks 2, 3, and 4 including first through fourth codewords is assumed as $C_{2,1\ldots 4}$ $$C_{2,1\ldots 4} = \left\{ \begin{bmatrix} \Theta_1 & 0_{4\times 4} \\ 0_{4\times 4} & \Theta_1 \end{bmatrix}, \begin{bmatrix} \Theta_2 & 0_{4\times 4} \\ 0_{4\times 4} & \Theta_2 \end{bmatrix}, \begin{bmatrix} \Theta_3 & 0_{4\times 4} \\ 0_{4\times 4} & \Theta_3 \end{bmatrix}, \begin{bmatrix} \Theta_4 & 0_{4\times 4} \\ 0_{4\times 4} & \Theta_4 \end{bmatrix} \right\}.$$

In this example, $\theta_1 = 1/16, \theta_2 = -1/16, \theta_3 = 1/8, \theta_4 = -1/8$.

With respect to $\alpha \in \{1, j\}$ and $\Theta=I$, when the second codebook for ranks 2, 3, and 4 including fifth through sixth codewords is assumed as $C_{2,5\ldots 6}$, $$C_{2,5\ldots 6} = \left\{ \begin{bmatrix} I & 0_{4\times 4} \\ 0_{4\times 4} & I \end{bmatrix}, \begin{bmatrix} I & 0_{4\times 4} \\ 0_{4\times 4} & jI \end{bmatrix} \right\}.$$

With respect to $\theta_3 = 1/8, \theta_4 = -1/8$ with $\alpha \in \{j\}$, when the second codebook for ranks 2, 3, and 4 including seventh through eighth codewords is assumed as $C_{2,7\ldots 8}$, $$C_{2,7\ldots 8} = \left\{ \begin{bmatrix} \Theta_3 & 0_{4\times 4} \\ 0_{4\times 4} & j\Theta_3 \end{bmatrix}, \begin{bmatrix} \Theta_4 & 0_{4\times 4} \\ 0_{4\times 4} & j\Theta_4 \end{bmatrix} \right\}.$$

Suggestion 2: Maximum 4-Bit Codebook for Each Rank for $W_1$

In suggestion 2, the first codebook for rank r where $r=1, \ldots 2$ may include 16 elements, the first codebook for rank r where $r=3, 4$ may include eight elements, and the first codebook for rank r where $r=5, 6, 7, 8$ may include four elements.

The above 64 entries may be divided into four subsets each including 16 entries. To indicate one of the subsets, two bits may be used. The two bits may indicate a rank corresponding to the selected subset among rank 1, rank 2, rank 3-4, and rank 5-8.

Codebook $C_1$

A first codebook $C_1$ for rank r may be indicated as $C_{1,r}$.

A rank 1 first codebook $C_{1,1}$ may be obtained by employing columns 1 through 16 of the following matrix:

$$V_1 = \frac{\sqrt{2}}{2} \begin{bmatrix} DFT_1 & DFT_2 & DFT_3 & DFT_4 \\ DFT_1 & -DFT_2 & jDFT_3 & -jDFT_4 \end{bmatrix}$$

The column vectors 1 through 16 may correspond to DFT vectors for eight transmit antennas.

A rank 2 first codebook $C_{1,2}$ may include the following 16 matrices:

$$C_{1,2} = \left\{ \begin{array}{c} \frac{1}{2}\begin{bmatrix} D_{1,k} & D_{1,k} \\ D_{1,k} & -D_{1,k} \end{bmatrix}, \frac{1}{2}\begin{bmatrix} D_{2,k} & D_{2,k} \\ D_{2,k} & -D_{2,k} \end{bmatrix}, \\ \frac{1}{2}\begin{bmatrix} D_{3,k} & D_{3,k} \\ jD_{3,k} & -jD_{3,k} \end{bmatrix}, \frac{1}{2}\begin{bmatrix} D_{4,k} & D_{4,k} \\ jD_{4,k} & -jD_{4,k} \end{bmatrix}, \\ k = 1, \ldots, 4 \end{array} \right\}$$

In this example, $D_{m,k}$ corresponds to a $k^{th}$ column of $DFT_m$. For example, $D_{1,k}$ corresponds to a $k^{th}$ column of $DFT_1$, $D_{2,k}$ corresponds to a $k^{th}$ column of $DFT_2$, $D_{3,k}$ corresponds to a $k^{th}$ column of $DFT_3$, and $D_{4,k}$ corresponds to a $k^{th}$ column of $DFT_4$.

The rank 2 first codebook $C_{1,2}$ may be obtained by using the rank 1 first codebook and adding orthogonal columns based on $$W_1 = \frac{1}{2} \begin{bmatrix} A & A \\ e^{j\phi}A & -e^{j\phi}A \end{bmatrix}.$$

A rank 3 first codebook $C_{1,3}$ may include the following eight matrices:

Example 1

$$C_{1,3} = \left\{ \begin{array}{c} \frac{1}{\sqrt{3}\sqrt{2}}\begin{bmatrix} D_{1,k} & D_{1,k} & D_{1,m} \\ D_{1,k} & -D_{1,k} & D_{1,m} \end{bmatrix}, \\ \frac{1}{\sqrt{3}\sqrt{2}}\begin{bmatrix} D_{2,k} & D_{2,k} & D_{2,m} \\ D_{2,k} & -D_{2,k} & D_{2,m} \end{bmatrix}, \\ \frac{1}{\sqrt{3}\sqrt{2}}\begin{bmatrix} D_{3,k} & D_{3,k} & D_{3,m} \\ jD_{3,k} & -jD_{3,k} & jD_{3,m} \end{bmatrix}, \\ \frac{1}{\sqrt{3}\sqrt{2}}\begin{bmatrix} D_{4,k} & D_{4,k} & D_{4,m} \\ jD_{4,k} & -jD_{4,k} & jD_{4,m} \end{bmatrix} \end{array} \right\}$$

In this example, k=1, 2 and m=k+2.

Example 2

$$C_{1,3} = \left\{ \begin{array}{l} \frac{1}{\sqrt{3}\sqrt{2}} \begin{bmatrix} D_{1,k} & D_{1,k} & D_{1,m} \\ D_{1,k} & -D_{1,k} & -D_{1,m} \end{bmatrix}, \\ \frac{1}{\sqrt{3}\sqrt{2}} \begin{bmatrix} D_{2,k} & D_{2,k} & D_{2,m} \\ D_{2,k} & -D_{2,k} & -D_{2,m} \end{bmatrix}, \\ \frac{1}{\sqrt{3}\sqrt{2}} \begin{bmatrix} D_{3,k} & D_{3,k} & D_{3,m} \\ jD_{3,k} & -jD_{3,k} & -jD_{3,m} \end{bmatrix}, \\ \frac{1}{\sqrt{3}\sqrt{2}} \begin{bmatrix} D_{4,k} & D_{4,k} & D_{4,m} \\ jD_{4,k} & -jD_{4,k} & -jD_{4,m} \end{bmatrix} \end{array} \right\}$$

In this example, k=1, 2 and m=k+2.

Example 3

$$C_{1,3} = \left\{ \begin{array}{l} \frac{1}{\sqrt{3}\sqrt{2}} \begin{bmatrix} D_{1,k} & D_{1,k} & D_{1,m} \\ D_{1,k} & -D_{1,k} & D_{1,m} \end{bmatrix}, \\ \frac{1}{\sqrt{3}\sqrt{2}} \begin{bmatrix} D_{2,k} & D_{2,k} & D_{2,m} \\ D_{2,k} & -D_{2,k} & D_{2,m} \end{bmatrix} \end{array} \right\}$$

or $$C_{1,3} = \left\{ \begin{array}{l} \frac{1}{\sqrt{3}\sqrt{2}} \begin{bmatrix} D_{1,k} & D_{1,k} & D_{1,m} \\ D_{1,k} & -D_{1,k} & -D_{1,m} \end{bmatrix}, \\ \frac{1}{\sqrt{3}\sqrt{2}} \begin{bmatrix} D_{2,k} & D_{2,k} & D_{2,m} \\ D_{2,k} & -D_{2,k} & -D_{2,m} \end{bmatrix} \end{array} \right\}$$

In this example, k=1, ..., 4 and m=k mod 4+1.

Example 4

$$C_{1,3} = \left\{ \frac{1}{\sqrt{3}\sqrt{2}} \begin{bmatrix} D_{1,k} & D_{1,k} & D_{1,m} \\ D_{1,k} & -D_{1,k} & D_{1,m} \end{bmatrix}, \frac{1}{\sqrt{3}\sqrt{2}} \begin{bmatrix} D_{2,k} & D_{2,k} & D_{2,m} \\ D_{2,k} & -D_{2,k} & D_{2,m} \end{bmatrix} \right\}$$

or $$C_{1,3} = \left\{ \frac{1}{\sqrt{3}\sqrt{2}} \begin{bmatrix} D_{1,k} & D_{1,k} & D_{1,m} \\ D_{1,k} & -D_{1,k} & -D_{1,m} \end{bmatrix}, \frac{1}{\sqrt{3}\sqrt{2}} \begin{bmatrix} D_{2,k} & D_{2,k} & D_{2,m} \\ D_{2,k} & -D_{2,k} & -D_{2,m} \end{bmatrix} \right\}$$

In this example, (k,m)={(1,2),(1,3),(1,4),(2,3)}.

In addition to examples 1) through 4), other examples may also be employed.

A rank 4 first codebook $C_{1,4}$ may include the following eight matrices:

Example 1

$$C_{1,4} = \left\{ \begin{array}{l} \frac{1}{\sqrt{4}\sqrt{2}} \begin{bmatrix} D_{1,k} & D_{1,k} & D_{1,m} & D_{1,m} \\ D_{1,k} & -D_{1,k} & D_{1,m} & -D_{1,m} \end{bmatrix}, \\ \frac{1}{\sqrt{4}\sqrt{2}} \begin{bmatrix} D_{2,k} & D_{2,k} & D_{2,m} & D_{2,m} \\ D_{2,k} & -D_{2,k} & D_{2,m} & -D_{2,m} \end{bmatrix}, \\ \frac{1}{\sqrt{4}\sqrt{2}} \begin{bmatrix} D_{3,k} & D_{3,k} & D_{3,m} & D_{3,m} \\ jD_{3,k} & -jD_{3,k} & jD_{3,m} & -jD_{3,m} \end{bmatrix}, \\ \frac{1}{\sqrt{4}\sqrt{2}} \begin{bmatrix} D_{4,k} & D_{4,k} & D_{4,m} & D_{4,m} \\ jD_{4,k} & -jD_{4,k} & jD_{4,m} & -jD_{4,m} \end{bmatrix} \end{array} \right\}$$

In this example, k=1, 2 and m=k+2.

Example 2

$$C_{1,4} = \left\{ \begin{array}{l} \frac{1}{\sqrt{4}\sqrt{2}} \begin{bmatrix} D_{1,k} & D_{1,k} & D_{1,m} & D_{1,n} \\ D_{1,k} & -D_{1,k} & D_{1,m} & -D_{1,m} \end{bmatrix}, \\ \frac{1}{\sqrt{4}\sqrt{2}} \begin{bmatrix} D_{2,k} & D_{2,k} & D_{2,m} & D_{2,m} \\ D_{2,k} & -D_{2,k} & D_{2,m} & -D_{2,m} \end{bmatrix}, \\ \frac{1}{\sqrt{4}\sqrt{2}} \begin{bmatrix} D_{3,k} & D_{3,k} & D_{3,m} & D_{3,m} \\ jD_{3,k} & -jD_{3,k} & jD_{3,m} & -jD_{3,m} \end{bmatrix}, \\ \frac{1}{\sqrt{4}\sqrt{2}} \begin{bmatrix} D_{4,k} & D_{4,k} & D_{4,m} & D_{4,m} \\ jD_{4,k} & -jD_{4,k} & jD_{4,m} & -jD_{4,m} \end{bmatrix} \end{array} \right\}$$

In this example, (k,m)={(1,2),(1,3)}.

Example 3

$$C_{1,4} = \left\{ \begin{array}{l} \frac{1}{\sqrt{4}\sqrt{2}} \begin{bmatrix} D_{1,k} & D_{1,k} & D_{1,m} & D_{1,m} \\ D_{1,k} & -D_{1,k} & D_{1,m} & -D_{1,m} \end{bmatrix}, \\ \frac{1}{\sqrt{4}\sqrt{2}} \begin{bmatrix} D_{2,k} & D_{2,k} & D_{2,m} & D_{2,m} \\ D_{2,k} & -D_{2,k} & D_{2,m} & -D_{2,m} \end{bmatrix} \end{array} \right\}$$

In this example, (k,m)={(1,2),(1,3),(1,4),(2,3)}.

In addition to examples 1) through 4), other examples may also be employed.

The rank 5 first codebook $C_{1,5}$ may include the following four matrices:

Example 1

$$C_{1,5} = \left\{ \frac{1}{\sqrt{5}\sqrt{2}} \begin{bmatrix} D_{1,k} & D_{1,k} & D_{1,m} & D_{1,m} & D_{1,n} \\ D_{1,k} & -D_{1,k} & D_{1,m} & -D_{1,m} & D_{1,n} \end{bmatrix} \right\}$$

In this example, (k,m,n)={(1,2,3),(1,2,4),(1,3,4),(2,3,4)}.

Example 2

$$C_{1,5} = \left\{ \frac{1}{\sqrt{5}\sqrt{2}} \begin{bmatrix} D_{1,k} & D_{1,k} & D_{1,m} & D_{1,m} & D_{1,n} \\ D_{1,k} & -D_{1,k} & D_{1,m} & -D_{1,m} & -D_{1,n} \end{bmatrix} \right\}$$

In this example, $(k,m,n)=\{(1,2,3),(1,2,4),(1,3,4),(2,3,4)\}$.

Example 3

$$C_{1,5} = \left\{ \frac{1}{\sqrt{5}\sqrt{2}} \begin{bmatrix} D_{1,k} & D_{1,k} & D_{1,m} & D_{1,m} & D_{1,n} \\ D_{1,k} & -D_{1,k} & D_{1,m} & -D_{1,m} & D_{1,n} \end{bmatrix}, \frac{1}{\sqrt{5}\sqrt{2}} \begin{bmatrix} D_{2,k} & D_{2,k} & D_{2,m} & D_{2,m} & D_{2,n} \\ D_{2,k} & -D_{2,k} & D_{2,m} & -D_{2,m} & D_{2,n} \end{bmatrix} \right\}$$

In this example, $(k,m,n)=\{(1,2,3),(1,2,4)\}$.

Example 4

$$C_{1,5} = \left\{ \frac{1}{\sqrt{5}\sqrt{2}} \begin{bmatrix} D_{1,k} & D_{1,k} & D_{1,m} & D_{1,m} & D_{1,n} \\ D_{1,k} & -D_{1,k} & D_{1,m} & -D_{1,m} & D_{1,n} \end{bmatrix}, \frac{1}{\sqrt{5}\sqrt{2}} \begin{bmatrix} D_{2,k} & D_{2,k} & D_{2,m} & D_{2,m} & D_{2,n} \\ D_{2,k} & -D_{2,k} & D_{2,m} & -D_{2,m} & D_{2,n} \end{bmatrix}, \frac{1}{\sqrt{5}\sqrt{2}} \begin{bmatrix} D_{3,k} & D_{3,k} & D_{3,m} & D_{3,m} & D_{3,n} \\ jD_{3,k} & -jD_{3,k} & jD_{3,m} & -jD_{3,m} & jD_{3,n} \end{bmatrix}, \frac{1}{\sqrt{5}\sqrt{2}} \begin{bmatrix} D_{4,k} & D_{4,k} & D_{4,m} & D_{4,m} & D_{4,n} \\ jD_{4,k} & -jD_{4,k} & jD_{4,m} & -jD_{4,m} & jD_{4,n} \end{bmatrix} \right\}$$

In this example, $(k,m,n)=\{(1,2,3)\}$.

A rank 6 first codebook $C_{1,6}$ may include the following four matrices:

Example 1

$$C_{1,6} = \left\{ \frac{1}{\sqrt{6}\sqrt{2}} \begin{bmatrix} D_{1,k} & D_{1,k} & D_{1,m} & D_{1,m} & D_{1,n} & D_{1,n} \\ D_{1,k} & -D_{1,k} & D_{1,m} & -D_{1,m} & D_{1,n} & -D_{1,n} \end{bmatrix} \right\}$$

In this example, $(k,m,n)=\{(1,2,3),(1,2,4),(1,3,4),(2,3,4)\}$.

Example 2

$$C_{1,6} = \left\{ \frac{1}{\sqrt{6}\sqrt{2}} \begin{bmatrix} D_{1,k} & D_{1,k} & D_{1,m} & D_{1,m} & D_{1,n} & D_{1,n} \\ D_{1,k} & -D_{1,k} & D_{1,m} & -D_{1,m} & D_{1,n} & -D_{1,n} \end{bmatrix}, \frac{1}{\sqrt{6}\sqrt{2}} \begin{bmatrix} D_{2,k} & D_{2,k} & D_{2,m} & D_{2,m} & D_{2,n} & D_{2,n} \\ D_{2,k} & -D_{2,k} & D_{2,m} & -D_{2,m} & D_{2,n} & -D_{2,n} \end{bmatrix} \right\}$$

In this example, $(k,m,n)=\{(1,2,3),(1,2,4)\}$.

Example 3

$$C_{1,6} = \left\{ \frac{1}{\sqrt{6}\sqrt{2}} \begin{bmatrix} D_{1,k} & D_{1,k} & D_{1,m} & D_{1,m} & D_{1,n} & D_{1,n} \\ D_{1,k} & -D_{1,k} & D_{1,m} & -D_{1,m} & D_{1,n} & -D_{1,n} \end{bmatrix}, \frac{1}{\sqrt{6}\sqrt{2}} \begin{bmatrix} D_{2,k} & D_{2,k} & D_{2,m} & D_{2,m} & D_{2,n} & D_{2,n} \\ D_{2,k} & -D_{2,k} & D_{2,m} & -D_{2,m} & D_{2,n} & -D_{2,n} \end{bmatrix}, \frac{1}{\sqrt{6}\sqrt{2}} \begin{bmatrix} D_{3,k} & D_{3,k} & D_{3,m} & D_{3,m} & D_{3,n} & D_{3,n} \\ jD_{3,k} & -jD_{3,k} & jD_{3,m} & -jD_{3,m} & jD_{3,n} & -jD_{3,n} \end{bmatrix}, \frac{1}{\sqrt{6}\sqrt{2}} \begin{bmatrix} D_{4,k} & D_{4,k} & D_{4,m} & D_{4,m} & D_{4,n} & D_{4,n} \\ jD_{4,k} & -jD_{4,k} & jD_{4,m} & -jD_{4,m} & jD_{4,n} & -jD_{4,n} \end{bmatrix} \right\}$$

In this example, $(k,m,n)=\{(1,2,3)\}$.

A rank 7 first codebook $C_{1,7}$ may include the following four matrices:

Example 1

$$C_{1,7} = \left\{ \frac{1}{\sqrt{7}\sqrt{2}} \begin{bmatrix} D_{1,k} & D_{1,k} & D_{1,m} & D_{1,m} & D_{1,n} & D_{1,n} & D_{1,p} \\ D_{1,k} & -D_{1,k} & D_{1,m} & -D_{1,m} & D_{1,n} & -D_{1,n} & D_{1,p} \end{bmatrix}, \frac{1}{\sqrt{7}\sqrt{2}} \begin{bmatrix} D_{2,k} & D_{2,k} & D_{2,m} & D_{2,m} & D_{2,n} & D_{2,n} & D_{2,p} \\ D_{2,k} & -D_{2,k} & D_{2,m} & -D_{2,m} & D_{2,n} & -D_{2,n} & D_{2,p} \end{bmatrix}, \frac{1}{\sqrt{7}\sqrt{2}} \begin{bmatrix} D_{3,k} & D_{3,k} & D_{3,m} & D_{3,m} & D_{3,n} & D_{3,n} & D_{3,p} \\ jD_{3,k} & -jD_{3,k} & jD_{3,m} & -jD_{3,m} & jD_{3,n} & -jD_{3,n} & jD_{3,p} \end{bmatrix}, \frac{1}{\sqrt{7}\sqrt{2}} \begin{bmatrix} D_{4,k} & D_{4,k} & D_{4,m} & D_{4,m} & D_{4,n} & D_{4,n} & D_{4,p} \\ jD_{4,k} & -jD_{4,k} & jD_{4,m} & -jD_{4,m} & jD_{4,n} & -jD_{4,n} & jD_{4,p} \end{bmatrix} \right\}$$

In this example, $(k,m,n,p)=\{(1,2,3,4)\}$.

Example 2

$$C_{1,7} = \left\{ \frac{1}{\sqrt{7}\sqrt{2}} \begin{bmatrix} D_{1,k} & D_{1,k} & D_{1,m} & D_{1,m} & D_{1,n} & D_{1,n} & D_{1,p} \\ D_{1,k} & -D_{1,k} & D_{1,m} & -D_{1,m} & D_{1,n} & -D_{1,n} & -D_{1,p} \end{bmatrix}, \frac{1}{\sqrt{7}\sqrt{2}} \begin{bmatrix} D_{2,k} & D_{2,k} & D_{2,m} & D_{2,m} & D_{2,n} & D_{2,n} & D_{2,p} \\ D_{2,k} & -D_{2,k} & D_{2,m} & -D_{2,m} & D_{2,n} & -D_{2,n} & -D_{2,p} \end{bmatrix}, \frac{1}{\sqrt{7}\sqrt{2}} \begin{bmatrix} D_{3,k} & D_{3,k} & D_{3,m} & D_{3,m} & D_{3,n} & D_{3,n} & D_{3,p} \\ jD_{3,k} & -jD_{3,k} & jD_{3,m} & -jD_{3,m} & jD_{3,n} & -jD_{3,n} & -jD_{3,p} \end{bmatrix}, \frac{1}{\sqrt{7}\sqrt{2}} \begin{bmatrix} D_{4,k} & D_{4,k} & D_{4,m} & D_{4,m} & D_{4,n} & D_{4,n} & D_{4,p} \\ jD_{4,k} & -jD_{4,k} & jD_{4,m} & -jD_{4,m} & jD_{4,n} & -jD_{4,n} & -jD_{4,p} \end{bmatrix} \right\}$$

In this example, $(k,m,n,p)=(1,2,3,4)$.

A rank 8 first codebook $C_{1,8}$ may include the following four matrices:

$$C_{1,8} = \left\{ \frac{1}{\sqrt{8}\sqrt{2}} \begin{bmatrix} D_1 & D_1 \\ D_1 & -D_1 \end{bmatrix}, \frac{1}{\sqrt{8}\sqrt{2}} \begin{bmatrix} D_2 & D_2 \\ D_2 & -D_2 \end{bmatrix}, \frac{1}{\sqrt{8}\sqrt{2}} \begin{bmatrix} D_3 & D_3 \\ jD_3 & -jD_3 \end{bmatrix}, \frac{1}{\sqrt{8}\sqrt{2}} \begin{bmatrix} D_4 & D_4 \\ jD_4 & -jD_4 \end{bmatrix} \right\}$$

Codebook $C_2$

The second codebook $C_2$ may be the same as in suggestion 1.

Suggestion 3: Maximum 4-Bit Codebook for Each Rank for $W_1$

Suggestion 3 relates to the structure of $W_1W_2$. In suggestion 3, the first codebook $C_1$ for rank r where r=1, 2 may include 16 elements, the first codebook $C_1$ for rank r where r=3, 4 may include eight elements, and the first codebook $C_1$ for rank r where r=5, 6, 7, 8 may include four elements.

The above 64 entries may be divided into four subsets each including 16 entries. To indicate one of the subsets, two bits may be used. The two bits may indicate a rank corresponding to the selected subset among rank 1, rank 2, rank 3-4, and rank 5-8.

Codebook $C_1$

The first codebook $C_1$ for rank r may be indicated as $C_{1,r}$.

A first codebook $C_{1,(1,2)}$ for ranks 1 and 2 may be obtained by the following matrices:

$$B = [\, b_0 \quad b_1 \quad \ldots \quad b_{31} \,],$$

$$[B]_{1+m,1+n} = e^{j\frac{2\pi mn}{32}},$$

$$m = 0, 1, 2, 3, n = 0, 1, \ldots 31$$

$$X^{(k)} \in \left\{ \frac{1}{2} [\, b_{2k\,mod\,32} \quad b_{(2k+1)mod\,32} \quad b_{(2k+2)mod\,32} \quad b_{(2k+3)mod\,32} \,] \right.$$
$$\left. :k = 0, 1, \ldots, 15 \right\}$$

$$W_1^{(k)} = \begin{bmatrix} X^{(k)} & 0 \\ 0 & X^{(k)} \end{bmatrix}$$

$$C_{1,(1,2)} = \{W_1^{(0)}, W_1^{(1)}, W_1^{(2)}, \ldots, W_1^{(15)}\}$$

In this example, $[B]_{1+m,1+n}$ indicates an element present in an $(1+m)^{th}$ row and an $(1+n)^{th}$ column among elements belonging to B, and $b_z$ (z=0, 1, 2, ..., 31) corresponds to a $z^{th}$ column vector of the matrix B, and a mod b denotes a remainder when a is divided by b.

A first codebook $C_{1,(3,4)}$ for ranks 3 and 4 may be obtained by the following matrices:

$$B = [\, b_0 \quad b_1 \quad \ldots \quad b_{31} \,],$$

$$[B]_{1+m,1+n} = e^{j\frac{2\pi mn}{32}},$$

$$m = 0, 1, 2, 3, n = 0, 1, \ldots 31$$

$$X^{(k)} \in \left\{ \frac{1}{2} [\, b_{4k\,mod\,32} \quad b_{(4k+1)mod\,32} \quad \ldots \quad b_{(4k+7)mod\,32} \,] \right.$$
$$\left. :k = 0, 1, 2, 3, 4, 5, 6, 7 \right\}$$

$$W_1^{(k)} = \begin{bmatrix} X^{(k)} & 0 \\ 0 & X^{(k)} \end{bmatrix}$$

$$C_{1,(3,4)} = \{W_1^{(0)}, W_1^{(1)}, W_1^{(2)}, \ldots, W_1^{(7)}\}$$

A first codebook $C_{1,(5,6,7,8)}$ for ranks 5, 6, 7, and 8 may be obtained by the following matrices:

$$X^{(0)} = \frac{1}{2} \times \begin{bmatrix} 1 & 1 & 1 & 1 \\ 1 & j & -1 & -j \\ 1 & -1 & 1 & -1 \\ 1 & -j & -1 & j \end{bmatrix},$$

$$X^{(1)} = \text{diag}\{1, e^{j\pi/4}, j, e^{j3\pi/4}\}X^{(0)},$$

$$X^{(2)} = \text{diag}\{1, e^{j\pi/8}, e^{j2\pi/8}, e^{j3\pi/8}\}X^{(0)},$$

$$X^{(3)} = \text{diag}\{1, e^{j3\pi/8}, e^{j6\pi/8}, e^{j9\pi/8}\}X^{(0)},$$

$$W_1^{(k)} = \left\{ \begin{bmatrix} X^{(k)} & 0 \\ 0 & X^{(k)} \end{bmatrix} \right\}, k = 0, 1, 2, 3$$

$$C_{1,(5,6,7,8)} = \{W_1^{(0)}, W_1^{(1)}, W_1^{(2)}, W_1^{(3)}\}$$

Codebook $C_2$

The second codebook $C_2$ for rank r may be indicated as $C_{2,r}$.

A second codebook $C_{2,1}$ for rank 1 may be expressed by:

$$C_{2,1} = \left\{ \frac{1}{\sqrt{2}} \begin{bmatrix} Y \\ Y \end{bmatrix}, \frac{1}{\sqrt{2}} \begin{bmatrix} Y \\ jY \end{bmatrix}, \frac{1}{\sqrt{2}} \begin{bmatrix} Y \\ -Y \end{bmatrix}, \frac{1}{\sqrt{2}} \begin{bmatrix} Y \\ -jY \end{bmatrix} \right\}$$

$$Y \in \{\tilde{e}_1, \tilde{e}_2, \tilde{e}_3, \tilde{e}_4\}$$

A second codebook $C_{2,2}$ for rank 2 may be expressed by:

$$C_{2,2} = \left\{ \frac{1}{\sqrt{2}\sqrt{2}} \begin{bmatrix} Y_1 & Y_2 \\ Y_1 & -Y_1 \end{bmatrix}, \frac{1}{\sqrt{2}\sqrt{2}} \begin{bmatrix} Y_1 & Y_2 \\ jY_1 & -jY_2 \end{bmatrix} \right\}$$

$$(Y_1, Y_2) \in \left\{ \begin{array}{l} (\tilde{e}_1, \tilde{e}_1), (\tilde{e}_2, \tilde{e}_2), (\tilde{e}_3, \tilde{e}_3), (\tilde{e}_4, \tilde{e}_4), \\ (\tilde{e}_1, \tilde{e}_2), (\tilde{e}_2, \tilde{e}_3), (\tilde{e}_1, \tilde{e}_4), (\tilde{e}_2, \tilde{e}_4) \end{array} \right\}$$

In this example, $\tilde{e}_n$ corresponds to a 4×1 selection vector. An $n^{th}$ element of $\tilde{e}_n$ may have a value of 1 with respect to ranks 1 and 2 and all of remaining elements may have a value of zero.

A second codebook $C_{2,3}$ for rank 3 may be expressed by $$C_{2,3} = \left\{ \frac{1}{\sqrt{3}\sqrt{2}} \begin{bmatrix} Y_1 & Y_2 \\ Y_1 & -Y_1 \end{bmatrix}, \frac{1}{\sqrt{3}\sqrt{2}} \begin{bmatrix} Y_1 & Y_2 \\ jY_1 & -jY_2 \end{bmatrix} \right\}$$

$$(Y_1, Y_2) \in \left\{ \begin{array}{l} (e_1, [\, e_1 \quad e_5 \,]), (e_2, [\, e_2 \quad e_6 \,]), \\ (e_3, [\, e_3 \quad e_7 \,]), (e_4, [\, e_4 \quad e_8 \,]), \\ (e_5, [\, e_1 \quad e_5 \,]), (e_6, [\, e_2 \quad e_6 \,]), \\ (e_7, [\, e_3 \quad e_7 \,]), (e_8, [\, e_4 \quad e_8 \,]) \end{array} \right\}$$

A second codebook $C_{2,4}$ for rank 4 may be expressed by $$C_{2,4} = \left\{ \frac{1}{\sqrt{4}\sqrt{2}} \begin{bmatrix} Y & Y \\ Y & -Y \end{bmatrix}, \frac{1}{\sqrt{4}\sqrt{2}} \begin{bmatrix} Y & Y \\ jY & -jY \end{bmatrix} \right\}$$

$$Y \in \{[\, e_1 \quad e_5 \,], [\, e_2 \quad e_6 \,], [\, e_3 \quad e_7 \,], [\, e_4 \quad e_8 \,]\}$$

In this example, $e_n$ corresponds to a 8×1 selection vector. An $n^{th}$ element of $e_n$ may have a value of 1 with respect to ranks 3 and 4, and all of remaining elements may have a value of zero.

A second codebook $C_{2,(5,6,7,8)}$ for ranks 5, 6, 7, and 8 may be obtained by the following matrices:

$$C_{2,5} = \frac{1}{\sqrt{5}\sqrt{2}} \begin{bmatrix} \tilde{e}_1 & \tilde{e}_1 & \tilde{e}_2 & \tilde{e}_2 & \tilde{e}_3 \\ \tilde{e}_1 & -\tilde{e}_1 & \tilde{e}_2 & -\tilde{e}_2 & -\tilde{e}_3 \end{bmatrix}$$

$$C_{2,6} = \frac{1}{\sqrt{6}\sqrt{2}} \begin{bmatrix} \tilde{e}_1 & \tilde{e}_1 & \tilde{e}_2 & \tilde{e}_2 & \tilde{e}_3 & \tilde{e}_3 \\ \tilde{e}_1 & -\tilde{e}_1 & \tilde{e}_2 & -\tilde{e}_2 & \tilde{e}_3 & -\tilde{e}_3 \end{bmatrix}$$

$$C_{2,7} = \frac{1}{\sqrt{7}\sqrt{2}} \begin{bmatrix} \tilde{e}_1 & \tilde{e}_1 & \tilde{e}_2 & \tilde{e}_2 & \tilde{e}_3 & \tilde{e}_3 & \tilde{e}_4 \\ \tilde{e}_1 & -\tilde{e}_1 & \tilde{e}_2 & -\tilde{e}_2 & \tilde{e}_3 & -\tilde{e}_3 & \tilde{e}_4 \end{bmatrix}$$

$$C_{2,8} = \frac{1}{\sqrt{8}\sqrt{2}} \begin{bmatrix} \tilde{e}_1 & \tilde{e}_1 & \tilde{e}_2 & \tilde{e}_2 & \tilde{e}_3 & \tilde{e}_3 & \tilde{e}_4 & \tilde{e}_4 \\ \tilde{e}_1 & -\tilde{e}_1 & \tilde{e}_2 & -\tilde{e}_2 & \tilde{e}_3 & -\tilde{e}_3 & \tilde{e}_4 & -\tilde{e}_4 \end{bmatrix}$$

In this example, $\tilde{e}_n$ corresponds to a 4×1 selection vector. An $n^{th}$ element of $\tilde{e}_n$ may have a value of 1 with respect to rank 5-8 nd all of remaining elements may have a value of zero.

Hereinafter, digits of the first codebook $C_1$ for $W_1$ and the second codebook $C_2$ for $W_2$ will be described in detail. The overall codebook C for W that is defined by performing inner product between each of codewords of $C_1$ and each of codewords of $C_2$ will be described. That is, one of codewords belonging to the overall codebook C may be a precoding matrix W that is finally used by the transmitter.

Detailed Digits of First Codebook $C_1$

Hereinafter, ans(:,:,n) corresponds to an $n^{th}$ codeword in a first codebook corresponding to a corresponding transmission rank. Each of codewords may include a plurality of column vectors. For example, a first codeword ans(:,:,1) in the first codebook for ranks 1 and 2 may include eight column vectors.

| Rank 1 and 2 | | | |
|---|---|---|---|
| ans(:, :, 1) = | | | |
| columns 1-4 | | | |
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |
| 0 | 0 | 0 | 0 |
| 0 | 0 | 0 | 0 |
| 0 | 0 | 0 | 0 |
| 0 | 0 | 0 | 0 |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |
| ans(:, :, 2) = | | | |
| columns 1-4 | | | |
| 0.5000 | 0.5000 | 0.5000 | 0.5000 |
| 0.4619 + 0.1913i | 0.4157 + 0.2778i | 0.3536 + 0.3536i | 0.2778 + 0.4157i |
| 0.3536 + 0.3536i | 0.1913 + 0.4619i | 0.0000 + 0.5000i | −0.1913 + 0.4619i |
| 0.1913 + 0.4619i | −0.0975 + 0.4904i | −0.3536 + 0.3536i | −0.4904 + 0.0975i |
| 0 | 0 | 0 | 0 |
| 0 | 0 | 0 | 0 |
| 0 | 0 | 0 | 0 |
| 0 | 0 | 0 | 0x |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.4619 + 0.1913i | 0.4157 + 0.2778i | 0.3536 + 0.3536i | 0.2778 + 0.4157i |
| 0.3536 + 0.3536i | 0.1913 + 0.4619i | 0.0000 + 0.5000i | −0.1913 + 0.4619i |
| 0.3536 + 0.3536i | 0.1913 + 0.4619i | 0.0000 + 0.5000i | −0.1913 + 0.4619i |
| ans(:, :, 3) = | | | |
| columns 1-4 | | | |
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |
| 0 | 0 | 0 | 0 |
| 0 | 0 | 0 | 0 |
| 0 | 0 | 0 | 0 |
| 0 | 0 | 0 | 0 |
| columns 5-8 | | | |
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 + 0.3536i | 0.2778 + 0.4157i | 0.1913 + 0.4619i | 0.0975 + 0.4904i |

-continued

|  |  |  |  |
|---|---|---|---|
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i | ans(:, :, 4) =
columns 1-4

|  |  |  |  |
|---|---|---|---|
| 0.5000 | 0.5000 | 0.5000 | 0.5000 |
| 0.1913 + 0.4619i | 0.0975 + 0.4904i | 0.0000 + 0.5000i | −0.0975 + 0.4904i |
| −0.3536 + 0.3536i | −0.4619 + 0.1913i | −0.5000 + 0.0000i | −0.4619 − 0.1913i |
| −0.4619 − 0.1913i | −0.2778 − 0.4157i | −0.0000 − 0.5000i | 0.2778 − 0.4157i |
| 0 | 0 | 0 | 0 |
| 0 | 0 | 0 | 0 |
| 0 | 0 | 0 | 0 |
| 0 | 0 | 0 | 0 | columns 5-8

|  |  |  |  |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.1913 + 0.4619i | 0.0975 + 0.4904i | 0.0000 + 0.5000i | −0.0975 + 0.4904i |
| −0.3536 + 0.3536i | −0.4619 + 0.1913i | −0.5000 + 0.0000i | −0.4619 − 0.1913i |
| −0.4619 − 0.1913i | −0.2778 − 0.4157i | −0.0000 − 0.5000i | 0.2778 − 0.4157i | ans(:, :, 5) =
columns 1-4

|  |  |  |  |
|---|---|---|---|
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |
| 0 | 0 | 0 | 0 |
| 0 | 0 | 0 | 0 |
| 0 | 0 | 0 | 0 |
| 0 | 0 | 0 | 0 | columns 5-8

|  |  |  |  |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i | ans(:, :, 6) =
columns 1-4

|  |  |  |  |
|---|---|---|---|
| 0.5000 | 0.5000 | 0.5000 | 0.5000 |
| −0.1913 + 0.4619i | −0.2778 + 0.4157i | −0.3536 + 0.3536i | −0.4157 + 0.2778i |
| −0.3536 − 0.3536i | −0.1913 − 0.4619i | −0.0000 − 0.5000i | 0.1913 − 0.4619i |
| 0.4619 − 0.1913i | 0.4904 + 0.0975i | 0.3536 + 0.3536i | 0.0975 + 0.4904i |
| 0 | 0 | 0 | 0 |
| 0 | 0 | 0 | 0 |
| 0 | 0 | 0 | 0 |
| 0 | 0 | 0 | 0 | columns 5-8

|  |  |  |  |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.1913 + 0.4619i | −0.2778 + 0.4157i | −0.3536 + 0.3536i | −0.4157 + 0.2778i |
| −0.3536 − 0.3536i | −0.1913 − 0.4619i | −0.0000 − 0.5000i | 0.1913 − 0.4619i |
| 0.4619 − 0.1913i | 0.4904 + 0.0975i | 0.3536 + 0.3536i | 0.0975 + 0.4904i | ans(:, :, 7) =
columns 1-4

|  |  |  |  |
|---|---|---|---|
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |
| 0 | 0 | 0 | 0 |
| 0 | 0 | 0 | 0 |
| 0 | 0 | 0 | 0 |
| 0 | 0 | 0 | 0 |

| columns 5-8 | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i | ans(:, :, 8) =
columns 1-4

| | | | |
|---|---|---|---|
| 0.5000 | 0.5000 | 0.5000 | 0.5000 |
| −0.4619 + 0.1913i | −0.4904 + 0.0975i | −0.5000 + 0.0000i | −0.4904 − 0.0975i |
| 0.3536 − 0.3536i | 0.4619 − 0.1913i | 0.5000 − 0.0000i | 0.4619 + 0.1913i |
| −0.1913 + 0.4619i | −0.4157 + 0.2778i | −0.5000 + 0.0000i | −0.4157 − 0.2778i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.4619 + 0.1913i | −0.4904 + 0.0975i | −0.5000 + 0.0000i | −0.4904 − 0.0975i |
| 0.3536 − 0.3536i | 0.4619 − 0.1913i | 0.5000 − 0.0000i | 0.4619 + 0.1913i |
| −0.1913 + 0.4619i | −0.4157 + 0.2778i | −0.5000 + 0.0000i | −0.4157 − 0.2778i | ans(:, :, 9) =
columns 1-4

| | | | |
|---|---|---|---|
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i | ans(:, :, 10) =
columns 1-4

| | | | |
|---|---|---|---|
| 0.5000 | 0.5000 | 0.5000 | 0.5000 |
| −0.4619 − 0.1913i | −0.4157 − 0.2778i | −0.3536 − 0.3536i | −0.2778 − 0.4157i |
| 0.3536 + 0.3536i | 0.1913 + 0.4619i | 0.0000 + 0.5000i | −0.1913 + 0.4619i |
| −0.1913 − 0.4619i | 0.0975 − 0.4904i | 0.3536 − 0.3536i | 0.4904 − 0.0975i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.4619 − 0.1913i | −0.4157 − 0.2778i | −0.3536 − 0.3536i | −0.2778 − 0.4157i |
| 0.3536 + 0.3536i | 0.1913 + 0.4619i | 0.0000 + 0.5000i | −0.1913 + 0.4619i |
| −0.1913 − 0.4619i | 0.0975 − 0.4904i | 0.3536 − 0.3536i | 0.4904 − 0.0975i | ans(:, :, 11) =
columns 1-4

| | | | |
|---|---|---|---|
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |

-continued

| | | | |
|---|---|---|---|
| 0.3536 − 0.3536i | 0.4904 − 0.0975i | 0.4619 + 0.1913i | 0.2778 + 0.4157i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i | ans(:, :, 12) =
columns 1-4

| | | | |
|---|---|---|---|
| 0.5000 | 0.5000 | 0.5000 | 0.5000 |
| −0.1913 − 0.4619i | −0.0975 − 0.4904i | −0.0000 − 0.5000i | 0.0975 − 0.4904i |
| −0.3536 + 0.3536i | −0.4619 + 0.1913i | −0.5000 + 0.0000i | −0.4619 − 0.1913i |
| 0.4619 + 0.1913i | 0.2778 + 0.4157i | 0.0000 + 0.5000i | −0.2778 + 0.4157i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.1913 − 0.4619i | −0.0975 − 0.4904i | −0.0000 − 0.5000i | 0.0975 − 0.4904i |
| −0.3536 + 0.3536i | −0.4619 + 0.1913i | −0.5000 + 0.0000i | −0.4619 − 0.1913i |
| 0.4619 + 0.1913i | 0.2778 + 0.4157i | 0.0000 + 0.5000i | −0.2778 + 0.4157i | ans(:, :, 13) =
columns 1-4

| | | | |
|---|---|---|---|
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i | ans(:, :, 14) =
columns 1-4

| | | | |
|---|---|---|---|
| 0.5000 | 0.5000 | 0.5000 | 0.5000 |
| 0.1913 − 0.4619i | 0.2778 − 0.4157i | 0.3536 − 0.3536i | 0.4157 − 0.2778i |
| −0.3536 − 0.3536i | −0.1913 − 0.4619i | −0.0000 − 0.5000i | 0.1913 − 0.4619i |
| −0.4619 + 0.1913i | −0.4904 − 0.0975i | −0.3536 − 0.3536i | −0.0975 − 0.4904i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.1913 − 0.4619i | 0.2778 − 0.4157i | 0.3536 − 0.3536i | 0.4157 − 0.2778i |

-continued

| | | | |
|---|---|---|---|
| −0.3536 − 0.3536i | −0.1913 − 0.4619i | −0.0000 − 0.5000i | 0.1913 − 0.4619i |
| −0.4619 + 0.1913i | −0.4904 − 0.0975i | −0.3536 − 0.3536i | −0.0975 − 0.4904i | ans(:, :, 15) =
columns 1-4

| | | | |
|---|---|---|---|
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i | ans(:, :, 16) =
columns 1-4

| | | | |
|---|---|---|---|
| 0.5000 | 0.5000 | 0.5000 | 0.5000 |
| 0.4619 − 0.1913i | 0.4904 − 0.0975i | 0.5000 | 0.4904 + 0.0975i |
| 0.3536 − 0.3536i | 0.4619 − 0.1913i | 0.5000 | 0.4619 + 0.1913i |
| 0.1913 − 0.4619i | 0.4157 − 0.2778i | 0.5000 | 0.4157 + 0.2778i |
| 0 | 0 | 0 | 0 |
| 0 | 0 | 0 | 0 |
| 0 | 0 | 0 | 0 |
| 0 | 0 | 0 | 0 | columns 5-8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.4619 − 0.1913i | 0.4904 − 0.0975i | 0.5000 | 0.4904 + 0.0975i |
| 0.3536 − 0.3536i | 0.4619 − 0.1913i | 0.5000 | 0.4619 + 0.1913i |
| 0.1913 − 0.4619i | 0.4157 − 0.2778i | 0.5000 | 0.4157 + 0.2778i |

Rank 3 and 4 ans(:, :, 1) =
Columns 1 through 4

| | | | |
|---|---|---|---|
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.5000 | 0.4904 + 0.0975i | 0.4619 + 0.1913i | 0.4157 + 0.2778i |

-continued

| | | | |
|---|---|---|---|
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i | ans(:, :, 2) =
Columns 1 through 4

| | | | |
|---|---|---|---|
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 + 0.3536i | 0.2778 + 0.4157i | 0.1913 + 0.4619i | 0.0975 + 0.4904i |
| 0.0000 + 0.5000i | −0.1913 + 0.4619i | −0.3536 + 0.3536i | −0.4619 + 0.1913i |
| −0.3536 + 0.3536i | −0.4904 + 0.0975i | −0.4619 − 0.1913i | −0.2778 − 0.4157i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i | ans(:, :, 3) =
Columns 1 through 4

| | | | |
|---|---|---|---|
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |

-continued

| | | | |
|---|---|---|---|
| 0 | 0 | 0 | 0 |
| 0.5000 | 0.5000 | 0.5000 | 0.5000 |
| 0.0000 + 0.5000i | −0.0975 + 0.4904i | −0.1913 + 0.4619i | −0.2778 + 0.4157i |
| −0.5000 + 0.0000i | −0.4619 − 0.1913i | −0.3536 − 0.3536i | −0.1913 − 0.4619i |
| −0.0000 − 0.5000i | 0.2778 − 0.4157i | 0.4619 − 0.1913i | 0.4904 + 0.0975i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i | ans(:, :, 4) =
Columns 1 through 4

| | | | |
|---|---|---|---|
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 + 0.3536i | −0.4157 + 0.2778i | −0.4619 + 0.1913i | −0.4904 + 0.0975i |
| −0.0000 − 0.5000i | 0.1913 − 0.4619i | 0.3536 − 0.3536i | 0.4619 − 0.1913i |
| 0.3536 + 0.3536i | 0.0975 + 0.4904i | −0.1913 + 0.4619i | −0.4157 + 0.2778i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i | ans(:, :, 5) =
Columns 1 through 4

| | | | |
|---|---|---|---|
| 0.5000 | 0.5000 | 0.5000 | 0.5000 |
| −0.5000 + 0.0000i | −0.4904 − 0.0975i | −0.4619 − 0.1913i | −0.4157 − 0.2778i |
| 0.5000 − 0.0000i | 0.4619 + 0.1913i | 0.3536 + 0.3536i | 0.1913 + 0.4619i |
| −0.5000 + 0.0000i | −0.4157 − 0.2778i | −0.1913 − 0.4619i | 0.0975 − 0.4904i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i |
| 0 | 0 | 0 | 0 |
| 0 | 0 | 0 | 0 |
| 0 | 0 | 0 | 0 |
| 0 | 0 | 0 | 0 |

Columns 9 through 12

| | | |
|---|---|---|
| 0 | 0 | 0 |
| 0 | 0 | 0 |
| 0 | 0 | 0 |
| 0 | 0 | 0 |
| 0.5000 | 0.5000 | 0.5000 |
| −0.5000 + 0.0000i | −0.4904 − 0.0975i | −0.4619 − 0.1913i |
| 0.5000 − 0.0000i | 0.4619 + 0.1913i | 0.3536 + 0.3536i |
| −0.5000 + 0.0000i | −0.4157 − 0.2778i | −0.1913 − 0.4619i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.4157 − 0.2778i | −0.3536 − 0.3536i | −0.2778 − 0.4157i | −0.1913 − 0.4619i | −0.0975 − 0.4904i |
| 0.1913 + 0.4619i | 0.0000 + 0.5000i | −0.1913 + 0.4619i | −0.3536 + 0.3536i | −0.4619 + 0.1913i |
| 0.0975 − 0.4904i | 0.3536 − 0.3536i | 0.4904 − 0.0975i | 0.4619 + 0.1913i | 0.2778 + 0.4157i | ans(:, :, 6) =

Columns 1 through 4

| | | | |
|---|---|---|---|
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.3536 − 0.3536i | −0.2778 − 0.4157i | −0.1913 − 0.4619i | −0.0975 − 0.4904i |
| 0.0000 + 0.5000i | −0.1913 + 0.4619i | −0.3536 + 0.3536i | −0.4619 + 0.1913i |
| 0.3536 − 0.3536i | 0.4904 − 0.0975i | 0.4619 + 0.1913i | 0.2778 + 0.4157i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i | ans(:, :, 7) =

Columns 1 through 4

| | | | |
|---|---|---|---|
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |

-continued

| | | | |
|---|---|---|---|
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| −0.0000 − 0.5000i | 0.0975 − 0.4904i | 0.1913 − 0.4619i | 0.2778 − 0.4157i |
| −0.5000 + 0.0000i | −0.4619 − 0.1913i | −0.3536 − 0.3536i | −0.1913 − 0.4619i |
| 0.0000 + 0.5000i | −0.2778 + 0.4157i | −0.4619 + 0.1913i | −0.4904 − 0.0975i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i | ans(:, :, 8) =
Columns 1 through 4

| | | | |
|---|---|---|---|
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |
| 0 | 0 | 0 | 0 |
| 0 | 0 | 0 | 0 |
| 0 | 0 | 0 | 0 |
| 0 | 0 | 0 | 0 |

Columns 9 through 12

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 − 0.3536i | 0.4157 − 0.2778i | 0.4619 − 0.1913i | 0.4904 − 0.0975i |
| −0.0000 − 0.5000i | 0.1913 − 0.4619i | 0.3536 − 0.3536i | 0.4619 − 0.1913i |
| −0.3536 − 0.3536i | −0.0975 − 0.4904i | 0.1913 − 0.4619i | 0.4157 − 0.2778i |

Columns 13 through 16

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.5000 | 0.4904 + 0.0975i | 0.4619 + 0.1913i | 0.4157 + 0.2778i |
| 0.5000 | 0.4619 + 0.1913i | 0.3536 + 0.3536i | 0.1913 + 0.4619i |
| 0.5000 | 0.4157 + 0.2778i | 0.1913 + 0.4619i | −0.0975 + 0.4904i |

Rank 5 and 6 and 7 and 8 ans(:, :, 1) =
Columns 1 through 4

| | | | |
|---|---|---|---|
| 0.5000 | 0.5000 | 0.5000 | 0.5000 |
| 0.5000 | 0 + 0.5000i | −0.5000 | 0 − 0.5000i |
| 0.5000 | −0.5000 | 0.5000 | −0.5000 |
| 0.5000 | 0 − 0.5000i | −0.5000 | 0 + 0.5000i |
| 0 | 0 | 0 | 0 |
| 0 | 0 | 0 | 0 |
| 0 | 0 | 0 | 0 |
| 0 | 0 | 0 | 0 |

-continued

| Columns 5 through 8 | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.5000 | 0 + 0.5000i | −0.5000 | 0 − 0.5000i |
| 0.5000 | −0.5000 | 0.5000 | −0.5000 |
| 0.5000 | 0 − 0.5000i | −0.5000 | 0 + 0.5000i | ans(:, :, 2) =
Columns 1 through 4

| | | | |
|---|---|---|---|
| 0.5000 | 0.5000 | 0.5000 | 0.5000 |
| 0.3536 + 0.3536i | −0.3536 + 0.3536i | −0.3536 − 0.3536i | 0.3536 − 0.3536i |
| 0.0000 + 0.5000i | −0.0000 − 0.5000i | 0.0000 + 0.5000i | −0.0000 − 0.5000i |
| −0.3536 + 0.3536i | 0.3536 + 0.3536i | 0.3536 − 0.3536i | −0.3536 − 0.3536i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.3536 + 0.3536i | −0.3536 + 0.3536i | −0.3536 − 0.3536i | 0.3536 − 0.3536i |
| 0.0000 + 0.5000i | −0.0000 − 0.5000i | 0.0000 + 0.5000i | −0.0000 − 0.5000i |
| −0.3536 + 0.3536i | 0.3536 + 0.3536i | 0.3536 − 0.3536i | −0.3536 − 0.3536i | ans(:, :, 3) =
Columns 1 through 4

| | | | |
|---|---|---|---|
| 0.5000 | 0.5000 | 0.5000 | 0.5000 |
| 0.4619 + 0.1913i | −0.1913 + 0.4619i | −0.4619 − 0.1913i | 0.1913 − 0.4619i |
| 0.3536 + 0.3536i | −0.3536 − 0.3536i | 0.3536 + 0.3536i | −0.3536 − 0.3536i |
| 0.1913 + 0.4619i | 0.4619 − 0.1913i | −0.1913 − 0.4619i | −0.4619 + 0.1913i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.4619 + 0.1913i | −0.1913 + 0.4619i | −0.4619 − 0.1913i | 0.1913 − 0.4619i |
| 0.3536 + 0.3536i | −0.3536 − 0.3536i | 0.3536 + 0.3536i | −0.3536 − 0.3536i |
| 0.1913 + 0.4619i | 0.4619 − 0.1913i | −0.1913 − 0.4619i | −0.4619 + 0.1913i | ans(:, :, 4) =
Columns 1 through 4

| | | | |
|---|---|---|---|
| 0.5000 | 0.5000 | 0.5000 | 0.5000 |
| 0.1913 + 0.4619i | −0.4619 + 0.1913i | −0.1913 − 0.4619i | 0.4619 − 0.1913i |
| −0.3536 + 0.3536i | 0.3536 − 0.3536i | −0.3536 + 0.3536i | 0.3536 − 0.3536i |
| −0.4619 − 0.1913i | −0.1913 + 0.4619i | 0.4619 + 0.1913i | 0.1913 − 0.4619i |
| 0 | 0 | 0 | 0 |
| 0 | 0 | 0 | 0 |
| 0 | 0 | 0 | 0 |
| 0 | 0 | 0 | 0 |

Columns 5 through 8

| | | | |
|---|---|---|---|
| 0 | 0 | 0 | 0 |
| 0 | 0 | 0 | 0 |
| 0 | 0 | 0 | 0 |
| 0 | 0 | 0 | 0 |
| 0.5000 | 0.5000 | 0.5000 | 0.5000 |
| 0.1913 + 0.4619i | −0.4619 + 0.1913i | −0.1913 − 0.4619i | 0.4619 − 0.1913i |
| −0.3536 + 0.3536i | 0.3536 − 0.3536i | −0.3536 + 0.3536i | 0.3536 − 0.3536i |
| −0.4619 − 0.1913i | −0.1913 + 0.4619i | 0.4619 + 0.1913i | 0.1913 − 0.4619i |

Detailed Digits of Second Codebook $C_2$

Hereinafter, digits of codewords belonging to the second codebook $C_2$ for a variety of ranks will be described in detail. $(:,:,n)$ corresponds to an $n^{th}$ codeword in a second codebook corresponding to a corresponding transmission rank. Each of codewords may include at least one column vector.

Rank 1

$(:,:,1) = \begin{bmatrix} 0.7071 \\ 0 \\ 0 \\ 0 \\ 0.7071 \\ 0 \\ 0 \\ 0 \end{bmatrix}$ $(:,:,2) = \begin{bmatrix} 0.7071 \\ 0 \\ 0 \\ 0 \\ 0 + 0.7071i \\ 0 \\ 0 \\ 0 \end{bmatrix}$ $(:,:,3) = \begin{bmatrix} 0.7071 \\ 0 \\ 0 \\ 0 \\ -0.7071 \\ 0 \\ 0 \\ 0 \end{bmatrix}$ $(:,:,4) = \begin{bmatrix} 0.7071 \\ 0 \\ 0 \\ 0 \\ 0 - 0.7071i \\ 0 \\ 0 \\ 0 \end{bmatrix}$ $(:,:,5) = \begin{bmatrix} 0 \\ 0.7071 \\ 0 \\ 0 \\ 0 \\ 0.7071 \\ 0 \\ 0 \end{bmatrix}$ $(:,:,6) = \begin{bmatrix} 0 \\ 0.7071 \\ 0 \\ 0 \\ 0 \\ 0 + 0.7071i \\ 0 \\ 0 \end{bmatrix}$ $(:,:,7) = \begin{bmatrix} 0 \\ 0.7071 \\ 0 \\ 0 \\ 0 \\ -0.7071 \\ 0 \\ 0 \end{bmatrix}$ $(:,:,8) = \begin{bmatrix} 0 \\ 0.7071 \\ 0 \\ 0 \\ 0 \\ 0 - 0.7071i \\ 0 \\ 0 \end{bmatrix}$ $(:,:,9) = \begin{bmatrix} 0 \\ 0 \\ 0.7071 \\ 0 \\ 0 \\ 0 \\ 0.7071 \\ 0 \end{bmatrix}$ $(:,:,10) = \begin{bmatrix} 0 \\ 0 \\ 0.7071 \\ 0 \\ 0 \\ 0 \\ 0 + 0.7071i \\ 0 \end{bmatrix}$ $(:,:,11) = \begin{bmatrix} 0 \\ 0 \\ 0.7071 \\ 0 \\ 0 \\ 0 \\ -0.7071 \\ 0 \end{bmatrix}$ $(:,:,12) = \begin{bmatrix} 0 \\ 0 \\ 0.7071 \\ 0 \\ 0 \\ 0 \\ 0 - 0.7071i \\ 0 \end{bmatrix}$ $(:,:,13) = \begin{bmatrix} 0 \\ 0 \\ 0 \\ 0.7071 \\ 0 \\ 0 \\ 0 \\ 0.7071 \end{bmatrix}$ $(:,:,14) = \begin{bmatrix} 0 \\ 0 \\ 0 \\ 0.7071 \\ 0 \\ 0 \\ 0 \\ 0 + 0.7071i \end{bmatrix}$ $(:,:,15) = \begin{bmatrix} 0 \\ 0 \\ 0 \\ 0.7071 \\ 0 \\ 0 \\ 0 \\ -0.7071 \end{bmatrix}$ $(:,:,16) = \begin{bmatrix} 0 \\ 0 \\ 0 \\ 0.7071 \\ 0 \\ 0 \\ 0 \\ 0 - 0.7071i \end{bmatrix}$

Rank 2

$(:,:,1) = \begin{bmatrix} 0.5000 & 0.5000 \\ 0 & 0 \\ 0 & 0 \\ 0 & 0 \\ 0.5000 & -0.5000 \\ 0 & 0 \\ 0 & 0 \\ 0 & 0 \end{bmatrix}$ $(:,:,2) = \begin{bmatrix} 0.5000 & 0.5000 \\ 0 & 0 \\ 0 & 0 \\ 0 & 0 \\ 0 + 0.5000i & 0 - 0.5000i \\ 0 & 0 \\ 0 & 0 \\ 0 & 0 \end{bmatrix}$ -continued

| | | |
|---|---|---|
| (:, :, 3) = | 0 | 0 |
| | 0.5000 | 0.5000 |
| | 0 | 0 |
| | 0 | 0 |
| | 0 | 0 |
| | 0.5000 | −0.5000 |
| | 0 | 0 |
| | 0 | 0 |
| (:, :, 4) = | 0 | 0 |
| | 0.5000 | 0.5000 |
| | 0 | 0 |
| | 0 | 0 |
| | 0 | 0 |
| | 0 + 0.5000i | 0 − 0.5000i |
| | 0 | 0 |
| | 0 | 0 |
| (:, :, 5) = | 0 | 0 |
| | 0 | 0 |
| | 0.5000 | 0.5000 |
| | 0 | 0 |
| | 0 | 0 |
| | 0 | 0 |
| | 0.5000 | −0.5000 |
| | 0 | 0 |
| (:, :, 6) = | 0 | 0 |
| | 0 | 0 |
| | 0.5000 | 0.5000 |
| | 0 | 0 |
| | 0 | 0 |
| | 0 | 0 |
| | 0 + 0.5000i | 0 − 0.5000i |
| | 0 | 0 |
| (:, :, 7) = | 0 | 0 |
| | 0 | 0 |
| | 0 | 0 |
| | 0.5000 | 0.5000 |
| | 0 | 0 |
| | 0 | 0 |
| | 0 | 0 |
| | 0.5000 | −0.5000 |
| (:, :, 8) = | 0 | 0 |
| | 0 | 0 |
| | 0 | 0 |
| | 0.5000 | 0.5000 |
| | 0 | 0 |
| | 0 | 0 |
| | 0 | 0 |
| | 0 + 0.5000i | 0 − 0.5000i |
| (:, :, 9) = | 0.5000 | 0 |
| | 0 | 0.5000 |
| | 0 | 0 |
| | 0 | 0 |
| | 0.5000 | 0 |
| | 0 | −0.5000 |
| | 0 | 0 |
| | 0 | 0 |
| (:, :, 10) = | 0.5000 | 0 |
| | 0 | 0.5000 |
| | 0 | 0 |
| | 0 | 0 |
| | 0 + 0.5000i | 0 |
| | 0 | 0 − 0.5000i |
| | 0 | 0 |
| | 0 | 0 |
| (:, :, 11) = | 0 | 0 |
| | 0.5000 | 0 |
| | 0 | 0.5000 |
| | 0 | 0 |
| | 0 | 0 |
| | 0.5000 | 0 |
| | 0 | −0.5000 |
| | 0 | 0 |

-continued

| | | |
|---|---|---|
| (:, :, 12) = | 0 | 0 |
| | 0.5000 | 0 |
| | 0 | 0.5000 |
| | 0 | 0 |
| | 0 | 0 |
| | 0 + 0.5000i | 0 |
| | 0 | 0 − 0.5000i |
| | 0 | 0 |
| (:, :, 13) = | 0.5000 | 0 |
| | 0 | 0 |
| | 0 | 0 |
| | 0 | 0.5000 |
| | 0.5000 | 0 |
| | 0 | 0 |
| | 0 | 0 |
| | 0 | −0.5000 |
| (:, :, 14) = | 0.5000 | 0 |
| | 0 | 0 |
| | 0 | 0 |
| | 0 | 0.5000 |
| | 0 + 0.5000i | 0 |
| | 0 | 0 |
| | 0 | 0 |
| | 0 | 0 − 0.5000i |
| (:, :, 15) = | 0 | 0 |
| | 0.5000 | 0 |
| | 0 | 0.5000 |
| | 0 | 0 |
| | 0.5000 | 0 |
| | 0 | 0 |
| | 0 | 0 |
| | 0 | −0.5000 |
| (:, :, 16) = | 0 | 0 |
| | 0.5000 | 0 |
| | 0 | 0 |
| | 0 | 0.5000 |
| | 0 | 0 |
| | 0 + 0.5000i | 0 |
| | 0 | 0 |
| | 0 | 0 − 0.5000i |

Rank 3

| | | | |
|---|---|---|---|
| (:, :, 1) = | 0.4082 | 0.4082 | 0 |
| | 0 | 0 | 0 |
| | 0 | 0 | 0 |
| | 0 | 0 | 0 |
| | 0 | 0 | 0.4082 |
| | 0 | 0 | 0 |
| | 0 | 0 | 0 |
| | 0.4082 | −0.4082 | 0 |
| | 0 | 0 | 0 |
| | 0 | 0 | 0 |
| | 0 | 0 | −0.4082 |
| | 0 | 0 | 0 |
| (:, :, 2) = | 0 | 0.4082 | 0 |
| | 0 | 0 | 0 |
| | 0 | 0 | 0 |
| | 0.4082 | 0 | 0.4082 |
| | 0 | 0 | 0 |
| | 0 | 0 | 0 |
| | 0 | −0.4082 | 0 |
| | 0 | 0 | 0 |
| | 0 | 0 | 0 |
| | 0.4082 | 0 | −0.4082 |
| | 0 | 0 | 0 |
| | 0 | 0 | 0 |
| (:, :, 3) = | 0.4082 | 0 | 0 |
| | 0 | 0 | 0 |
| | 0 | 0 | 0 |

```
            0       0.4082   0.4082
            0       0        0
            0       0        0
            0       0        0
        0.4082      0        0
            0       0        0
            0       0        0
            0       0        0
            0       0.4082  -0.4082
            0       0        0
            0       0        0
            0       0        0
(:,:,4) =   0       0.4082   0.4082
            0       0        0
            0       0        0
            0       0        0
        0.4082      0        0
            0       0        0
            0       0        0
            0       0        0
            0       0.4082  -0.4082
            0       0        0
            0       0        0
            0       0        0
        0.4082      0        0
            0       0        0
            0       0        0
            0       0        0
(:,:,5) =   0       0        0
        0.4082   0.4082      0
            0       0        0
            0       0        0
            0       0        0.4082
            0       0        0
            0       0        0
        0.4082  -0.4082      0
            0       0        0
            0       0        0
            0       0        0
            0       0       -0.4082
            0       0        0
(:,:,6) =   0       0        0
            0       0.4082   0
            0       0        0
            0       0        0
        0.4082      0        0.4082
            0       0        0
            0       0        0
            0      -0.4082   0
            0       0        0
            0       0        0
        0.4082      0       -0.4082
            0       0        0
(:,:,7) =   0       0        0
        0.4082      0        0
            0       0        0
            0       0        0
            0       0.4082   0.4082
            0       0        0
            0       0        0
        0.4082      0        0
            0       0        0
            0       0        0
            0       0.4082  -0.4082
            0       0        0
(:,:,8) =   0       0        0
            0       0.4082   0.4082
            0       0        0
```

```
            0       0        0
            0       0        0
        0.4082      0        0
            0       0        0
            0       0        0
            0       0        0
            0       0.4082  -0.4082
            0       0        0
            0       0        0
        0.4082      0        0
            0       0        0
(:,:,9) =   0       0        0
            0       0        0
        0.4082   0.4082      0
            0       0        0
            0       0        0
            0       0        0.4082
            0       0        0
            0       0        0
            0       0.4082   0
            0       0        0
            0       0        0
            0       0       -0.4082
            0       0        0
(:,:,10) =  0       0        0
            0       0.4082   0
            0       0        0
            0       0        0
        0.4082      0        0.4082
            0       0        0
            0       0        0
            0      -0.4082   0
            0       0        0
            0       0        0
        0.4082      0       -0.4082
            0       0        0
(:,:,11) =  0       0        0
        0.4082      0        0
            0       0        0
            0       0        0
            0       0.4082   0.4082
            0       0        0
            0       0        0
        0.4082      0        0
            0       0        0
            0       0        0
            0       0.4082  -0.4082
            0       0        0
(:,:,12) =  0       0        0
            0       0.4082   0.4082
            0       0        0
            0       0        0
        0.4082      0        0
            0       0        0
            0       0        0
            0       0        0
            0       0.4082  -0.4082
            0       0        0
            0       0        0
        0.4082      0        0
            0       0        0
(:,:,13) =  0       0        0
            0       0        0
```

-continued $(:, :, 14) =$
```
0       0        0
0.4082  0.4082   0
0       0        0
0       0        0
0       0        0
0       0        0.4082
0       0        0
0       0        0
0       0        0
0.4082  -0.4082  0
0       0        0
0       0        0
0       0        -0.4082
0       0        0
0       0        0
0       0.4082   0
0       0        0
0       0        0
0.4082  0        0.4082
0       0        0
0       0        0
0       0        0
0       -0.4082  0
0       0        0
0       0        0
0       0        0
0.4082  0        -0.4082
```

$(:, :, 15) =$
```
0       0        0
0       0        0
0.4082  0        0
0       0        0
0       0        0
0       0        0
0       0.4082   0.4082
0       0        0
0       0        0
0.4082  0        0
0       0        0
0       0        0
0       0.4082   -0.4082
```

$(:, :, 16) =$
```
0       0        0
0       0        0
0       0        0
0       0.4082   0.4082
0       0        0
0       0        0
0.4082  0        0
0       0        0
0       0        0
0       0.4082   -0.4082
0       0        0
0       0        0
0.4082  0        0
```

Rank 4

$(:, :, 1) =$
```
0.3536   0        0.3536   0
0        0        0        0
0        0        0        0
0        0        0        0
0        0.3536   0        0.3536
0        0        0        0
0        0        0        0
0        0        0        0
0.3536   0        -0.3536  0
0        0        0        0
0        0        0        0
0        0        0        0
0        0.3536   0        -0.3536
0        0        0        0
```

$(:, :, 2) =$
```
0        0        0        0
0        0        0        0
0.3536   0        0.3536   0
0        0        0        0
0        0        0        0
0        0        0        0
0        0.3536   0        0.3536
0        0        0        0
0        0        0        0
0        0        0        0
0 + 0.3536i  0    0 - 0.3536i  0
0        0        0        0
0        0        0        0
0        0        0        0
0        0 + 0.3536i  0    0 - 0.3536i
0        0        0        0
```

$(:, :, 3) =$
```
0        0        0        0
0.3536   0        0.3536   0
0        0        0        0
0        0        0        0
0        0.3536   0        0.3536
0        0        0        0
0        0        0        0
0        0        0        0
0.3536   0        -0.3536  0
0        0        0        0
0        0        0        0
0        0.3536   0        -0.3536
0        0        0        0
0        0        0        0
```

$(:, :, 4) =$
```
0        0        0        0
0.3536   0        0.3536   0
0        0        0        0
0        0        0        0
0        0.3536   0        0.3536
0        0        0        0
0        0        0        0
0        0        0        0
0 + 0.3536i  0    0 - 0.3536i  0
0        0        0        0
0        0        0        0
0        0 + 0.3536i  0    0 - 0.3536i
0        0        0        0
0        0        0        0
```

$(:, :, 5) =$
```
0        0        0        0
0.3536   0        0.3536   0
0        0        0        0
0        0        0        0
0        0.3536   0        0.3536
0        0        0        0
0        0        0        0
0        0        0        0
0.3536   0        -0.3536  0
0        0        0        0
0        0        0        0
0        0.3536   0        -0.3536
0        0        0        0
0        0        0        0
```

$(:, :, 6) =$
```
0        0        0        0
0        0        0        0
0.3536   0        0.3536   0
0        0        0        0
0        0        0        0
0        0        0        0
0        0.3536   0        0.3536
0        0        0        0
0        0        0        0
0        0        0        0
0 + 0.3536i  0    0 - 0.3536i  0
0        0        0        0
0        0        0        0
0        0        0        0
```

-continued

| | | | | |
|---|---|---|---|---|
| (:, :, 7) = | 0 | 0 | 0 | 0 |
| | 0 | 0 + 0.3536i | 0 | 0 − 0.3536i |
| | 0 | 0 | 0 | 0 |
| | 0 | 0 | 0 | 0 |
| | 0 | 0 | 0 | 0 |
| | 0 | 0 | 0 | 0 |
| | 0.3536 | 0 | 0.3536 | 0 |
| | 0 | 0 | 0 | 0 |
| | 0 | 0 | 0 | 0 |
| | 0 | 0 | 0 | 0 |
| | 0 | 0.3536 | 0 | 0.3536 |
| | 0 | 0 | 0 | 0 |
| | 0 | 0 | 0 | 0 |
| | 0 | 0 | 0 | 0 |
| | 0.3536 | 0 | −0.3536 | 0 |
| | 0 | 0 | 0 | 0 |
| | 0 | 0 | 0 | 0 |
| | 0 | 0 | 0 | 0 |
| | 0 | 0.3536 | 0 | −0.3536 |
| (:, :, 8) = | 0 | 0 | 0 | 0 |
| | 0 | 0 | 0 | 0 |
| | 0 | 0 | 0 | 0 |
| | 0.3536 | 0 | 0.3536 | 0 |
| | 0 | 0 | 0 | 0 |
| | 0 | 0 | 0 | 0 |
| | 0 | 0 | 0 | 0 |
| | 0 | 0.3536 | 0 | 0.3536 |
| | 0 | 0 | 0 | 0 |
| | 0 | 0 | 0 | 0 |
| | 0 | 0 | 0 | 0 |
| | 0 + 0.3536i | 0 | 0 − 0.3536i | 0 |
| | 0 | 0 | 0 | 0 |
| | 0 | 0 | 0 | 0 |
| | 0 | 0 | 0 | 0 |
| | 0 | 0 + 0.3536i | 0 | 0 − 0.3536i |

Rank 5

| | | | | | |
|---|---|---|---|---|---|
| (:, :, 1) = | .3162 | 0.3162 | 0 | 0 | 0 |
| | 0 | 0 | 0.3162 | 0.3162 | 0 |
| | 0 | 0 | 0 | 0 | 0.3162 |
| | 0 | 0 | 0 | 0 | 0 |
| | 0.3162 | −0.3162 | 0 | 0 | 0 |
| | 0 | 0 | 0.3162 | −0.3162 | 0 |
| | 0 | 0 | 0 | 0 | 0.3162 |
| | 0 | 0 | 0 | 0 | 0 |

Rank 6

| | | | | | | |
|---|---|---|---|---|---|---|
| (:, :, 1) = | 0.2887 | 0.2887 | 0 | 0 | 0 | 0 |
| | 0 | 0 | 0.2887 | 0.2887 | 0 | 0 |
| | 0 | 0 | 0 | 0 | 0.2887 | 0.2887 |
| | 0 | 0 | 0 | 0 | 0 | 0 |
| | 0.2887 | −0.2887 | 0 | 0 | 0 | 0 |
| | 0 | 0 | 0.2887 | −0.2887 | 0 | 0 |
| | 0 | 0 | 0 | 0 | 0.2887 | −0.2887 |
| | 0 | 0 | 0 | 0 | 0 | 0 |

Rank 7

| | | | | |
|---|---|---|---|---|
| (:, :, 1) = columns 1-4 | 0.2673 | 0.2673 | 0 | 0 |
| | 0 | 0 | 0.2673 | 0.2673 |
| | 0 | 0 | 0 | 0 |
| | 0 | 0 | 0 | 0 |
| | 0.2673 | −0.2673 | 0 | 0 |
| | 0 | 0 | 0.2673 | −0.2673 |
| | 0 | 0 | 0 | 0 |
| | 0 | 0 | 0 | 0 |
| columns 5-7 | 0 | 0 | 0 | |
| | 0 | 0 | 0 | |
| | 0.2673 | 0.2673 | 0 | |
| | 0 | 0 | 0.2673 | |
| | 0 | 0 | 0 | |
| | 0 | 0 | 0 | |
| | 0.2673 | −0.2673 | 0 | |
| | 0 | 0 | 0.2673 | |

Rank 8

| | | | | |
|---|---|---|---|---|
| (:, :, 1) = columns 1-4 | 0.2500 | 0.2500 | 0 | 0 |
| | 0 | 0 | 0.2500 | 0.2500 |
| | 0 | 0 | 0 | 0 |
| | 0 | 0 | 0 | 0 |
| | 0.2500 | −0.2500 | 0 | 0 |
| | 0 | 0 | 0.2500 | −0.2500 |
| | 0 | 0 | 0 | 0 |
| | 0 | 0 | 0 | 0 |
| columns 5-8 | 0 | 0 | 0 | 0 |
| | 0 | 0 | 0 | 0 |
| | 0.2500 | 0.2500 | 0 | 0 |
| | 0 | 0 | 0.2500 | 0.2500 |
| | 0 | 0 | 0 | 0 |
| | 0 | 0 | 0 | 0 |
| | 0.2500 | −0.2500 | 0 | 0 |
| | 0 | 0 | 0.2500 | −0.2500 |

Detailed Digits of Overall Codebook C

A final precoding matrix candidate may be induced by performing inner product with respect to one of codewords belonging to the first codebook $C_1$ and one of codewords belonging to the second codebook $C_2$. That is, the receiver may select a single codeword from the codewords belonging to the first codebook $C_1$ and may select a single codeword from the codewords belonging to the second codebook $C_2$. A combination of the selected two codewords may indicate one of codewords belonging to the overall codebook C, which is described below.

Hereinafter, ans(:,:,m,n) for rank r may indicate an inter product between ans(:,:,m) in the first codebook $C_1$ for rank r and (:,:,n) in the second codebook $C_2$ for rank r. That is, ans(:,:,m,n)=ans(:,:,m) (:,:,n).

For a variety of ranks, the detailed digits of the overall codebook C may be expressed as follows:

Rank 1

| | |
|---|---|
| ans(:, :, 1, 1) = | 0.3536 |
| | 0.3536 |
| | 0.3536 |
| | 0.3536 |
| | 0.3536 |
| | 0.3536 |
| | 0.3536 |
| | 0.3536 |
| ans(:, :, 2, 1) = | 0.3536 |
| | 0.3266 + 0.1353i |
| | 0.2500 + 0.2500i |
| | 0.1353 + 0.3266i |
| | 0.3536 |
| | 0.3266 + 0.1353i |
| | 0.2500 + 0.2500i |
| | 0.1353 + 0.3266i |

-continued

| | |
|---|---|
| ans(:, :, 3, 1) = | 0.3536 |
| | 0.2500 + 0.2500i |
| | 0.0000 + 0.3536i |
| | −0.2500 + 0.2500i |
| | 0.3536 |
| | 0.2500 + 0.2500i |
| | 0.0000 + 0.3536i |
| | −0.2500 + 0.2500i |
| ans(:, :, 4, 1) = | 0.3536 |
| | 0.1353 + 0.3266i |
| | −0.2500 + 0.2500i |
| | −0.3266 − 0.1353i |
| | 0.3536 |
| | 0.1353 + 0.3266i |
| | −0.2500 + 0.2500i |
| | −0.3266 − 0.1353i |
| ans(:, :, 5, 1) = | 0.3536 |
| | 0.0000 + 0.3536i |
| | −0.3536 + 0.0000i |
| | −0.0000 − 0.3536i |
| | 0.3536 |
| | 0.0000 + 0.3536i |
| | −0.3536 + 0.0000i |
| | −0.0000 − 0.3536i |
| ans(:, :, 6, 1) = | 0.3536 |
| | −0.1353 + 0.3266i |
| | −0.2500 − 0.2500i |
| | 0.3266 − 0.1353i |
| | 0.3536 |
| | −0.1353 + 0.3266i |
| | −0.2500 − 0.2500i |
| | 0.3266 − 0.1353i |
| ans(:, :, 7, 1) = | 0.3536 |
| | −0.2500 + 0.2500i |
| | −0.0000 − 0.3536i |
| | 0.2500 + 0.2500i |
| | 0.3536 |
| | −0.2500 + 0.2500i |
| | −0.0000 − 0.3536i |
| | 0.2500 + 0.2500i |
| ans(:, :, 8, 1) = | 0.3536 |
| | −0.3266 + 0.1353i |
| | 0.2500 − 0.2500i |
| | −0.1353 + 0.3266i |
| | 0.3536 |
| | −0.3266 + 0.1353i |
| | 0.2500 − 0.2500i |
| | −0.1353 + 0.3266i |
| ans(:, :, 9, 1) = | 0.3536 |
| | −0.3536 + 0.0000i |
| | 0.3536 − 0.0000i |
| | −0.3536 + 0.0000i |
| | 0.3536 |
| | −0.3536 + 0.0000i |
| | 0.3536 − 0.0000i |
| | −0.3536 + 0.0000i |
| ans(:, :, 10, 1) = | 0.3536 |
| | −0.3266 − 0.1353i |
| | 0.2500 + 0.2500i |
| | −0.1353 − 0.3266i |
| | 0.3536 |
| | −0.3266 − 0.1353i |
| | 0.2500 + 0.2500i |
| | −0.1353 − 0.3266i |
| ans(:, :, 11, 1) = | 0.3536 |
| | −0.2500 − 0.2500i |
| | 0.0000 + 0.3536i |
| | 0.2500 − 0.2500i |
| | 0.3536 |
| | −0.2500 − 0.2500i |
| | 0.0000 + 0.3536i |
| | 0.2500 − 0.2500i |

-continued

| | |
|---|---|
| ans(:, :, 12, 1) = | 0.3536 |
| | −0.1353 − 0.3266i |
| | −0.2500 + 0.2500i |
| | 0.3266 + 0.1353i |
| | 0.3536 |
| | −0.1353 − 0.3266i |
| | −0.2500 + 0.2500i |
| | 0.3266 + 0.1353i |
| ans(:, :, 13, 1) = | 0.3536 |
| | −0.0000 − 0.3536i |
| | −0.3536 + 0.0000i |
| | 0.0000 + 0.3536i |
| | 0.3536 |
| | −0.0000 − 0.3536i |
| | −0.3536 + 0.0000i |
| | 0.0000 + 0.3536i |
| ans(:, :, 14, 1) = | 0.3536 |
| | 0.1353 − 0.3266i |
| | −0.2500 − 0.2500i |
| | −0.3266 + 0.1353i |
| | 0.3536 |
| | 0.1353 − 0.3266i |
| | −0.2500 − 0.2500i |
| | −0.3266 + 0.1353i |
| ans(:, :, 15, 1) = | 0.3536 |
| | 0.2500 − 0.2500i |
| | −0.0000 − 0.3536i |
| | −0.2500 − 0.2500i |
| | 0.3536 |
| | 0.2500 − 0.2500i |
| | −0.0000 − 0.3536i |
| | −0.2500 − 0.2500i |
| ans(:, :, 16, 1) = | 0.3536 |
| | 0.3266 − 0.1353i |
| | 0.2500 − 0.2500i |
| | 0.1353 − 0.3266i |
| | 0.3536 |
| | 0.3266 − 0.1353i |
| | 0.2500 − 0.2500i |
| | 0.1353 − 0.3266i |
| ans(:, :, 1, 2) = | 0.3536 |
| | 0.3536 |
| | 0.3536 |
| | 0.3536 |
| | 0 + 0.3536i |
| | 0 + 0.3536i |
| | 0 + 0.3536i |
| | 0 + 0.3536i |
| ans(:, :, 2, 2) = | 0.3536 |
| | 0.3266 + 0.1353i |
| | 0.2500 + 0.2500i |
| | 0.1353 + 0.3266i |
| | 0 + 0.3536i |
| | −0.1353 + 0.3266i |
| | −0.2500 + 0.2500i |
| | −0.3266 + 0.1353i |
| ans(:, :, 3, 2) = | 0.3536 |
| | 0.2500 + 0.2500i |
| | 0.0000 + 0.3536i |
| | −0.2500 + 0.2500i |
| | 0 + 0.3536i |
| | −0.2500 + 0.2500i |
| | −0.3536 + 0.0000i |
| | −0.2500 − 0.2500i |
| ans(:, :, 4, 2) = | 0.3536 |
| | 0.1353 + 0.3266i |
| | −0.2500 + 0.2500i |
| | −0.3266 − 0.1353i |
| | 0 + 0.3536i |
| | −0.3266 + 0.1353i |
| | −0.2500 − 0.2500i |
| | 0.1353 − 0.3266i |

| | |
|---|---|
| ans(:, :, 5, 2) = | 0.3536 |
| | 0.0000 + 0.3536i |
| | −0.3536 + 0.0000i |
| | −0.0000 − 0.3536i |
| | 0 + 0.3536i |
| | −0.3536 + 0.0000i |
| | −0.0000 − 0.3536i |
| | 0.3536 − 0.0000i |
| ans(:, :, 6, 2) = | 0.3536 |
| | −0.1353 + 0.3266i |
| | −0.2500 − 0.2500i |
| | 0.3266 − 0.1353i |
| | 0 + 0.3536i |
| | −0.3266 − 0.1353i |
| | 0.2500 − 0.2500i |
| | 0.1353 + 0.3266i |
| ans(:, :, 7, 2) = | 0.3536 |
| | −0.2500 + 0.2500i |
| | −0.0000 − 0.3536i |
| | 0.2500 + 0.2500i |
| | 0 + 0.3536i |
| | −0.2500 − 0.2500i |
| | 0.3536 − 0.0000i |
| | −0.2500 + 0.2500i |
| ans(:, :, 8, 2) = | 0.3536 |
| | −0.3266 + 0.1353i |
| | 0.2500 − 0.2500i |
| | −0.1353 + 0.3266i |
| | 0 + 0.3536i |
| | −0.1353 − 0.3266i |
| | 0.2500 + 0.2500i |
| | −0.3266 − 0.1353i |
| ans(:, :, 9, 2) = | 0.3536 |
| | −0.3536 + 0.0000i |
| | 0.3536 − 0.0000i |
| | −0.3536 + 0.0000i |
| | 0 + 0.3536i |
| | −0.0000 − 0.3536i |
| | 0.0000 + 0.3536i |
| | −0.0000 − 0.3536i |
| ans(:, :, 10, 2) = | 0.3536 |
| | −0.3266 − 0.1353i |
| | 0.2500 + 0.2500i |
| | −0.1353 − 0.3266i |
| | 0 + 0.3536i |
| | 0.1353 − 0.3266i |
| | −0.2500 + 0.2500i |
| | 0.3266 − 0.1353i |
| ans(:, :, 11, 2) = | 0.3536 |
| | −0.2500 − 0.2500i |
| | 0.0000 + 0.3536i |
| | 0.2500 − 0.2500i |
| | 0 + 0.3536i |
| | 0.2500 − 0.2500i |
| | −0.3536 + 0.0000i |
| | 0.2500 + 0.2500i |
| ans(:, :, 12, 2) = | 0.3536 |
| | −0.1353 − 0.3266i |
| | −0.2500 + 0.2500i |
| | 0.3266 + 0.1353i |
| | 0 + 0.3536i |
| | 0.3266 − 0.1353i |
| | −0.2500 − 0.2500i |
| | −0.1353 + 0.3266i |
| ans(:, :, 13, 2) = | 0.3536 |
| | −0.0000 − 0.3536i |
| | −0.3536 + 0.0000i |
| | 0.0000 + 0.3536i |
| | 0 + 0.3536i |
| | 0.3536 − 0.0000i |
| | −0.0000 − 0.3536i |
| | −0.3536 + 0.0000i |

-continued

| | |
|---|---|
| ans(:, :, 14, 2) = | 0.3536 |
| | 0.1353 − 0.3266i |
| | −0.2500 − 0.2500i |
| | −0.3266 + 0.1353i |
| | 0 + 0.3536i |
| | 0.3266 + 0.1353i |
| | 0.2500 − 0.2500i |
| | −0.1353 − 0.3266i |
| ans(:, :, 15, 2) = | 0.3536 |
| | 0.2500 − 0.2500i |
| | −0.0000 − 0.3536i |
| | −0.2500 − 0.2500i |
| | 0 + 0.3536i |
| | 0.2500 + 0.2500i |
| | 0.3536 − 0.0000i |
| | 0.2500 − 0.2500i |
| ans(:, :, 16, 2) = | 0.3536 |
| | 0.3266 − 0.1353i |
| | 0.2500 − 0.2500i |
| | 0.1353 − 0.3266i |
| | 0 + 0.3536i |
| | 0.1353 + 0.3266i |
| | 0.2500 + 0.2500i |
| | 0.3266 + 0.1353i |
| ans(:, :, 1, 3) = | 0.3536 |
| | 0.3536 |
| | 0.3536 |
| | 0.3536 |
| | −0.3536 |
| | −0.3536 |
| | −0.3536 |
| | −0.3536 |
| ans(:, :, 2, 3) = | 0.3536 |
| | 0.3266 + 0.1353i |
| | 0.2500 + 0.2500i |
| | 0.1353 + 0.3266i |
| | −0.3536 |
| | −0.3266 − 0.1353i |
| | −0.2500 − 0.2500i |
| | −0.1353 − 0.3266i |
| ans(:, :, 3, 3) = | 0.3536 |
| | 0.2500 + 0.2500i |
| | 0.0000 + 0.3536i |
| | −0.2500 + 0.2500i |
| | −0.3536 |
| | −0.2500 − 0.2500i |
| | −0.0000 − 0.3536i |
| | 0.2500 − 0.2500i |
| ans(:, :, 4, 3) = | 0.3536 |
| | 0.1353 + 0.3266i |
| | −0.2500 + 0.2500i |
| | −0.3266 − 0.1353i |
| | −0.3536 |
| | −0.1353 − 0.3266i |
| | 0.2500 − 0.2500i |
| | 0.3266 + 0.1353i |
| ans(:, :, 5, 3) = | 0.3536 |
| | 0.0000 + 0.3536i |
| | −0.3536 + 0.0000i |
| | −0.0000 − 0.3536i |
| | −0.3536 |
| | −0.0000 − 0.3536i |
| | 0.3536 − 0.0000i |
| | 0.0000 + 0.3536i |
| ans(:, :, 6, 3) = | 0.3536 |
| | −0.1353 + 0.3266i |
| | −0.2500 − 0.2500i |
| | 0.3266 − 0.1353i |
| | −0.3536 |
| | 0.1353 − 0.3266i |
| | 0.2500 + 0.2500i |
| | −0.3266 + 0.1353i |

-continued

| | |
|---|---|
| ans(:, :, 7, 3) = | 0.3536 |
| | −0.2500 + 0.2500i |
| | −0.0000 − 0.3536i |
| | 0.2500 + 0.2500i |
| | −0.3536 |
| | 0.2500 − 0.2500i |
| | 0.0000 + 0.3536i |
| | −0.2500 − 0.2500i |
| ans(:, :, 8, 3) = | 0.3536 |
| | −0.3266 + 0.1353i |
| | 0.2500 − 0.2500i |
| | −0.1353 + 0.3266i |
| | −0.3536 |
| | 0.3266 − 0.1353i |
| | −0.2500 + 0.2500i |
| | 0.1353 − 0.3266i |
| ans(:, :, 9, 3) = | 0.3536 |
| | −0.3536 + 0.0000i |
| | 0.3536 − 0.0000i |
| | −0.3536 + 0.0000i |
| | −0.3536 |
| | 0.3536 − 0.0000i |
| | −0.3536 + 0.0000i |
| | 0.3536 − 0.0000i |
| ans(:, :, 10, 3) = | 0.3536 |
| | −0.3266 − 0.1353i |
| | 0.2500 + 0.2500i |
| | −0.1353 − 0.3266i |
| | −0.3536 |
| | 0.3266 + 0.1353i |
| | −0.2500 − 0.2500i |
| | 0.1353 + 0.3266i |
| ans(:, :, 11, 3) = | 0.3536 |
| | −0.2500 − 0.2500i |
| | 0.0000 + 0.3536i |
| | 0.2500 − 0.2500i |
| | −0.3536 |
| | 0.2500 + 0.2500i |
| | −0.0000 − 0.3536i |
| | −0.2500 + 0.2500i |
| ans(:, :, 12, 3) = | 0.3536 |
| | −0.1353 − 0.3266i |
| | −0.2500 + 0.2500i |
| | 0.3266 + 0.1353i |
| | −0.3536 |
| | 0.1353 + 0.3266i |
| | 0.2500 − 0.2500i |
| | −0.3266 − 0.1353i |
| ans(:, :, 13, 3) = | 0.3536 |
| | −0.0000 − 0.3536i |
| | −0.3536 + 0.0000i |
| | 0.0000 + 0.3536i |
| | −0.3536 |
| | 0.0000 + 0.3536i |
| | 0.3536 − 0.0000i |
| | −0.0000 − 0.3536i |
| ans(:, :, 14, 3) = | 0.3536 |
| | 0.1353 − 0.3266i |
| | −0.2500 − 0.2500i |
| | −0.3266 + 0.1353i |
| | −0.3536 |
| | −0.1353 + 0.3266i |
| | 0.2500 + 0.2500i |
| | 0.3266 − 0.1353i |
| ans(:, :, 15, 3) = | 0.3536 |
| | 0.2500 − 0.2500i |
| | −0.0000 − 0.3536i |
| | −0.2500 − 0.2500i |
| | −0.3536 |
| | −0.2500 + 0.2500i |
| | 0.0000 + 0.3536i |
| | 0.2500 + 0.2500i |

| | |
|---|---|
| ans(:, :, 16, 3) = | 0.3536 |
| | 0.3266 − 0.1353i |
| | 0.2500 − 0.2500i |
| | 0.1353 − 0.3266i |
| | −0.3536 |
| | −0.3266 + 0.1353i |
| | −0.2500 + 0.2500i |
| | −0.1353 + 0.3266i |
| ans(:, :, 1, 4) = | 0.3536 |
| | 0.3536 |
| | 0.3536 |
| | 0.3536 |
| | 0 − 0.3536i |
| | 0 − 0.3536i |
| | 0 − 0.3536i |
| | 0 − 0.3536i |
| ans(:, :, 2, 4) = | 0.3536 |
| | 0.3266 + 0.1353i |
| | 0.2500 + 0.2500i |
| | 0.1353 + 0.3266i |
| | 0 − 0.3536i |
| | 0.1353 − 0.3266i |
| | 0.2500 − 0.2500i |
| | 0.3266 − 0.1353i |
| ans(:, :, 3, 4) = | 0.3536 |
| | 0.2500 + 0.2500i |
| | 0.0000 + 0.3536i |
| | −0.2500 + 0.2500i |
| | 0 − 0.3536i |
| | 0.2500 − 0.2500i |
| | 0.3536 − 0.0000i |
| | 0.2500 + 0.2500i |
| ans(:, :, 4, 4) = | 0.3536 |
| | 0.1353 + 0.3266i |
| | −0.2500 + 0.2500i |
| | −0.3266 − 0.1353i |
| | 0 − 0.3536i |
| | 0.3266 − 0.1353i |
| | 0.2500 + 0.2500i |
| | −0.1353 + 0.3266i |
| ans(:, :, 5, 4) = | 0.3536 |
| | 0.0000 + 0.3536i |
| | −0.3536 + 0.0000i |
| | −0.0000 − 0.3536i |
| | 0 − 0.3536i |
| | 0.3536 − 0.0000i |
| | 0.0000 + 0.3536i |
| | −0.3536 + 0.0000i |
| ans(:, :, 6, 4) = | 0.3536 |
| | −0.1353 + 0.3266i |
| | −0.2500 − 0.2500i |
| | 0.3266 − 0.1353i |
| | 0 − 0.3536i |
| | 0.3266 + 0.1353i |
| | −0.2500 + 0.2500i |
| | −0.1353 − 0.3266i |
| ans(:, :, 7, 4) = | 0.3536 |
| | −0.2500 + 0.2500i |
| | −0.0000 − 0.3536i |
| | 0.2500 + 0.2500i |
| | 0 − 0.3536i |
| | 0.2500 + 0.2500i |
| | −0.3536 + 0.0000i |
| | 0.2500 − 0.2500i |
| ans(:, :, 8, 4) = | 0.3536 |
| | −0.3266 + 0.1353i |
| | 0.2500 − 0.2500i |
| | −0.1353 + 0.3266i |
| | 0 − 0.3536i |
| | 0.1353 + 0.3266i |
| | −0.2500 − 0.2500i |
| | 0.3266 + 0.1353i |

-continued

| | |
|---|---|
| ans(:, :, 9, 4) = | 0.3536 |
| | −0.3536 + 0.0000i |
| | 0.3536 − 0.0000i |
| | −0.3536 + 0.0000i |
| | 0 − 0.3536i |
| | 0.0000 + 0.3536i |
| | −0.0000 − 0.3536i |
| | 0.0000 + 0.3536i |
| ans(:, :, 10, 4) = | 0.3536 |
| | −0.3266 − 0.1353i |
| | 0.2500 + 0.2500i |
| | −0.1353 − 0.3266i |
| | 0 − 0.3536i |
| | −0.1353 + 0.3266i |
| | 0.2500 − 0.2500i |
| | −0.3266 + 0.1353i |
| ans(:, :, 11, 4) = | 0.3536 |
| | −0.2500 − 0.2500i |
| | 0.0000 + 0.3536i |
| | 0.2500 − 0.2500i |
| | 0 − 0.3536i |
| | −0.2500 + 0.2500i |
| | 0.3536 − 0.0000i |
| | −0.2500 − 0.2500i |
| ans(:, :, 12, 4) = | 0.3536 |
| | −0.1353 − 0.3266i |
| | −0.2500 + 0.2500i |
| | 0.3266 + 0.1353i |
| | 0 − 0.3536i |
| | −0.3266 + 0.1353i |
| | 0.2500 + 0.2500i |
| | 0.1353 − 0.3266i |
| ans(:, :, 13, 4) = | 0.3536 |
| | −0.0000 − 0.3536i |
| | −0.3536 + 0.0000i |
| | 0.0000 + 0.3536i |
| | 0 − 0.3536i |
| | −0.3536 + 0.0000i |
| | 0.0000 + 0.3536i |
| | 0.3536 − 0.0000i |
| ans(:, :, 14, 4) = | 0.3536 |
| | 0.1353 − 0.3266i |
| | −0.2500 − 0.2500i |
| | −0.3266 + 0.1353i |
| | 0 − 0.3536i |
| | −0.3266 − 0.1353i |
| | −0.2500 + 0.2500i |
| | 0.1353 + 0.3266i |
| ans(:, :, 15, 4) = | 0.3536 |
| | 0.2500 − 0.2500i |
| | −0.0000 − 0.3536i |
| | −0.2500 − 0.2500i |
| | 0 − 0.3536i |
| | −0.2500 − 0.2500i |
| | −0.3536 + 0.0000i |
| | −0.2500 + 0.2500i |
| ans(:, :, 16, 4) = | 0.3536 |
| | 0.3266 − 0.1353i |
| | 0.2500 − 0.2500i |
| | 0.1353 − 0.3266i |
| | 0 − 0.3536i |
| | −0.1353 − 0.3266i |
| | −0.2500 − 0.2500i |
| | −0.3266 − 0.1353i |
| ans(:, :, 1, 5) = | 0.3536 |
| | 0.3468 + 0.0690i |
| | 0.3266 + 0.1353i |
| | 0.2940 + 0.1964i |
| | 0.3536 |
| | 0.3468 + 0.0690i |
| | 0.3266 + 0.1353i |
| | 0.2940 + 0.1964i | ans(:, :, 2, 5) = 0.3536
0.2940 + 0.1964i
0.1353 + 0.3266i
−0.0690 + 0.3468i
0.3536
0.2940 + 0.1964i
0.1353 + 0.3266i
−0.0690 + 0.3468i ans(:, :, 3, 5) = 0.3536
0.1964 + 0.2940i
−0.1353 + 0.3266i
−0.3468 + 0.0690i
0.3536
0.1964 + 0.2940i
−0.1353 + 0.3266i
−0.3468 + 0.0690i ans(:, :, 4, 5) = 0.3536
0.0690 + 0.3468i
−0.3266 + 0.1353i
−0.1964 − 0.2940i
0.3536
0.0690 + 0.3468i
−0.3266 + 0.1353i
−0.1964 − 0.2940i ans(:, :, 5, 5) = 0.3536
−0.0690 + 0.3468i
−0.3266 − 0.1353i
0.1964 − 0.2940i
0.3536
−0.0690 + 0.3468i
−0.3266 − 0.1353i
0.1964 − 0.2940i ans(:, :, 6, 5) = 0.3536
−0.1964 + 0.2940i
−0.1353 − 0.3266i
0.3468 + 0.0690i
0.3536
−0.1964 + 0.2940i
−0.1353 − 0.3266i
0.3468 + 0.0690i ans(:, :, 7, 5) = 0.3536
−0.2940 + 0.1964i
0.1353 − 0.3266i
0.0690 + 0.3468i
0.3536
−0.2940 + 0.1964i
0.1353 − 0.3266i
0.0690 + 0.3468i ans(:, :, 8, 5) = 0.3536
−0.3468 + 0.0690i
0.3266 − 0.1353i
−0.2940 + 0.1964i
0.3536
−0.3468 + 0.0690i
0.3266 − 0.1353i
−0.2940 + 0.1964i ans(:, :, 9, 5) = 0.3536
−0.3468 − 0.0690i
0.3266 + 0.1353i
−0.2940 − 0.1964i
0.3536
−0.3468 − 0.0690i
0.3266 + 0.1353i
−0.2940 − 0.1964i ans(:, :, 10, 5) = 0.3536
−0.2940 − 0.1964i
0.1353 + 0.3266i
0.0690 − 0.3468i
0.3536
−0.2940 − 0.1964i
0.1353 + 0.3266i
0.0690 − 0.3468i -continued

| | |
|---|---|
| ans(:, :, 11, 5) = | 0.3536 |
| | −0.1964 − 0.2940i |
| | −0.1353 + 0.3266i |
| | 0.3468 − 0.0690i |
| | 0.3536 |
| | −0.1964 − 0.2940i |
| | −0.1353 + 0.3266i |
| | 0.3468 − 0.0690i |
| ans(:, :, 12, 5) = | 0.3536 |
| | −0.0690 − 0.3468i |
| | −0.3266 + 0.1353i |
| | 0.1964 + 0.2940i |
| | 0.3536 |
| | −0.0690 − 0.3468i |
| | −0.3266 + 0.1353i |
| | 0.1964 + 0.2940i |
| ans(:, :, 13, 5) = | 0.3536 |
| | 0.0690 − 0.3468i |
| | −0.3266 − 0.1353i |
| | −0.1964 + 0.2940i |
| | 0.3536 |
| | 0.0690 − 0.3468i |
| | −0.3266 − 0.1353i |
| | −0.1964 + 0.2940i |
| ans(:, :, 14, 5) = | 0.3536 |
| | 0.1964 − 0.2940i |
| | −0.1353 − 0.3266i |
| | −0.3468 − 0.0690i |
| | 0.3536 |
| | 0.1964 − 0.2940i |
| | −0.1353 − 0.3266i |
| | −0.3468 − 0.0690i |
| ans(:, :, 15, 5) = | 0.3536 |
| | 0.2940 − 0.1964i |
| | 0.1353 − 0.3266i |
| | −0.0690 − 0.3468i |
| | 0.3536 |
| | 0.2940 − 0.1964i |
| | 0.1353 − 0.3266i |
| | −0.0690 − 0.3468i |
| ans(:, :, 16, 5) = | 0.3536 |
| | 0.3468 − 0.0690i |
| | 0.3266 − 0.1353i |
| | 0.2940 − 0.1964i |
| | 0.3536 |
| | 0.3468 − 0.0690i |
| | 0.3266 − 0.1353i |
| | 0.2940 − 0.1964i |
| ans(:, :, 1, 6) = | 0.3536 |
| | 0.3468 + 0.0690i |
| | 0.3266 + 0.1353i |
| | 0.2940 + 0.1964i |
| | 0 + 0.3536i |
| | −0.0690 + 0.3468i |
| | −0.1353 + 0.3266i |
| | −0.1964 + 0.2940i |
| ans(:, :, 2, 6) = | 0.3536 |
| | 0.2940 + 0.1964i |
| | 0.1353 + 0.3266i |
| | −0.0690 + 0.3468i |
| | 0 + 0.3536i |
| | −0.1964 + 0.2940i |
| | −0.3266 + 0.1353i |
| | −0.3468 − 0.0690i |
| ans(:, :, 3, 6) = | 0.3536 |
| | 0.1964 + 0.2940i |
| | −0.1353 + 0.3266i |
| | −0.3468 + 0.0690i |
| | 0 + 0.3536i |
| | −0.2940 + 0.1964i |
| | −0.3266 − 0.1353i |
| | −0.0690 − 0.3468i |

-continued

| | |
|---|---|
| ans(:, :, 4, 6) = | 0.3536 |
| | 0.0690 + 0.3468i |
| | −0.3266 + 0.1353i |
| | −0.1964 − 0.2940i |
| | 0 + 0.3536i |
| | −0.3468 + 0.0690i |
| | −0.1353 − 0.3266i |
| | 0.2940 − 0.1964i |
| ans(:, :, 5, 6) = | 0.3536 |
| | −0.0690 + 0.3468i |
| | −0.3266 − 0.1353i |
| | 0.1964 − 0.2940i |
| | 0 + 0.3536i |
| | −0.3468 − 0.0690i |
| | 0.1353 − 0.3266i |
| | 0.2940 + 0.1964i |
| ans(:, :, 6, 6) = | 0.3536 |
| | −0.1964 + 0.2940i |
| | −0.1353 − 0.3266i |
| | 0.3468 + 0.0690i |
| | 0 + 0.3536i |
| | −0.2940 − 0.1964i |
| | 0.3266 − 0.1353i |
| | −0.0690 + 0.3468i |
| ans(:, :, 7, 6) = | 0.3536 |
| | −0.2940 + 0.1964i |
| | 0.1353 − 0.3266i |
| | 0.0690 + 0.3468i |
| | 0 + 0.3536i |
| | −0.1964 − 0.2940i |
| | 0.3266 + 0.1353i |
| | −0.3468 + 0.0690i |
| ans(:, :, 8, 6) = | 0.3536 |
| | −0.3468 + 0.0690i |
| | 0.3266 − 0.1353i |
| | −0.2940 + 0.1964i |
| | 0 + 0.3536i |
| | −0.0690 − 0.3468i |
| | 0.1353 + 0.3266i |
| | −0.1964 − 0.2940i |
| ans(:, :, 9, 6) = | 0.3536 |
| | −0.3468 − 0.0690i |
| | 0.3266 + 0.1353i |
| | −0.2940 − 0.1964i |
| | 0 + 0.3536i |
| | 0.0690 − 0.3468i |
| | −0.1353 + 0.3266i |
| | 0.1964 − 0.2940i |
| ans(:, :, 10, 6) = | 0.3536 |
| | −0.2940 − 0.1964i |
| | 0.1353 + 0.3266i |
| | 0.0690 − 0.3468i |
| | 0 + 0.3536i |
| | 0.1964 − 0.2940i |
| | −0.3266 + 0.1353i |
| | 0.3468 + 0.0690i |
| ans(:, :, 11, 6) = | 0.3536 |
| | −0.1964 − 0.2940i |
| | −0.1353 + 0.3266i |
| | 0.3468 − 0.0690i |
| | 0 + 0.3536i |
| | 0.2940 − 0.1964i |
| | −0.3266 − 0.1353i |
| | 0.0690 + 0.3468i |
| ans(:, :, 12, 6) = | 0.3536 |
| | −0.0690 − 0.3468i |
| | −0.3266 + 0.1353i |
| | 0.1964 + 0.2940i |
| | 0 + 0.3536i |
| | 0.3468 − 0.0690i |
| | −0.1353 − 0.3266i |
| | −0.2940 + 0.1964i |

-continued

| | |
|---|---|
| ans(:, :, 13, 6) = | 0.3536 |
| | 0.0690 − 0.3468i |
| | −0.3266 − 0.1353i |
| | −0.1964 + 0.2940i |
| | 0 + 0.3536i |
| | 0.3468 + 0.0690i |
| | 0.1353 − 0.3266i |
| | −0.2940 − 0.1964i |
| ans(:, :, 14, 6) = | 0.3536 |
| | 0.1964 − 0.2940i |
| | −0.1353 − 0.3266i |
| | −0.3468 − 0.0690i |
| | 0 + 0.3536i |
| | 0.2940 + 0.1964i |
| | 0.3266 − 0.1353i |
| | 0.0690 − 0.3468i |
| ans(:, :, 15, 6) = | 0.3536 |
| | 0.2940 − 0.1964i |
| | 0.1353 − 0.3266i |
| | −0.0690 − 0.3468i |
| | 0 + 0.3536i |
| | 0.1964 + 0.2940i |
| | 0.3266 + 0.1353i |
| | 0.3468 − 0.0690i |
| ans(:, :, 16, 6) = | 0.3536 |
| | 0.3468 − 0.0690i |
| | 0.3266 − 0.1353i |
| | 0.2940 − 0.1964i |
| | 0 + 0.3536i |
| | 0.0690 + 0.3468i |
| | 0.1353 + 0.3266i |
| | 0.1964 + 0.2940i |
| ans(:, :, 1, 7) = | 0.3536 |
| | 0.3468 + 0.0690i |
| | 0.3266 + 0.1353i |
| | 0.2940 + 0.1964i |
| | −0.3536 |
| | −0.3468 − 0.0690i |
| | −0.3266 − 0.1353i |
| | −0.2940 − 0.1964i |
| ans(:, :, 2, 7) = | 0.3536 |
| | 0.2940 + 0.1964i |
| | 0.1353 + 0.3266i |
| | −0.0690 + 0.3468i |
| | −0.3536 |
| | −0.2940 − 0.1964i |
| | −0.1353 − 0.3266i |
| | 0.0690 − 0.3468i |
| ans(:, :, 3, 7) = | 0.3536 |
| | 0.1964 + 0.2940i |
| | −0.1353 + 0.3266i |
| | −0.3468 + 0.0690i |
| | −0.3536 |
| | −0.1964 − 0.2940i |
| | 0.1353 − 0.3266i |
| | 0.3468 − 0.0690i |
| ans(:, :, 4, 7) = | 0.3536 |
| | 0.0690 + 0.3468i |
| | −0.3266 + 0.1353i |
| | −0.1964 − 0.2940i |
| | −0.3536 |
| | −0.0690 − 0.3468i |
| | 0.3266 − 0.1353i |
| | 0.1964 + 0.2940i |
| ans(:, :, 5, 7) = | 0.3536 |
| | −0.0690 + 0.3468i |
| | −0.3266 − 0.1353i |
| | 0.1964 − 0.2940i |
| | −0.3536 |
| | 0.0690 − 0.3468i |
| | 0.3266 + 0.1353i |
| | −0.1964 + 0.2940i |

-continued ans(:, :, 6, 7) =  0.3536
                  −0.1964 + 0.2940i
                  −0.1353 − 0.3266i
                  0.3468 + 0.0690i
                  −0.3536
                  0.1964 − 0.2940i
                  0.1353 + 0.3266i
                  −0.3468 − 0.0690i
ans(:, :, 7, 7) =  0.3536
                  −0.2940 + 0.1964i
                  0.1353 − 0.3266i
                  0.0690 + 0.3468i
                  −0.3536
                  0.2940 − 0.1964i
                  −0.1353 + 0.3266i
                  −0.0690 − 0.3468i
ans(:, :, 8, 7) =  0.3536
                  −0.3468 + 0.0690i
                  0.3266 − 0.1353i
                  −0.2940 + 0.1964i
                  −0.3536
                  0.3468 − 0.0690i
                  −0.3266 + 0.1353i
                  0.2940 − 0.1964i
ans(:, :, 9, 7) =  0.3536
                  −0.3468 − 0.0690i
                  0.3266 + 0.1353i
                  −0.2940 − 0.1964i
                  −0.3536
                  0.3468 + 0.0690i
                  −0.3266 − 0.1353i
                  0.2940 + 0.1964i
ans(:, :, 10, 7) = 0.3536
                  −0.2940 − 0.1964i
                  0.1353 + 0.3266i
                  0.0690 − 0.3468i
                  −0.3536
                  0.2940 + 0.1964i
                  −0.1353 − 0.3266i
                  −0.0690 + 0.3468i
ans(:, :, 11, 7) = 0.3536
                  −0.1964 − 0.2940i
                  −0.1353 + 0.3266i
                  0.3468 − 0.0690i
                  −0.3536
                  0.1964 + 0.2940i
                  0.1353 − 0.3266i
                  −0.3468 + 0.0690i
ans(:, :, 12, 7) = 0.3536
                  −0.0690 − 0.3468i
                  −0.3266 + 0.1353i
                  0.1964 + 0.2940i
                  −0.3536
                  0.0690 + 0.3468i
                  0.3266 − 0.1353i
                  −0.1964 − 0.2940i
ans(:, :, 13, 7) = 0.3536
                  0.0690 − 0.3468i
                  −0.3266 − 0.1353i
                  −0.1964 + 0.2940i
                  −0.3536
                  −0.0690 + 0.3468i
                  0.3266 + 0.1353i
                  0.1964 − 0.2940i
ans(:, :, 14, 7) = 0.3536
                  0.1964 − 0.2940i
                  −0.1353 − 0.3266i
                  −0.3468 − 0.0690i
                  −0.3536
                  −0.1964 + 0.2940i
                  0.1353 + 0.3266i
                  0.3468 + 0.0690i

| | |
|---|---|
| ans(:, :, 15, 7) = | 0.3536 |
| | 0.2940 − 0.1964i |
| | 0.1353 − 0.3266i |
| | −0.0690 − 0.3468i |
| | −0.3536 |
| | −0.2940 + 0.1964i |
| | −0.1353 + 0.3266i |
| | 0.0690 + 0.3468i |
| ans(:, :, 16, 7) = | 0.3536 |
| | 0.3468 − 0.0690i |
| | 0.3266 − 0.1353i |
| | 0.2940 − 0.1964i |
| | −0.3536 |
| | −0.3468 + 0.0690i |
| | −0.3266 + 0.1353i |
| | −0.2940 + 0.1964i |
| ans(:, :, 1, 8) = | 0.3536 |
| | 0.3468 + 0.0690i |
| | 0.3266 + 0.1353i |
| | 0.2940 + 0.1964i |
| | 0 − 0.3536i |
| | 0.0690 − 0.3468i |
| | 0.1353 − 0.3266i |
| | 0.1964 − 0.2940i |
| ans(:, :, 2, 8) = | 0.3536 |
| | 0.2940 + 0.1964i |
| | 0.1353 + 0.3266i |
| | −0.0690 + 0.3468i |
| | 0 − 0.3536i |
| | 0.1964 − 0.2940i |
| | 0.3266 − 0.1353i |
| | 0.3468 + 0.0690i |
| ans(:, :, 3, 8) = | 0.3536 |
| | 0.1964 + 0.2940i |
| | −0.1353 + 0.3266i |
| | −0.3468 + 0.0690i |
| | 0 − 0.3536i |
| | 0.2940 − 0.1964i |
| | 0.3266 + 0.1353i |
| | 0.0690 + 0.3468i |
| ans(:, :, 4, 8) = | 0.3536 |
| | 0.0690 + 0.3468i |
| | −0.3266 + 0.1353i |
| | −0.1964 − 0.2940i |
| | 0 − 0.3536i |
| | 0.3468 − 0.0690i |
| | 0.1353 + 0.3266i |
| | −0.2940 + 0.1964i |
| ans(:, :, 5, 8) = | 0.3536 |
| | −0.0690 + 0.3468i |
| | −0.3266 − 0.1353i |
| | 0.1964 − 0.2940i |
| | 0 − 0.3536i |
| | 0.3468 + 0.0690i |
| | −0.1353 + 0.3266i |
| | −0.2940 − 0.1964i |
| ans(:, :, 6, 8) = | 0.3536 |
| | −0.1964 + 0.2940i |
| | −0.1353 − 0.3266i |
| | 0.3468 + 0.0690i |
| | 0 − 0.3536i |
| | 0.2940 + 0.1964i |
| | −0.3266 + 0.1353i |
| | 0.0690 − 0.3468i |
| ans(:, :, 7, 8) = | 0.3536 |
| | −0.2940 + 0.1964i |
| | 0.1353 − 0.3266i |
| | 0.0690 + 0.3468i |
| | 0 − 0.3536i |
| | 0.1964 + 0.2940i |
| | −0.3266 − 0.1353i |
| | 0.3468 − 0.0690i |

-continued

| | |
|---|---|
| ans(:, :, 8, 8) = | 0.3536 |
| | −0.3468 + 0.0690i |
| | 0.3266 − 0.1353i |
| | −0.2940 + 0.1964i |
| | 0 − 0.3536i |
| | 0.0690 + 0.3468i |
| | −0.1353 − 0.3266i |
| | 0.1964 + 0.2940i |
| ans(:, :, 9, 8) = | 0.3536 |
| | −0.3468 − 0.0690i |
| | 0.3266 + 0.1353i |
| | −0.2940 − 0.1964i |
| | 0 − 0.3536i |
| | −0.0690 + 0.3468i |
| | 0.1353 − 0.3266i |
| | −0.1964 + 0.2940i |
| ans(:, :, 10, 8) = | 0.3536 |
| | −0.2940 − 0.1964i |
| | 0.1353 + 0.3266i |
| | 0.0690 − 0.3468i |
| | 0 − 0.3536i |
| | −0.1964 + 0.2940i |
| | 0.3266 − 0.1353i |
| | −0.3468 − 0.0690i |
| ans(:, :, 11, 8) = | 0.3536 |
| | −0.1964 − 0.2940i |
| | −0.1353 + 0.3266i |
| | 0.3468 − 0.0690i |
| | 0 − 0.3536i |
| | −0.2940 + 0.1964i |
| | 0.3266 + 0.1353i |
| | −0.0690 − 0.3468i |
| ans(:, :, 12, 8) = | 0.3536 |
| | −0.0690 − 0.3468i |
| | −0.3266 + 0.1353i |
| | 0.1964 + 0.2940i |
| | 0 − 0.3536i |
| | −0.3468 + 0.0690i |
| | 0.1353 + 0.3266i |
| | 0.2940 − 0.1964i |
| ans(:, :, 13, 8) = | 0.3536 |
| | 0.0690 − 0.3468i |
| | −0.3266 − 0.1353i |
| | −0.1964 + 0.2940i |
| | 0 − 0.3536i |
| | −0.3468 − 0.0690i |
| | −0.1353 + 0.3266i |
| | 0.2940 + 0.1964i |
| ans(:, :, 14, 8) = | 0.3536 |
| | 0.1964 − 0.2940i |
| | −0.1353 − 0.3266i |
| | −0.3468 − 0.0690i |
| | 0 − 0.3536i |
| | −0.2940 − 0.1964i |
| | −0.3266 + 0.1353i |
| | −0.0690 + 0.3468i |
| ans(:, :, 15, 8) = | 0.3536 |
| | 0.2940 − 0.1964i |
| | 0.1353 − 0.3266i |
| | −0.0690 − 0.3468i |
| | 0 − 0.3536i |
| | −0.1964 − 0.2940i |
| | −0.3266 − 0.1353i |
| | −0.3468 + 0.0690i |
| ans(:, :, 16, 8) = | 0.3536 |
| | 0.3468 − 0.0690i |
| | 0.3266 − 0.1353i |
| | 0.2940 − 0.1964i |
| | 0 − 0.3536i |
| | −0.0690 − 0.3468i |
| | −0.1353 − 0.3266i |
| | −0.1964 − 0.2940i |

-continued ans(:, :, 1, 9) = 
0.3536
0.3266 + 0.1353i
0.2500 + 0.2500i
0.1353 + 0.3266i
0.3536
0.3266 + 0.1353i
0.2500 + 0.2500i
0.1353 + 0.3266i ans(:, :, 2, 9) = 
0.3536
0.2500 + 0.2500i
0.0000 + 0.3536i
−0.2500 + 0.2500i
0.3536
0.2500 + 0.2500i
0.0000 + 0.3536i
−0.2500 + 0.2500i ans(:, :, 3, 9) = 
0.3536
0.1353 + 0.3266i
−0.2500 + 0.2500i
−0.3266 − 0.1353i
0.3536
0.1353 + 0.3266i
−0.2500 + 0.2500i
−0.3266 − 0.1353i ans(:, :, 4, 9) = 
0.3536
0.0000 + 0.3536i
−0.3536 + 0.0000i
−0.0000 − 0.3536i
0.3536
0.0000 + 0.3536i
−0.3536 + 0.0000i
−0.0000 − 0.3536i ans(:, :, 5, 9) = 
0.3536
−0.1353 + 0.3266i
−0.2500 − 0.2500i
0.3266 − 0.1353i
0.3536
−0.1353 + 0.3266i
−0.2500 − 0.2500i
0.3266 − 0.1353i ans(:, :, 6, 9) = 
0.3536
−0.2500 + 0.2500i
−0.0000 − 0.3536i
0.2500 + 0.2500i
0.3536
−0.2500 + 0.2500i
−0.0000 − 0.3536i
0.2500 + 0.2500i ans(:, :, 7, 9) = 
0.3536
−0.3266 + 0.1353i
0.2500 − 0.2500i
−0.1353 + 0.3266i
0.3536
−0.3266 + 0.1353i
0.2500 − 0.2500i
−0.1353 + 0.3266i ans(:, :, 8, 9) = 
0.3536
−0.3536 + 0.0000i
0.3536 − 0.0000i
−0.3536 + 0.0000i
0.3536
−0.3536 + 0.0000i
0.3536 − 0.0000i
−0.3536 + 0.0000i ans(:, :, 9, 9) = 
0.3536
−0.3266 − 0.1353i
0.2500 + 0.2500i
−0.1353 − 0.3266i
0.3536
−0.3266 − 0.1353i
0.2500 + 0.2500i
−0.1353 − 0.3266i -continued

| | |
|---|---|
| ans(:, :, 10, 9) = | 0.3536 |
| | −0.2500 − 0.2500i |
| | 0.0000 + 0.3536i |
| | 0.2500 − 0.2500i |
| | 0.3536 |
| | −0.2500 − 0.2500i |
| | 0.0000 + 0.3536i |
| | 0.2500 − 0.2500i |
| ans(:, :, 11, 9) = | 0.3536 |
| | −0.1353 − 0.3266i |
| | −0.2500 + 0.2500i |
| | 0.3266 + 0.1353i |
| | 0.3536 |
| | −0.1353 − 0.3266i |
| | −0.2500 + 0.2500i |
| | 0.3266 + 0.1353i |
| ans(:, :, 12, 9) = | 0.3536 |
| | −0.0000 − 0.3536i |
| | −0.3536 + 0.0000i |
| | 0.0000 + 0.3536i |
| | 0.3536 |
| | −0.0000 − 0.3536i |
| | −0.3536 + 0.0000i |
| | 0.0000 + 0.3536i |
| ans(:, :, 13, 9) = | 0.3536 |
| | 0.1353 − 0.3266i |
| | −0.2500 − 0.2500i |
| | −0.3266 + 0.1353i |
| | 0.3536 |
| | 0.1353 − 0.3266i |
| | −0.2500 − 0.2500i |
| | −0.3266 + 0.1353i |
| ans(:, :, 14, 9) = | 0.3536 |
| | 0.2500 − 0.2500i |
| | −0.0000 − 0.3536i |
| | −0.2500 − 0.2500i |
| | 0.3536 |
| | 0.2500 − 0.2500i |
| | −0.0000 − 0.3536i |
| | −0.2500 − 0.2500i |
| ans(:, :, 15, 9) = | 0.3536 |
| | 0.3266 − 0.1353i |
| | 0.2500 − 0.2500i |
| | 0.1353 − 0.3266i |
| | 0.3536 |
| | 0.3266 − 0.1353i |
| | 0.2500 − 0.2500i |
| | 0.1353 − 0.3266i |
| ans(:, :, 16, 9) = | 0.3536 |
| | 0.3536 |
| | 0.3536 |
| | 0.3536 |
| | 0.3536 |
| | 0.3536 |
| | 0.3536 |
| | 0.3536 |
| ans(:, :, 1, 10) = | 0.3536 |
| | 0.3266 + 0.1353i |
| | 0.2500 + 0.2500i |
| | 0.1353 + 0.3266i |
| | 0 + 0.3536i |
| | −0.1353 + 0.3266i |
| | −0.2500 + 0.2500i |
| | −0.3266 + 0.1353i |
| ans(:, :, 2, 10) = | 0.3536 |
| | 0.2500 + 0.2500i |
| | 0.0000 + 0.3536i |
| | −0.2500 + 0.2500i |
| | 0 + 0.3536i |
| | −0.2500 + 0.2500i |
| | −0.3536 + 0.0000i |
| | −0.2500 − 0.2500i |

-continued ans(:, :, 3, 10) =         0.3536
                           0.1353 + 0.3266i
                           −0.2500 + 0.2500i
                           −0.3266 − 0.1353i
                           0 + 0.3536i
                           −0.3266 + 0.1353i
                           −0.2500 − 0.2500i
                           0.1353 − 0.3266i
ans(:, :, 4, 10) =         0.3536
                           0.0000 + 0.3536i
                           −0.3536 + 0.0000i
                           −0.0000 − 0.3536i
                           0 + 0.3536i
                           −0.3536 + 0.0000i
                           −0.0000 − 0.3536i
                           0.3536 − 0.0000i
ans(:, :, 5, 10) =         0.3536
                           −0.1353 + 0.3266i
                           −0.2500 − 0.2500i
                           0.3266 − 0.1353i
                           0 + 0.3536i
                           −0.3266 − 0.1353i
                           0.2500 − 0.2500i
                           0.1353 + 0.3266i
ans(:, :, 6, 10) =         0.3536
                           −0.2500 + 0.2500i
                           −0.0000 − 0.3536i
                           0.2500 + 0.2500i
                           0 + 0.3536i
                           −0.2500 − 0.2500i
                           0.3536 − 0.0000i
                           −0.2500 + 0.2500i
ans(:, :, 7, 10) =         0.3536
                           −0.3266 + 0.1353i
                           0.2500 − 0.2500i
                           −0.1353 + 0.3266i
                           0 + 0.3536i
                           −0.1353 − 0.3266i
                           0.2500 + 0.2500i
                           −0.3266 − 0.1353i
ans(:, :, 8, 10) =         0.3536
                           −0.3536 + 0.0000i
                           0.3536 − 0.0000i
                           −0.3536 + 0.0000i
                           0 + 0.3536i
                           −0.0000 − 0.3536i
                           0.0000 + 0.3536i
                           −0.0000 − 0.3536i
ans(:, :, 9, 10) =         0.3536
                           −0.3266 − 0.1353i
                           0.2500 + 0.2500i
                           −0.1353 − 0.3266i
                           0 + 0.3536i
                           0.1353 − 0.3266i
                           −0.2500 + 0.2500i
                           0.3266 − 0.1353i
ans(:, :, 10, 10) =        0.3536
                           −0.2500 − 0.2500i
                           0.0000 + 0.3536i
                           0.2500 − 0.2500i
                           0 + 0.3536i
                           0.2500 − 0.2500i
                           −0.3536 + 0.0000i
                           0.2500 + 0.2500i
ans(:, :, 11, 10) =        0.3536
                           −0.1353 − 0.3266i
                           −0.2500 + 0.2500i
                           0.3266 + 0.1353i
                           0 + 0.3536i
                           0.3266 − 0.1353i
                           −0.2500 − 0.2500i
                           −0.1353 + 0.3266i -continued

| | |
|---|---|
| ans(:, :, 12, 10) = | 0.3536 |
| | −0.0000 − 0.3536i |
| | −0.3536 + 0.0000i |
| | 0.0000 + 0.3536i |
| | 0 + 0.3536i |
| | 0.3536 − 0.0000i |
| | −0.0000 − 0.3536i |
| | −0.3536 + 0.0000i |
| ans(:, :, 13, 10) = | 0.3536 |
| | 0.1353 − 0.3266i |
| | −0.2500 − 0.2500i |
| | −0.3266 + 0.1353i |
| | 0 + 0.3536i |
| | 0.3266 + 0.1353i |
| | 0.2500 − 0.2500i |
| | −0.1353 − 0.3266i |
| ans(:, :, 14, 10) = | 0.3536 |
| | 0.2500 − 0.2500i |
| | −0.0000 − 0.3536i |
| | −0.2500 − 0.2500i |
| | 0 + 0.3536i |
| | 0.2500 + 0.2500i |
| | 0.3536 − 0.0000i |
| | 0.2500 − 0.2500i |
| ans(:, :, 15, 10) = | 0.3536 |
| | 0.3266 − 0.1353i |
| | 0.2500 − 0.2500i |
| | 0.1353 − 0.3266i |
| | 0 + 0.3536i |
| | 0.1353 + 0.3266i |
| | 0.2500 + 0.2500i |
| | 0.3266 + 0.1353i |
| ans(:, :, 16, 10) = | 0.3536 |
| | 0.3536 |
| | 0.3536 |
| | 0.3536 |
| | 0 + 0.3536i |
| | 0 + 0.3536i |
| | 0 + 0.3536i |
| | 0 + 0.3536i |
| ans(:, :, 1, 11) = | 0.3536 |
| | 0.3266 + 0.1353i |
| | 0.2500 + 0.2500i |
| | 0.1353 + 0.3266i |
| | −0.3536 |
| | −0.3266 − 0.1353i |
| | −0.2500 − 0.2500i |
| | −0.1353 − 0.3266i |
| ans(:, :, 2, 11) = | 0.3536 |
| | 0.2500 + 0.2500i |
| | 0.0000 + 0.3536i |
| | −0.2500 + 0.2500i |
| | −0.3536 |
| | −0.2500 − 0.2500i |
| | −0.0000 − 0.3536i |
| | 0.2500 − 0.2500i |
| ans(:, :, 3, 11) = | 0.3536 |
| | 0.1353 + 0.3266i |
| | −0.2500 + 0.2500i |
| | −0.3266 − 0.1353i |
| | −0.3536 |
| | −0.1353 − 0.3266i |
| | 0.2500 − 0.2500i |
| | 0.3266 + 0.1353i |
| ans(:, :, 4, 11) = | 0.3536 |
| | 0.0000 + 0.3536i |
| | −0.3536 + 0.0000i |
| | −0.0000 − 0.3536i |
| | −0.3536 |
| | −0.0000 − 0.3536i |
| | 0.3536 − 0.0000i |
| | 0.0000 + 0.3536i |

-continued ans(:, :, 5, 11) = 0.3536
−0.1353 + 0.3266i
−0.2500 − 0.2500i
0.3266 − 0.1353i
−0.3536
0.1353 − 0.3266i
0.2500 + 0.2500i
−0.3266 + 0.1353i ans(:, :, 6, 11) = 0.3536
−0.2500 + 0.2500i
−0.0000 − 0.3536i
0.2500 + 0.2500i
−0.3536
0.2500 − 0.2500i
0.0000 + 0.3536i
−0.2500 − 0.2500i ans(:, :, 7, 11) = 0.3536
−0.3266 + 0.1353i
0.2500 − 0.2500i
−0.1353 + 0.3266i
−0.3536
0.3266 − 0.1353i
−0.2500 + 0.2500i
0.1353 − 0.3266i ans(:, :, 8, 11) = 0.3536
−0.3536 + 0.0000i
0.3536 − 0.0000i
−0.3536 + 0.0000i
−0.3536
0.3536 − 0.0000i
−0.3536 + 0.0000i
0.3536 − 0.0000i ans(:, :, 9, 11) = 0.3536
−0.3266 − 0.1353i
0.2500 + 0.2500i
−0.1353 − 0.3266i
−0.3536
0.3266 + 0.1353i
−0.2500 − 0.2500i
0.1353 + 0.3266i ans(:, :, 10, 11) = 0.3536
−0.2500 − 0.2500i
0.0000 + 0.3536i
0.2500 − 0.2500i
−0.3536
0.2500 + 0.2500i
−0.0000 − 0.3536i
−0.2500 + 0.2500i ans(:, :, 11, 11) = 0.3536
−0.1353 − 0.3266i
−0.2500 + 0.2500i
0.3266 + 0.1353i
−0.3536
0.1353 + 0.3266i
0.2500 − 0.2500i
−0.3266 − 0.1353i ans(:, :, 12, 11) = 0.3536
−0.0000 − 0.3536i
−0.3536 + 0.0000i
0.0000 + 0.3536i
−0.3536
0.0000 + 0.3536i
0.3536 − 0.0000i
−0.0000 − 0.3536i ans(:, :, 13, 11) = 0.3536
0.1353 − 0.3266i
−0.2500 − 0.2500i
−0.3266 + 0.1353i
−0.3536
−0.1353 + 0.3266i
0.2500 + 0.2500i
0.3266 − 0.1353i -continued

| | |
|---|---|
| ans(:, :, 14, 11) = | 0.3536 |
| | 0.2500 − 0.2500i |
| | −0.0000 − 0.3536i |
| | −0.2500 − 0.2500i |
| | −0.3536 |
| | −0.2500 + 0.2500i |
| | 0.0000 + 0.3536i |
| | 0.2500 + 0.2500i |
| ans(:, :, 15, 11) = | 0.3536 |
| | 0.3266 − 0.1353i |
| | 0.2500 − 0.2500i |
| | 0.1353 − 0.3266i |
| | −0.3536 |
| | −0.3266 + 0.1353i |
| | −0.2500 + 0.2500i |
| | −0.1353 + 0.3266i |
| ans(:, :, 16, 11) = | 0.3536 |
| | 0.3536 |
| | 0.3536 |
| | 0.3536 |
| | −0.3536 |
| | −0.3536 |
| | −0.3536 |
| | −0.3536 |
| ans(:, :, 1, 12) = | 0.3536 |
| | 0.3266 + 0.1353i |
| | 0.2500 + 0.2500i |
| | 0.1353 + 0.3266i |
| | 0 − 0.3536i |
| | 0.1353 − 0.3266i |
| | 0.2500 − 0.2500i |
| | 0.3266 − 0.1353i |
| ans(:, :, 2, 12) = | 0.3536 |
| | 0.2500 + 0.2500i |
| | 0.0000 + 0.3536i |
| | −0.2500 + 0.2500i |
| | 0 − 0.3536i |
| | 0.2500 − 0.2500i |
| | 0.3536 − 0.0000i |
| | 0.2500 + 0.2500i |
| ans(:, :, 3, 12) = | 0.3536 |
| | 0.1353 + 0.3266i |
| | −0.2500 + 0.2500i |
| | −0.3266 − 0.1353i |
| | 0 − 0.3536i |
| | 0.3266 − 0.1353i |
| | 0.2500 + 0.2500i |
| | −0.1353 + 0.3266i |
| ans(:, :, 4, 12) = | 0.3536 |
| | 0.0000 + 0.3536i |
| | −0.3536 + 0.0000i |
| | −0.0000 − 0.3536i |
| | 0 − 0.3536i |
| | 0.3536 − 0.0000i |
| | 0.0000 + 0.3536i |
| | −0.3536 + 0.0000i |
| ans(:, :, 5, 12) = | 0.3536 |
| | −0.1353 + 0.3266i |
| | −0.2500 − 0.2500i |
| | 0.3266 − 0.1353i |
| | 0 − 0.3536i |
| | 0.3266 + 0.1353i |
| | −0.2500 + 0.2500i |
| | −0.1353 − 0.3266i |
| ans(:, :, 6, 12) = | 0.3536 |
| | −0.2500 + 0.2500i |
| | −0.0000 − 0.3536i |
| | 0.2500 + 0.2500i |
| | 0 − 0.3536i |
| | 0.2500 + 0.2500i |
| | −0.3536 + 0.0000i |
| | 0.2500 − 0.2500i |

-continued ans(:, :, 7, 12) = 0.3536
−0.3266 + 0.1353i
0.2500 − 0.2500i
−0.1353 + 0.3266i
0 − 0.3536i
0.1353 + 0.3266i
−0.2500 − 0.2500i
0.3266 + 0.1353i ans(:, :, 8, 12) = 0.3536
−0.3536 + 0.0000i
0.3536 − 0.0000i
−0.3536 + 0.0000i
0 − 0.3536i
0.0000 + 0.3536i
−0.0000 − 0.3536i
0.0000 + 0.3536i ans(:, :, 9, 12) = 0.3536
−0.3266 − 0.1353i
0.2500 + 0.2500i
−0.1353 − 0.3266i
0 − 0.3536i
−0.1353 + 0.3266i
0.2500 − 0.2500i
−0.3266 + 0.1353i ans(:, :, 10, 12) = 0.3536
−0.2500 − 0.2500i
0.0000 + 0.3536i
0.2500 − 0.2500i
0 − 0.3536i
−0.2500 + 0.2500i
0.3536 − 0.0000i
−0.2500 − 0.2500i ans(:, :, 11, 12) = 0.3536
−0.1353 − 0.3266i
−0.2500 + 0.2500i
0.3266 + 0.1353i
0 − 0.3536i
−0.3266 + 0.1353i
0.2500 + 0.2500i
0.1353 − 0.3266i ans(:, :, 12, 12) = 0.3536
−0.0000 − 0.3536i
−0.3536 + 0.0000i
0.0000 + 0.3536i
0 − 0.3536i
−0.3536 + 0.0000i
0.0000 + 0.3536i
0.3536 − 0.0000i ans(:, :, 13, 12) = 0.3536
0.1353 − 0.3266i
−0.2500 − 0.2500i
−0.3266 + 0.1353i
0 − 0.3536i
−0.3266 − 0.1353i
−0.2500 + 0.2500i
0.1353 + 0.3266i ans(:, :, 14, 12) = 0.3536
0.2500 − 0.2500i
−0.0000 − 0.3536i
−0.2500 − 0.2500i
0 − 0.3536i
−0.2500 − 0.2500i
−0.3536 + 0.0000i
−0.2500 + 0.2500i ans(:, :, 15, 12) = 0.3536
0.3266 − 0.1353i
0.2500 − 0.2500i
0.1353 − 0.3266i
0 − 0.3536i
−0.1353 − 0.3266i
−0.2500 − 0.2500i
−0.3266 − 0.1353i -continued

| | |
|---|---|
| ans(:, :, 16, 12) = | 0.3536 |
| | 0.3536 |
| | 0.3536 |
| | 0.3536 |
| | 0 − 0.3536i |
| | 0 − 0.3536i |
| | 0 − 0.3536i |
| | 0 − 0.3536i |
| ans(:, :, 1, 13) = | 0.3536 |
| | 0.2940 + 0.1964i |
| | 0.1353 + 0.3266i |
| | −0.0690 + 0.3468i |
| | 0.3536 |
| | 0.2940 + 0.1964i |
| | 0.1353 + 0.3266i |
| | −0.0690 + 0.3468i |
| ans(:, :, 2, 13) = | 0.3536 |
| | 0.1964 + 0.2940i |
| | −0.1353 + 0.3266i |
| | −0.3468 + 0.0690i |
| | 0.3536 |
| | 0.1964 + 0.2940i |
| | −0.1353 + 0.3266i |
| | −0.3468 + 0.0690i |
| ans(:, :, 3, 13) = | 0.3536 |
| | 0.0690 + 0.3468i |
| | −0.3266 + 0.1353i |
| | −0.1964 − 0.2940i |
| | 0.3536 |
| | 0.0690 + 0.3468i |
| | −0.3266 + 0.1353i |
| | −0.1964 − 0.2940i |
| ans(:, :, 4, 13) = | 0.3536 |
| | −0.0690 + 0.3468i |
| | −0.3266 − 0.1353i |
| | 0.1964 − 0.2940i |
| | 0.3536 |
| | −0.0690 + 0.3468i |
| | −0.3266 − 0.1353i |
| | 0.1964 − 0.2940i |
| ans(:, :, 5, 13) = | 0.3536 |
| | −0.1964 + 0.2940i |
| | −0.1353 − 0.3266i |
| | 0.3468 + 0.0690i |
| | 0.3536 |
| | −0.1964 + 0.2940i |
| | −0.1353 − 0.3266i |
| | 0.3468 + 0.0690i |
| ans(:, :, 6, 13) = | 0.3536 |
| | −0.2940 + 0.1964i |
| | 0.1353 − 0.3266i |
| | 0.0690 + 0.3468i |
| | 0.3536 |
| | −0.2940 + 0.1964i |
| | 0.1353 − 0.3266i |
| | 0.0690 + 0.3468i |
| ans(:, :, 7, 13) = | 0.3536 |
| | −0.3468 + 0.0690i |
| | 0.3266 − 0.1353i |
| | −0.2940 + 0.1964i |
| | 0.3536 |
| | −0.3468 + 0.0690i |
| | 0.3266 − 0.1353i |
| | −0.2940 + 0.1964i |
| ans(:, :, 8, 13) = | 0.3536 |
| | −0.3468 − 0.0690i |
| | 0.3266 + 0.1353i |
| | −0.2940 − 0.1964i |
| | 0.3536 |
| | −0.3468 − 0.0690i |
| | 0.3266 + 0.1353i |
| | −0.2940 − 0.1964i |

-continued

| | |
|---|---|
| ans(:, :, 9, 13) = | 0.3536 |
| | −0.2940 − 0.1964i |
| | 0.1353 + 0.3266i |
| | 0.0690 − 0.3468i |
| | 0.3536 |
| | −0.2940 − 0.1964i |
| | 0.1353 + 0.3266i |
| | 0.0690 − 0.3468i |
| ans(:, :, 10, 13) = | 0.3536 |
| | −0.1964 − 0.2940i |
| | −0.1353 + 0.3266i |
| | 0.3468 − 0.0690i |
| | 0.3536 |
| | −0.1964 − 0.2940i |
| | −0.1353 + 0.3266i |
| | 0.3468 − 0.0690i |
| ans(:, :, 11, 13) = | 0.3536 |
| | −0.0690 − 0.3468i |
| | −0.3266 + 0.1353i |
| | 0.1964 + 0.2940i |
| | 0.3536 |
| | −0.0690 − 0.3468i |
| | −0.3266 + 0.1353i |
| | 0.1964 + 0.2940i |
| ans(:, :, 12, 13) = | 0.3536 |
| | 0.0690 − 0.3468i |
| | −0.3266 − 0.1353i |
| | −0.1964 + 0.2940i |
| | 0.3536 |
| | 0.0690 − 0.3468i |
| | −0.3266 − 0.1353i |
| | −0.1964 + 0.2940i |
| ans(:, :, 13, 13) = | 0.3536 |
| | 0.1964 − 0.2940i |
| | −0.1353 − 0.3266i |
| | −0.3468 − 0.0690i |
| | 0.3536 |
| | 0.1964 − 0.2940i |
| | −0.1353 − 0.3266i |
| | −0.3468 − 0.0690i |
| ans(:, :, 14, 13) = | 0.3536 |
| | 0.2940 − 0.1964i |
| | 0.1353 − 0.3266i |
| | −0.0690 − 0.3468i |
| | 0.3536 |
| | 0.2940 − 0.1964i |
| | 0.1353 − 0.3266i |
| | −0.0690 − 0.3468i |
| ans(:, :, 15, 13) = | 0.3536 |
| | 0.3468 − 0.0690i |
| | 0.3266 − 0.1353i |
| | 0.2940 − 0.1964i |
| | 0.3536 |
| | 0.3468 − 0.0690i |
| | 0.3266 − 0.1353i |
| | 0.2940 − 0.1964i |
| ans(:, :, 16, 13) = | 0.3536 |
| | 0.3468 + 0.0690i |
| | 0.3266 + 0.1353i |
| | 0.2940 + 0.1964i |
| | 0.3536 |
| | 0.3468 + 0.0690i |
| | 0.3266 + 0.1353i |
| | 0.2940 + 0.1964i |
| ans(:, :, 1, 14) = | 0.3536 |
| | 0.2940 + 0.1964i |
| | 0.1353 + 0.3266i |
| | −0.0690 + 0.3468i |
| | 0 + 0.3536i |
| | −0.1964 + 0.2940i |
| | −0.3266 + 0.1353i |
| | −0.3468 − 0.0690i |

-continued ans(:, :, 2, 14) = 0.3536
0.1964 + 0.2940i
−0.1353 + 0.3266i
−0.3468 + 0.0690i
0 + 0.3536i
−0.2940 + 0.1964i
−0.3266 − 0.1353i
−0.0690 − 0.3468i ans(:, :, 3, 14) = 0.3536
0.0690 + 0.3468i
−0.3266 + 0.1353i
−0.1964 − 0.2940i
0 + 0.3536i
−0.3468 + 0.0690i
−0.1353 − 0.3266i
0.2940 − 0.1964i ans(:, :, 4, 14) = 0.3536
−0.0690 + 0.3468i
−0.3266 − 0.1353i
0.1964 − 0.2940i
0 + 0.3536i
−0.3468 − 0.0690i
0.1353 − 0.3266i
0.2940 + 0.1964i ans(:, :, 5, 14) = 0.3536
−0.1964 + 0.2940i
−0.1353 − 0.3266i
0.3468 + 0.0690i
0 + 0.3536i
−0.2940 − 0.1964i
0.3266 − 0.1353i
−0.0690 + 0.3468i ans(:, :, 6, 14) = 0.3536
−0.2940 + 0.1964i
0.1353 − 0.3266i
0.0690 + 0.3468i
0 + 0.3536i
−0.1964 − 0.2940i
0.3266 + 0.1353i
−0.3468 + 0.0690i ans(:, :, 7, 14) = 0.3536
−0.3468 + 0.0690i
0.3266 − 0.1353i
−0.2940 + 0.1964i
0 + 0.3536i
−0.0690 − 0.3468i
0.1353 + 0.3266i
−0.1964 − 0.2940i ans(:, :, 8, 14) = 0.3536
−0.3468 − 0.0690i
0.3266 + 0.1353i
−0.2940 − 0.1964i
0 + 0.3536i
0.0690 − 0.3468i
−0.1353 + 0.3266i
0.1964 − 0.2940i ans(:, :, 9, 14) = 0.3536
−0.2940 − 0.1964i
0.1353 + 0.3266i
0.0690 − 0.3468i
0 + 0.3536i
0.1964 − 0.2940i
−0.3266 + 0.1353i
0.3468 + 0.0690i ans(:, :, 10, 14) = 0.3536
−0.1964 − 0.2940i
−0.1353 + 0.3266i
0.3468 − 0.0690i
0 + 0.3536i
0.2940 − 0.1964i
−0.3266 − 0.1353i
0.0690 + 0.3468i

| | |
|---|---|
| ans(:, :, 11, 14) = | 0.3536 |
| | −0.0690 − 0.3468i |
| | −0.3266 + 0.1353i |
| | 0.1964 + 0.2940i |
| | 0 + 0.3536i |
| | 0.3468 − 0.0690i |
| | −0.1353 − 0.3266i |
| | −0.2940 + 0.1964i |
| ans(:, :, 12, 14) = | 0.3536 |
| | 0.0690 − 0.3468i |
| | −0.3266 − 0.1353i |
| | −0.1964 + 0.2940i |
| | 0 + 0.3536i |
| | 0.3468 + 0.0690i |
| | 0.1353 − 0.3266i |
| | −0.2940 − 0.1964i |
| (:, :, 13, 14) = | 0.3536 |
| | 00.1964 − 0.2940i |
| | −0.1353 − 0.3266i |
| | −0.3468 − 0.0690i |
| | 00 + 0.3536i |
| | 00.2940 + 0.1964i |
| | 00.3266 − 0.1353i |
| | 00.0690 − 0.3468i |
| (:, :, 14, 14) = | 0.3536 |
| | 00.2940 − 0.1964i |
| | 00.1353 − 0.3266i |
| | −0.0690 − 0.3468i |
| | 00 + 0.3536i |
| | 00.1964 + 0.2940i |
| | 00.3266 + 0.1353i |
| | 00.3468 − 0.0690i |
| (:, :, 15, 14) = | 0.3536 |
| | 00.3468 − 0.0690i |
| | 00.3266 − 0.1353i |
| | 00.2940 − 0.1964i |
| | 00 + 0.3536i |
| | 00.0690 + 0.3468i |
| | 00.1353 + 0.3266i |
| | 00.1964 + 0.2940i |
| (:, :, 16, 14) = | 0.3536 |
| | 00.3468 + 0.0690i |
| | 00.3266 + 0.1353i |
| | 00.2940 + 0.1964i |
| | 00 + 0.3536i |
| | −0.0690 + 0.3468i |
| | −0.1353 + 0.3266i |
| | −0.1964 + 0.2940i |
| (:, :, 1, 15) = | 0.3536 |
| | 00.2940 + 0.1964i |
| | 00.1353 + 0.3266i |
| | −0.0690 + 0.3468i |
| | −0.3536 |
| | −0.2940 − 0.1964i |
| | −0.1353 − 0.3266i |
| | 00.0690 − 0.3468i |
| (:, :, 2, 15) = | 0.3536 |
| | 00.1964 + 0.2940i |
| | −0.1353 + 0.3266i |
| | −0.3468 + 0.0690i |
| | −0.3536 |
| | −0.1964 − 0.2940i |
| | 00.1353 − 0.3266i |
| | 00.3468 − 0.0690i |
| (:, :, 3, 15) = | 0.3536 |
| | 00.0690 + 0.3468i |
| | −0.3266 + 0.1353i |
| | −0.1964 − 0.2940i |
| | −0.3536 |
| | −0.0690 − 0.3468i |
| | 00.3266 − 0.1353i |
| | 00.1964 + 0.2940i |

-continued (:, :, 4, 15) = 0.3536
−0.0690 + 0.3468i
−0.3266 − 0.1353i
00.1964 − 0.2940i
−0.3536
00.0690 − 0.3468i
00.3266 + 0.1353i
−0.1964 + 0.2940i
(:, :, 5, 15) = 0.3536
−0.1964 + 0.2940i
−0.1353 − 0.3266i
00.3468 + 0.0690i
−0.3536
00.1964 − 0.2940i
00.1353 + 0.3266i
−0.3468 − 0.0690i
(:, :, 6, 15) = 0.3536
−0.2940 + 0.1964i
00.1353 − 0.3266i
00.0690 + 0.3468i
−0.3536
00.2940 − 0.1964i
−0.1353 + 0.3266i
−0.0690 − 0.3468i
(:, :, 7, 15) = 0.3536
−0.3468 + 0.0690i
00.3266 − 0.1353i
−0.2940 + 0.1964i
−0.3536
00.3468 − 0.0690i
−0.3266 + 0.1353i
00.2940 − 0.1964i
(:, :, 8, 15) = 0.3536
−0.3468 − 0.0690i
00.3266 + 0.1353i
−0.2940 − 0.1964i
−0.3536
00.3468 + 0.0690i
−0.3266 − 0.1353i
00.2940 + 0.1964i
(:, :, 9, 15) = 0.3536
−0.2940 − 0.1964i
00.1353 + 0.3266i
00.0690 − 0.3468i
−0.3536
00.2940 + 0.1964i
−0.1353 − 0.3266i
−0.0690 + 0.3468i
(:, :, 10, 15) = 0.3536
−0.1964 − 0.2940i
−0.1353 + 0.3266i
00.3468 − 0.0690i
−0.3536
00.1964 + 0.2940i
00.1353 − 0.3266i
−0.3468 + 0.0690i
(:, :, 11, 15) = 0.3536
−0.0690 − 0.3468i
−0.3266 + 0.1353i
0.1964 + 0.2940i
−0.3536
0.0690 + 0.3468i
0.3266 − 0.1353i
−0.1964 − 0.2940i
(:, :, 12, 15) = 0.3536
00.0690 − 0.3468i
−0.3266 − 0.1353i
−0.1964 + 0.2940i
−0.3536
−0.0690 + 0.3468i
00.3266 + 0.1353i
00.1964 − 0.2940i -continued

| | |
|---|---|
| (:, :, 13, 15) = | 0.3536 |
| | 00.1964 − 0.2940i |
| | −0.1353 − 0.3266i |
| | −0.3468 − 0.0690i |
| | −0.3536 |
| | −0.1964 + 0.2940i |
| | 00.1353 + 0.3266i |
| | 00.3468 + 0.0690i |
| (:, :, 14, 15) = | 0.3536 |
| | 00.2940 − 0.1964i |
| | 00.1353 − 0.3266i |
| | −0.0690 − 0.3468i |
| | −0.3536 |
| | −0.2940 + 0.1964i |
| | −0.1353 + 0.3266i |
| | 00.0690 + 0.3468i |
| (:, :, 15, 15) = | 0.3536 |
| | 00.3468 − 0.0690i |
| | 00.3266 − 0.1353i |
| | 00.2940 − 0.1964i |
| | −0.3536 |
| | −0.3468 + 0.0690i |
| | −0.3266 + 0.1353i |
| | −0.2940 + 0.1964i |
| (:, :, 16, 15) = | 0.3536 |
| | 00.3468 + 0.0690i |
| | 00.3266 + 0.1353i |
| | 00.2940 + 0.1964i |
| | −0.3536 |
| | −0.3468 − 0.0690i |
| | −0.3266 − 0.1353i |
| | −0.2940 − 0.1964i |
| (:, :, 1, 16) = | 0.3536 |
| | 00.2940 + 0.1964i |
| | 00.1353 + 0.3266i |
| | −0.0690 + 0.3468i |
| | 00 − 0.3536i |
| | 00.1964 − 0.2940i |
| | 00.3266 − 0.1353i |
| | 00.3468 + 0.0690i |
| (:, :, 2, 16) = | 0.3536 |
| | 00.1964 + 0.2940i |
| | −0.1353 + 0.3266i |
| | −0.3468 + 0.0690i |
| | 00 − 0.3536i |
| | 00.2940 − 0.1964i |
| | 00.3266 + 0.1353i |
| | 00.0690 + 0.3468i |
| (:, :, 3, 16) = | 0.3536 |
| | 00.0690 + 0.3468i |
| | −0.3266 + 0.1353i |
| | −0.1964 − 0.2940i |
| | 00 − 0.3536i |
| | 00.3468 − 0.0690i |
| | 00.1353 + 0.3266i |
| | −0.2940 + 0.1964i |
| (:, :, 4, 16) = | 0.3536 |
| | −0.0690 + 0.3468i |
| | −0.3266 − 0.1353i |
| | 00.1964 − 0.2940i |
| | 00 − 0.3536i |
| | 00.3468 + 0.0690i |
| | −0.1353 + 0.3266i |
| | −0.2940 − 0.1964i |
| aans(:, :, 5, 16) = | 0.3536 |
| | −0.1964 + 0.2940i |
| | −0.1353 − 0.3266i |
| | 00.3468 + 0.0690i |
| | 00 − 0.3536i |
| | 00.2940 + 0.1964i |
| | −0.3266 + 0.1353i |
| | 00.0690 − 0.3468i |

-continued

| | |
|---|---|
| aans(:, :, 6, 16) = | 0.3536 |
| | −0.2940 + 0.1964i |
| | 00.1353 − 0.3266i |
| | 00.0690 + 0.3468i |
| | 00 − 0.3536i |
| | 00.1964 + 0.2940i |
| | −0.3266 − 0.1353i |
| | 00.3468 − 0.0690i |
| aans(:, :, 7, 16) = | 0.3536 |
| | −0.3468 + 0.0690i |
| | 00.3266 − 0.1353i |
| | −0.2940 + 0.1964i |
| | 00 − 0.3536i |
| | 00.0690 + 0.3468i |
| | −0.1353 − 0.3266i |
| | 00.1964 + 0.2940i |
| (:, :, 8, 16) = | 0.3536 |
| | −0.3468 − 0.0690i |
| | 0.3266 + 0.1353i |
| | −0.2940 − 0.1964i |
| | 0 − 0.3536i |
| | −0.0690 + 0.3468i |
| | 0.1353 − 0.3266i |
| | −0.1964 + 0.2940i |
| (:, :, 9, 16) = | 0.3536 |
| | −0.2940 − 0.1964i |
| | 0.1353 + 0.3266i |
| | 0.0690 − 0.3468i |
| | 0 − 0.3536i |
| | −0.1964 + 0.2940i |
| | 0.3266 − 0.1353i |
| | −0.3468 − 0.0690i |
| (:, :, 10, 16) = | 0.3536 |
| | −0.1964 − 0.2940i |
| | −0.1353 + 0.3266i |
| | 0.3468 − 0.0690i |
| | 0 − 0.3536i |
| | −0.2940 + 0.1964i |
| | 0.3266 + 0.1353i |
| | −0.0690 − 0.3468i |
| (:, :, 11, 16) = | 0.3536 |
| | −0.0690 − 0.3468i |
| | −0.3266 + 0.1353i |
| | 0.1964 + 0.2940i |
| | 0 − 0.3536i |
| | −0.3468 + 0.0690i |
| | 0.1353 + 0.3266i |
| | 0.2940 − 0.1964i |
| (:, :, 12, 16) = | 0.3536 |
| | 0.0690 − 0.3468i |
| | −0.3266 − 0.1353i |
| | −0.1964 + 0.2940i |
| | 0 − 0.3536i |
| | −0.3468 − 0.0690i |
| | −0.1353 + 0.3266i |
| | 0.2940 + 0.1964i |
| (:, :, 13, 16) = | 0.3536 |
| | 0.1964 − 0.2940i |
| | −0.1353 − 0.3266i |
| | −0.3468 − 0.0690i |
| | 0 − 0.3536i |
| | −0.2940 − 0.1964i |
| | −0.3266 + 0.1353i |
| | −0.0690 + 0.3468i |
| (:, :, 14, 16) = | 0.3536 |
| | 0.2940 − 0.1964i |
| | 0.1353 − 0.3266i |
| | −0.0690 − 0.3468i |
| | 0 − 0.3536i |
| | −0.1964 − 0.2940i |
| | −0.3266 − 0.1353i |
| | −0.3468 + 0.0690i |

-continued

| | | |
|---|---|---|
| (:, :, 15, 16) = | 0.3536 | |
| | 0.3468 − 0.0690i | |
| | 0.3266 − 0.1353i | |
| | 0.2940 − 0.1964i | |
| | 0 − 0.3536i | |
| | −0.0690 − 0.3468i | |
| | −0.1353 − 0.3266i | |
| | −0.1964 − 0.2940i | |
| (:, :, 16, 16) = | 0.3536 | |
| | 0.3468 + 0.0690i | |
| | 0.3266 + 0.1353i | |
| | 0.2940 + 0.1964i | |
| | 0 − 0.3536i | |
| | 0.0690 − 0.3468i | |
| | 0.1353 − 0.3266i | |
| | 0.1964 − 0.2940i | |

Rank 2

| | | |
|---|---|---|
| (:, :, 1, 1) = | 0.2500 | 0.2500 |
| | 0.2500 | 0.2500 |
| | 0.2500 | 0.2500 |
| | 0.2500 | 0.2500 |
| | 0.2500 | −0.2500 |
| | 0.2500 | −0.2500 |
| | 0.2500 | −0.2500 |
| | 0.2500 | −0.2500 |
| (:, :, 2, 1) = | 0.2500 | 0.2500 |
| | 0.2310 + 0.0957i | 0.2310 + 0.0957i |
| | 0.1768 + 0.1768i | 0.1768 + 0.1768i |
| | 0.0957 + 0.2310i | 0.0957 + 0.2310i |
| | 0.2500 | −0.2500 |
| | 0.2310 + 0.0957i | −0.2310 − 0.0957i |
| | 0.1768 + 0.1768i | −0.1768 − 0.1768i |
| | 0.0957 + 0.2310i | −0.0957 − 0.2310i |
| (:, :, 3, 1) = | 0.2500 | 0.2500 |
| | 0.1768 + 0.1768i | 0.1768 + 0.1768i |
| | 0.0000 + 0.2500i | 0.0000 + 0.2500i |
| | −0.1768 + 0.1768i | −0.1768 + 0.1768i |
| | 0.2500 | −0.2500 |
| | 0.1768 + 0.1768i | −0.1768 − 0.1768i |
| | 0.0000 + 0.2500i | −0.0000 − 0.2500i |
| | −0.1768 + 0.1768i | 0.1768 − 0.1768i |
| (:, :, 4, 1) = | 0.2500 | 0.2500 |
| | 0.0957 + 0.2310i | 0.0957 + 0.2310i |
| | −0.1768 + 0.1768i | −0.1768 + 0.1768i |
| | −0.2310 − 0.0957i | −0.2310 − 0.0957i |
| | 0.2500 | −0.2500 |
| | 0.0957 + 0.2310i | −0.0957 − 0.2310i |
| | −0.1768 + 0.1768i | 0.1768 − 0.1768i |
| | −0.2310 − 0.0957i | 0.2310 + 0.0957i |
| (:, :, 5, 1) = | 0.2500 | 0.2500 |
| | 0.0000 + 0.2500i | 0.0000 + 0.2500i |
| | −0.2500 + 0.0000i | −0.2500 + 0.0000i |
| | −0.0000 − 0.2500i | −0.0000 − 0.2500i |
| | 0.2500 | −0.2500 |
| | 0.0000 + 0.2500i | −0.0000 − 0.2500i |
| | −0.2500 + 0.0000i | 0.2500 − 0.0000i |
| | −0.0000 − 0.2500i | 0.0000 + 0.2500i |
| (:, :, 6, 1) = | 0.2500 | 0.2500 |
| | −0.0957 + 0.2310i | −0.0957 + 0.2310i |
| | −0.1768 − 0.1768i | −0.1768 − 0.1768i |
| | 0.2310 − 0.0957i | 0.2310 − 0.0957i |
| | 0.2500 | −0.2500 |
| | −0.0957 + 0.2310i | 0.0957 − 0.2310i |
| | −0.1768 − 0.1768i | 0.1768 + 0.1768i |
| | 0.2310 − 0.0957i | −0.2310 + 0.0957i |
| (:, :, 7, 1) = | 0.2500 | 0.2500 |
| | −0.1768 + 0.1768i | −0.1768 + 0.1768i |
| | −0.0000 − 0.2500i | −0.0000 − 0.2500i |
| | 0.1768 + 0.1768i | 0.1768 + 0.1768i |
| | 0.2500 | −0.2500 |
| | −0.1768 + 0.1768i | 0.1768 − 0.1768i |
| | −0.0000 − 0.2500i | 0.0000 + 0.2500i |
| | 0.1768 + 0.1768i | −0.1768 − 0.1768i |
| (:, :, 8, 1) = | 0.2500 | 0.2500 |
| | −0.2310 + 0.0957i | −0.2310 + 0.0957i |
| | 0.1768 − 0.1768i | 0.1768 − 0.1768i |
| | −0.0957 + 0.2310i | −0.0957 + 0.2310i |

|            |                    |                    |
|------------|--------------------|--------------------|
|            | 0.2500             | −0.2500            |
|            | −0.2310 + 0.0957i  | 0.2310 − 0.0957i   |
|            | 0.1768 − 0.1768i   | −0.1768 + 0.1768i  |
|            | −0.0957 + 0.2310i  | 0.0957 − 0.2310i   |
| (:, :, 9, 1) = | 0.2500         | 0.2500             |
|            | −0.2500 + 0.0000i  | −0.2500 + 0.0000i  |
|            | 0.2500 − 0.0000i   | 0.2500 − 0.0000i   |
|            | −0.2500 + 0.0000i  | −0.2500 + 0.0000i  |
|            | 0.2500             | −0.2500            |
|            | −0.2500 + 0.0000i  | 0.2500 − 0.0000i   |
|            | 0.2500 − 0.0000i   | −0.2500 + 0.0000i  |
|            | −0.2500 + 0.0000i  | 0.2500 − 0.0000i   |
| (:, :, 10, 1) = | 0.2500        | 0.2500             |
|            | −0.2310 − 0.0957i  | −0.2310 − 0.0957i  |
|            | 0.1768 + 0.1768i   | 0.1768 + 0.1768i   |
|            | −0.0957 − 0.2310i  | −0.0957 − 0.2310i  |
|            | 0.2500             | −0.2500            |
|            | −0.2310 − 0.0957i  | 0.2310 + 0.0957i   |
|            | 0.1768 + 0.1768i   | −0.1768 − 0.1768i  |
|            | −0.0957 − 0.2310i  | 0.0957 + 0.2310i   |
| (:, :, 11, 1) = | 0.2500        | 0.2500             |
|            | −0.1768 − 0.1768i  | −0.1768 − 0.1768i  |
|            | 0.0000 + 0.2500i   | 0.0000 + 0.2500i   |
|            | 0.1768 − 0.1768i   | 0.1768 − 0.1768i   |
|            | 0.2500             | −0.2500            |
|            | −0.1768 − 0.1768i  | 0.1768 + 0.1768i   |
|            | 0.0000 + 0.2500i   | −0.0000 − 0.2500i  |
|            | 0.1768 − 0.1768i   | −0.1768 + 0.1768i  |
| (:, :, 12, 1) = | 0.2500        | 0.2500             |
|            | −0.0957 − 0.2310i  | −0.0957 − 0.2310i  |
|            | −0.1768 + 0.1768i  | −0.1768 + 0.1768i  |
|            | 0.2310 + 0.0957i   | 0.2310 + 0.0957i   |
|            | 0.2500             | −0.2500            |
|            | −0.0957 − 0.2310i  | 0.0957 + 0.2310i   |
|            | −0.1768 + 0.1768i  | 0.1768 − 0.1768i   |
|            | 0.2310 + 0.0957i   | −0.2310 − 0.0957i  |
| (:, :, 13, 1) = | 0.2500        | 0.2500             |
|            | −0.0000 − 0.2500i  | −0.0000 − 0.2500i  |
|            | −0.2500 + 0.0000i  | −0.2500 + 0.0000i  |
|            | 0.0000 + 0.2500i   | 0.0000 + 0.2500i   |
|            | 0.2500             | −0.2500            |
|            | −0.0000 − 0.2500i  | 0.0000 + 0.2500i   |
|            | −0.2500 + 0.0000i  | 0.2500 − 0.0000i   |
|            | 0.0000 + 0.2500i   | −0.0000 − 0.2500i  |
| (:, :, 14, 1) = | 0.2500        | 0.2500             |
|            | 0.0957 − 0.2310i   | 0.0957 − 0.2310i   |
|            | −0.1768 − 0.1768i  | −0.1768 − 0.1768i  |
|            | −0.2310 + 0.0957i  | −0.2310 + 0.0957i  |
|            | 0.2500             | −0.2500            |
|            | 0.0957 − 0.2310i   | −0.0957 + 0.2310i  |
|            | −0.1768 − 0.1768i  | 0.1768 + 0.1768i   |
|            | −0.2310 + 0.0957i  | 0.2310 − 0.0957i   |
| (:, :, 15, 1) = | 0.2500        | 0.2500             |
|            | 0.1768 − 0.1768i   | 0.1768 − 0.1768i   |
|            | −0.0000 − 0.2500i  | −0.0000 − 0.2500i  |
|            | −0.1768 − 0.1768i  | −0.1768 − 0.1768i  |
|            | 0.2500             | −0.2500            |
|            | 0.1768 − 0.1768i   | −0.1768 + 0.1768i  |
|            | −0.0000 − 0.2500i  | 0.0000 + 0.2500i   |
|            | −0.1768 − 0.1768i  | 0.1768 + 0.1768i   |
| (:, :, 16, 1) = | 0.2500        | 0.2500             |
|            | 0.2310 − 0.0957i   | 0.2310 − 0.0957i   |
|            | 0.1768 − 0.1768i   | 0.1768 − 0.1768i   |
|            | 0.0957 − 0.2310i   | 0.0957 − 0.2310i   |
|            | 0.2500             | −0.2500            |
|            | 0.2310 − 0.0957i   | −0.2310 + 0.0957i  |
|            | 0.1768 − 0.1768i   | −0.1768 + 0.1768i  |
|            | 0.0957 − 0.2310i   | −0.0957 + 0.2310i  |
| (:, :, 1, 2) = | 0.2500         | 0.2500             |
|            | 0.2500             | 0.2500             |
|            | 0.2500             | 0.2500             |
|            | 0.2500             | 0.2500             |
|            | 0 + 0.2500i        | 0 − 0.2500i        |
|            | 0 + 0.2500i        | 0 − 0.2500i        |
|            | 0 + 0.2500i        | 0 − 0.2500i        |
|            | 0 + 0.2500i        | 0 − 0.2500i        |
| (:, :, 2, 2) = | 0.2500         | 0.2500             |
|            | 0.2310 + 0.0957i   | 0.2310 + 0.0957i   |
|            | 0.1768 + 0.1768i   | 0.1768 + 0.1768i   |

-continued

|  |  |  |
|---|---|---|
| | 0.0957 + 0.2310i | 0.0957 + 0.2310i |
| | 0 + 0.2500i | 0 − 0.2500i |
| | −0.0957 + 0.2310i | 0.0957 − 0.2310i |
| | −0.1768 + 0.1768i | 0.1768 − 0.1768i |
| | −0.2310 + 0.0957i | 0.2310 − 0.0957i |
| (:, :, 3, 2) = | 0.2500 | 0.2500 |
| | 0.1768 + 0.1768i | 0.1768 + 0.1768i |
| | 0.0000 + 0.2500i | 0.0000 + 0.2500i |
| | −0.1768 + 0.1768i | −0.1768 + 0.1768i |
| | 0 + 0.2500i | 0 − 0.2500i |
| | −0.1768 + 0.1768i | 0.1768 − 0.1768i |
| | −0.2500 + 0.0000i | 0.2500 − 0.0000i |
| | −0.1768 − 0.1768i | 0.1768 + 0.1768i |
| (:, :, 4, 2) = | 0.2500 | 0.2500 |
| | 0.0957 + 0.2310i | 0.0957 + 0.2310i |
| | −0.1768 + 0.1768i | −0.1768 + 0.1768i |
| | −0.2310 − 0.0957i | −0.2310 − 0.0957i |
| | 0 + 0.2500i | 0 − 0.2500i |
| | −0.2310 + 0.0957i | 0.2310 − 0.0957i |
| | −0.1768 − 0.1768i | 0.1768 + 0.1768i |
| | 0.0957 − 0.2310i | −0.0957 + 0.2310i |
| (:, :, 5, 2) = | 0.2500 | 0.2500 |
| | 0.0000 + 0.2500i | 0.0000 + 0.2500i |
| | −0.2500 + 0.0000i | −0.2500 + 0.0000i |
| | −0.0000 − 0.2500i | −0.0000 − 0.2500i |
| | 0 + 0.2500i | 0 − 0.2500i |
| | −0.2500 + 0.0000i | 0.2500 − 0.0000i |
| | −0.0000 − 0.2500i | 0.0000 + 0.2500i |
| | 0.2500 − 0.0000i | −0.2500 + 0.0000i |
| (:, :, 6, 2) = | 0.2500 | 0.2500 |
| | −0.0957 + 0.2310i | −0.0957 + 0.2310i |
| | −0.1768 − 0.1768i | −0.1768 − 0.1768i |
| | 0.2310 − 0.0957i | 0.2310 − 0.0957i |
| | 0 + 0.2500i | 0 − 0.2500i |
| | −0.2310 − 0.0957i | 0.2310 + 0.0957i |
| | 0.1768 − 0.1768i | −0.1768 + 0.1768i |
| | 0.0957 + 0.2310i | −0.0957 − 0.2310i |
| (:, :, 7, 2) = | 0.2500 | 0.2500 |
| | −0.1768 + 0.1768i | −0.1768 + 0.1768i |
| | −0.0000 − 0.2500i | −0.0000 − 0.2500i |
| | 0.1768 + 0.1768i | 0.1768 + 0.1768i |
| | 0 + 0.2500i | 0 − 0.2500i |
| | −0.1768 − 0.1768i | 0.1768 + 0.1768i |
| | 0.2500 − 0.0000i | −0.2500 + 0.0000i |
| | −0.1768 + 0.1768i | 0.1768 − 0.1768i |
| (:, :, 8, 2) = | 0.2500 | 0.2500 |
| | −0.2310 + 0.0957i | −0.2310 + 0.0957i |
| | 0.1768 − 0.1768i | 0.1768 − 0.1768i |
| | −0.0957 + 0.2310i | −0.0957 + 0.2310i |
| | 0 + 0.2500i | 0 − 0.2500i |
| | −0.0957 − 0.2310i | 0.0957 + 0.2310i |
| | 0.1768 + 0.1768i | −0.1768 − 0.1768i |
| | −0.2310 − 0.0957i | 0.2310 + 0.0957i |
| (:, :, 9, 2) = | 0.2500 | 0.2500 |
| | −0.2500 + 0.0000i | −0.2500 + 0.0000i |
| | 0.2500 − 0.0000i | 0.2500 − 0.0000i |
| | −0.2500 + 0.0000i | −0.2500 + 0.0000i |
| | 0 + 0.2500i | 0 − 0.2500i |
| | −0.0000 − 0.2500i | 0.0000 + 0.2500i |
| | 0.0000 + 0.2500i | −0.0000 − 0.2500i |
| | −0.0000 − 0.2500i | 0.0000 + 0.2500i |
| (:, :, 10, 2) = | 0.2500 | 0.2500 |
| | −0.2310 − 0.0957i | −0.2310 − 0.0957i |
| | 0.1768 + 0.1768i | 0.1768 + 0.1768i |
| | −0.0957 − 0.2310i | −0.0957 − 0.2310i |
| | 0 + 0.2500i | 0 − 0.2500i |
| | 0.0957 − 0.2310i | −0.0957 + 0.2310i |
| | −0.1768 + 0.1768i | 0.1768 − 0.1768i |
| | 0.2310 − 0.0957i | −0.2310 + 0.0957i |
| (:, :, 11, 2) = | 0.2500 | 0.2500 |
| | −0.1768 − 0.1768i | −0.1768 − 0.1768i |
| | 0.0000 + 0.2500i | 0.0000 + 0.2500i |
| | 0.1768 − 0.1768i | 0.1768 − 0.1768i |
| | 0 + 0.2500i | 0 − 0.2500i |
| | 0.1768 − 0.1768i | −0.1768 + 0.1768i |
| | −0.2500 + 0.0000i | 0.2500 − 0.0000i |
| | 0.1768 + 0.1768i | −0.1768 − 0.1768i |
| (:, :, 12, 2) = | 0.2500 | 0.2500 |
| | −0.0957 − 0.2310i | −0.0957 − 0.2310i |

|                  | -continued |                  |
|------------------|------------|------------------|
|                  | −0.1768 + 0.1768i | −0.1768 + 0.1768i |
|                  | 0.2310 + 0.0957i  | 0.2310 + 0.0957i  |
|                  | 0 + 0.2500i       | 0 − 0.2500i       |
|                  | 0.2310 − 0.0957i  | −0.2310 + 0.0957i |
|                  | −0.1768 − 0.1768i | 0.1768 + 0.1768i  |
|                  | −0.0957 + 0.2310i | 0.0957 − 0.2310i  |
| (:, :, 13, 2) =  | 0.2500            | 0.2500            |
|                  | −0.0000 − 0.2500i | −0.0000 − 0.2500i |
|                  | −0.2500 + 0.0000i | −0.2500 + 0.0000i |
|                  | 0.0000 + 0.2500i  | 0.0000 + 0.2500i  |
|                  | 0 + 0.2500i       | 0 − 0.2500i       |
|                  | 0.2500 − 0.0000i  | −0.2500 + 0.0000i |
|                  | −0.0000 − 0.2500i | 0.0000 + 0.2500i  |
|                  | −0.2500 + 0.0000i | 0.2500 − 0.0000i  |
| (:, :, 14, 2) =  | 0.2500            | 0.2500            |
|                  | 0.0957 − 0.2310i  | 0.0957 − 0.2310i  |
|                  | −0.1768 − 0.1768i | −0.1768 − 0.1768i |
|                  | −0.2310 + 0.0957i | −0.2310 + 0.0957i |
|                  | 0 + 0.2500i       | 0 − 0.2500i       |
|                  | 0.2310 + 0.0957i  | −0.2310 − 0.0957i |
|                  | 0.1768 − 0.1768i  | −0.1768 + 0.1768i |
|                  | −0.0957 − 0.2310i  | 0.0957 + 0.2310i  |
| (:, :, 15, 2) =  | 0.2500            | 0.2500            |
|                  | 0.1768 − 0.1768i  | 0.1768 − 0.1768i  |
|                  | −0.0000 − 0.2500i | −0.0000 − 0.2500i |
|                  | −0.1768 − 0.1768i | −0.1768 − 0.1768i |
|                  | 0 + 0.2500i       | 0 − 0.2500i       |
|                  | 0.1768 + 0.1768i  | −0.1768 − 0.1768i |
|                  | 0.2500 − 0.0000i  | −0.2500 + 0.0000i |
|                  | 0.1768 − 0.1768i  | −0.1768 + 0.1768i |
| (:, :, 16, 2) =  | 0.2500            | 0.2500            |
|                  | 0.2310 − 0.0957i  | 0.2310 − 0.0957i  |
|                  | 0.1768 − 0.1768i  | 0.1768 − 0.1768i  |
|                  | 0.0957 − 0.2310i  | 0.0957 − 0.2310i  |
|                  | 0 + 0.2500i       | 0 − 0.2500i       |
|                  | 0.0957 + 0.2310i  | −0.0957 − 0.2310i |
|                  | 0.1768 + 0.1768i  | −0.1768 − 0.1768i |
|                  | 0.2310 + 0.0957i  | −0.2310 − 0.0957i |
| (:, :, 1, 3) =   | 0.2500            | 0.2500            |
|                  | 0.2452 + 0.0488i  | 0.2452 + 0.0488i  |
|                  | 0.2310 + 0.0957i  | 0.2310 + 0.0957i  |
|                  | 0.2079 + 0.1389i  | 0.2079 + 0.1389i  |
|                  | 0.2500            | −0.2500           |
|                  | 0.2452 + 0.0488i  | −0.2452 − 0.0488i |
|                  | 0.2310 + 0.0957i  | −0.2310 − 0.0957i |
|                  | 0.2079 + 0.1389i  | −0.2079 − 0.1389i |
| (:, :, 2, 3) =   | 0.2500            | 0.2500            |
|                  | 0.2079 + 0.1389i  | 0.2079 + 0.1389i  |
|                  | 0.0957 + 0.2310i  | 0.0957 + 0.2310i  |
|                  | −0.0488 + 0.2452i | −0.0488 + 0.2452i |
|                  | 0.2500            | −0.2500           |
|                  | 0.2079 + 0.1389i  | −0.2079 − 0.1389i |
|                  | 0.0957 + 0.2310i  | −0.0957 − 0.2310i |
|                  | −0.0488 + 0.2452i | 0.0488 − 0.2452i  |
| (:, :, 3, 3) =   | 0.2500            | 0.2500            |
|                  | 0.1389 + 0.2079i  | 0.1389 + 0.2079i  |
|                  | −0.0957 + 0.2310i | −0.0957 + 0.2310i |
|                  | −0.2452 + 0.0488i | −0.2452 + 0.0488i |
|                  | 0.2500            | −0.2500           |
|                  | 0.1389 + 0.2079i  | −0.1389 − 0.2079i |
|                  | −0.0957 + 0.2310i | 0.0957 − 0.2310i  |
|                  | −0.2452 + 0.0488i | 0.2452 − 0.0488i  |
| (:, :, 4, 3) =   | 0.2500            | 0.2500            |
|                  | 0.0488 + 0.2452i  | 0.0488 + 0.2452i  |
|                  | −0.2310 + 0.0957i | −0.2310 + 0.0957i |
|                  | −0.1389 − 0.2079i | −0.1389 − 0.2079i |
|                  | 0.2500            | −0.2500           |
|                  | 0.0488 + 0.2452i  | −0.0488 − 0.2452i |
|                  | −0.2310 + 0.0957i | 0.2310 − 0.0957i  |
|                  | −0.1389 − 0.2079i | 0.1389 + 0.2079i  |
| (:, :, 5, 3) =   | 0.2500            | 0.2500            |
|                  | −0.0488 + 0.2452i | −0.0488 + 0.2452i |
|                  | −0.2310 − 0.0957i | −0.2310 − 0.0957i |
|                  | 0.1389 − 0.2079i  | 0.1389 − 0.2079i  |
|                  | 0.2500            | −0.2500           |
|                  | −0.0488 + 0.2452i | 0.0488 − 0.2452i  |
|                  | −0.2310 − 0.0957i | 0.2310 + 0.0957i  |
|                  | 0.1389 − 0.2079i  | −0.1389 + 0.2079i |

-continued

| | | |
|---|---|---|
| (:, :, 6, 3) = | 0.2500 | 0.2500 |
| | −0.1389 + 0.2079i | −0.1389 + 0.2079i |
| | −0.0957 − 0.2310i | −0.0957 − 0.2310i |
| | 0.2452 + 0.0488i | 0.2452 + 0.0488i |
| | 0.2500 | −0.2500 |
| | −0.1389 + 0.2079i | 0.1389 − 0.2079i |
| | −0.0957 − 0.2310i | 0.0957 + 0.2310i |
| | 0.2452 + 0.0488i | −0.2452 − 0.0488i |
| (:, :, 7, 3) = | 0.2500 | 0.2500 |
| | −0.2079 + 0.1389i | −0.2079 + 0.1389i |
| | 0.0957 − 0.2310i | 0.0957 − 0.2310i |
| | 0.0488 + 0.2452i | 0.0488 + 0.2452i |
| | 0.2500 | −0.2500 |
| | −0.2079 + 0.1389i | 0.2079 − 0.1389i |
| | 0.0957 − 0.2310i | −0.0957 + 0.2310i |
| | 0.0488 + 0.2452i | −0.0488 − 0.2452i |
| (:, :, 8, 3) = | 0.2500 | 0.2500 |
| | −0.2452 + 0.0488i | −0.2452 + 0.0488i |
| | 0.2310 − 0.0957i | 0.2310 − 0.0957i |
| | −0.2079 + 0.1389i | −0.2079 + 0.1389i |
| | 0.2500 | −0.2500 |
| | −0.2452 + 0.0488i | 0.2452 − 0.0488i |
| | 0.2310 − 0.0957i | −0.2310 + 0.0957i |
| | −0.2079 + 0.1389i | 0.2079 − 0.1389i |
| (:, :, 9, 3) = | 0.2500 | 0.2500 |
| | −0.2452 − 0.0488i | −0.2452 − 0.0488i |
| | 0.2310 + 0.0957i | 0.2310 + 0.0957i |
| | −0.2079 − 0.1389i | −0.2079 − 0.1389i |
| | 0.2500 | −0.2500 |
| | −0.2452 − 0.0488i | 0.2452 + 0.0488i |
| | 0.2310 + 0.0957i | −0.2310 − 0.0957i |
| | −0.2079 − 0.1389i | 0.2079 + 0.1389i |
| (:, :, 10, 3) = | 0.2500 | 0.2500 |
| | −0.2079 − 0.1389i | −0.2079 − 0.1389i |
| | 0.0957 + 0.2310i | 0.0957 + 0.2310i |
| | 0.0488 − 0.2452i | 0.0488 − 0.2452i |
| | 0.2500 | −0.2500 |
| | −0.2079 − 0.1389i | 0.2079 + 0.1389i |
| | 0.0957 + 0.2310i | −0.0957 − 0.2310i |
| | 0.0488 − 0.2452i | −0.0488 + 0.2452i |
| (:, :, 11, 3) = | 0.2500 | 0.2500 |
| | −0.1389 − 0.2079i | −0.1389 − 0.2079i |
| | −0.0957 + 0.2310i | −0.0957 + 0.2310i |
| | 0.2452 − 0.0488i | 0.2452 − 0.0488i |
| | 0.2500 | −0.2500 |
| | −0.1389 − 0.2079i | 0.1389 + 0.2079i |
| | −0.0957 + 0.2310i | 0.0957 − 0.2310i |
| | 0.2452 − 0.0488i | −0.2452 + 0.0488i |
| (:, :, 12, 3) = | 0.2500 | 0.2500 |
| | −0.0488 − 0.2452i | −0.0488 − 0.2452i |
| | −0.2310 + 0.0957i | −0.2310 + 0.0957i |
| | 0.1389 + 0.2079i | 0.1389 + 0.2079i |
| | 0.2500 | −0.2500 |
| | −0.0488 − 0.2452i | 0.0488 + 0.2452i |
| | −0.2310 + 0.0957i | 0.2310 − 0.0957i |
| | 0.1389 + 0.2079i | −0.1389 − 0.2079i |
| (:, :, 13, 3) = | 0.2500 | 0.2500 |
| | 0.0488 − 0.2452i | 0.0488 − 0.2452i |
| | −0.2310 − 0.0957i | −0.2310 − 0.0957i |
| | −0.1389 + 0.2079i | −0.1389 + 0.2079i |
| | 0.2500 | −0.2500 |
| | 0.0488 − 0.2452i | −0.0488 + 0.2452i |
| | −0.2310 − 0.0957i | 0.2310 + 0.0957i |
| | −0.1389 + 0.2079i | 0.1389 − 0.2079i |
| (:, :, 14, 3) = | 0.2500 | 0.2500 |
| | 0.1389 − 0.2079i | 0.1389 − 0.2079i |
| | −0.0957 − 0.2310i | −0.0957 − 0.2310i |
| | −0.2452 − 0.0488i | −0.2452 − 0.0488i |
| | 0.2500 | −0.2500 |
| | 0.1389 − 0.2079i | −0.1389 + 0.2079i |
| | −0.0957 − 0.2310i | 0.0957 + 0.2310i |
| | −0.2452 − 0.0488i | 0.2452 + 0.0488i |

-continued (:, :, 15, 3) =
0.2500              0.2500
0.2079 − 0.1389i    0.2079 − 0.1389i
0.0957 − 0.2310i    0.0957 − 0.2310i
−0.0488 − 0.2452i   −0.0488 − 0.2452i
0.2500              −0.2500
0.2079 − 0.1389i    −0.2079 + 0.1389i
0.0957 − 0.2310i    −0.0957 + 0.2310i
−0.0488 − 0.2452i   0.0488 + 0.2452i (:, :, 16, 3) =
0.2500              0.2500
0.2452 − 0.0488i    0.2452 − 0.0488i
0.2310 − 0.0957i    0.2310 − 0.0957i
0.2079 − 0.1389i    0.2079 − 0.1389i
0.2500              −0.2500
0.2452 − 0.0488i    −0.2452 + 0.0488i
0.2310 − 0.0957i    −0.2310 + 0.0957i
0.2079 − 0.1389i    −0.2079 + 0.1389i (:, :, 1, 4) =
0.2500              0.2500
0.2452 + 0.0488i    0.2452 + 0.0488i
0.2310 + 0.0957i    0.2310 + 0.0957i
0.2079 + 0.1389i    0.2079 + 0.1389i
0 + 0.2500i         0 − 0.2500i
−0.0488 + 0.2452i   0.0488 − 0.2452i
−0.0957 + 0.2310i   0.0957 − 0.2310i
−0.1389 + 0.2079i   0.1389 − 0.2079i (:, :, 2, 4) =
0.2500              0.2500
0.2079 + 0.1389i    0.2079 + 0.1389i
0.0957 + 0.2310i    0.0957 + 0.2310i
−0.0488 + 0.2452i   −0.0488 + 0.2452i
0 + 0.2500i         0 − 0.2500i
−0.1389 + 0.2079i   0.1389 − 0.2079i
−0.2310 + 0.0957i   0.2310 − 0.0957i
−0.2452 − 0.0488i   0.2452 + 0.0488i (:, :, 3, 4) =
0.2500              0.2500
0.1389 + 0.2079i    0.1389 + 0.2079i
−0.0957 + 0.2310i   −0.0957 + 0.2310i
−0.2452 + 0.0488i   −0.2452 + 0.0488i
0 + 0.2500i         0 − 0.2500i
−0.2079 + 0.1389i   0.2079 − 0.1389i
−0.2310 − 0.0957i   0.2310 + 0.0957i
−0.0488 − 0.2452i   0.0488 + 0.2452i (:, :, 4, 4) =
0.2500              0.2500
0.0488 + 0.2452i    0.0488 + 0.2452i
−0.2310 + 0.0957i   −0.2310 + 0.0957i
−0.1389 − 0.2079i   −0.1389 − 0.2079i
0 + 0.2500i         0 − 0.2500i
−0.2452 + 0.0488i   0.2452 − 0.0488i
−0.0957 − 0.2310i   0.0957 + 0.2310i
0.2079 − 0.1389i    −0.2079 + 0.1389i (:, :, 5, 4) =
0.2500              0.2500
−0.0488 + 0.2452i   −0.0488 + 0.2452i
−0.2310 − 0.0957i   −0.2310 − 0.0957i
0.1389 − 0.2079i    0.1389 − 0.2079i
0 + 0.2500i         0 − 0.2500i
−0.2452 − 0.0488i   0.2452 + 0.0488i
0.0957 − 0.2310i    −0.0957 + 0.2310i
0.2079 + 0.1389i    −0.2079 − 0.1389i (:, :, 6, 4) =
0.2500              0.2500
−0.1389 + 0.2079i   −0.1389 + 0.2079i
−0.0957 − 0.2310i   −0.0957 − 0.2310i
0.2452 + 0.0488i    0.2452 + 0.0488i
0 + 0.2500i         0 − 0.2500i
−0.2079 − 0.1389i   0.2079 + 0.1389i
0.2310 − 0.0957i    −0.2310 + 0.0957i
−0.0488 + 0.2452i   0.0488 − 0.2452i (:, :, 7, 4) =
0.2500              0.2500
−0.2079 + 0.1389i   −0.2079 + 0.1389i
0.0957 − 0.2310i    0.0957 − 0.2310i
0.0488 + 0.2452i    0.0488 + 0.2452i
0 + 0.2500i         0 − 0.2500i
−0.1389 − 0.2079i   0.1389 + 0.2079i
0.2310 + 0.0957i    −0.2310 − 0.0957i
−0.2452 + 0.0488i   0.2452 − 0.0488i -continued

| | | |
|---|---|---|
| (:, :, 8, 4) = | 0.2500 | 0.2500 |
| | −0.2452 + 0.0488i | −0.2452 + 0.0488i |
| | 0.2310 − 0.0957i | 0.2310 − 0.0957i |
| | −0.2079 + 0.1389i | −0.2079 + 0.1389i |
| | 0 + 0.2500i | 0 − 0.2500i |
| | −0.0488 − 0.2452i | 0.0488 + 0.2452i |
| | 0.0957 + 0.2310i | −0.0957 − 0.2310i |
| | −0.1389 − 0.2079i | 0.1389 + 0.2079i |
| (:, :, 9, 4) = | 0.2500 | 0.2500 |
| | −0.2452 − 0.0488i | −0.2452 − 0.0488i |
| | 0.2310 + 0.0957i | 0.2310 + 0.0957i |
| | −0.2079 − 0.1389i | −0.2079 − 0.1389i |
| | 0 + 0.2500i | 0 − 0.2500i |
| | 0.0488 − 0.2452i | −0.0488 + 0.2452i |
| | −0.0957 + 0.2310i | 0.0957 − 0.2310i |
| | 0.1389 − 0.2079i | −0.1389 + 0.2079i |
| (:, :, 10, 4) = | 0.2500 | 0.2500 |
| | −0.2079 − 0.1389i | −0.2079 − 0.1389i |
| | 0.0957 + 0.2310i | 0.0957 + 0.2310i |
| | 0.0488 − 0.2452i | 0.0488 − 0.2452i |
| | 0 + 0.2500i | 0 − 0.2500i |
| | 0.1389 − 0.2079i | −0.1389 + 0.2079i |
| | −0.2310 + 0.0957i | 0.2310 − 0.0957i |
| | 0.2452 + 0.0488i | −0.2452 − 0.0488i |
| (:, :, 11, 4) = | 0.2500 | 0.2500 |
| | −0.1389 − 0.2079i | −0.1389 − 0.2079i |
| | −0.0957 + 0.2310i | −0.0957 + 0.2310i |
| | 0.2452 − 0.0488i | 0.2452 − 0.0488i |
| | 0 + 0.2500i | 0 − 0.2500i |
| | 0.2079 − 0.1389i | −0.2079 + 0.1389i |
| | −0.2310 − 0.0957i | 0.2310 + 0.0957i |
| | 0.0488 + 0.2452i | −0.0488 − 0.2452i |
| (:, :, 12, 4) = | 0.2500 | 0.2500 |
| | −0.0488 − 0.2452i | −0.0488 − 0.2452i |
| | −0.2310 + 0.0957i | −0.2310 + 0.0957i |
| | 0.1389 + 0.2079i | 0.1389 + 0.2079i |
| | 0 + 0.2500i | 0 − 0.2500i |
| | 0.2452 − 0.0488i | −0.2452 + 0.0488i |
| | −0.0957 − 0.2310i | 0.0957 + 0.2310i |
| | −0.2079 + 0.1389i | 0.2079 − 0.1389i |
| (:, :, 13, 4) = | 0.2500 | 0.2500 |
| | 0.0488 − 0.2452i | 0.0488 − 0.2452i |
| | −0.2310 − 0.0957i | −0.2310 − 0.0957i |
| | −0.1389 + 0.2079i | −0.1389 + 0.2079i |
| | 0 + 0.2500i | 0 − 0.2500i |
| | 0.2452 + 0.0488i | −0.2452 − 0.0488i |
| | 0.0957 − 0.2310i | −0.0957 + 0.2310i |
| | −0.2079 − 0.1389i | 0.2079 + 0.1389i |
| (:, :, 14, 4) = | 0.2500 | 0.2500 |
| | 0.1389 − 0.2079i | 0.1389 − 0.2079i |
| | −0.0957 − 0.2310i | −0.0957 − 0.2310i |
| | −0.2452 − 0.0488i | −0.2452 − 0.0488i |
| | 0 + 0.2500i | 0 − 0.2500i |
| | 0.2079 + 0.1389i | −0.2079 − 0.1389i |
| | 0.2310 − 0.0957i | −0.2310 + 0.0957i |
| | 0.0488 − 0.2452i | −0.0488 + 0.2452i |
| (:, :, 15, 4) = | 0.2500 | 0.2500 |
| | 0.2079 − 0.1389i | 0.2079 − 0.1389i |
| | 0.0957 − 0.2310i | 0.0957 − 0.2310i |
| | −0.0488 − 0.2452i | −0.0488 − 0.2452i |
| | 0 + 0.2500i | 0 − 0.2500i |
| | 0.1389 + 0.2079i | −0.1389 − 0.2079i |
| | 0.2310 + 0.0957i | −0.2310 − 0.0957i |
| | 0.2452 − 0.0488i | −0.2452 + 0.0488i |
| (:, :, 16, 4) = | 0.2500 | 0.2500 |
| | 0.2452 − 0.0488i | 0.2452 − 0.0488i |
| | 0.2310 − 0.0957i | 0.2310 − 0.0957i |
| | 0.2079 − 0.1389i | 0.2079 − 0.1389i |
| | 0 + 0.2500i | 0 − 0.2500i |
| | 0.0488 + 0.2452i | −0.0488 − 0.2452i |
| | 0.0957 + 0.2310i | −0.0957 − 0.2310i |
| | 0.1389 + 0.2079i | −0.1389 − 0.2079i |

-continued

| | | |
|---|---|---|
| (:, :, 1, 5) = | 0.2500 | 0.2500 |
| | 0.2310 + 0.0957i | 0.2310 + 0.0957i |
| | 0.1768 + 0.1768i | 0.1768 + 0.1768i |
| | 0.0957 + 0.2310i | 0.0957 + 0.2310i |
| | 0.2500 | −0.2500 |
| | 0.2310 + 0.0957i | −0.2310 − 0.0957i |
| | 0.1768 + 0.1768i | −0.1768 − 0.1768i |
| | 0.0957 + 0.2310i | −0.0957 − 0.2310i |
| (:, :, 2, 5) = | 0.2500 | 0.2500 |
| | 0.1768 + 0.1768i | 0.1768 + 0.1768i |
| | 0.0000 + 0.2500i | 0.0000 + 0.2500i |
| | −0.1768 + 0.1768i | −0.1768 + 0.1768i |
| | 0.2500 | −0.2500 |
| | 0.1768 + 0.1768i | −0.1768 − 0.1768i |
| | 0.0000 + 0.2500i | −0.0000 − 0.2500i |
| | −0.1768 + 0.1768i | 0.1768 − 0.1768i |
| (:, :, 3, 5) = | 0.2500 | 0.2500 |
| | 0.0957 + 0.2310i | 0.0957 + 0.2310i |
| | −0.1768 + 0.1768i | −0.1768 + 0.1768i |
| | −0.2310 − 0.0957i | −0.2310 − 0.0957i |
| | 0.2500 | −0.2500 |
| | 0.0957 + 0.2310i | −0.0957 − 0.2310i |
| | −0.1768 + 0.1768i | 0.1768 − 0.1768i |
| | −0.2310 − 0.0957i | 0.2310 + 0.0957i |
| (:, :, 4, 5) = | 0.2500 | 0.2500 |
| | 0.0000 + 0.2500i | 0.0000 + 0.2500i |
| | −0.2500 + 0.0000i | −0.2500 + 0.0000i |
| | −0.0000 − 0.2500i | −0.0000 − 0.2500i |
| | 0.2500 | −0.2500 |
| | 0.0000 + 0.2500i | −0.0000 − 0.2500i |
| | −0.2500 + 0.0000i | 0.2500 − 0.0000i |
| | −0.0000 − 0.2500i | 0.0000 + 0.2500i |
| (:, :, 5, 5) = | 0.2500 | 0.2500 |
| | −0.0957 + 0.2310i | −0.0957 + 0.2310i |
| | −0.1768 − 0.1768i | −0.1768 − 0.1768i |
| | 0.2310 − 0.0957i | 0.2310 − 0.0957i |
| | 0.2500 | −0.2500 |
| | −0.0957 + 0.2310i | 0.0957 − 0.2310i |
| | −0.1768 − 0.1768i | 0.1768 + 0.1768i |
| | 0.2310 − 0.0957i | −0.2310 + 0.0957i |
| (:, :, 6, 5) = | 0.2500 | 0.2500 |
| | −0.1768 + 0.1768i | −0.1768 + 0.1768i |
| | −0.0000 − 0.2500i | −0.0000 − 0.2500i |
| | 0.1768 + 0.1768i | 0.1768 + 0.1768i |
| | 0.2500 | −0.2500 |
| | −0.1768 + 0.1768i | 0.1768 − 0.1768i |
| | −0.0000 − 0.2500i | 0.0000 + 0.2500i |
| | 0.1768 + 0.1768i | −0.1768 − 0.1768i |
| (:, :, 7, 5) = | 0.2500 | 0.2500 |
| | −0.2310 + 0.0957i | −0.2310 + 0.0957i |
| | 0.1768 − 0.1768i | 0.1768 − 0.1768i |
| | −0.0957 + 0.2310i | −0.0957 + 0.2310i |
| | 0.2500 | −0.2500 |
| | −0.2310 + 0.0957i | 0.2310 − 0.0957i |
| | 0.1768 − 0.1768i | −0.1768 + 0.1768i |
| | −0.0957 + 0.2310i | 0.0957 − 0.2310i |
| (:, :, 8, 5) = | 0.2500 | 0.2500 |
| | −0.2500 + 0.0000i | −0.2500 + 0.0000i |
| | 0.2500 − 0.0000i | 0.2500 − 0.0000i |
| | −0.2500 + 0.0000i | −0.2500 + 0.0000i |
| | 0.2500 | −0.2500 |
| | −0.2500 + 0.0000i | 0.2500 − 0.0000i |
| | 0.2500 − 0.0000i | −0.2500 + 0.0000i |
| | −0.2500 + 0.0000i | 0.2500 − 0.0000i |
| (:, :, 9, 5) = | 0.2500 | 0.2500 |
| | −0.2310 − 0.0957i | −0.2310 − 0.0957i |
| | 0.1768 + 0.1768i | 0.1768 + 0.1768i |
| | −0.0957 − 0.2310i | −0.0957 − 0.2310i |
| | 0.2500 | −0.2500 |
| | −0.2310 − 0.0957i | 0.2310 + 0.0957i |
| | 0.1768 + 0.1768i | −0.1768 − 0.1768i |
| | −0.0957 − 0.2310i | 0.0957 + 0.2310i |

-continued

| | | |
|---|---|---|
| (:, :, 10, 5) = | 0.2500 | 0.2500 |
| | −0.1768 − 0.1768i | −0.1768 − 0.1768i |
| | 0.0000 + 0.2500i | 0.0000 + 0.2500i |
| | 0.1768 − 0.1768i | 0.1768 − 0.1768i |
| | 0.2500 | −0.2500 |
| | −0.1768 − 0.1768i | 0.1768 + 0.1768i |
| | 0.0000 + 0.2500i | −0.0000 − 0.2500i |
| | 0.1768 − 0.1768i | −0.1768 + 0.1768i |
| (:, :, 11, 5) = | 0.2500 | 0.2500 |
| | −0.0957 − 0.2310i | −0.0957 − 0.2310i |
| | −0.1768 + 0.1768i | −0.1768 + 0.1768i |
| | 0.2310 + 0.0957i | 0.2310 + 0.0957i |
| | 0.2500 | −0.2500 |
| | −0.0957 − 0.2310i | 0.0957 + 0.2310i |
| | −0.1768 + 0.1768i | 0.1768 − 0.1768i |
| | 0.2310 + 0.0957i | −0.2310 − 0.0957i |
| (:, :, 12, 5) = | 0.2500 | 0.2500 |
| | −0.0000 − 0.2500i | −0.0000 − 0.2500i |
| | −0.2500 + 0.0000i | −0.2500 + 0.0000i |
| | 0.0000 + 0.2500i | 0.0000 + 0.2500i |
| | 0.2500 | −0.2500 |
| | −0.0000 − 0.2500i | 0.0000 + 0.2500i |
| | −0.2500 + 0.0000i | 0.2500 − 0.0000i |
| | 0.0000 + 0.2500i | −0.0000 − 0.2500i |
| ans(:, :, 13, 5) = | 0.2500 | 0.2500 |
| | 0.0957 − 0.2310i | 0.0957 − 0.2310i |
| | −0.1768 − 0.1768i | −0.1768 − 0.1768i |
| | −0.2310 + 0.0957i | −0.2310 + 0.0957i |
| | 0.2500 | −0.2500 |
| | 0.0957 − 0.2310i | −0.0957 + 0.2310i |
| | −0.1768 − 0.1768i | 0.1768 + 0.1768i |
| | −0.2310 + 0.0957i | 0.2310 − 0.0957i |
| ans(:, :, 14, 5) = | 0.2500 | 0.2500 |
| | 0.1768 − 0.1768i | 0.1768 − 0.1768i |
| | −0.0000 − 0.2500i | −0.0000 − 0.2500i |
| | −0.1768 − 0.1768i | −0.1768 − 0.1768i |
| | 0.2500 | −0.2500 |
| | 0.1768 − 0.1768i | −0.1768 + 0.1768i |
| | −0.0000 − 0.2500i | 0.0000 + 0.2500i |
| | −0.1768 − 0.1768i | 0.1768 + 0.1768i |
| ans(:, :, 15, 5) = | 0.2500 | 0.2500 |
| | 0.2310 − 0.0957i | 0.2310 − 0.0957i |
| | 0.1768 − 0.1768i | 0.1768 − 0.1768i |
| | 0.0957 − 0.2310i | 0.0957 − 0.2310i |
| | 0.2500 | −0.2500 |
| | 0.2310 − 0.0957i | −0.2310 + 0.0957i |
| | 0.1768 − 0.1768i | −0.1768 + 0.1768i |
| | 0.0957 − 0.2310i | −0.0957 + 0.2310i |
| ans(:, :, 16, 5) = | 0.2500 | 0.2500 |
| | 0.2500 | 0.2500 |
| | 0.2500 | 0.2500 |
| | 0.2500 | 0.2500 |
| | 0.2500 | −0.2500 |
| | 0.2500 | −0.2500 |
| | 0.2500 | −0.2500 |
| | 0.2500 | −0.2500 |
| ans(:, :, 1, 6) = | 0.2500 | 0.2500 |
| | 0.2310 + 0.0957i | 0.2310 + 0.0957i |
| | 0.1768 + 0.1768i | 0.1768 + 0.1768i |
| | 0.0957 + 0.2310i | 0.0957 + 0.2310i |
| | 0 + 0.2500i | 0 − 0.2500i |
| | −0.0957 + 0.2310i | 0.0957 − 0.2310i |
| | −0.1768 + 0.1768i | 0.1768 − 0.1768i |
| | −0.2310 + 0.0957i | 0.2310 − 0.0957i |
| ans(:, :, 2, 6) = | 0.2500 | 0.2500 |
| | 0.1768 + 0.1768i | 0.1768 + 0.1768i |
| | 0.0000 + 0.2500i | 0.0000 + 0.2500i |
| | −0.1768 + 0.1768i | −0.1768 + 0.1768i |
| | 0 + 0.2500i | 0 − 0.2500i |
| | −0.1768 + 0.1768i | 0.1768 − 0.1768i |
| | −0.2500 + 0.0000i | 0.2500 − 0.0000i |
| | −0.1768 − 0.1768i | 0.1768 + 0.1768i |

-continued

| | | |
|---|---|---|
| ans(:, :, 3, 6) = | 0.2500 | 0.2500 |
| | 0.0957 + 0.2310i | 0.0957 + 0.2310i |
| | −0.1768 + 0.1768i | −0.1768 + 0.1768i |
| | −0.2310 − 0.0957i | −0.2310 − 0.0957i |
| | 0 + 0.2500i | 0 − 0.2500i |
| | −0.2310 + 0.0957i | 0.2310 − 0.0957i |
| | −0.1768 − 0.1768i | 0.1768 + 0.1768i |
| | 0.0957 − 0.2310i | −0.0957 + 0.2310i |
| ans(:, :, 4, 6) = | 0.2500 | 0.2500 |
| | 0.0000 + 0.2500i | 0.0000 + 0.2500i |
| | −0.2500 + 0.0000i | −0.2500 + 0.0000i |
| | −0.0000 − 0.2500i | −0.0000 − 0.2500i |
| | 0 + 0.2500i | 0 − 0.2500i |
| | −0.2500 + 0.0000i | 0.2500 − 0.0000i |
| | −0.0000 − 0.2500i | 0.0000 + 0.2500i |
| | 0.2500 − 0.0000i | −0.2500 + 0.0000i |
| ans(:, :, 5, 6) = | 0.2500 | 0.2500 |
| | −0.0957 + 0.2310i | −0.0957 + 0.2310i |
| | −0.1768 − 0.1768i | −0.1768 − 0.1768i |
| | 0.2310 − 0.0957i | 0.2310 − 0.0957i |
| | 0 + 0.2500i | 0 − 0.2500i |
| | −0.2310 − 0.0957i | 0.2310 + 0.0957i |
| | 0.1768 − 0.1768i | −0.1768 + 0.1768i |
| | 0.0957 + 0.2310i | −0.0957 − 0.2310i |
| ans(:, :, 6, 6) = | 0.2500 | 0.2500 |
| | −0.1768 + 0.1768i | −0.1768 + 0.1768i |
| | −0.0000 − 0.2500i | −0.0000 − 0.2500i |
| | 0.1768 + 0.1768i | 0.1768 + 0.1768i |
| | 0 + 0.2500i | 0 − 0.2500i |
| | −0.1768 − 0.1768i | 0.1768 + 0.1768i |
| | 0.2500 − 0.0000i | −0.2500 + 0.0000i |
| | −0.1768 + 0.1768i | 0.1768 − 0.1768i |
| ans(:, :, 7, 6) = | 0.2500 | 0.2500 |
| | −0.2310 + 0.0957i | −0.2310 + 0.0957i |
| | 0.1768 − 0.1768i | 0.1768 − 0.1768i |
| | −0.0957 + 0.2310i | −0.0957 + 0.2310i |
| | 0 + 0.2500i | 0 − 0.2500i |
| | −0.0957 − 0.2310i | 0.0957 + 0.2310i |
| | 0.1768 + 0.1768i | −0.1768 − 0.1768i |
| | −0.2310 − 0.0957i | 0.2310 + 0.0957i |
| ans(:, :, 8, 6) = | 0.2500 | 0.2500 |
| | −0.2500 + 0.0000i | −0.2500 + 0.0000i |
| | 0.2500 − 0.0000i | 0.2500 − 0.0000i |
| | −0.2500 + 0.0000i | −0.2500 + 0.0000i |
| | 0 + 0.2500i | 0 − 0.2500i |
| | −0.0000 − 0.2500i | 0.0000 + 0.2500i |
| | 0.0000 + 0.2500i | −0.0000 − 0.2500i |
| | −0.0000 − 0.2500i | 0.0000 + 0.2500i |
| ans(:, :, 9, 6) = | 0.2500 | 0.2500 |
| | −0.2310 − 0.0957i | −0.2310 − 0.0957i |
| | 0.1768 + 0.1768i | 0.1768 + 0.1768i |
| | −0.0957 − 0.2310i | −0.0957 − 0.2310i |
| | 0 + 0.2500i | 0 − 0.2500i |
| | 0.0957 − 0.2310i | −0.0957 + 0.2310i |
| | −0.1768 + 0.1768i | 0.1768 − 0.1768i |
| | 0.2310 − 0.0957i | −0.2310 + 0.0957i |
| ans(:, :, 10, 6) = | 0.2500 | 0.2500 |
| | −0.1768 − 0.1768i | −0.1768 − 0.1768i |
| | 0.0000 + 0.2500i | 0.0000 + 0.2500i |
| | 0.1768 − 0.1768i | 0.1768 − 0.1768i |
| | 0 + 0.2500i | 0 − 0.2500i |
| | 0.1768 − 0.1768i | −0.1768 + 0.1768i |
| | −0.2500 + 0.0000i | 0.2500 − 0.0000i |
| | 0.1768 + 0.1768i | −0.1768 − 0.1768i |
| ans(:, :, 11, 6) = | 0.2500 | 0.2500 |
| | −0.0957 − 0.2310i | −0.0957 − 0.2310i |
| | −0.1768 + 0.1768i | −0.1768 + 0.1768i |
| | 0.2310 + 0.0957i | 0.2310 + 0.0957i |
| | 0 + 0.2500i | 0 − 0.2500i |
| | 0.2310 − 0.0957i | −0.2310 + 0.0957i |
| | −0.1768 − 0.1768i | 0.1768 + 0.1768i |
| | −0.0957 + 0.2310i | 0.0957 − 0.2310i |

-continued

| | | |
|---|---|---|
| ans(:, :, 12, 6) = | 0.2500 | 0.2500 |
| | −0.0000 − 0.2500i | −0.0000 − 0.2500i |
| | −0.2500 + 0.0000i | −0.2500 + 0.0000i |
| | 0.0000 + 0.2500i | 0.0000 + 0.2500i |
| | 0 + 0.2500i | 0 − 0.2500i |
| | 0.2500 − 0.0000i | −0.2500 + 0.0000i |
| | −0.0000 − 0.2500i | 0.0000 + 0.2500i |
| | −0.2500 + 0.0000i | 0.2500 − 0.0000i |
| ans(:, :, 13, 6) = | 0.2500 | 0.2500 |
| | 0.0957 − 0.2310i | 0.0957 − 0.2310i |
| | −0.1768 − 0.1768i | −0.1768 − 0.1768i |
| | −0.2310 + 0.0957i | −0.2310 + 0.0957i |
| | 0 + 0.2500i | 0 − 0.2500i |
| | 0.2310 + 0.0957i | −0.2310 − 0.0957i |
| | 0.1768 − 0.1768i | −0.1768 + 0.1768i |
| | −0.0957 − 0.2310i | 0.0957 + 0.2310i |
| ans(:, :, 14, 6) = | 0.2500 | 0.2500 |
| | 0.1768 − 0.1768i | 0.1768 − 0.1768i |
| | −0.0000 − 0.2500i | −0.0000 − 0.2500i |
| | −0.1768 − 0.1768i | −0.1768 − 0.1768i |
| | 0 + 0.2500i | 0 − 0.2500i |
| | 0.1768 + 0.1768i | −0.1768 − 0.1768i |
| | 0.2500 − 0.0000i | −0.2500 + 0.0000i |
| | 0.1768 − 0.1768i | −0.1768 + 0.1768i |
| ans(:, :, 15, 6) = | 0.2500 | 0.2500 |
| | 0.2310 − 0.0957i | 0.2310 − 0.0957i |
| | 0.1768 − 0.1768i | 0.1768 − 0.1768i |
| | 0.0957 − 0.2310i | 0.0957 − 0.2310i |
| | 0 + 0.2500i | 0 − 0.2500i |
| | 0.0957 + 0.2310i | −0.0957 − 0.2310i |
| | 0.1768 + 0.1768i | −0.1768 − 0.1768i |
| | 0.2310 + 0.0957i | −0.2310 − 0.0957i |
| ans(:, :, 16, 6) = | 0.2500 | 0.2500 |
| | 0.2500 | 0.2500 |
| | 0.2500 | 0.2500 |
| | 0.2500 | 0.2500 |
| | 0 + 0.2500i | 0 − 0.2500i |
| | 0 + 0.2500i | 0 − 0.2500i |
| | 0 + 0.2500i | 0 − 0.2500i |
| | 0 + 0.2500i | 0 − 0.2500i |
| ans(:, :, 1, 7) = | 0.2500 | 0.2500 |
| | 0.2079 + 0.1389i | 0.2079 + 0.1389i |
| | 0.0957 + 0.2310i | 0.0957 + 0.2310i |
| | −0.0488 + 0.2452i | −0.0488 + 0.2452i |
| | 0.2500 | −0.2500 |
| | 0.2079 + 0.1389i | −0.2079 − 0.1389i |
| | 0.0957 + 0.2310i | −0.0957 − 0.2310i |
| | −0.0488 + 0.2452i | 0.0488 − 0.2452i |
| ans(:, :, 2, 7) = | 0.2500 | 0.2500 |
| | 0.1389 + 0.2079i | 0.1389 + 0.2079i |
| | −0.0957 + 0.2310i | −0.0957 + 0.2310i |
| | −0.2452 + 0.0488i | −0.2452 + 0.0488i |
| | 0.2500 | −0.2500 |
| | 0.1389 + 0.2079i | −0.1389 − 0.2079i |
| | −0.0957 + 0.2310i | 0.0957 − 0.2310i |
| | −0.2452 + 0.0488i | 0.2452 − 0.0488i |
| ans(:, :, 3, 7) = | 0.2500 | 0.2500 |
| | 0.0488 + 0.2452i | 0.0488 + 0.2452i |
| | −0.2310 + 0.0957i | −0.2310 + 0.0957i |
| | −0.1389 − 0.2079i | −0.1389 − 0.2079i |
| | 0.2500 | −0.2500 |
| | 0.0488 + 0.2452i | −0.0488 − 0.2452i |
| | −0.2310 + 0.0957i | 0.2310 − 0.0957i |
| | −0.1389 − 0.2079i | 0.1389 + 0.2079i |
| ans(:, :, 4, 7) = | 0.2500 | 0.2500 |
| | −0.0488 + 0.2452i | −0.0488 + 0.2452i |
| | −0.2310 − 0.0957i | −0.2310 − 0.0957i |
| | 0.1389 − 0.2079i | 0.1389 − 0.2079i |
| | 0.2500 | −0.2500 |
| | −0.0488 + 0.2452i | 0.0488 − 0.2452i |
| | −0.2310 − 0.0957i | 0.2310 + 0.0957i |
| | 0.1389 − 0.2079i | −0.1389 + 0.2079i |

-continued

| | | |
|---|---|---|
| ans(:, :, 5, 7) = | 0.2500 | 0.2500 |
| | −0.1389 + 0.2079i | −0.1389 + 0.2079i |
| | −0.0957 − 0.2310i | −0.0957 − 0.2310i |
| | 0.2452 + 0.0488i | 0.2452 + 0.0488i |
| | 0.2500 | −0.2500 |
| | −0.1389 + 0.2079i | 0.1389 − 0.2079i |
| | −0.0957 − 0.2310i | 0.0957 + 0.2310i |
| | 0.2452 + 0.0488i | −0.2452 − 0.0488i |
| ans(:, :, 6, 7) = | 0.2500 | 0.2500 |
| | −0.2079 + 0.1389i | −0.2079 + 0.1389i |
| | 0.0957 − 0.2310i | 0.0957 − 0.2310i |
| | 0.0488 + 0.2452i | 0.0488 + 0.2452i |
| | 0.2500 | −0.2500 |
| | −0.2079 + 0.1389i | 0.2079 − 0.1389i |
| | 0.0957 − 0.2310i | −0.0957 + 0.2310i |
| | 0.0488 + 0.2452i | −0.0488 − 0.2452i |
| ans(:, :, 7, 7) = | 0.2500 | 0.2500 |
| | −0.2452 + 0.0488i | −0.2452 + 0.0488i |
| | 0.2310 − 0.0957i | 0.2310 − 0.0957i |
| | −0.2079 + 0.1389i | −0.2079 + 0.1389i |
| | 0.2500 | −0.2500 |
| | −0.2452 + 0.0488i | 0.2452 − 0.0488i |
| | 0.2310 − 0.0957i | −0.2310 + 0.0957i |
| | −0.2079 + 0.1389i | 0.2079 − 0.1389i |
| ans(:, :, 8, 7) = | 0.2500 | 0.2500 |
| | −0.2452 − 0.0488i | −0.2452 − 0.0488i |
| | 0.2310 + 0.0957i | 0.2310 + 0.0957i |
| | −0.2079 − 0.1389i | −0.2079 − 0.1389i |
| | 0.2500 | −0.2500 |
| | −0.2452 − 0.0488i | 0.2452 + 0.0488i |
| | 0.2310 + 0.0957i | −0.2310 − 0.0957i |
| | −0.2079 − 0.1389i | 0.2079 + 0.1389i |
| ans(:, :, 9, 7) = | 0.2500 | 0.2500 |
| | −0.2079 − 0.1389i | −0.2079 − 0.1389i |
| | 0.0957 + 0.2310i | 0.0957 + 0.2310i |
| | 0.0488 − 0.2452i | 0.0488 − 0.2452i |
| | 0.2500 | −0.2500 |
| | −0.2079 − 0.1389i | 0.2079 + 0.1389i |
| | 0.0957 + 0.2310i | −0.0957 − 0.2310i |
| | 0.0488 − 0.2452i | −0.0488 + 0.2452i |
| ans(:, :, 10, 7) = | 0.2500 | 0.2500 |
| | −0.1389 − 0.2079i | −0.1389 − 0.2079i |
| | −0.0957 + 0.2310i | −0.0957 + 0.2310i |
| | 0.2452 − 0.0488i | 0.2452 − 0.0488i |
| | 0.2500 | −0.2500 |
| | −0.1389 − 0.2079i | 0.1389 + 0.2079i |
| | −0.0957 + 0.2310i | 0.0957 − 0.2310i |
| | 0.2452 − 0.0488i | −0.2452 + 0.0488i |
| ans(:, :, 11, 7) = | 0.2500 | 0.2500 |
| | −0.0488 − 0.2452i | −0.0488 − 0.2452i |
| | −0.2310 + 0.0957i | −0.2310 + 0.0957i |
| | 0.1389 + 0.2079i | 0.1389 + 0.2079i |
| | 0.2500 | −0.2500 |
| | −0.0488 − 0.2452i | 0.0488 + 0.2452i |
| | −0.2310 + 0.0957i | 0.2310 − 0.0957i |
| | 0.1389 + 0.2079i | −0.1389 − 0.2079i |
| ans(:, :, 12, 7) = | 0.2500 | 0.2500 |
| | 0.0488 − 0.2452i | 0.0488 − 0.2452i |
| | −0.2310 − 0.0957i | −0.2310 − 0.0957i |
| | −0.1389 + 0.2079i | −0.1389 + 0.2079i |
| | 0.2500 | −0.2500 |
| | 0.0488 − 0.2452i | −0.0488 + 0.2452i |
| | −0.2310 − 0.0957i | 0.2310 + 0.0957i |
| | −0.1389 + 0.2079i | 0.1389 − 0.2079i |
| ans(:, :, 13, 7) = | 0.2500 | 0.2500 |
| | 0.1389 − 0.2079i | 0.1389 − 0.2079i |
| | −0.0957 − 0.2310i | −0.0957 − 0.2310i |
| | −0.2452 − 0.0488i | −0.2452 − 0.0488i |
| | 0.2500 | −0.2500 |
| | 0.1389 − 0.2079i | −0.1389 + 0.2079i |
| | −0.0957 − 0.2310i | 0.0957 + 0.2310i |
| | −0.2452 − 0.0488i | 0.2452 + 0.0488i | ans(:, :, 14, 7) =   0.2500              0.2500
                     0.2079 − 0.1389i    0.2079 − 0.1389i
                     0.0957 − 0.2310i    0.0957 − 0.2310i
                     −0.0488 − 0.2452i   −0.0488 − 0.2452i
                     0.2500              −0.2500
                     0.2079 − 0.1389i    −0.2079 + 0.1389i
                     0.0957 − 0.2310i    −0.0957 + 0.2310i
                     −0.0488 − 0.2452i   0.0488 + 0.2452i
ans(:, :, 15, 7) =   0.2500              0.2500
                     0.2452 − 0.0488i    0.2452 − 0.0488i
                     0.2310 − 0.0957i    0.2310 − 0.0957i
                     0.2079 − 0.1389i    0.2079 − 0.1389i
                     0.2500              −0.2500
                     0.2452 − 0.0488i    −0.2452 + 0.0488i
                     0.2310 − 0.0957i    −0.2310 + 0.0957i
                     0.2079 − 0.1389i    −0.2079 + 0.1389i
ans(:, :, 16, 7) =   0.2500              0.2500
                     0.2452 + 0.0488i    0.2452 + 0.0488i
                     0.2310 + 0.0957i    0.2310 + 0.0957i
                     0.2079 + 0.1389i    0.2079 + 0.1389i
                     0.2500              −0.2500
                     0.2452 + 0.0488i    −0.2452 − 0.0488i
                     0.2310 + 0.0957i    −0.2310 − 0.0957i
                     0.2079 + 0.1389i    −0.2079 − 0.1389i
ans(:, :, 1, 8) =    0.2500              0.2500
                     0.2079 + 0.1389i    0.2079 + 0.1389i
                     0.0957 + 0.2310i    0.0957 + 0.2310i
                     −0.0488 + 0.2452i   −0.0488 + 0.2452i
                     0 + 0.2500i         0 − 0.2500i
                     −0.1389 + 0.2079i   0.1389 − 0.2079i
                     −0.2310 + 0.0957i   0.2310 − 0.0957i
                     −0.2452 − 0.0488i   0.2452 + 0.0488i
ans(:, :, 2, 8) =    0.2500              0.2500
                     0.1389 + 0.2079i    0.1389 + 0.2079i
                     −0.0957 + 0.2310i   −0.0957 + 0.2310i
                     −0.2452 + 0.0488i   −0.2452 + 0.0488i
                     0 + 0.2500i         0 − 0.2500i
                     −0.2079 + 0.1389i   0.2079 − 0.1389i
                     −0.2310 − 0.0957i   0.2310 + 0.0957i
                     −0.0488 − 0.2452i   0.0488 + 0.2452i
ans(:, :, 3, 8) =    0.2500              0.2500
                     0.0488 + 0.2452i    0.0488 + 0.2452i
                     −0.2310 + 0.0957i   −0.2310 + 0.0957i
                     −0.1389 − 0.2079i   −0.1389 − 0.2079i
                     0 + 0.2500i         0 − 0.2500i
                     −0.2452 + 0.0488i   0.2452 − 0.0488i
                     −0.0957 − 0.2310i   0.0957 + 0.2310i
                     0.2079 − 0.1389i    −0.2079 + 0.1389i
ans(:, :, 4, 8) =    0.2500              0.2500
                     −0.0488 + 0.2452i   −0.0488 + 0.2452i
                     −0.2310 − 0.0957i   −0.2310 − 0.0957i
                     0.1389 − 0.2079i    0.1389 − 0.2079i
                     0 + 0.2500i         0 − 0.2500i
                     −0.2452 − 0.0488i   0.2452 + 0.0488i
                     0.0957 − 0.2310i    −0.0957 + 0.2310i
                     0.2079 + 0.1389i    −0.2079 − 0.1389i
ans(:, :, 5, 8) =    0.2500              0.2500
                     −0.1389 + 0.2079i   −0.1389 + 0.2079i
                     −0.0957 − 0.2310i   −0.0957 − 0.2310i
                     0.2452 + 0.0488i    0.2452 + 0.0488i
                     0 + 0.2500i         0 − 0.2500i
                     −0.2079 − 0.1389i   0.2079 + 0.1389i
                     0.2310 − 0.0957i    −0.2310 + 0.0957i
                     −0.0488 + 0.2452i   0.0488 − 0.2452i
ans(:, :, 6, 8) =    0.2500              0.2500
                     −0.2079 + 0.1389i   −0.2079 + 0.1389i
                     0.0957 − 0.2310i    0.0957 − 0.2310i
                     0.0488 + 0.2452i    0.0488 + 0.2452i
                     0 + 0.2500i         0 − 0.2500i
                     −0.1389 − 0.2079i   0.1389 + 0.2079i
                     0.2310 + 0.0957i    −0.2310 − 0.0957i
                     −0.2452 + 0.0488i   0.2452 − 0.0488i -continued ans(:, :, 7, 8) =      0.2500                  0.2500
                       −0.2452 + 0.0488i       −0.2452 + 0.0488i
                       0.2310 − 0.0957i        0.2310 − 0.0957i
                       −0.2079 + 0.1389i       −0.2079 + 0.1389i
                       0 + 0.2500i             0 − 0.2500i
                       −0.0488 − 0.2452i       0.0488 + 0.2452i
                       0.0957 + 0.2310i        −0.0957 − 0.2310i
                       −0.1389 − 0.2079i       0.1389 + 0.2079i
ans(:, :, 8, 8) =      0.2500                  0.2500
                       −0.2452 − 0.0488i       −0.2452 − 0.0488i
                       0.2310 + 0.0957i        0.2310 + 0.0957i
                       −0.2079 − 0.1389i       −0.2079 − 0.1389i
                       0 + 0.2500i             0 − 0.2500i
                       0.0488 − 0.2452i        −0.0488 + 0.2452i
                       −0.0957 + 0.2310i       0.0957 − 0.2310i
                       0.1389 − 0.2079i        −0.1389 + 0.2079i
ans(:, :, 9, 8) =      0.2500                  0.2500
                       −0.2079 − 0.1389i       −0.2079 − 0.1389i
                       0.0957 + 0.2310i        0.0957 + 0.2310i
                       0.0488 − 0.2452i        0.0488 − 0.2452i
                       0 + 0.2500i             0 − 0.2500i
                       0.1389 − 0.2079i        −0.1389 + 0.2079i
                       −0.2310 + 0.0957i       0.2310 − 0.0957i
                       0.2452 + 0.0488i        −0.2452 − 0.0488i
ans(:, :, 10, 8) =     0.2500                  0.2500
                       −0.1389 − 0.2079i       −0.1389 − 0.2079i
                       −0.0957 + 0.2310i       −0.0957 + 0.2310i
                       0.2452 − 0.0488i        0.2452 − 0.0488i
                       0 + 0.2500i             0 − 0.2500i
                       0.2079 − 0.1389i        −0.2079 + 0.1389i
                       −0.2310 − 0.0957i       0.2310 + 0.0957i
                       0.0488 + 0.2452i        −0.0488 − 0.2452i
ans(:, :, 11, 8) =     0.2500                  0.2500
                       −0.0488 − 0.2452i       −0.0488 − 0.2452i
                       −0.2310 + 0.0957i       −0.2310 + 0.0957i
                       0.1389 + 0.2079i        0.1389 + 0.2079i
                       0 + 0.2500i             0 − 0.2500i
                       0.2452 − 0.0488i        −0.2452 + 0.0488i
                       −0.0957 − 0.2310i       0.0957 + 0.2310i
                       −0.2079 + 0.1389i       0.2079 − 0.1389i
ans(:, :, 12, 8) =     0.2500                  0.2500
                       0.0488 − 0.2452i        0.0488 − 0.2452i
                       −0.2310 − 0.0957i       −0.2310 − 0.0957i
                       −0.1389 + 0.2079i       −0.1389 + 0.2079i
                       0 + 0.2500i             0 − 0.2500i
                       0.2452 + 0.0488i        −0.2452 − 0.0488i
                       0.0957 − 0.2310i        −0.0957 + 0.2310i
                       −0.2079 − 0.1389i       0.2079 + 0.1389i
ans(:, :, 13, 8) =     0.2500                  0.2500
                       0.1389 − 0.2079i        0.1389 − 0.2079i
                       −0.0957 − 0.2310i       −0.0957 − 0.2310i
                       −0.2452 − 0.0488i       −0.2452 − 0.0488i
                       0 + 0.2500i             0 − 0.2500i
                       0.2079 + 0.1389i        −0.2079 − 0.1389i
                       0.2310 − 0.0957i        −0.2310 + 0.0957i
                       0.0488 − 0.2452i        −0.0488 + 0.2452i
ans(:, :, 14, 8) =     0.2500                  0.2500
                       0.2079 − 0.1389i        0.2079 − 0.1389i
                       0.0957 − 0.2310i        0.0957 − 0.2310i
                       −0.0488 − 0.2452i       −0.0488 − 0.2452i
                       0 + 0.2500i             0 − 0.2500i
                       0.1389 + 0.2079i        −0.1389 − 0.2079i
                       0.2310 + 0.0957i        −0.2310 − 0.0957i
                       0.2452 − 0.0488i        −0.2452 + 0.0488i
ans(:, :, 15, 8) =     0.2500                  0.2500
                       0.2452 − 0.0488i        0.2452 − 0.0488i
                       0.2310 − 0.0957i        0.2310 − 0.0957i
                       0.2079 − 0.1389i        0.2079 − 0.1389i
                       0 + 0.2500i             0 − 0.2500i
                       0.0488 + 0.2452i        −0.0488 − 0.2452i
                       0.0957 + 0.2310i        −0.0957 − 0.2310i
                       0.1389 + 0.2079i        −0.1389 − 0.2079i -continued

| | | |
|---|---|---|
| ans(:, :, 16, 8) = | 0.2500 | 0.2500 |
| | 0.2452 + 0.0488i | 0.2452 + 0.0488i |
| | 0.2310 + 0.0957i | 0.2310 + 0.0957i |
| | 0.2079 + 0.1389i | 0.2079 + 0.1389i |
| | 0 + 0.2500i | 0 − 0.2500i |
| | −0.0488 + 0.2452i | 0.0488 − 0.2452i |
| | −0.0957 + 0.2310i | 0.0957 − 0.2310i |
| | −0.1389 + 0.2079i | 0.1389 − 0.2079i |
| ans(:, :, 1, 9) = | 0.2500 | 0.2500 |
| | 0.2500 | 0.2452 + 0.0488i |
| | 0.2500 | 0.2310 + 0.0957i |
| | 0.2500 | 0.2079 + 0.1389i |
| | 0.2500 | −0.2500 |
| | 0.2500 | −0.2452 − 0.0488i |
| | 0.2500 | −0.2310 − 0.0957i |
| | 0.2500 | −0.2079 − 0.1389i |
| ans(:, :, 2, 9) = | 0.2500 | 0.2500 |
| | 0.2310 + 0.0957i | 0.2079 + 0.1389i |
| | 0.1768 + 0.1768i | 0.0957 + 0.2310i |
| | 0.0957 + 0.2310i | −0.0488 + 0.2452i |
| | 0.2500 | −0.2500 |
| | 0.2310 + 0.0957i | −0.2079 − 0.1389i |
| | 0.1768 + 0.1768i | −0.0957 − 0.2310i |
| | 0.0957 + 0.2310i | 0.0488 − 0.2452i |
| ans(:, :, 3, 9) = | 0.2500 | 0.2500 |
| | 0.1768 + 0.1768i | 0.1389 + 0.2079i |
| | 0.0000 + 0.2500i | −0.0957 + 0.2310i |
| | −0.1768 + 0.1768i | −0.2452 + 0.0488i |
| | 0.2500 | −0.2500 |
| | 0.1768 + 0.1768i | −0.1389 − 0.2079i |
| | 0.0000 + 0.2500i | 0.0957 − 0.2310i |
| | −0.1768 + 0.1768i | 0.2452 − 0.0488i |
| ans(:, :, 4, 9) = | 0.2500 | 0.2500 |
| | 0.0957 + 0.2310i | 0.0488 + 0.2452i |
| | −0.1768 + 0.1768i | −0.2310 + 0.0957i |
| | −0.2310 − 0.0957i | −0.1389 − 0.2079i |
| | 0.2500 | −0.2500 |
| | 0.0957 + 0.2310i | −0.0488 − 0.2452i |
| | −0.1768 + 0.1768i | 0.2310 − 0.0957i |
| | −0.2310 − 0.0957i | 0.1389 + 0.2079i |
| ans(:, :, 5, 9) = | 0.2500 | 0.2500 |
| | 0.0000 + 0.2500i | −0.0488 + 0.2452i |
| | −0.2500 + 0.0000i | −0.2310 − 0.0957i |
| | −0.0000 − 0.2500i | 0.1389 − 0.2079i |
| | 0.2500 | −0.2500 |
| | 0.0000 + 0.2500i | 0.0488 − 0.2452i |
| | −0.2500 + 0.0000i | 0.2310 + 0.0957i |
| | −0.0000 − 0.2500i | −0.1389 + 0.2079i |
| ans(:, :, 6, 9) = | 0.2500 | 0.2500 |
| | −0.0957 + 0.2310i | −0.1389 + 0.2079i |
| | −0.1768 − 0.1768i | −0.0957 − 0.2310i |
| | 0.2310 − 0.0957i | 0.2452 + 0.0488i |
| | 0.2500 | −0.2500 |
| | −0.0957 + 0.2310i | 0.1389 − 0.2079i |
| | −0.1768 − 0.1768i | 0.0957 + 0.2310i |
| | 0.2310 − 0.0957i | −0.2452 − 0.0488i |
| ans(:, :, 7, 9) = | 0.2500 | 0.2500 |
| | −0.1768 + 0.1768i | −0.2079 + 0.1389i |
| | −0.0000 − 0.2500i | 0.0957 − 0.2310i |
| | 0.1768 + 0.1768i | 0.0488 + 0.2452i |
| | 0.2500 | −0.2500 |
| | −0.1768 + 0.1768i | 0.2079 − 0.1389i |
| | −0.0000 − 0.2500i | −0.0957 + 0.2310i |
| | 0.1768 + 0.1768i | −0.0488 − 0.2452i |
| ans(:, :, 8, 9) = | 0.2500 | 0.2500 |
| | −0.2310 + 0.0957i | −0.2452 + 0.0488i |
| | 0.1768 − 0.1768i | 0.2310 − 0.0957i |
| | −0.0957 + 0.2310i | −0.2079 + 0.1389i |
| | 0.2500 | −0.2500 |
| | −0.2310 + 0.0957i | 0.2452 − 0.0488i |
| | 0.1768 − 0.1768i | −0.2310 + 0.0957i |
| | −0.0957 + 0.2310i | 0.2079 − 0.1389i |

| ans(:, :, 9, 9) = | 0.2500 | 0.2500 |
| | −0.2500 + 0.0000i | −0.2452 − 0.0488i |
| | 0.2500 − 0.0000i | 0.2310 + 0.0957i |
| | −0.2500 + 0.0000i | −0.2079 − 0.1389i |
| | 0.2500 | −0.2500 |
| | −0.2500 + 0.0000i | 0.2452 + 0.0488i |
| | 0.2500 − 0.0000i | −0.2310 − 0.0957i |
| | −0.2500 + 0.0000i | 0.2079 + 0.1389i |
| ans(:, :, 10, 9) = | 0.2500 | 0.2500 |
| | −0.2310 − 0.0957i | −0.2079 − 0.1389i |
| | 0.1768 + 0.1768i | 0.0957 + 0.2310i |
| | −0.0957 − 0.2310i | 0.0488 − 0.2452i |
| | 0.2500 | −0.2500 |
| | −0.2310 − 0.0957i | 0.2079 + 0.1389i |
| | 0.1768 + 0.1768i | −0.0957 − 0.2310i |
| | −0.0957 − 0.2310i | −0.0488 + 0.2452i |
| ans(:, :, 11, 9) = | 0.2500 | 0.2500 |
| | −0.1768 − 0.1768i | −0.1389 − 0.2079i |
| | 0.0000 + 0.2500i | −0.0957 + 0.2310i |
| | 0.1768 − 0.1768i | 0.2452 − 0.0488i |
| | 0.2500 | −0.2500 |
| | −0.1768 − 0.1768i | 0.1389 + 0.2079i |
| | 0.0000 + 0.2500i | 0.0957 − 0.2310i |
| | 0.1768 − 0.1768i | −0.2452 + 0.0488i |
| ans(:, :, 12, 9) = | 0.2500 | 0.2500 |
| | −0.0957 − 0.2310i | −0.0488 − 0.2452i |
| | −0.1768 + 0.1768i | −0.2310 + 0.0957i |
| | 0.2310 + 0.0957i | 0.1389 + 0.2079i |
| | 0.2500 | −0.2500 |
| | −0.0957 − 0.2310i | 0.0488 + 0.2452i |
| | −0.1768 + 0.1768i | 0.2310 − 0.0957i |
| | 0.2310 + 0.0957i | −0.1389 − 0.2079i |
| ans(:, :, 13, 9) = | 0.2500 | 0.2500 |
| | −0.0000 − 0.2500i | 0.0488 − 0.2452i |
| | −0.2500 + 0.0000i | −0.2310 − 0.0957i |
| | 0.0000 + 0.2500i | −0.1389 + 0.2079i |
| | 0.2500 | −0.2500 |
| | −0.0000 − 0.2500i | −0.0488 + 0.2452i |
| | −0.2500 + 0.0000i | 0.2310 + 0.0957i |
| | 0.0000 + 0.2500i | 0.1389 − 0.2079i |
| ans(:, :, 14, 9) = | 0.2500 | 0.2500 |
| | 0.0957 − 0.2310i | 0.1389 − 0.2079i |
| | −0.1768 − 0.1768i | −0.0957 − 0.2310i |
| | −0.2310 + 0.0957i | −0.2452 − 0.0488i |
| | 0.2500 | −0.2500 |
| | 0.0957 − 0.2310i | −0.1389 + 0.2079i |
| | −0.1768 − 0.1768i | 0.0957 + 0.2310i |
| | −0.2310 + 0.0957i | 0.2452 + 0.0488i |
| ans(:, :, 15, 9) = | 0.2500 | 0.2500 |
| | 0.1768 − 0.1768i | 0.2079 − 0.1389i |
| | −0.0000 − 0.2500i | 0.0957 − 0.2310i |
| | −0.1768 − 0.1768i | −0.0488 − 0.2452i |
| | 0.2500 | −0.2500 |
| | 0.1768 − 0.1768i | −0.2079 + 0.1389i |
| | −0.0000 − 0.2500i | −0.0957 + 0.2310i |
| | −0.1768 − 0.1768i | 0.0488 + 0.2452i |
| ans(:, :, 16, 9) = | 0.2500 | 0.2500 |
| | 0.2310 − 0.0957i | 0.2452 − 0.0488i |
| | 0.1768 − 0.1768i | 0.2310 − 0.0957i |
| | 0.0957 − 0.2310i | 0.2079 − 0.1389i |
| | 0.2500 | −0.2500 |
| | 0.2310 − 0.0957i | −0.2452 + 0.0488i |
| | 0.1768 − 0.1768i | −0.2310 + 0.0957i |
| | 0.0957 − 0.2310i | −0.2079 + 0.1389i |
| ans(:, :, 1, 10) = | 0.2500 | 0.2500 |
| | 0.2500 | 0.2452 + 0.0488i |
| | 0.2500 | 0.2310 + 0.0957i |
| | 0.2500 | 0.2079 + 0.1389i |
| | 0 + 0.2500i | 0 − 0.2500i |
| | 0 + 0.2500i | 0.0488 − 0.2452i |
| | 0 + 0.2500i | 0.0957 − 0.2310i |
| | 0 + 0.2500i | 0.1389 − 0.2079i |

-continued

| | | |
|---|---|---|
| ans(:, :, 2, 10) = | 0.2500 | 0.2500 |
| | 0.2310 + 0.0957i | 0.2079 + 0.1389i |
| | 0.1768 + 0.1768i | 0.0957 + 0.2310i |
| | 0.0957 + 0.2310i | −0.0488 + 0.2452i |
| | 0 + 0.2500i | 0 − 0.2500i |
| | −0.0957 + 0.2310i | 0.1389 − 0.2079i |
| | −0.1768 + 0.1768i | 0.2310 − 0.0957i |
| | −0.2310 + 0.0957i | 0.2452 + 0.0488i |
| ans(:, :, 3, 10) = | 0.2500 | 0.2500 |
| | 0.1768 + 0.1768i | 0.1389 + 0.2079i |
| | 0.0000 + 0.2500i | −0.0957 + 0.2310i |
| | −0.1768 + 0.1768i | −0.2452 + 0.0488i |
| | 0 + 0.2500i | 0 − 0.2500i |
| | −0.1768 + 0.1768i | 0.2079 − 0.1389i |
| | −0.2500 + 0.0000i | 0.2310 + 0.0957i |
| | −0.1768 − 0.1768i | 0.0488 + 0.2452i |
| ans(:, :, 4, 10) = | 0.2500 | 0.2500 |
| | 0.0957 + 0.2310i | 0.0488 + 0.2452i |
| | −0.1768 + 0.1768i | −0.2310 + 0.0957i |
| | −0.2310 − 0.0957i | −0.1389 − 0.2079i |
| | 0 + 0.2500i | 0 − 0.2500i |
| | −0.2310 + 0.0957i | 0.2452 − 0.0488i |
| | −0.1768 − 0.1768i | 0.0957 + 0.2310i |
| | 0.0957 − 0.2310i | −0.2079 + 0.1389i |
| ans(:, :, 5, 10) = | 0.2500 | 0.2500 |
| | 0.0000 + 0.2500i | −0.0488 + 0.2452i |
| | −0.2500 + 0.0000i | −0.2310 − 0.0957i |
| | −0.0000 − 0.2500i | 0.1389 − 0.2079i |
| | 0 + 0.2500i | 0 − 0.2500i |
| | −0.2500 + 0.0000i | 0.2452 + 0.0488i |
| | −0.0000 − 0.2500i | −0.0957 + 0.2310i |
| | 0.2500 − 0.0000i | −0.2079 − 0.1389i |
| ans(:, :, 6, 10) = | 0.2500 | 0.2500 |
| | −0.0957 + 0.2310i | −0.1389 + 0.2079i |
| | −0.1768 − 0.1768i | −0.0957 − 0.2310i |
| | 0.2310 − 0.0957i | 0.2452 + 0.0488i |
| | 0 + 0.2500i | 0 − 0.2500i |
| | −0.2310 − 0.0957i | 0.2079 + 0.1389i |
| | 0.1768 − 0.1768i | −0.2310 + 0.0957i |
| | 0.0957 + 0.2310i | 0.0488 − 0.2452i |
| ans(:, :, 7, 10) = | 0.2500 | 0.2500 |
| | −0.1768 + 0.1768i | −0.2079 + 0.1389i |
| | −0.0000 − 0.2500i | 0.0957 − 0.2310i |
| | 0.1768 + 0.1768i | 0.0488 + 0.2452i |
| | 0 + 0.2500i | 0 − 0.2500i |
| | −0.1768 − 0.1768i | 0.1389 + 0.2079i |
| | 0.2500 − 0.0000i | −0.2310 − 0.0957i |
| | −0.1768 + 0.1768i | 0.2452 − 0.0488i |
| ans(:, :, 8, 10) = | 0.2500 | 0.2500 |
| | −0.2310 + 0.0957i | −0.2452 + 0.0488i |
| | 0.1768 − 0.1768i | 0.2310 − 0.0957i |
| | −0.0957 + 0.2310i | −0.2079 + 0.1389i |
| | 0 + 0.2500i | 0 − 0.2500i |
| | −0.0957 − 0.2310i | 0.0488 + 0.2452i |
| | 0.1768 + 0.1768i | −0.0957 − 0.2310i |
| | −0.2310 − 0.0957i | 0.1389 + 0.2079i |
| ans(:, :, 9, 10) = | 0.2500 | 0.2500 |
| | −0.2500 + 0.0000i | −0.2452 − 0.0488i |
| | 0.2500 − 0.0000i | 0.2310 + 0.0957i |
| | −0.2500 + 0.0000i | −0.2079 − 0.1389i |
| | 0 + 0.2500i | 0 − 0.2500i |
| | −0.0000 − 0.2500i | −0.0488 + 0.2452i |
| | 0.0000 + 0.2500i | 0.0957 − 0.2310i |
| | −0.0000 − 0.2500i | −0.1389 + 0.2079i |
| ans(:, :, 10, 10) = | 0.2500 | 0.2500 |
| | −0.2310 − 0.0957i | −0.2079 − 0.1389i |
| | 0.1768 + 0.1768i | 0.0957 + 0.2310i |
| | −0.0957 − 0.2310i | 0.0488 − 0.2452i |
| | 0 + 0.2500i | 0 − 0.2500i |
| | 0.0957 − 0.2310i | −0.1389 + 0.2079i |
| | −0.1768 + 0.1768i | 0.2310 − 0.0957i |
| | 0.2310 − 0.0957i | −0.2452 − 0.0488i |

-continued

| | | |
|---|---|---|
| ans(:, :, 11, 10) = | 0.2500 | 0.2500 |
| | −0.1768 − 0.1768i | −0.1389 − 0.2079i |
| | 0.0000 + 0.2500i | −0.0957 + 0.2310i |
| | 0.1768 − 0.1768i | 0.2452 − 0.0488i |
| | 0 + 0.2500i | 0 − 0.2500i |
| | 0.1768 − 0.1768i | −0.2079 + 0.1389i |
| | −0.2500 + 0.0000i | 0.2310 + 0.0957i |
| | 0.1768 + 0.1768i | −0.0488 − 0.2452i |
| ans(:, :, 12, 10) = | 0.2500 | 0.2500 |
| | −0.0957 − 0.2310i | −0.0488 − 0.2452i |
| | −0.1768 + 0.1768i | −0.2310 + 0.0957i |
| | 0.2310 + 0.0957i | 0.1389 + 0.2079i |
| | 0 + 0.2500i | 0 − 0.2500i |
| | 0.2310 − 0.0957i | −0.2452 + 0.0488i |
| | −0.1768 − 0.1768i | 0.0957 + 0.2310i |
| | −0.0957 + 0.2310i | 0.2079 − 0.1389i |
| ans(:, :, 13, 10) = | 0.2500 | 0.2500 |
| | −0.0000 − 0.2500i | 0.0488 − 0.2452i |
| | −0.2500 + 0.0000i | −0.2310 − 0.0957i |
| | 0.0000 + 0.2500i | −0.1389 + 0.2079i |
| | 0 + 0.2500i | 0 − 0.2500i |
| | 0.2500 − 0.0000i | −0.2452 − 0.0488i |
| | −0.0000 − 0.2500i | −0.0957 + 0.2310i |
| | −0.2500 + 0.0000i | 0.2079 + 0.1389i |
| ans(:, :, 14, 10) = | 0.2500 | 0.2500 |
| | 0.0957 − 0.2310i | 0.1389 − 0.2079i |
| | −0.1768 − 0.1768i | −0.0957 − 0.2310i |
| | −0.2310 + 0.0957i | −0.2452 − 0.0488i |
| | 0 + 0.2500i | 0 − 0.2500i |
| | 0.2310 + 0.0957i | −0.2079 − 0.1389i |
| | 0.1768 − 0.1768i | −0.2310 + 0.0957i |
| | −0.0957 − 0.2310i | −0.0488 + 0.2452i |
| ans(:, :, 15, 10) = | 0.2500 | 0.2500 |
| | 0.1768 − 0.1768i | 0.2079 − 0.1389i |
| | −0.0000 − 0.2500i | 0.0957 − 0.2310i |
| | −0.1768 − 0.1768i | −0.0488 − 0.2452i |
| | 0 + 0.2500i | 0 − 0.2500i |
| | 0.1768 + 0.1768i | −0.1389 − 0.2079i |
| | 0.2500 − 0.0000i | −0.2310 − 0.0957i |
| | 0.1768 − 0.1768i | −0.2452 + 0.0488i |
| ans(:, :, 16, 10) = | 0.2500 | 0.2500 |
| | 0.2310 − 0.0957i | 0.2452 − 0.0488i |
| | 0.1768 − 0.1768i | 0.2310 − 0.0957i |
| | 0.0957 − 0.2310i | 0.2079 − 0.1389i |
| | 0 + 0.2500i | 0 − 0.2500i |
| | 0.0957 + 0.2310i | −0.0488 − 0.2452i |
| | 0.1768 + 0.1768i | −0.0957 − 0.2310i |
| | 0.2310 + 0.0957i | −0.1389 − 0.2079i |
| ans(:, :, 1, 11) = | 0.2500 | 0.2500 |
| | 0.2452 + 0.0488i | 0.2310 + 0.0957i |
| | 0.2310 + 0.0957i | 0.1768 + 0.1768i |
| | 0.2079 + 0.1389i | 0.0957 + 0.2310i |
| | 0.2500 | −0.2500 |
| | 0.2452 + 0.0488i | −0.2310 − 0.0957i |
| | 0.2310 + 0.0957i | −0.1768 − 0.1768i |
| | 0.2079 + 0.1389i | −0.0957 − 0.2310i |
| ans(:, :, 2, 11) = | 0.2500 | 0.2500 |
| | 0.2079 + 0.1389i | 0.1768 + 0.1768i |
| | 0.0957 + 0.2310i | 0.0000 + 0.2500i |
| | −0.0488 + 0.2452i | −0.1768 + 0.1768i |
| | 0.2500 | −0.2500 |
| | 0.2079 + 0.1389i | −0.1768 − 0.1768i |
| | 0.0957 + 0.2310i | −0.0000 − 0.2500i |
| | −0.0488 + 0.2452i | 0.1768 − 0.1768i |
| ans(:, :, 3, 11) = | 0.2500 | 0.2500 |
| | 0.1389 + 0.2079i | 0.0957 + 0.2310i |
| | −0.0957 + 0.2310i | −0.1768 + 0.1768i |
| | −0.2452 + 0.0488i | −0.2310 − 0.0957i |
| | 0.2500 | −0.2500 |
| | 0.1389 + 0.2079i | −0.0957 − 0.2310i |
| | −0.0957 + 0.2310i | 0.1768 − 0.1768i |
| | −0.2452 + 0.0488i | 0.2310 + 0.0957i |

-continued

| | | |
|---|---|---|
| ans(:, :, 4, 11) = | 0.2500 | 0.2500 |
| | 0.0488 + 0.2452i | 0.0000 + 0.2500i |
| | −0.2310 + 0.0957i | −0.2500 + 0.0000i |
| | −0.1389 − 0.2079i | −0.0000 − 0.2500i |
| | 0.2500 | −0.2500 |
| | 0.0488 + 0.2452i | −0.0000 − 0.2500i |
| | −0.2310 + 0.0957i | 0.2500 − 0.0000i |
| | −0.1389 − 0.2079i | 0.0000 + 0.2500i |
| ans(:, :, 5, 11) = | 0.2500 | 0.2500 |
| | −0.0488 + 0.2452i | −0.0957 + 0.2310i |
| | −0.2310 − 0.0957i | −0.1768 − 0.1768i |
| | 0.1389 − 0.2079i | 0.2310 − 0.0957i |
| | 0.2500 | −0.2500 |
| | −0.0488 + 0.2452i | 0.0957 − 0.2310i |
| | −0.2310 − 0.0957i | 0.1768 + 0.1768i |
| | 0.1389 − 0.2079i | −0.2310 + 0.0957i |
| ans(:, :, 6, 11) = | 0.2500 | 0.2500 |
| | −0.1389 + 0.2079i | −0.1768 + 0.1768i |
| | −0.0957 − 0.2310i | −0.0000 − 0.2500i |
| | 0.2452 + 0.0488i | 0.1768 + 0.1768i |
| | 0.2500 | −0.2500 |
| | −0.1389 + 0.2079i | 0.1768 − 0.1768i |
| | −0.0957 − 0.2310i | 0.0000 + 0.2500i |
| | 0.2452 + 0.0488i | −0.1768 − 0.1768i |
| ans(:, :, 7, 11) = | 0.2500 | 0.2500 |
| | −0.2079 + 0.1389i | −0.2310 + 0.0957i |
| | 0.0957 − 0.2310i | 0.1768 − 0.1768i |
| | 0.0488 + 0.2452i | −0.0957 + 0.2310i |
| | 0.2500 | −0.2500 |
| | −0.2079 + 0.1389i | 0.2310 − 0.0957i |
| | 0.0957 − 0.2310i | −0.1768 + 0.1768i |
| | 0.0488 + 0.2452i | 0.0957 − 0.2310i |
| ans(:, :, 8, 11) = | 0.2500 | 0.2500 |
| | −0.2452 + 0.0488i | −0.2500 + 0.0000i |
| | 0.2310 − 0.0957i | 0.2500 − 0.0000i |
| | −0.2079 + 0.1389i | −0.2500 + 0.0000i |
| | 0.2500 | −0.2500 |
| | −0.2452 + 0.0488i | 0.2500 − 0.0000i |
| | 0.2310 − 0.0957i | −0.2500 + 0.0000i |
| | −0.2079 + 0.1389i | 0.2500 − 0.0000i |
| ans(:, :, 9, 11) = | 0.2500 | 0.2500 |
| | −0.2452 − 0.0488i | −0.2310 − 0.0957i |
| | 0.2310 + 0.0957i | 0.1768 + 0.1768i |
| | −0.2079 − 0.1389i | −0.0957 − 0.2310i |
| | 0.2500 | −0.2500 |
| | −0.2452 − 0.0488i | 0.2310 + 0.0957i |
| | 0.2310 + 0.0957i | −0.1768 − 0.1768i |
| | −0.2079 − 0.1389i | 0.0957 + 0.2310i |
| ans(:, :, 10, 11) = | 0.2500 | 0.2500 |
| | −0.2079 − 0.1389i | −0.1768 − 0.1768i |
| | 0.0957 + 0.2310i | 0.0000 + 0.2500i |
| | 0.0488 − 0.2452i | 0.1768 − 0.1768i |
| | 0.2500 | −0.2500 |
| | −0.2079 − 0.1389i | 0.1768 + 0.1768i |
| | 0.0957 + 0.2310i | −0.0000 − 0.2500i |
| | 0.0488 − 0.2452i | −0.1768 + 0.1768i |
| ans(:, :, 11, 11) = | 0.2500 | 0.2500 |
| | −0.1389 − 0.2079i | −0.0957 − 0.2310i |
| | −0.0957 + 0.2310i | −0.1768 + 0.1768i |
| | 0.2452 − 0.0488i | 0.2310 + 0.0957i |
| | 0.2500 | −0.2500 |
| | −0.1389 − 0.2079i | 0.0957 + 0.2310i |
| | −0.0957 + 0.2310i | 0.1768 − 0.1768i |
| | 0.2452 − 0.0488i | −0.2310 − 0.0957i |
| ans(:, :, 12, 11) = | 0.2500 | 0.2500 |
| | −0.0488 − 0.2452i | −0.0000 − 0.2500i |
| | −0.2310 + 0.0957i | −0.2500 + 0.0000i |
| | 0.1389 + 0.2079i | 0.0000 + 0.2500i |
| | 0.2500 | −0.2500 |
| | −0.0488 − 0.2452i | 0.0000 + 0.2500i |
| | −0.2310 + 0.0957i | 0.2500 − 0.0000i |
| | 0.1389 + 0.2079i | −0.0000 − 0.2500i |

-continued

| | | |
|---|---|---|
| ans(:, :, 13, 11) = | 0.2500 | 0.2500 |
| | 0.0488 − 0.2452i | 0.0957 − 0.2310i |
| | −0.2310 − 0.0957i | −0.1768 − 0.1768i |
| | −0.1389 + 0.2079i | −0.2310 + 0.0957i |
| | 0.2500 | −0.2500 |
| | 0.0488 − 0.2452i | −0.0957 + 0.2310i |
| | −0.2310 − 0.0957i | 0.1768 + 0.1768i |
| | −0.1389 + 0.2079i | 0.2310 − 0.0957i |
| ans(:, :, 14, 11) = | 0.2500 | 0.2500 |
| | 0.1389 − 0.2079i | 0.1768 − 0.1768i |
| | −0.0957 − 0.2310i | −0.0000 − 0.2500i |
| | −0.2452 − 0.0488i | −0.1768 − 0.1768i |
| | 0.2500 | −0.2500 |
| | 0.1389 − 0.2079i | −0.1768 + 0.1768i |
| | −0.0957 − 0.2310i | 0.0000 + 0.2500i |
| | −0.2452 − 0.0488i | 0.1768 + 0.1768i |
| ans(:, :, 15, 11) = | 0.2500 | 0.2500 |
| | 0.2079 − 0.1389i | 0.2310 − 0.0957i |
| | 0.0957 − 0.2310i | 0.1768 − 0.1768i |
| | −0.0488 − 0.2452i | 0.0957 − 0.2310i |
| | 0.2500 | −0.2500 |
| | 0.2079 − 0.1389i | −0.2310 + 0.0957i |
| | 0.0957 − 0.2310i | −0.1768 + 0.1768i |
| | −0.0488 − 0.2452i | −0.0957 + 0.2310i |
| ans(:, :, 16, 11) = | 0.2500 | 0.2500 |
| | 0.2452 − 0.0488i | 0.2500 |
| | 0.2310 − 0.0957i | 0.2500 |
| | 0.2079 − 0.1389i | 0.2500 |
| | 0.2500 | −0.2500 |
| | 0.2452 − 0.0488i | −0.2500 |
| | 0.2310 − 0.0957i | −0.2500 |
| | 0.2079 − 0.1389i | −0.2500 |
| ans(:, :, 1, 12) = | 0.2500 | 0.2500 |
| | 0.2452 + 0.0488i | 0.2310 + 0.0957i |
| | 0.2310 + 0.0957i | 0.1768 + 0.1768i |
| | 0.2079 + 0.1389i | 0.0957 + 0.2310i |
| | 0 + 0.2500i | 0 − 0.2500i |
| | −0.0488 + 0.2452i | 0.0957 − 0.2310i |
| | −0.0957 + 0.2310i | 0.1768 − 0.1768i |
| | −0.1389 + 0.2079i | 0.2310 − 0.0957i |
| ans(:, :, 2, 12) = | 0.2500 | 0.2500 |
| | 0.2079 + 0.1389i | 0.1768 + 0.1768i |
| | 0.0957 + 0.2310i | 0.0000 + 0.2500i |
| | −0.0488 + 0.2452i | −0.1768 + 0.1768i |
| | 0 + 0.2500i | 0 − 0.2500i |
| | −0.1389 + 0.2079i | 0.1768 − 0.1768i |
| | −0.2310 + 0.0957i | 0.2500 − 0.0000i |
| | −0.2452 − 0.0488i | 0.1768 + 0.1768i |
| ans(:, :, 3, 12) = | 0.2500 | 0.2500 |
| | 0.1389 + 0.2079i | 0.0957 + 0.2310i |
| | −0.0957 + 0.2310i | −0.1768 + 0.1768i |
| | −0.2452 + 0.0488i | −0.2310 − 0.0957i |
| | 0 + 0.2500i | 0 − 0.2500i |
| | −0.2079 + 0.1389i | 0.2310 − 0.0957i |
| | −0.2310 − 0.0957i | 0.1768 + 0.1768i |
| | −0.0488 − 0.2452i | −0.0957 + 0.2310i |
| ans(:, :, 4, 12) = | 0.2500 | 0.2500 |
| | 0.0488 + 0.2452i | 0.0000 + 0.2500i |
| | −0.2310 + 0.0957i | −0.2500 + 0.0000i |
| | −0.1389 − 0.2079i | −0.0000 − 0.2500i |
| | 0 + 0.2500i | 0 − 0.2500i |
| | −0.2452 + 0.0488i | 0.2500 − 0.0000i |
| | −0.0957 − 0.2310i | 0.0000 + 0.2500i |
| | 0.2079 − 0.1389i | −0.2500 + 0.0000i |
| ans(:, :, 5, 12) = | 0.2500 | 0.2500 |
| | −0.0488 + 0.2452i | −0.0957 + 0.2310i |
| | −0.2310 − 0.0957i | −0.1768 − 0.1768i |
| | 0.1389 − 0.2079i | 0.2310 − 0.0957i |
| | 0 + 0.2500i | 0 − 0.2500i |
| | −0.2452 − 0.0488i | 0.2310 + 0.0957i |
| | 0.0957 − 0.2310i | −0.1768 + 0.1768i |
| | 0.2079 + 0.1389i | −0.0957 − 0.2310i |

-continued

| | | |
|---|---|---|
| ans(:, :, 6, 12) = | 0.2500 | 0.2500 |
| | −0.1389 + 0.2079i | −0.1768 + 0.1768i |
| | −0.0957 − 0.2310i | −0.0000 − 0.2500i |
| | 0.2452 + 0.0488i | 0.1768 + 0.1768i |
| | 0 + 0.2500i | 0 − 0.2500i |
| | −0.2079 − 0.1389i | 0.1768 + 0.1768i |
| | 0.2310 − 0.0957i | −0.2500 + 0.0000i |
| | −0.0488 + 0.2452i | 0.1768 − 0.1768i |
| ans(:, :, 7, 12) = | 0.2500 | 0.2500 |
| | −0.2079 + 0.1389i | −0.2310 + 0.0957i |
| | 0.0957 − 0.2310i | 0.1768 − 0.1768i |
| | 0.0488 + 0.2452i | −0.0957 + 0.2310i |
| | 0 + 0.2500i | 0 − 0.2500i |
| | −0.1389 − 0.2079i | 0.0957 + 0.2310i |
| | 0.2310 + 0.0957i | −0.1768 − 0.1768i |
| | −0.2452 + 0.0488i | 0.2310 + 0.0957i |
| ans(:, :, 8, 12) = | 0.2500 | 0.2500 |
| | −0.2452 + 0.0488i | −0.2500 + 0.0000i |
| | 0.2310 − 0.0957i | 0.2500 − 0.0000i |
| | −0.2079 + 0.1389i | −0.2500 + 0.0000i |
| | 0 + 0.2500i | 0 − 0.2500i |
| | −0.0488 − 0.2452i | 0.0000 + 0.2500i |
| | 0.0957 + 0.2310i | −0.0000 − 0.2500i |
| | −0.1389 − 0.2079i | 0.0000 + 0.2500i |
| ans(:, :, 9, 12) = | 0.2500 | 0.2500 |
| | −0.2452 − 0.0488i | −0.2310 − 0.0957i |
| | 0.2310 + 0.0957i | 0.1768 + 0.1768i |
| | −0.2079 − 0.1389i | −0.0957 − 0.2310i |
| | 0 + 0.2500i | 0 − 0.2500i |
| | 0.0488 − 0.2452i | −0.0957 − 0.2310i |
| | −0.0957 + 0.2310i | 0.1768 − 0.1768i |
| | 0.1389 − 0.2079i | −0.2310 + 0.0957i |
| ans(:, :, 10, 12) = | 0.2500 | 0.2500 |
| | −0.2079 − 0.1389i | −0.1768 − 0.1768i |
| | 0.0957 + 0.2310i | 0.0000 + 0.2500i |
| | 0.0488 − 0.2452i | 0.1768 − 0.1768i |
| | 0 + 0.2500i | 0 − 0.2500i |
| | 0.1389 − 0.2079i | −0.1768 + 0.1768i |
| | −0.2310 + 0.0957i | 0.2500 − 0.0000i |
| | 0.2452 + 0.0488i | −0.1768 − 0.1768i |
| ans(:, :, 11, 12) = | 0.2500 | 0.2500 |
| | −0.1389 − 0.2079i | −0.0957 − 0.2310i |
| | −0.0957 + 0.2310i | −0.1768 + 0.1768i |
| | 0.2452 − 0.0488i | 0.2310 + 0.0957i |
| | 0 + 0.2500i | 0 − 0.2500i |
| | 0.2079 − 0.1389i | −0.2310 + 0.0957i |
| | −0.2310 − 0.0957i | 0.1768 + 0.1768i |
| | 0.0488 + 0.2452i | 0.0957 − 0.2310i |
| ans(:, :, 12, 12) = | 0.2500 | 0.2500 |
| | −0.0488 − 0.2452i | −0.0000 − 0.2500i |
| | −0.2310 + 0.0957i | −0.2500 + 0.0000i |
| | 0.1389 + 0.2079i | 0.0000 + 0.2500i |
| | 0 + 0.2500i | 0 − 0.2500i |
| | 0.2452 − 0.0488i | −0.2500 + 0.0000i |
| | −0.0957 − 0.2310i | 0.0000 + 0.2500i |
| | −0.2079 + 0.1389i | 0.2500 − 0.0000i |
| ans(:, :, 13, 12) = | 0.2500 | 0.2500 |
| | 0.0488 − 0.2452i | 0.0957 − 0.2310i |
| | −0.2310 − 0.0957i | −0.1768 − 0.1768i |
| | −0.1389 + 0.2079i | −0.2310 + 0.0957i |
| | 0 + 0.2500i | 0 − 0.2500i |
| | 0.2452 + 0.0488i | −0.2310 − 0.0957i |
| | 0.0957 − 0.2310i | −0.1768 + 0.1768i |
| | −0.2079 − 0.1389i | 0.0957 + 0.2310i |
| ans(:, :, 14, 12) = | 0.2500 | 0.2500 |
| | 0.1389 − 0.2079i | 0.1768 − 0.1768i |
| | −0.0957 − 0.2310i | −0.0000 − 0.2500i |
| | −0.2452 − 0.0488i | −0.1768 − 0.1768i |
| | 0 + 0.2500i | 0 − 0.2500i |
| | 0.2079 + 0.1389i | −0.1768 − 0.1768i |
| | 0.2310 − 0.0957i | −0.2500 + 0.0000i |
| | 0.0488 − 0.2452i | −0.1768 + 0.1768i |

-continued

| | | |
|---|---|---|
| ans(:, :, 15, 12) = | 0.2500 | 0.2500 |
| | 0.2079 − 0.1389i | 0.2310 − 0.0957i |
| | 0.0957 − 0.2310i | 0.1768 − 0.1768i |
| | −0.0488 − 0.2452i | 0.0957 − 0.2310i |
| | 0 + 0.2500i | 0 − 0.2500i |
| | 0.1389 + 0.2079i | −0.0957 − 0.2310i |
| | 0.2310 + 0.0957i | −0.1768 − 0.1768i |
| | 0.2452 − 0.0488i | −0.2310 − 0.0957i |
| ans(:, :, 16, 12) = | 0.2500 | 0.2500 |
| | 0.2452 − 0.0488i | 0.2500 |
| | 0.2310 − 0.0957i | 0.2500 |
| | 0.2079 − 0.1389i | 0.2500 |
| | 0 + 0.2500i | 0 − 0.2500i |
| | 0.0488 + 0.2452i | 0 − 0.2500i |
| | 0.0957 + 0.2310i | 0 − 0.2500i |
| | 0.1389 + 0.2079i | 0 − 0.2500i |
| ans(:, :, 1, 13) = | 0.2500 | 0.2500 |
| | 0.2500 | 0.2079 + 0.1389i |
| | 0.2500 | 0.0957 + 0.2310i |
| | 0.2500 | −0.0488 + 0.2452i |
| | 0.2500 | −0.2500 |
| | 0.2500 | −0.2079 − 0.1389i |
| | 0.2500 | −0.0957 − 0.2310i |
| | 0.2500 | 0.0488 − 0.2452i |
| ans(:, :, 2, 13) = | 0.2500 | 0.2500 |
| | 0.2310 + 0.0957i | 0.1389 + 0.2079i |
| | 0.1768 + 0.1768i | −0.0957 + 0.2310i |
| | 0.0957 + 0.2310i | −0.2452 + 0.0488i |
| | 0.2500 | −0.2500 |
| | 0.2310 + 0.0957i | −0.1389 − 0.2079i |
| | 0.1768 + 0.1768i | 0.0957 − 0.2310i |
| | 0.0957 + 0.2310i | 0.2452 − 0.0488i |
| ans(:, :, 3, 13) = | 0.2500 | 0.2500 |
| | 0.1768 + 0.1768i | 0.0488 + 0.2452i |
| | 0.0000 + 0.2500i | −0.2310 + 0.0957i |
| | −0.1768 + 0.1768i | −0.1389 − 0.2079i |
| | 0.2500 | −0.2500 |
| | 0.1768 + 0.1768i | −0.0488 − 0.2452i |
| | 0.0000 + 0.2500i | 0.2310 − 0.0957i |
| | −0.1768 + 0.1768i | 0.1389 + 0.2079i |
| ans(:, :, 4, 13) = | 0.2500 | 0.2500 |
| | 0.0957 + 0.2310i | −0.0488 + 0.2452i |
| | −0.1768 + 0.1768i | −0.2310 − 0.0957i |
| | −0.2310 − 0.0957i | 0.1389 − 0.2079i |
| | 0.2500 | −0.2500 |
| | 0.0957 + 0.2310i | 0.0488 − 0.2452i |
| | −0.1768 + 0.1768i | 0.2310 + 0.0957i |
| | −0.2310 − 0.0957i | −0.1389 + 0.2079i |
| ans(:, :, 5, 13) = | 0.2500 | 0.2500 |
| | 0.0000 + 0.2500i | −0.1389 + 0.2079i |
| | −0.2500 + 0.0000i | −0.0957 − 0.2310i |
| | −0.0000 − 0.2500i | 0.2452 + 0.0488i |
| | 0.2500 | −0.2500 |
| | 0.0000 + 0.2500i | 0.1389 − 0.2079i |
| | −0.2500 + 0.0000i | 0.0957 + 0.2310i |
| | −0.0000 − 0.2500i | −0.2452 − 0.0488i |
| ans(:, :, 6, 13) = | 0.2500 | 0.2500 |
| | −0.0957 + 0.2310i | −0.2079 + 0.1389i |
| | −0.1768 − 0.1768i | 0.0957 − 0.2310i |
| | 0.2310 − 0.0957i | 0.0488 + 0.2452i |
| | 0.2500 | −0.2500 |
| | −0.0957 + 0.2310i | 0.2079 − 0.1389i |
| | −0.1768 − 0.1768i | −0.0957 + 0.2310i |
| | 0.2310 − 0.0957i | −0.0488 − 0.2452i |
| ans(:, :, 7, 13) = | 0.2500 | 0.2500 |
| | −0.1768 + 0.1768i | −0.2452 + 0.0488i |
| | −0.0000 − 0.2500i | 0.2310 − 0.0957i |
| | 0.1768 + 0.1768i | −0.2079 + 0.1389i |
| | 0.2500 | −0.2500 |
| | −0.1768 + 0.1768i | 0.2452 − 0.0488i |
| | −0.0000 − 0.2500i | −0.2310 + 0.0957i |
| | 0.1768 + 0.1768i | 0.2079 − 0.1389i |

-continued ans(:, :, 8, 13) =
| | 0.2500 | 0.2500 |
|---|---|---|
| | −0.2310 + 0.0957i | −0.2452 − 0.0488i |
| | 0.1768 − 0.1768i | 0.2310 + 0.0957i |
| | −0.0957 + 0.2310i | −0.2079 − 0.1389i |
| | 0.2500 | −0.2500 |
| | −0.2310 + 0.0957i | 0.2452 + 0.0488i |
| | 0.1768 − 0.1768i | −0.2310 − 0.0957i |
| | −0.0957 + 0.2310i | 0.2079 + 0.1389i | ans(:, :, 9, 13) =
| | 0.2500 | 0.2500 |
|---|---|---|
| | −0.2500 + 0.0000i | −0.2079 − 0.1389i |
| | 0.2500 − 0.0000i | 0.0957 + 0.2310i |
| | −0.2500 + 0.0000i | 0.0488 − 0.2452i |
| | 0.2500 | −0.2500 |
| | −0.2500 + 0.0000i | 0.2079 + 0.1389i |
| | 0.2500 − 0.0000i | −0.0957 − 0.2310i |
| | −0.2500 + 0.0000i | −0.0488 + 0.2452i | ans(:, :, 10, 13) =
| | 0.2500 | 0.2500 |
|---|---|---|
| | −0.2310 − 0.0957i | −0.1389 − 0.2079i |
| | 0.1768 + 0.1768i | −0.0957 + 0.2310i |
| | −0.0957 − 0.2310i | 0.2452 − 0.0488i |
| | 0.2500 | −0.2500 |
| | −0.2310 − 0.0957i | 0.1389 + 0.2079i |
| | 0.1768 + 0.1768i | 0.0957 − 0.2310i |
| | −0.0957 − 0.2310i | −0.2452 + 0.0488i | ans(:, :, 11, 13) =
| | 0.2500 | 0.2500 |
|---|---|---|
| | −0.1768 − 0.1768i | −0.0488 − 0.2452i |
| | 0.0000 + 0.2500i | −0.2310 + 0.0957i |
| | 0.1768 − 0.1768i | 0.1389 + 0.2079i |
| | 0.2500 | −0.2500 |
| | −0.1768 − 0.1768i | 0.0488 + 0.2452i |
| | 0.0000 + 0.2500i | 0.2310 − 0.0957i |
| | 0.1768 − 0.1768i | −0.1389 − 0.2079i | ans(:, :, 12, 13) =
| | 0.2500 | 0.2500 |
|---|---|---|
| | −0.0957 − 0.2310i | 0.0488 − 0.2452i |
| | −0.1768 + 0.1768i | −0.2310 − 0.0957i |
| | 0.2310 + 0.0957i | −0.1389 + 0.2079i |
| | 0.2500 | −0.2500 |
| | −0.0957 − 0.2310i | −0.0488 + 0.2452i |
| | −0.1768 + 0.1768i | 0.2310 + 0.0957i |
| | 0.2310 + 0.0957i | 0.1389 − 0.2079i | ans(:, :, 13, 13) =
| | 0.2500 | 0.2500 |
|---|---|---|
| | −0.0000 − 0.2500i | 0.1389 − 0.2079i |
| | −0.2500 + 0.0000i | −0.0957 − 0.2310i |
| | 0.0000 + 0.2500i | −0.2452 − 0.0488i |
| | 0.2500 | −0.2500 |
| | −0.0000 − 0.2500i | −0.1389 + 0.2079i |
| | −0.2500 + 0.0000i | 0.0957 + 0.2310i |
| | 0.0000 + 0.2500i | 0.2452 + 0.0488i | ans(:, :, 14, 13) =
| | 0.2500 | 0.2500 |
|---|---|---|
| | 0.0957 − 0.2310i | 0.2079 − 0.1389i |
| | −0.1768 − 0.1768i | 0.0957 − 0.2310i |
| | −0.2310 + 0.0957i | −0.0488 − 0.2452i |
| | 0.2500 | −0.2500 |
| | 0.0957 − 0.2310i | −0.2079 + 0.1389i |
| | −0.1768 − 0.1768i | −0.0957 + 0.2310i |
| | −0.2310 + 0.0957i | 0.0488 + 0.2452i | ans(:, :, 15, 13) =
| | 0.2500 | 0.2500 |
|---|---|---|
| | 0.1768 − 0.1768i | 0.2452 − 0.0488i |
| | −0.0000 − 0.2500i | 0.2310 − 0.0957i |
| | −0.1768 − 0.1768i | 0.2079 − 0.1389i |
| | 0.2500 | −0.2500 |
| | 0.1768 − 0.1768i | −0.2452 + 0.0488i |
| | −0.0000 − 0.2500i | −0.2310 + 0.0957i |
| | −0.1768 − 0.1768i | −0.2079 + 0.1389i | ans(:, :, 16, 13) =
| | 0.2500 | 0.2500 |
|---|---|---|
| | 0.2310 − 0.0957i | 0.2452 + 0.0488i |
| | 0.1768 − 0.1768i | 0.2310 + 0.0957i |
| | 0.0957 − 0.2310i | 0.2079 + 0.1389i |
| | 0.2500 | −0.2500 |
| | 0.2310 − 0.0957i | −0.2452 − 0.0488i |
| | 0.1768 − 0.1768i | −0.2310 − 0.0957i |
| | 0.0957 − 0.2310i | −0.2079 − 0.1389i |

-continued

| | | |
|---|---|---|
| ans(:, :, 1, 14) = | 0.2500 | 0.2500 |
| | 0.2500 | 0.2079 + 0.1389i |
| | 0.2500 | 0.0957 + 0.2310i |
| | 0.2500 | −0.0488 + 0.2452i |
| | 0 + 0.2500i | 0 − 0.2500i |
| | 0 + 0.2500i | 0.1389 − 0.2079i |
| | 0 + 0.2500i | 0.2310 − 0.0957i |
| | 0 + 0.2500i | 0.2452 + 0.0488i |
| ans(:, :, 2, 14) = | 0.2500 | 0.2500 |
| | 0.2310 + 0.0957i | 0.1389 + 0.2079i |
| | 0.1768 + 0.1768i | −0.0957 + 0.2310i |
| | 0.0957 + 0.2310i | −0.2452 + 0.0488i |
| | 0 + 0.2500i | 0 − 0.2500i |
| | −0.0957 + 0.2310i | 0.2079 − 0.1389i |
| | −0.1768 + 0.1768i | 0.2310 + 0.0957i |
| | −0.2310 + 0.0957i | 0.0488 + 0.2452i |
| ans(:, :, 3, 14) = | 0.2500 | 0.2500 |
| | 0.1768 + 0.1768i | 0.0488 + 0.2452i |
| | 0.0000 + 0.2500i | −0.2310 + 0.0957i |
| | −0.1768 + 0.1768i | −0.1389 − 0.2079i |
| | 0 + 0.2500i | 0 − 0.2500i |
| | −0.1768 + 0.1768i | 0.2452 − 0.0488i |
| | −0.2500 + 0.0000i | 0.0957 + 0.2310i |
| | −0.1768 − 0.1768i | −0.2079 + 0.1389i |
| ans(:, :, 4, 14) = | 0.2500 | 0.2500 |
| | 0.0957 + 0.2310i | −0.0488 + 0.2452i |
| | −0.1768 + 0.1768i | −0.2310 − 0.0957i |
| | −0.2310 − 0.0957i | 0.1389 − 0.2079i |
| | 0 + 0.2500i | 0 − 0.2500i |
| | −0.2310 + 0.0957i | 0.2452 + 0.0488i |
| | −0.1768 − 0.1768i | −0.0957 + 0.2310i |
| | 0.0957 − 0.2310i | −0.2079 − 0.1389i |
| ans(:, :, 5, 14) = | 0.2500 | 0.2500 |
| | 0.0000 + 0.2500i | −0.1389 + 0.2079i |
| | −0.2500 + 0.0000i | −0.0957 − 0.2310i |
| | −0.0000 − 0.2500i | 0.2452 + 0.0488i |
| | 0 + 0.2500i | 0 − 0.2500i |
| | −0.2500 + 0.0000i | 0.2079 + 0.1389i |
| | −0.0000 − 0.2500i | −0.2310 + 0.0957i |
| | 0.2500 − 0.0000i | 0.0488 − 0.2452i |
| ans(:, :, 6, 14) = | 0.2500 | 0.2500 |
| | −0.0957 + 0.2310i | −0.2079 + 0.1389i |
| | −0.1768 − 0.1768i | 0.0957 − 0.2310i |
| | 0.2310 − 0.0957i | 0.0488 + 0.2452i |
| | 0 + 0.2500i | 0 − 0.2500i |
| | −0.2310 − 0.0957i | 0.1389 + 0.2079i |
| | 0.1768 − 0.1768i | −0.2310 − 0.0957i |
| | 0.0957 + 0.2310i | 0.2452 − 0.0488i |
| ans(:, :, 7, 14) = | 0.2500 | 0.2500 |
| | −0.1768 + 0.1768i | −0.2452 + 0.0488i |
| | −0.0000 − 0.2500i | 0.2310 − 0.0957i |
| | 0.1768 + 0.1768i | −0.2079 + 0.1389i |
| | 0 + 0.2500i | 0 − 0.2500i |
| | −0.1768 − 0.1768i | 0.0488 + 0.2452i |
| | 0.2500 − 0.0000i | −0.0957 − 0.2310i |
| | −0.1768 + 0.1768i | 0.1389 + 0.2079i |
| ans(:, :, 8, 14) = | 0.2500 | 0.2500 |
| | −0.2310 + 0.0957i | −0.2452 − 0.0488i |
| | 0.1768 − 0.1768i | 0.2310 + 0.0957i |
| | −0.0957 + 0.2310i | −0.2079 − 0.1389i |
| | 0 + 0.2500i | 0 − 0.2500i |
| | −0.0957 − 0.2310i | −0.0488 + 0.2452i |
| | 0.1768 + 0.1768i | 0.0957 − 0.2310i |
| | −0.2310 − 0.0957i | −0.1389 + 0.2079i |
| ans(:, :, 9, 14) = | 0.2500 | 0.2500 |
| | −0.2500 + 0.0000i | −0.2079 − 0.1389i |
| | 0.2500 − 0.0000i | 0.0957 + 0.2310i |
| | −0.2500 + 0.0000i | 0.0488 − 0.2452i |
| | 0 + 0.2500i | 0 − 0.2500i |
| | −0.0000 − 0.2500i | −0.1389 + 0.2079i |
| | 0.0000 + 0.2500i | 0.2310 − 0.0957i |
| | −0.0000 − 0.2500i | −0.2452 − 0.0488i |

-continued ans(:, :, 10, 14) =
  0.2500              0.2500
  −0.2310 − 0.0957i   −0.1389 − 0.2079i
  0.1768 + 0.1768i    −0.0957 + 0.2310i
  −0.0957 − 0.2310i   0.2452 − 0.0488i
  0 + 0.2500i         0 − 0.2500i
  0.0957 − 0.2310i    −0.2079 + 0.1389i
  −0.1768 + 0.1768i   0.2310 + 0.0957i
  0.2310 − 0.0957i    −0.0488 − 0.2452i ans(:, :, 11, 14) =
  0.2500              0.2500
  −0.1768 − 0.1768i   −0.0488 − 0.2452i
  0.0000 + 0.2500i    −0.2310 + 0.0957i
  0.1768 − 0.1768i    0.1389 + 0.2079i
  0 + 0.2500i         0 − 0.2500i
  0.1768 − 0.1768i    −0.2452 + 0.0488i
  −0.2500 + 0.0000i   0.0957 + 0.2310i
  0.1768 + 0.1768i    0.2079 − 0.1389i ans(:, :, 12, 14) =
  0.2500              0.2500
  −0.0957 − 0.2310i   0.0488 − 0.2452i
  −0.1768 + 0.1768i   −0.2310 − 0.0957i
  0.2310 + 0.0957i    −0.1389 + 0.2079i
  0 + 0.2500i         0 − 0.2500i
  0.2310 − 0.0957i    −0.2452 − 0.0488i
  −0.1768 − 0.1768i   −0.0957 + 0.2310i
  −0.0957 + 0.2310i   0.2079 + 0.1389i ans(:, :, 13, 14) =
  0.2500              0.2500
  −0.0000 − 0.2500i   0.1389 − 0.2079i
  −0.2500 + 0.0000i   −0.0957 − 0.2310i
  0.0000 + 0.2500i    −0.2452 − 0.0488i
  0 + 0.2500i         0 − 0.2500i
  0.2500 − 0.0000i    −0.2079 − 0.1389i
  −0.0000 − 0.2500i   −0.2310 + 0.0957i
  −0.2500 + 0.0000i   −0.0488 + 0.2452i ans(:, :, 14, 14) =
  0.2500              0.2500
  0.0957 − 0.2310i    0.2079 − 0.1389i
  −0.1768 − 0.1768i   0.0957 − 0.2310i
  −0.2310 + 0.0957i   −0.0488 − 0.2452i
  0 + 0.2500i         0 − 0.2500i
  0.2310 + 0.0957i    −0.1389 − 0.2079i
  0.1768 − 0.1768i    −0.2310 − 0.0957i
  −0.0957 − 0.2310i   −0.2452 + 0.0488i ans(:, :, 15, 14) =
  0.2500              0.2500
  0.1768 − 0.1768i    0.2452 − 0.0488i
  −0.0000 − 0.2500i   0.2310 − 0.0957i
  −0.1768 − 0.1768i   0.2079 − 0.1389i
  0 + 0.2500i         0 − 0.2500i
  0.1768 + 0.1768i    −0.0488 − 0.2452i
  0.2500 − 0.0000i    −0.0957 − 0.2310i
  0.1768 − 0.1768i    −0.1389 − 0.2079i ans(:, :, 16, 14) =
  0.2500              0.2500
  0.2310 − 0.0957i    0.2452 + 0.0488i
  0.1768 − 0.1768i    0.2310 + 0.0957i
  0.0957 − 0.2310i    0.2079 + 0.1389i
  0 + 0.2500i         0 − 0.2500i
  0.0957 + 0.2310i    0.0488 − 0.2452i
  0.1768 + 0.1768i    0.0957 − 0.2310i
  0.2310 + 0.0957i    0.1389 − 0.2079i ans(:, :, 1, 15) =
  0.2500              0.2500
  0.2452 + 0.0488i    0.2079 + 0.1389i
  0.2310 + 0.0957i    0.0957 + 0.2310i
  0.2079 + 0.1389i    −0.0488 + 0.2452i
  0.2500              −0.2500
  0.2452 + 0.0488i    −0.2079 − 0.1389i
  0.2310 + 0.0957i    −0.0957 − 0.2310i
  0.2079 + 0.1389i    0.0488 − 0.2452i ans(:, :, 2, 15) =
  0.2500              0.2500
  0.2079 + 0.1389i    0.1389 + 0.2079i
  0.0957 + 0.2310i    −0.0957 + 0.2310i
  −0.0488 + 0.2452i   −0.2452 + 0.0488i
  0.2500              −0.2500
  0.2079 + 0.1389i    −0.1389 − 0.2079i
  0.0957 + 0.2310i    0.0957 − 0.2310i
  −0.0488 + 0.2452i   0.2452 − 0.0488i -continued

| | | |
|---|---|---|
| ans(:, :, 3, 15) = | 0.2500 | 0.2500 |
| | 0.1389 + 0.2079i | 0.0488 + 0.2452i |
| | −0.0957 + 0.2310i | −0.2310 + 0.0957i |
| | −0.2452 + 0.0488i | −0.1389 − 0.2079i |
| | 0.2500 | −0.2500 |
| | 0.1389 + 0.2079i | −0.0488 − 0.2452i |
| | −0.0957 + 0.2310i | 0.2310 − 0.0957i |
| | −0.2452 + 0.0488i | 0.1389 + 0.2079i |
| ans(:, :, 4, 15) = | 0.2500 | 0.2500 |
| | 0.0488 + 0.2452i | −0.0488 + 0.2452i |
| | −0.2310 + 0.0957i | −0.2310 − 0.0957i |
| | −0.1389 − 0.2079i | 0.1389 − 0.2079i |
| | 0.2500 | −0.2500 |
| | 0.0488 + 0.2452i | 0.0488 − 0.2452i |
| | −0.2310 + 0.0957i | 0.2310 + 0.0957i |
| | −0.1389 − 0.2079i | −0.1389 + 0.2079i |
| ans(:, :, 5, 15) = | 0.2500 | 0.2500 |
| | −0.0488 + 0.2452i | −0.1389 + 0.2079i |
| | −0.2310 − 0.0957i | −0.0957 − 0.2310i |
| | 0.1389 − 0.2079i | 0.2452 + 0.0488i |
| | 0.2500 | −0.2500 |
| | −0.0488 + 0.2452i | 0.1389 − 0.2079i |
| | −0.2310 − 0.0957i | 0.0957 + 0.2310i |
| | 0.1389 − 0.2079i | −0.2452 − 0.0488i |
| ans(:, :, 6, 15) = | 0.2500 | 0.2500 |
| | −0.1389 + 0.2079i | −0.2079 + 0.1389i |
| | −0.0957 − 0.2310i | 0.0957 − 0.2310i |
| | 0.2452 + 0.0488i | 0.0488 + 0.2452i |
| | 0.2500 | −0.2500 |
| | −0.1389 + 0.2079i | 0.2079 − 0.1389i |
| | −0.0957 − 0.2310i | −0.0957 + 0.2310i |
| | 0.2452 + 0.0488i | −0.0488 − 0.2452i |
| ans(:, :, 7, 15) = | 0.2500 | 0.2500 |
| | −0.2079 + 0.1389i | −0.2452 + 0.0488i |
| | 0.0957 − 0.2310i | 0.2310 − 0.0957i |
| | 0.0488 + 0.2452i | −0.2079 + 0.1389i |
| | 0.2500 | −0.2500 |
| | −0.2079 + 0.1389i | 0.2452 − 0.0488i |
| | 0.0957 − 0.2310i | −0.2310 + 0.0957i |
| | 0.0488 + 0.2452i | 0.2079 − 0.1389i |
| ans(:, :, 8, 15) = | 0.2500 | 0.2500 |
| | −0.2452 + 0.0488i | −0.2452 − 0.0488i |
| | 0.2310 − 0.0957i | 0.2310 + 0.0957i |
| | −0.2079 + 0.1389i | −0.2079 − 0.1389i |
| | 0.2500 | −0.2500 |
| | −0.2452 + 0.0488i | 0.2452 + 0.0488i |
| | 0.2310 − 0.0957i | −0.2310 − 0.0957i |
| | −0.2079 + 0.1389i | 0.2079 + 0.1389i |
| ans(:, :, 9, 15) = | 0.2500 | 0.2500 |
| | −0.2452 − 0.0488i | −0.2079 − 0.1389i |
| | 0.2310 + 0.0957i | 0.0957 + 0.2310i |
| | −0.2079 − 0.1389i | 0.0488 − 0.2452i |
| | 0.2500 | −0.2500 |
| | −0.2452 − 0.0488i | 0.2079 + 0.1389i |
| | 0.2310 + 0.0957i | −0.0957 − 0.2310i |
| | −0.2079 − 0.1389i | −0.0488 + 0.2452i |
| ans(:, :, 10, 15) = | 0.2500 | 0.2500 |
| | −0.2079 − 0.1389i | −0.1389 − 0.2079i |
| | 0.0957 + 0.2310i | −0.0957 + 0.2310i |
| | 0.0488 − 0.2452i | 0.2452 − 0.0488i |
| | 0.2500 | −0.2500 |
| | −0.2079 − 0.1389i | 0.1389 + 0.2079i |
| | 0.0957 + 0.2310i | 0.0957 − 0.2310i |
| | 0.0488 − 0.2452i | −0.2452 + 0.0488i |
| ans(:, :, 11, 15) = | 0.2500 | 0.2500 |
| | −0.1389 − 0.2079i | −0.0488 − 0.2452i |
| | −0.0957 + 0.2310i | −0.2310 + 0.0957i |
| | 0.2452 − 0.0488i | 0.1389 + 0.2079i |
| | 0.2500 | −0.2500 |
| | −0.1389 − 0.2079i | 0.0488 + 0.2452i |
| | −0.0957 + 0.2310i | 0.2310 − 0.0957i |
| | 0.2452 − 0.0488i | −0.1389 − 0.2079i |

-continued

| | | |
|---|---|---|
| ans(:, :, 12, 15) = | 0.2500 | 0.2500 |
| | −0.0488 − 0.2452i | 0.0488 − 0.2452i |
| | −0.2310 + 0.0957i | −0.2310 − 0.0957i |
| | 0.1389 + 0.2079i | −0.1389 + 0.2079i |
| | 0.2500 | −0.2500 |
| | −0.0488 − 0.2452i | −0.0488 + 0.2452i |
| | −0.2310 + 0.0957i | 0.2310 + 0.0957i |
| | 0.1389 + 0.2079i | 0.1389 − 0.2079i |
| ans(:, :, 13, 15) = | 0.2500 | 0.2500 |
| | 0.0488 − 0.2452i | 0.1389 − 0.2079i |
| | −0.2310 − 0.0957i | −0.0957 − 0.2310i |
| | −0.1389 + 0.2079i | −0.2452 − 0.0488i |
| | 0.2500 | −0.2500 |
| | 0.0488 − 0.2452i | −0.1389 + 0.2079i |
| | −0.2310 − 0.0957i | 0.0957 + 0.2310i |
| | −0.1389 + 0.2079i | 0.2452 + 0.0488i |
| ans(:, :, 14, 15) = | 0.2500 | 0.2500 |
| | 0.1389 − 0.2079i | 0.2079 − 0.1389i |
| | −0.0957 − 0.2310i | 0.0957 − 0.2310i |
| | −0.2452 − 0.0488i | −0.0488 − 0.2452i |
| | 0.2500 | −0.2500 |
| | 0.1389 − 0.2079i | −0.2079 + 0.1389i |
| | −0.0957 − 0.2310i | −0.0957 + 0.2310i |
| | −0.2452 − 0.0488i | 0.0488 + 0.2452i |
| ans(:, :, 15, 15) = | 0.2500 | 0.2500 |
| | 0.2079 − 0.1389i | 0.2452 − 0.0488i |
| | 0.0957 − 0.2310i | 0.2310 − 0.0957i |
| | −0.0488 − 0.2452i | 0.2079 − 0.1389i |
| | 0.2500 | −0.2500 |
| | 0.2079 − 0.1389i | −0.2452 + 0.0488i |
| | 0.0957 − 0.2310i | −0.2310 + 0.0957i |
| | −0.0488 − 0.2452i | −0.2079 + 0.1389i |
| ans(:, :, 16, 15) = | 0.2500 | 0.2500 |
| | 0.2452 − 0.0488i | 0.2452 + 0.0488i |
| | 0.2310 − 0.0957i | 0.2310 + 0.0957i |
| | 0.2079 − 0.1389i | 0.2079 + 0.1389i |
| | 0.2500 | −0.2500 |
| | 0.2452 − 0.0488i | −0.2452 − 0.0488i |
| | 0.2310 − 0.0957i | −0.2310 − 0.0957i |
| | 0.2079 − 0.1389i | −0.2079 − 0.1389i |
| ans(:, :, 1, 16) = | 0.2500 | 0.2500 |
| | 0.2452 + 0.0488i | 0.2079 + 0.1389i |
| | 0.2310 + 0.0957i | 0.0957 + 0.2310i |
| | 0.2079 + 0.1389i | −0.0488 + 0.2452i |
| | 0 + 0.2500i | 0 − 0.2500i |
| | −0.0488 + 0.2452i | 0.1389 − 0.2079i |
| | −0.0957 + 0.2310i | 0.2310 − 0.0957i |
| | −0.1389 + 0.2079i | 0.2452 + 0.0488i |
| ans(:, :, 2, 16) = | 0.2500 | 0.2500 |
| | 0.2079 + 0.1389i | 0.1389 + 0.2079i |
| | 0.0957 + 0.2310i | −0.0957 + 0.2310i |
| | −0.0488 + 0.2452i | −0.2452 + 0.0488i |
| | 0 + 0.2500i | 0 − 0.2500i |
| | −0.1389 + 0.2079i | 0.2079 − 0.1389i |
| | −0.2310 + 0.0957i | 0.2310 + 0.0957i |
| | −0.2452 − 0.0488i | 0.0488 + 0.2452i |
| ans(:, :, 3, 16) = | 0.2500 | 0.2500 |
| | 0.1389 + 0.2079i | 0.0488 + 0.2452i |
| | −0.0957 + 0.2310i | −0.2310 + 0.0957i |
| | −0.2452 + 0.0488i | −0.1389 − 0.2079i |
| | 0 + 0.2500i | 0 − 0.2500i |
| | −0.2079 + 0.1389i | 0.2452 − 0.0488i |
| | −0.2310 − 0.0957i | 0.0957 + 0.2310i |
| | −0.0488 − 0.2452i | −0.2079 + 0.1389i |
| ans(:, :, 4, 16) = | 0.2500 | 0.2500 |
| | 0.0488 + 0.2452i | −0.0488 + 0.2452i |
| | −0.2310 + 0.0957i | −0.2310 − 0.0957i |
| | −0.1389 − 0.2079i | 0.1389 − 0.2079i |
| | 0 + 0.2500i | 0 − 0.2500i |
| | −0.2452 + 0.0488i | 0.2452 + 0.0488i |
| | −0.0957 − 0.2310i | −0.0957 + 0.2310i |
| | 0.2079 − 0.1389i | −0.2079 − 0.1389i |

-continued

| | | |
|---|---|---|
| ans(:, :, 5, 16) = | 0.2500 | 0.2500 |
| | −0.0488 + 0.2452i | −0.1389 + 0.2079i |
| | −0.2310 − 0.0957i | −0.0957 − 0.2310i |
| | 0.1389 − 0.2079i | 0.2452 + 0.0488i |
| | 0 + 0.2500i | 0 − 0.2500i |
| | −0.2452 − 0.0488i | 0.2079 + 0.1389i |
| | 0.0957 − 0.2310i | −0.2310 + 0.0957i |
| | 0.2079 + 0.1389i | 0.0488 − 0.2452i |
| ans(:, :, 6, 16) = | 0.2500 | 0.2500 |
| | −0.1389 + 0.2079i | −0.2079 + 0.1389i |
| | −0.0957 − 0.2310i | 0.0957 − 0.2310i |
| | 0.2452 + 0.0488i | 0.0488 + 0.2452i |
| | 0 + 0.2500i | 0 − 0.2500i |
| | −0.2079 − 0.1389i | 0.1389 + 0.2079i |
| | 0.2310 − 0.0957i | −0.2310 − 0.0957i |
| | −0.0488 + 0.2452i | 0.2452 − 0.0488i |
| ans(:, :, 7, 16) = | 0.2500 | 0.2500 |
| | −0.2079 + 0.1389i | −0.2452 + 0.0488i |
| | 0.0957 − 0.2310i | 0.2310 − 0.0957i |
| | 0.0488 + 0.2452i | −0.2079 + 0.1389i |
| | 0 + 0.2500i | 0 − 0.2500i |
| | −0.1389 − 0.2079i | 0.0488 + 0.2452i |
| | 0.2310 + 0.0957i | −0.0957 − 0.2310i |
| | −0.2452 + 0.0488i | 0.1389 + 0.2079i |
| ans(:, :, 8, 16) = | 0.2500 | 0.2500 |
| | −0.2452 + 0.0488i | −0.2452 − 0.0488i |
| | 0.2310 − 0.0957i | 0.2310 + 0.0957i |
| | −0.2079 + 0.1389i | −0.2079 − 0.1389i |
| | 0 + 0.2500i | 0 − 0.2500i |
| | −0.0488 − 0.2452i | −0.0488 + 0.2452i |
| | 0.0957 + 0.2310i | 0.0957 − 0.2310i |
| | −0.1389 − 0.2079i | −0.1389 + 0.2079i |
| ans(:, :, 9, 16) = | 0.2500 | 0.2500 |
| | −0.2452 − 0.0488i | −0.2079 − 0.1389i |
| | 0.2310 + 0.0957i | 0.0957 + 0.2310i |
| | −0.2079 − 0.1389i | 0.0488 − 0.2452i |
| | 0 + 0.2500i | 0 − 0.2500i |
| | 0.0488 − 0.2452i | −0.1389 + 0.2079i |
| | −0.0957 + 0.2310i | 0.2310 − 0.0957i |
| | 0.1389 − 0.2079i | −0.2452 − 0.0488i |
| ans(:, :, 10, 16) = | 0.2500 | 0.2500 |
| | −0.2079 − 0.1389i | −0.1389 − 0.2079i |
| | 0.0957 + 0.2310i | −0.0957 + 0.2310i |
| | 0.0488 − 0.2452i | 0.2452 − 0.0488i |
| | 0 + 0.2500i | 0 − 0.2500i |
| | 0.1389 − 0.2079i | −0.2079 + 0.1389i |
| | −0.2310 + 0.0957i | 0.2310 + 0.0957i |
| | 0.2452 + 0.0488i | −0.0488 − 0.2452i |
| ans(:, :, 11, 16) = | 0.2500 | 0.2500 |
| | −0.1389 − 0.2079i | −0.0488 − 0.2452i |
| | −0.0957 + 0.2310i | −0.2310 + 0.0957i |
| | 0.2452 − 0.0488i | 0.1389 + 0.2079i |
| | 0 + 0.2500i | 0 − 0.2500i |
| | 0.2079 − 0.1389i | −0.2452 + 0.0488i |
| | −0.2310 − 0.0957i | 0.0957 + 0.2310i |
| | 0.0488 + 0.2452i | 0.2079 − 0.1389i |
| ans(:, :, 12, 16) = | 0.2500 | 0.2500 |
| | −0.0488 − 0.2452i | 0.0488 − 0.2452i |
| | −0.2310 + 0.0957i | −0.2310 − 0.0957i |
| | 0.1389 + 0.2079i | −0.1389 + 0.2079i |
| | 0 + 0.2500i | 0 − 0.2500i |
| | 0.2452 − 0.0488i | −0.2452 − 0.0488i |
| | −0.0957 − 0.2310i | −0.0957 + 0.2310i |
| | −0.2079 + 0.1389i | 0.2079 + 0.1389i |
| ans(:, :, 13, 16) = | 0.2500 | 0.2500 |
| | 0.0488 − 0.2452i | 0.1389 − 0.2079i |
| | −0.2310 − 0.0957i | −0.0957 − 0.2310i |
| | −0.1389 + 0.2079i | −0.2452 − 0.0488i |
| | 0 + 0.2500i | 0 − 0.2500i |
| | 0.2452 + 0.0488i | −0.2079 − 0.1389i |
| | 0.0957 − 0.2310i | −0.2310 + 0.0957i |
| | −0.2079 − 0.1389i | −0.0488 + 0.2452i |
| ans(:, :, 14, 16) = | 0.2500 | 0.2500 |
| | 0.1389 − 0.2079i | 0.2079 − 0.1389i |
| | −0.0957 − 0.2310i | 0.0957 − 0.2310i |
| | −0.2452 − 0.0488i | −0.0488 − 0.2452i |
| | 0 + 0.2500i | 0 − 0.2500i |

-continued

|  | 0.2079 + 0.1389i | −0.1389 − 0.2079i |
|---|---|---|
|  | 0.2310 − 0.0957i | −0.2310 − 0.0957i |
|  | 0.0488 − 0.2452i | −0.2452 + 0.0488i |
| ans(:, :, 15, 16) = | 0.2500 | 0.2500 |
|  | 0.2079 − 0.1389i | 0.2452 − 0.0488i |
|  | 0.0957 − 0.2310i | 0.2310 − 0.0957i |
|  | −0.0488 − 0.2452i | 0.2079 − 0.1389i |
|  | 0 + 0.2500i | 0 − 0.2500i |
|  | 0.1389 + 0.2079i | −0.0488 − 0.2452i |
|  | 0.2310 + 0.0957i | −0.0957 − 0.2310i |
|  | 0.2452 − 0.0488i | −0.1389 − 0.2079i |
| ans(:, :, 16, 16) = | 0.2500 | 0.2500 |
|  | 0.2452 − 0.0488i | 0.2452 + 0.0488i |
|  | 0.2310 − 0.0957i | 0.2310 + 0.0957i |
|  | 0.2079 − 0.1389i | 0.2079 + 0.1389i |
|  | 0 + 0.2500i | 0 − 0.2500i |
|  | 0.0488 + 0.2452i | 0.0488 − 0.2452i |
|  | 0.0957 + 0.2310i | 0.0957 − 0.2310i |
|  | 0.1389 + 0.2079i | 0.1389 − 0.2079i |

| Rank 3 ||||
|---|---|---|---|
| ans(:, :, 1, 1) = | 0.2041 | 0.2041 | 0.2041 |
|  | 0.2041 | 0.2041 | 0.0000 + 0.2041i |
|  | 0.2041 | 0.2041 | −0.2041 + 0.0000i |
|  | 0.2041 | 0.2041 | −0.0000 − 0.2041i |
|  | 0.2041 | −0.2041 | −0.2041 |
|  | 0.2041 | −0.2041 | −0.0000 − 0.2041i |
|  | 0.2041 | −0.2041 | 0.2041 − 0.0000i |
|  | 0.2041 | −0.2041 | 0.0000 + 0.2041i |
| ans(:, :, 2, 1) = | 0.2041 | 0.2041 | 0.2041 |
|  | 0 + 0.2041i | 0 + 0.2041i | −0.2041 + 0.0000i |
|  | −0.2041 | −0.2041 | 0.2041 − 0.0000i |
|  | 0 − 0.2041i | 0 − 0.2041i | −0.2041 + 0.0000i |
|  | 0.2041 | −0.2041 | −0.2041 |
|  | 0 + 0.2041i | 0 − 0.2041i | 0.2041 − 0.0000i |
|  | −0.2041 | 0.2041 | −0.2041 + 0.0000i |
|  | 0 − 0.2041i | 0 + 0.2041i | 0.2041 − 0.0000i |
| ans(:, :, 3, 1) = | 0.2041 | 0.2041 | 0.2041 |
|  | −0.2041 | −0.2041 | −0.0000 − 0.2041i |
|  | 0.2041 | 0.2041 | −0.2041 + 0.0000i |
|  | −0.2041 | −0.2041 | 0.0000 + 0.2041i |
|  | 0.2041 | −0.2041 | −0.2041 |
|  | −0.2041 | 0.2041 | 0.0000 + 0.2041i |
|  | 0.2041 | −0.2041 | 0.2041 − 0.0000i |
|  | −0.2041 | 0.2041 | −0.0000 − 0.2041i |
| ans(:, :, 4, 1) = | 0.2041 | 0.2041 | 0.2041 |
|  | 0 − 0.2041i | 0 − 0.2041i | 0.2041 − 0.0000i |
|  | −0.2041 | −0.2041 | 0.2041 − 0.0000i |
|  | 0 + 0.2041i | 0 + 0.2041i | 0.2041 − 0.0000i |
|  | 0.2041 | −0.2041 | −0.2041 |
|  | 0 − 0.2041i | 0 + 0.2041i | −0.2041 + 0.0000i |
|  | −0.2041 | 0.2041 | −0.2041 + 0.0000i |
|  | 0 + 0.2041i | 0 − 0.2041i | −0.2041 + 0.0000i |
| ans(:, :, 1, 2) = | 0.2041 | 0.2041 | 0.2041 |
|  | 0.0000 + 0.2041i | 0.2041 | 0.0000 + 0.2041i |
|  | −0.2041 + 0.0000i | 0.2041 | −0.2041 + 0.0000i |
|  | −0.0000 − 0.2041i | 0.2041 | −0.0000 − 0.2041i |
|  | 0.2041 | −0.2041 | −0.2041 |
|  | 0.0000 + 0.2041i | −0.2041 | −0.0000 − 0.2041i |
|  | −0.2041 + 0.0000i | −0.2041 | 0.2041 − 0.0000i |
|  | −0.0000 − 0.2041i | −0.2041 | 0.0000 + 0.2041i |
| ans(:, :, 2, 2) = | 0.2041 | 0.2041 | 0.2041 |
|  | −0.2041 + 0.0000i | 0 + 0.2041i | −0.2041 + 0.0000i |
|  | 0.2041 − 0.0000i | −0.2041 | 0.2041 − 0.0000i |
|  | −0.2041 + 0.0000i | 0 − 0.2041i | −0.2041 + 0.0000i |
|  | 0.2041 | −0.2041 | −0.2041 |
|  | −0.2041 + 0.0000i | 0 − 0.2041i | 0.2041 − 0.0000i |
|  | 0.2041 − 0.0000i | 0.2041 | −0.2041 + 0.0000i |
|  | −0.2041 + 0.0000i | 0 + 0.2041i | 0.2041 − 0.0000i |
| ans(:, :, 3, 2) = | 0.2041 | 0.2041 | 0.2041 |
|  | −0.0000 − 0.2041i | −0.2041 | −0.0000 − 0.2041i |
|  | −0.2041 + 0.0000i | 0.2041 | −0.2041 + 0.0000i |
|  | 0.0000 + 0.2041i | −0.2041 | 0.0000 + 0.2041i |
|  | 0.2041 | −0.2041 | −0.2041 |
|  | −0.0000 − 0.2041i | 0.2041 | 0.0000 + 0.2041i |
|  | −0.2041 + 0.0000i | −0.2041 | 0.2041 − 0.0000i |
|  | 0.0000 + 0.2041i | 0.2041 | −0.0000 − 0.2041i |

-continued

| | | | |
|---|---|---|---|
| ans(:, :, 4, 2) = | 0.2041 | 0.2041 | 0.2041 |
| | 0.2041 − 0.0000i | 0 − 0.2041i | 0.2041 − 0.0000i |
| | 0.2041 − 0.0000i | −0.2041 | 0.2041 − 0.0000i |
| | 0.2041 − 0.0000i | 0 + 0.2041i | 0.2041 − 0.0000i |
| | 0.2041 | −0.2041 | −0.2041 |
| | 0.2041 − 0.0000i | 0 + 0.2041i | −0.2041 + 0.0000i |
| | 0.2041 − 0.0000i | 0.2041 | −0.2041 + 0.0000i |
| | 0.2041 − 0.0000i | 0 − 0.2041i | −0.2041 + 0.0000i |
| ans(:, :, 1, 3) = | 0.2041 | 0.2041 | 0.2041 |
| | 0.2041 | 0.0000 + 0.2041i | 0.0000 + 0.2041i |
| | 0.2041 | −0.2041 + 0.0000i | −0.2041 + 0.0000i |
| | 0.2041 | −0.0000 − 0.2041i | −0.0000 − 0.2041i |
| | 0.2041 | 0.2041 | −0.2041 |
| | 0.2041 | 0.0000 + 0.2041i | −0.0000 − 0.2041i |
| | 0.2041 | −0.2041 + 0.0000i | 0.2041 − 0.0000i |
| | 0.2041 | −0.0000 − 0.2041i | 0.0000 + 0.2041i |
| ans(:, :, 2, 3) = | 0.2041 | 0.2041 | 0.2041 |
| | 0 + 0.2041i | −0.2041 + 0.0000i | −0.2041 + 0.0000i |
| | −0.2041 | 0.2041 − 0.0000i | 0.2041 − 0.0000i |
| | 0 − 0.2041i | −0.2041 + 0.0000i | −0.2041 + 0.0000i |
| | 0.2041 | 0.2041 | −0.2041 |
| | 0 + 0.2041i | −0.2041 + 0.0000i | 0.2041 − 0.0000i |
| | −0.2041 | 0.2041 − 0.0000i | −0.2041 + 0.0000i |
| | 0 − 0.2041i | −0.2041 + 0.0000i | 0.2041 − 0.0000i |
| ans(:, :, 3, 3) = | 0.2041 | 0.2041 | 0.2041 |
| | −0.2041 | −0.0000 − 0.2041i | −0.0000 − 0.2041i |
| | 0.2041 | −0.2041 + 0.0000i | −0.2041 + 0.0000i |
| | −0.2041 | 0.0000 + 0.2041i | 0.0000 + 0.2041i |
| | 0.2041 | 0.2041 | −0.2041 |
| | −0.2041 | −0.0000 − 0.2041i | 0.0000 + 0.2041i |
| | 0.2041 | −0.2041 + 0.0000i | 0.2041 − 0.0000i |
| | −0.2041 | 0.0000 + 0.2041i | −0.0000 − 0.2041i |
| ans(:, :, 4, 3) = | 0.2041 | 0.2041 | 0.2041 |
| | 0 − 0.2041i | 0.2041 − 0.0000i | 0.2041 − 0.0000i |
| | −0.2041 | 0.2041 − 0.0000i | 0.2041 − 0.0000i |
| | 0 + 0.2041i | 0.2041 − 0.0000i | 0.2041 − 0.0000i |
| | 0.2041 | 0.2041 | −0.2041 |
| | 0 − 0.2041i | 0.2041 − 0.0000i | −0.2041 + 0.0000i |
| | −0.2041 | 0.2041 − 0.0000i | −0.2041 + 0.0000i |
| | 0 + 0.2041i | 0.2041 − 0.0000i | −0.2041 + 0.0000i |
| ans(:, :, 1, 4) = | 0.2041 | 0.2041 | 0.2041 |
| | 0.0000 + 0.2041i | 0.2041 | 0.2041 |
| | −0.2041 + 0.0000i | 0.2041 | 0.2041 |
| | −0.0000 − 0.2041i | 0.2041 | 0.2041 |
| | 0.2041 | 0.2041 | −0.2041 |
| | 0.0000 + 0.2041i | 0.2041 | −0.2041 |
| | −0.2041 + 0.0000i | 0.2041 | −0.2041 |
| | −0.0000 − 0.2041i | 0.2041 | −0.2041 |
| ans(:, :, 2, 4) = | 0.2041 | 0.2041 | 0.2041 |
| | −0.2041 + 0.0000i | 0 + 0.2041i | 0 + 0.2041i |
| | 0.2041 − 0.0000i | −0.2041 | −0.2041 |
| | −0.2041 + 0.0000i | 0 − 0.2041i | 0 − 0.2041i |
| | 0.2041 | 0.2041 | −0.2041 |
| | −0.2041 + 0.0000i | 0 + 0.2041i | 0 − 0.2041i |
| | 0.2041 − 0.0000i | −0.2041 | 0.2041 |
| | −0.2041 + 0.0000i | 0 − 0.2041i | 0 + 0.2041i |
| ans(:, :, 3, 4) = | 0.2041 | 0.2041 | 0.2041 |
| | −0.0000 − 0.2041i | −0.2041 | −0.2041 |
| | −0.2041 + 0.0000i | 0.2041 | 0.2041 |
| | 0.0000 + 0.2041i | −0.2041 | −0.2041 |
| | 0.2041 | 0.2041 | −0.2041 |
| | −0.0000 − 0.2041i | −0.2041 | 0.2041 |
| | −0.2041 + 0.0000i | 0.2041 | −0.2041 |
| | 0.0000 + 0.2041i | −0.2041 | 0.2041 |
| ans(:, :, 4, 4) = | 0.2041 | 0.2041 | 0.2041 |
| | 0.2041 − 0.0000i | 0 − 0.2041i | 0 − 0.2041i |
| | 0.2041 − 0.0000i | −0.2041 | −0.2041 |
| | 0.2041 − 0.0000i | 0 + 0.2041i | 0 + 0.2041i |
| | 0.2041 | 0.2041 | −0.2041 |
| | 0.2041 − 0.0000i | 0 − 0.2041i | 0 + 0.2041i |
| | 0.2041 − 0.0000i | −0.2041 | 0.2041 |
| | 0.2041 − 0.0000i | 0 + 0.2041i | 0 − 0.2041i |
| ans(:, :, 1, 5) = | 0.2041 | 0.2041 | 0.2041 |
| | 0.1886 + 0.0781i | 0.1886 + 0.0781i | −0.0781 + 0.1886i |
| | 0.1443 + 0.1443i | 0.1443 + 0.1443i | −0.1443 − 0.1443i |
| | 0.0781 + 0.1886i | 0.0781 + 0.1886i | 0.1886 − 0.0781i |
| | 0.2041 | −0.2041 | −0.2041 |

|  |  |  |  |
|---|---|---|---|
| | 0.1886 + 0.0781i | −0.1886 − 0.0781i | 0.0781 − 0.1886i |
| | 0.1443 + 0.1443i | −0.1443 − 0.1443i | 0.1443 + 0.1443i |
| | 0.0781 + 0.1886i | −0.0781 − 0.1886i | −0.1886 + 0.0781i |
| ans(:, :, 2, 5) = | 0.2041 | 0.2041 | 0.2041 |
| | −0.0781 + 0.1886i | −0.1886 + 0.0781i | −0.1886 − 0.0781i |
| | −0.1443 − 0.1443i | −0.1443 − 0.1443i | 0.1443 + 0.1443i |
| | 0.1886 − 0.0781i | 0.1886 − 0.0781i | −0.0781 − 0.1886i |
| | 0.2041 | −0.2041 | −0.2041 |
| | −0.0781 + 0.1886i | 0.0781 − 0.1886i | 0.1886 + 0.0781i |
| | −0.1443 − 0.1443i | 0.1443 + 0.1443i | −0.1443 − 0.1443i |
| | 0.1886 − 0.0781i | −0.1886 + 0.0781i | 0.0781 + 0.1886i |
| ans(:, :, 3, 5) = | 0.2041 | 0.2041 | 0.2041 |
| | −0.1886 − 0.0781i | −0.1886 − 0.0781i | 0.0781 − 0.1886i |
| | 0.1443 + 0.1443i | 0.1443 + 0.1443i | −0.1443 − 0.1443i |
| | −0.0781 − 0.1886i | −0.0781 − 0.1886i | −0.1886 + 0.0781i |
| | 0.2041 | −0.2041 | −0.2041 |
| | −0.1886 − 0.0781i | 0.1886 + 0.0781i | −0.0781 + 0.1886i |
| | 0.1443 + 0.1443i | −0.1443 − 0.1443i | 0.1443 + 0.1443i |
| | −0.0781 − 0.1886i | 0.0781 + 0.1886i | 0.1886 − 0.0781i |
| ans(:, :, 4, 5) = | 0.2041 | 0.2041 | 0.2041 |
| | 0.0781 − 0.1886i | 0.0781 − 0.1886i | 0.1886 + 0.0781i |
| | −0.1443 − 0.1443i | −0.1443 − 0.1443i | 0.1443 + 0.1443i |
| | −0.1886 + 0.0781i | −0.1886 + 0.0781i | 0.0781 + 0.1886i |
| | 0.2041 | −0.2041 | −0.2041 |
| | 0.0781 − 0.1886i | −0.0781 + 0.1886i | −0.1886 − 0.0781i |
| | −0.1443 − 0.1443i | 0.1443 + 0.1443i | −0.1443 − 0.1443i |
| | −0.1886 + 0.0781i | 0.1886 − 0.0781i | −0.0781 − 0.1886i |
| ans(:, :, 1, 6) = | 0.2041 | 0.2041 | 0.2041 |
| | −0.0781 + 0.1886i | 0.1886 + 0.0781i | −0.0781 + 0.1886i |
| | −0.1443 − 0.1443i | 0.1443 + 0.1443i | −0.1443 − 0.1443i |
| | 0.1886 − 0.0781i | 0.0781 + 0.1886i | 0.1886 − 0.0781i |
| | 0.2041 | −0.2041 | −0.2041 |
| | −0.0781 + 0.1886i | −0.1886 − 0.0781i | 0.0781 − 0.1886i |
| | −0.1443 − 0.1443i | −0.1443 − 0.1443i | 0.1443 + 0.1443i |
| | 0.1886 − 0.0781i | −0.0781 − 0.1886i | −0.1886 + 0.0781i |
| ans(:, :, 2, 6) = | 0.2041 | 0.2041 | 0.2041 |
| | −0.1886 − 0.0781i | −0.0781 + 0.1886i | −0.1886 − 0.0781i |
| | 0.1443 + 0.1443i | −0.1443 − 0.1443i | 0.1443 + 0.1443i |
| | −0.0781 − 0.1886i | 0.1886 − 0.0781i | −0.0781 − 0.1886i |
| | 0.2041 | −0.2041 | −0.2041 |
| | −0.1886 − 0.0781i | 0.0781 − 0.1886i | 0.1886 + 0.0781i |
| | 0.1443 + 0.1443i | 0.1443 + 0.1443i | −0.1443 − 0.1443i |
| | −0.0781 − 0.1886i | −0.1886 + 0.0781i | 0.0781 + 0.1886i |
| ans(:, :, 3, 6) = | 0.2041 | 0.2041 | 0.2041 |
| | 0.0781 − 0.1886i | −0.1886 − 0.0781i | 0.0781 − 0.1886i |
| | −0.1443 − 0.1443i | 0.1443 + 0.1443i | −0.1443 − 0.1443i |
| | −0.1886 + 0.0781i | −0.0781 − 0.1886i | −0.1886 + 0.0781i |
| | 0.2041 | −0.2041 | −0.2041 |
| | 0.0781 − 0.1886i | 0.1886 + 0.0781i | −0.0781 + 0.1886i |
| | −0.1443 − 0.1443i | −0.1443 − 0.1443i | 0.1443 + 0.1443i |
| | −0.1886 + 0.0781i | 0.0781 + 0.1886i | 0.1886 − 0.0781i |
| ans(:, :, 4, 6) = | 0.2041 | 0.2041 | 0.2041 |
| | 0.1886 + 0.0781i | 0.0781 − 0.1886i | 0.1886 + 0.0781i |
| | 0.1443 + 0.1443i | −0.1443 − 0.1443i | 0.1443 + 0.1443i |
| | 0.0781 + 0.1886i | −0.1886 + 0.0781i | 0.0781 + 0.1886i |
| | 0.2041 | −0.2041 | −0.2041 |
| | 0.1886 + 0.0781i | −0.0781 + 0.1886i | −0.1886 − 0.0781i |
| | 0.1443 + 0.1443i | 0.1443 + 0.1443i | −0.1443 − 0.1443i |
| | 0.0781 + 0.1886i | 0.1886 − 0.0781i | −0.0781 − 0.1886i |
| ans(:, :, 1, 7) = | 0.2041 | 0.2041 | 0.2041 |
| | 0.1886 + 0.0781i | −0.0781 + 0.1886i | −0.0781 + 0.1886i |
| | 0.1443 + 0.1443i | −0.1443 − 0.1443i | −0.1443 − 0.1443i |
| | 0.0781 + 0.1886i | 0.1886 − 0.0781i | 0.1886 − 0.0781i |
| | 0.2041 | 0.2041 | −0.2041 |
| | 0.1886 + 0.0781i | −0.0781 + 0.1886i | 0.0781 − 0.1886i |
| | 0.1443 + 0.1443i | −0.1443 − 0.1443i | 0.1443 + 0.1443i |
| | 0.0781 + 0.1886i | 0.1886 − 0.0781i | −0.1886 + 0.0781i |
| ans(:, :, 2, 7) = | 0.2041 | 0.2041 | 0.2041 |
| | −0.0781 + 0.1886i | −0.1886 − 0.0781i | −0.1886 − 0.0781i |
| | −0.1443 − 0.1443i | 0.1443 + 0.1443i | 0.1443 + 0.1443i |
| | 0.1886 − 0.0781i | −0.0781 − 0.1886i | −0.0781 − 0.1886i |
| | 0.2041 | 0.2041 | −0.2041 |
| | −0.0781 + 0.1886i | −0.1886 − 0.0781i | 0.1886 + 0.0781i |
| | −0.1443 − 0.1443i | 0.1443 + 0.1443i | −0.1443 − 0.1443i |
| | 0.1886 − 0.0781i | −0.0781 − 0.1886i | 0.0781 + 0.1886i |
| ans(:, :, 3, 7) = | 0.2041 | 0.2041 | 0.2041 |
| | −0.1886 − 0.0781i | 0.0781 − 0.1886i | 0.0781 − 0.1886i |
| | 0.1443 + 0.1443i | −0.1443 − 0.1443i | −0.1443 − 0.1443i |
| | −0.0781 − 0.1886i | −0.1886 + 0.0781i | −0.1886 + 0.0781i |

|                | 0.2041            | 0.2041            | −0.2041           |
|                | −0.1886 − 0.0781i | 0.0781 − 0.1886i  | −0.0781 + 0.1886i |
|                | 0.1443 + 0.1443i  | −0.1443 − 0.1443i | 0.1443 + 0.1443i  |
|                | −0.0781 − 0.1886i | −0.1886 + 0.0781i | 0.1886 − 0.0781i  |
| ans(:, :, 4, 7) = | 0.2041         | 0.2041            | 0.2041            |
|                | 0.0781 − 0.1886i  | 0.1886 + 0.0781i  | 0.1886 + 0.0781i  |
|                | −0.1443 − 0.1443i | 0.1443 + 0.1443i  | 0.1443 + 0.1443i  |
|                | −0.1886 + 0.0781i | 0.0781 + 0.1886i  | 0.0781 + 0.1886i  |
|                | 0.2041            | 0.2041            | −0.2041           |
|                | 0.0781 − 0.1886i  | 0.1886 + 0.0781i  | −0.1886 − 0.0781i |
|                | −0.1443 − 0.1443i | 0.1443 + 0.1443i  | −0.1443 − 0.1443i |
|                | −0.1886 + 0.0781i | 0.0781 + 0.1886i  | −0.0781 − 0.1886i |
| ans(:, :, 1, 8) = | 0.2041         | 0.2041            | 0.2041            |
|                | −0.0781 + 0.1886i | 0.1886 + 0.0781i  | 0.1886 + 0.0781i  |
|                | −0.1443 − 0.1443i | 0.1443 + 0.1443i  | 0.1443 + 0.1443i  |
|                | 0.1886 − 0.0781i  | 0.0781 + 0.1886i  | 0.0781 + 0.1886i  |
|                | 0.2041            | 0.2041            | −0.2041           |
|                | −0.0781 + 0.1886i | 0.1886 + 0.0781i  | −0.1886 − 0.0781i |
|                | −0.1443 − 0.1443i | 0.1443 + 0.1443i  | −0.1443 − 0.1443i |
|                | 0.1886 − 0.0781i  | 0.0781 + 0.1886i  | −0.0781 − 0.1886i |
| ans(:, :, 2, 8) = | 0.2041         | 0.2041            | 0.2041            |
|                | −0.1886 − 0.0781i | −0.0781 + 0.1886i | −0.0781 + 0.1886i |
|                | 0.1443 + 0.1443i  | −0.1443 − 0.1443i | −0.1443 − 0.1443i |
|                | −0.0781 − 0.1886i | 0.1886 − 0.0781i  | 0.1886 − 0.0781i  |
|                | 0.2041            | 0.2041            | −0.2041           |
|                | −0.1886 − 0.0781i | −0.0781 + 0.1886i | 0.0781 − 0.1886i  |
|                | 0.1443 + 0.1443i  | −0.1443 − 0.1443i | 0.1443 + 0.1443i  |
|                | −0.0781 − 0.1886i | 0.1886 − 0.0781i  | −0.1886 + 0.0781i |
| ans(:, :, 3, 8) = | 0.2041         | 0.2041            | 0.2041            |
|                | 0.0781 − 0.1886i  | −0.1886 − 0.0781i | −0.1886 − 0.0781i |
|                | −0.1443 − 0.1443i | 0.1443 + 0.1443i  | 0.1443 + 0.1443i  |
|                | −0.1886 + 0.0781i | −0.0781 − 0.1886i | −0.0781 − 0.1886i |
|                | 0.2041            | 0.2041            | −0.2041           |
|                | 0.0781 − 0.1886i  | −0.1886 − 0.0781i | 0.1886 + 0.0781i  |
|                | −0.1443 − 0.1443i | 0.1443 + 0.1443i  | −0.1443 − 0.1443i |
|                | −0.1886 + 0.0781i | −0.0781 − 0.1886i | 0.0781 + 0.1886i  |
| ans(:, :, 4, 8) = | 0.2041         | 0.2041            | 0.2041            |
|                | 0.1886 + 0.0781i  | 0.0781 − 0.1886i  | 0.0781 − 0.1886i  |
|                | 0.1443 + 0.1443i  | −0.1443 − 0.1443i | −0.1443 − 0.1443i |
|                | 0.0781 + 0.1886i  | −0.1886 + 0.0781i | −0.1886 + 0.0781i |
|                | 0.2041            | 0.2041            | −0.2041           |
|                | 0.1886 + 0.0781i  | 0.0781 − 0.1886i  | −0.0781 + 0.1886i |
|                | 0.1443 + 0.1443i  | −0.1443 − 0.1443i | 0.1443 + 0.1443i  |
|                | 0.0781 + 0.1886i  | −0.1886 + 0.0781i | 0.1886 − 0.0781i  |
| ans(:, :, 1, 9) = | 0.2041         | 0.2041            | 0.2041            |
|                | 0.1443 + 0.1443i  | 0.1443 + 0.1443i  | −0.1443 + 0.1443i |
|                | 0.0000 + 0.2041i  | 0.0000 + 0.2041i  | −0.0000 − 0.2041i |
|                | −0.1443 + 0.1443i | −0.1443 + 0.1443i | 0.1443 + 0.1443i  |
|                | 0.2041            | −0.2041           | −0.2041           |
|                | 0.1443 + 0.1443i  | −0.1443 − 0.1443i | 0.1443 − 0.1443i  |
|                | 0.0000 + 0.2041i  | −0.0000 − 0.2041i | 0.0000 + 0.2041i  |
|                | −0.1443 + 0.1443i | 0.1443 − 0.1443i  | −0.1443 − 0.1443i |
| ans(:, :, 2, 9) = | 0.2041         | 0.2041            | 0.2041            |
|                | −0.1443 + 0.1443i | −0.1443 + 0.1443i | −0.1443 − 0.1443i |
|                | −0.0000 − 0.2041i | −0.0000 − 0.2041i | 0.0000 + 0.2041i  |
|                | 0.1443 + 0.1443i  | 0.1443 + 0.1443i  | 0.1443 − 0.1443i  |
|                | 0.2041            | −0.2041           | −0.2041           |
|                | −0.1443 + 0.1443i | 0.1443 − 0.1443i  | 0.1443 + 0.1443i  |
|                | −0.0000 − 0.2041i | 0.0000 + 0.2041i  | −0.0000 − 0.2041i |
|                | 0.1443 + 0.1443i  | −0.1443 − 0.1443i | −0.1443 − 0.1443i |
| ans(:, :, 3, 9) = | 0.2041         | 0.2041            | 0.2041            |
|                | −0.1443 − 0.1443i | −0.1443 − 0.1443i | 0.1443 − 0.1443i  |
|                | 0.0000 + 0.2041i  | 0.0000 + 0.2041i  | −0.0000 − 0.2041i |
|                | 0.1443 − 0.1443i  | 0.1443 − 0.1443i  | −0.1443 − 0.1443i |
|                | 0.2041            | −0.2041           | −0.2041           |
|                | −0.1443 − 0.1443i | 0.1443 + 0.1443i  | −0.1443 + 0.1443i |
|                | 0.0000 + 0.2041i  | −0.0000 − 0.2041i | 0.0000 + 0.2041i  |
|                | 0.1443 − 0.1443i  | −0.1443 + 0.1443i | 0.1443 + 0.1443i  |
| ans(:, :, 4, 9) = | 0.2041         | 0.2041            | 0.2041            |
|                | 0.1443 − 0.1443i  | 0.1443 − 0.1443i  | 0.1443 + 0.1443i  |
|                | −0.0000 − 0.2041i | −0.0000 − 0.2041i | 0.0000 + 0.2041i  |
|                | −0.1443 − 0.1443i | −0.1443 − 0.1443i | −0.1443 + 0.1443i |
|                | 0.2041            | −0.2041           | −0.2041           |
|                | 0.1443 − 0.1443i  | −0.1443 + 0.1443i | −0.1443 − 0.1443i |
|                | −0.0000 − 0.2041i | 0.0000 + 0.2041i  | −0.0000 − 0.2041i |
|                | −0.1443 − 0.1443i | 0.1443 + 0.1443i  | 0.1443 − 0.1443i  |
| ans(:, :, 1, 10) = | 0.2041        | 0.2041            | 0.2041            |
|                | −0.1443 + 0.1443i | 0.1443 + 0.1443i  | −0.1443 + 0.1443i |
|                | −0.0000 − 0.2041i | 0.0000 + 0.2041i  | −0.0000 − 0.2041i |

-continued

|                  |                   |                   |                   |
|------------------|-------------------|-------------------|-------------------|
|                  | 0.1443 + 0.1443i  | −0.1443 + 0.1443i | 0.1443 + 0.1443i  |
|                  | 0.2041            | −0.2041           | −0.2041           |
|                  | −0.1443 + 0.1443i | −0.1443 − 0.1443i | 0.1443 − 0.1443i  |
|                  | −0.0000 − 0.2041i | −0.0000 − 0.2041i | 0.0000 + 0.2041i  |
|                  | 0.1443 + 0.1443i  | 0.1443 + 0.1443i  | −0.1443 − 0.1443i |
| ans(:, :, 2, 10) = | 0.2041          | 0.2041            | 0.2041            |
|                  | −0.1443 − 0.1443i | −0.1443 + 0.1443i | −0.1443 − 0.1443i |
|                  | 0.0000 + 0.2041i  | −0.0000 − 0.2041i | 0.0000 + 0.2041i  |
|                  | 0.1443 − 0.1443i  | 0.1443 + 0.1443i  | 0.1443 − 0.1443i  |
|                  | 0.2041            | −0.2041           | −0.2041           |
|                  | −0.1443 − 0.1443i | 0.1443 − 0.1443i  | 0.1443 + 0.1443i  |
|                  | 0.0000 + 0.2041i  | 0.0000 + 0.2041i  | −0.0000 − 0.2041i |
|                  | 0.1443 − 0.1443i  | −0.1443 − 0.1443i | −0.1443 + 0.1443i |
| ans(:, :, 3, 10) = | 0.2041          | 0.2041            | 0.2041            |
|                  | 0.1443 − 0.1443i  | −0.1443 − 0.1443i | 0.1443 − 0.1443i  |
|                  | −0.0000 − 0.2041i | 0.0000 + 0.2041i  | −0.0000 − 0.2041i |
|                  | −0.1443 − 0.1443i | 0.1443 − 0.1443i  | −0.1443 − 0.1443i |
|                  | 0.2041            | −0.2041           | −0.2041           |
|                  | 0.1443 − 0.1443i  | 0.1443 + 0.1443i  | −0.1443 + 0.1443i |
|                  | −0.0000 − 0.2041i | −0.0000 − 0.2041i | 0.0000 + 0.2041i  |
|                  | −0.1443 − 0.1443i | −0.1443 + 0.1443i | 0.1443 + 0.1443i  |
| ans(:, :, 4, 10) = | 0.2041          | 0.2041            | 0.2041            |
|                  | 0.1443 + 0.1443i  | 0.1443 − 0.1443i  | 0.1443 + 0.1443i  |
|                  | 0.0000 + 0.2041i  | −0.0000 − 0.2041i | 0.0000 + 0.2041i  |
|                  | −0.1443 + 0.1443i | −0.1443 − 0.1443i | −0.1443 + 0.1443i |
|                  | 0.2041            | −0.2041           | −0.2041           |
|                  | 0.1443 + 0.1443i  | −0.1443 + 0.1443i | −0.1443 − 0.1443i |
|                  | 0.0000 + 0.2041i  | 0.0000 + 0.2041i  | −0.0000 − 0.2041i |
|                  | −0.1443 + 0.1443i | 0.1443 + 0.1443i  | 0.1443 − 0.1443i  |
| ans(:, :, 1, 11) = | 0.2041          | 0.2041            | 0.2041            |
|                  | 0.1443 + 0.1443i  | −0.1443 + 0.1443i | −0.1443 + 0.1443i |
|                  | 0.0000 + 0.2041i  | −0.0000 − 0.2041i | −0.0000 − 0.2041i |
|                  | −0.1443 + 0.1443i | 0.1443 + 0.1443i  | 0.1443 + 0.1443i  |
|                  | 0.2041            | 0.2041            | −0.2041           |
|                  | 0.1443 + 0.1443i  | −0.1443 + 0.1443i | 0.1443 − 0.1443i  |
|                  | 0.0000 + 0.2041i  | −0.0000 − 0.2041i | 0.0000 + 0.2041i  |
|                  | −0.1443 + 0.1443i | 0.1443 + 0.1443i  | −0.1443 − 0.1443i |
| ans(:, :, 2, 11) = | 0.2041          | 0.2041            | 0.2041            |
|                  | −0.1443 + 0.1443i | −0.1443 − 0.1443i | −0.1443 − 0.1443i |
|                  | −0.0000 − 0.2041i | 0.0000 + 0.2041i  | 0.0000 + 0.2041i  |
|                  | 0.1443 + 0.1443i  | 0.1443 − 0.1443i  | 0.1443 − 0.1443i  |
|                  | 0.2041            | 0.2041            | −0.2041           |
|                  | −0.1443 + 0.1443i | −0.1443 − 0.1443i | 0.1443 + 0.1443i  |
|                  | −0.0000 − 0.2041i | 0.0000 + 0.2041i  | −0.0000 − 0.2041i |
|                  | 0.1443 + 0.1443i  | 0.1443 − 0.1443i  | −0.1443 + 0.1443i |
| ans(:, :, 3, 11) = | 0.2041          | 0.2041            | 0.2041            |
|                  | −0.1443 − 0.1443i | 0.1443 − 0.1443i  | 0.1443 − 0.1443i  |
|                  | 0.0000 + 0.2041i  | −0.0000 − 0.2041i | −0.0000 − 0.2041i |
|                  | 0.1443 − 0.1443i  | −0.1443 − 0.1443i | −0.1443 − 0.1443i |
|                  | 0.2041            | 0.2041            | −0.2041           |
|                  | −0.1443 − 0.1443i | 0.1443 − 0.1443i  | −0.1443 + 0.1443i |
|                  | 0.0000 + 0.2041i  | −0.0000 − 0.2041i | 0.0000 + 0.2041i  |
|                  | 0.1443 − 0.1443i  | −0.1443 − 0.1443i | 0.1443 + 0.1443i  |
| ans(:, :, 4, 11) = | 0.2041          | 0.2041            | 0.2041            |
|                  | 0.1443 − 0.1443i  | 0.1443 + 0.1443i  | 0.1443 + 0.1443i  |
|                  | −0.0000 − 0.2041i | 0.0000 + 0.2041i  | 0.0000 + 0.2041i  |
|                  | −0.1443 − 0.1443i | −0.1443 + 0.1443i | −0.1443 + 0.1443i |
|                  | 0.2041            | 0.2041            | −0.2041           |
|                  | 0.1443 − 0.1443i  | 0.1443 + 0.1443i  | −0.1443 − 0.1443i |
|                  | −0.0000 − 0.2041i | 0.0000 + 0.2041i  | −0.0000 − 0.2041i |
|                  | −0.1443 − 0.1443i | −0.1443 + 0.1443i | 0.1443 − 0.1443i  |
| ans(:, :, 1, 12) = | 0.2041          | 0.2041            | 0.2041            |
|                  | −0.1443 + 0.1443i | 0.1443 + 0.1443i  | 0.1443 + 0.1443i  |
|                  | −0.0000 − 0.2041i | 0.0000 + 0.2041i  | 0.0000 + 0.2041i  |
|                  | 0.1443 + 0.1443i  | −0.1443 + 0.1443i | −0.1443 + 0.1443i |
|                  | 0.2041            | 0.2041            | −0.2041           |
|                  | −0.1443 + 0.1443i | 0.1443 + 0.1443i  | −0.1443 − 0.1443i |
|                  | −0.0000 − 0.2041i | 0.0000 + 0.2041i  | −0.0000 − 0.2041i |
|                  | 0.1443 + 0.1443i  | −0.1443 + 0.1443i | 0.1443 − 0.1443i  |
| ans(:, :, 2, 12) = | 0.2041          | 0.2041            | 0.2041            |
|                  | −0.1443 − 0.1443i | −0.1443 + 0.1443i | −0.1443 + 0.1443i |
|                  | 0.0000 + 0.2041i  | −0.0000 − 0.2041i | −0.0000 − 0.2041i |
|                  | 0.1443 − 0.1443i  | 0.1443 + 0.1443i  | 0.1443 + 0.1443i  |
|                  | 0.2041            | 0.2041            | −0.2041           |
|                  | −0.1443 − 0.1443i | −0.1443 + 0.1443i | 0.1443 − 0.1443i  |
|                  | 0.0000 + 0.2041i  | −0.0000 − 0.2041i | 0.0000 + 0.2041i  |
|                  | 0.1443 − 0.1443i  | 0.1443 + 0.1443i  | −0.1443 − 0.1443i |
| ans(:, :, 3, 12) = | 0.2041          | 0.2041            | 0.2041            |
|                  | 0.1443 − 0.1443i  | −0.1443 − 0.1443i | −0.1443 − 0.1443i |

|             |                     |                     |                     |
|-------------|---------------------|---------------------|---------------------|
|             | −0.0000 − 0.2041i   | 0.0000 + 0.2041i    | 0.0000 + 0.2041i    |
|             | −0.1443 − 0.1443i   | 0.1443 − 0.1443i    | 0.1443 − 0.1443i    |
|             | 0.2041              | 0.2041              | −0.2041             |
|             | 0.1443 − 0.1443i    | −0.1443 − 0.1443i   | 0.1443 + 0.1443i    |
|             | −0.0000 − 0.2041i   | 0.0000 + 0.2041i    | −0.0000 − 0.2041i   |
|             | −0.1443 − 0.1443i   | 0.1443 − 0.1443i    | −0.1443 + 0.1443i   |
| ans(:, :, 4, 12) = | 0.2041         | 0.2041              | 0.2041              |
|             | 0.1443 + 0.1443i    | 0.1443 − 0.1443i    | 0.1443 − 0.1443i    |
|             | 0.0000 + 0.2041i    | −0.0000 − 0.2041i   | −0.0000 − 0.2041i   |
|             | −0.1443 + 0.1443i   | −0.1443 − 0.1443i   | −0.1443 − 0.1443i   |
|             | 0.2041              | 0.2041              | −0.2041             |
|             | 0.1443 + 0.1443i    | 0.1443 − 0.1443i    | −0.1443 + 0.1443i   |
|             | 0.0000 + 0.2041i    | −0.0000 − 0.2041i   | 0.0000 + 0.2041i    |
|             | −0.1443 + 0.1443i   | −0.1443 + 0.1443i   | 0.1443 + 0.1443i    |
| ans(:, :, 1, 13) = | 0.2041         | 0.2041              | 0.2041              |
|             | 0.0781 + 0.1886i    | 0.0781 + 0.1886i    | −0.1886 + 0.0781i   |
|             | −0.1443 + 0.1443i   | −0.1443 + 0.1443i   | 0.1443 − 0.1443i    |
|             | −0.1886 − 0.0781i   | −0.1886 − 0.0781i   | −0.0781 + 0.1886i   |
|             | 0.2041              | −0.2041             | −0.2041             |
|             | 0.0781 + 0.1886i    | −0.0781 − 0.1886i   | 0.1886 − 0.0781i    |
|             | −0.1443 + 0.1443i   | 0.1443 − 0.1443i    | −0.1443 + 0.1443i   |
|             | −0.1886 − 0.0781i   | 0.1886 + 0.0781i    | 0.0781 − 0.1886i    |
| ans(:, :, 2, 13) = | 0.2041         | 0.2041              | 0.2041              |
|             | −0.1886 + 0.0781i   | −0.1886 + 0.0781i   | −0.0781 − 0.1886i   |
|             | 0.1443 − 0.1443i    | 0.1443 − 0.1443i    | −0.1443 + 0.1443i   |
|             | −0.0781 + 0.1886i   | −0.0781 + 0.1886i   | 0.1886 + 0.0781i    |
|             | 0.2041              | −0.2041             | −0.2041             |
|             | −0.1886 + 0.0781i   | 0.1886 − 0.0781i    | 0.0781 + 0.1886i    |
|             | 0.1443 − 0.1443i    | −0.1443 + 0.1443i   | 0.1443 − 0.1443i    |
|             | −0.0781 + 0.1886i   | 0.0781 − 0.1886i    | −0.1886 − 0.0781i   |
| ans(:, :, 3, 13) = | 0.2041         | 0.2041              | 0.2041              |
|             | −0.0781 − 0.1886i   | −0.0781 − 0.1886i   | 0.1886 − 0.0781i    |
|             | −0.1443 + 0.1443i   | −0.1443 + 0.1443i   | 0.1443 − 0.1443i    |
|             | 0.1886 + 0.0781i    | 0.1886 + 0.0781i    | 0.0781 − 0.1886i    |
|             | 0.2041              | −0.2041             | −0.2041             |
|             | −0.0781 − 0.1886i   | 0.0781 + 0.1886i    | −0.1886 + 0.0781i   |
|             | −0.1443 + 0.1443i   | 0.1443 − 0.1443i    | −0.1443 + 0.1443i   |
|             | 0.1886 + 0.0781i    | −0.1886 − 0.0781i   | −0.0781 + 0.1886i   |
| ans(:, :, 4, 13) = | 0.2041         | 0.2041              | 0.2041              |
|             | 0.1886 − 0.0781i    | 0.1886 − 0.0781i    | 0.0781 + 0.1886i    |
|             | 0.1443 − 0.1443i    | 0.1443 − 0.1443i    | −0.1443 + 0.1443i   |
|             | 0.0781 − 0.1886i    | 0.0781 − 0.1886i    | −0.1886 − 0.0781i   |
|             | 0.2041              | −0.2041             | −0.2041             |
|             | 0.1886 − 0.0781i    | −0.1886 + 0.0781i   | −0.0781 − 0.1886i   |
|             | 0.1443 − 0.1443i    | −0.1443 + 0.1443i   | 0.1443 − 0.1443i    |
|             | 0.0781 − 0.1886i    | −0.0781 + 0.1886i   | 0.1886 + 0.0781i    |
| ans(:, :, 1, 14) = | 0.2041         | 0.2041              | 0.2041              |
|             | −0.1886 + 0.0781i   | 0.0781 + 0.1886i    | −0.1886 + 0.0781i   |
|             | 0.1443 − 0.1443i    | −0.1443 + 0.1443i   | 0.1443 − 0.1443i    |
|             | −0.0781 + 0.1886i   | −0.1886 − 0.0781i   | −0.0781 + 0.1886i   |
|             | 0.2041              | −0.2041             | −0.2041             |
|             | −0.1886 + 0.0781i   | −0.0781 − 0.1886i   | 0.1886 − 0.0781i    |
|             | 0.1443 − 0.1443i    | 0.1443 − 0.1443i    | −0.1443 + 0.1443i   |
|             | −0.0781 + 0.1886i   | 0.1886 + 0.0781i    | 0.0781 − 0.1886i    |
| ans(:, :, 2, 14) = | 0.2041         | 0.2041              | 0.2041              |
|             | −0.0781 − 0.1886i   | −0.1886 + 0.0781i   | −0.0781 − 0.1886i   |
|             | −0.1443 + 0.1443i   | 0.1443 − 0.1443i    | −0.1443 + 0.1443i   |
|             | 0.1886 + 0.0781i    | −0.0781 + 0.1886i   | 0.1886 + 0.0781i    |
|             | 0.2041              | −0.2041             | −0.2041             |
|             | −0.0781 − 0.1886i   | 0.1886 − 0.0781i    | 0.0781 + 0.1886i    |
|             | −0.1443 + 0.1443i   | −0.1443 + 0.1443i   | 0.1443 − 0.1443i    |
|             | 0.1886 + 0.0781i    | 0.0781 + 0.1886i    | −0.1886 − 0.0781i   |
| ans(:, :, 3, 14) = | 0.2041         | 0.2041              | 0.2041              |
|             | 0.1886 − 0.0781i    | −0.0781 − 0.1886i   | 0.1886 − 0.0781i    |
|             | 0.1443 − 0.1443i    | −0.1443 + 0.1443i   | 0.1443 − 0.1443i    |
|             | 0.0781 − 0.1886i    | 0.1886 + 0.0781i    | 0.0781 − 0.1886i    |
|             | 0.2041              | −0.2041             | −0.2041             |
|             | 0.1886 − 0.0781i    | 0.0781 + 0.1886i    | −0.1886 + 0.0781i   |
|             | 0.1443 − 0.1443i    | 0.1443 − 0.1443i    | −0.1443 + 0.1443i   |
|             | 0.0781 − 0.1886i    | −0.1886 − 0.0781i   | −0.0781 + 0.1886i   |
| ans(:, :, 4, 14) = | 0.2041         | 0.2041              | 0.2041              |
|             | 0.0781 + 0.1886i    | 0.1886 − 0.0781i    | 0.0781 + 0.1886i    |
|             | −0.1443 + 0.1443i   | 0.1443 − 0.1443i    | −0.1443 + 0.1443i   |
|             | −0.1886 − 0.0781i   | 0.0781 − 0.1886i    | −0.1886 − 0.0781i   |
|             | 0.2041              | −0.2041             | −0.2041             |
|             | 0.0781 + 0.1886i    | −0.1886 + 0.0781i   | −0.0781 − 0.1886i   |
|             | −0.1443 + 0.1443i   | −0.1443 + 0.1443i   | 0.1443 − 0.1443i    |
|             | −0.1886 − 0.0781i   | −0.0781 + 0.1886i   | 0.1886 + 0.0781i    |

-continued

| | | | |
|---|---|---|---|
| ans(:, :, 1, 15) = | 0.2041 | 0.2041 | 0.2041 |
| | 0.0781 + 0.1886i | −0.1886 + 0.0781i | −0.1886 + 0.0781i |
| | −0.1443 + 0.1443i | 0.1443 − 0.1443i | 0.1443 − 0.1443i |
| | −0.1886 − 0.0781i | −0.0781 + 0.1886i | −0.0781 + 0.1886i |
| | 0.2041 | 0.2041 | −0.2041 |
| | 0.0781 + 0.1886i | −0.1886 + 0.0781i | 0.1886 − 0.0781i |
| | −0.1443 + 0.1443i | 0.1443 − 0.1443i | −0.1443 + 0.1443i |
| | −0.1886 − 0.0781i | −0.0781 + 0.1886i | 0.0781 − 0.1886i |
| ans(:, :, 2, 15) = | 0.2041 | 0.2041 | 0.2041 |
| | −0.1886 + 0.0781i | −0.0781 − 0.1886i | −0.0781 − 0.1886i |
| | 0.1443 − 0.1443i | −0.1443 + 0.1443i | −0.1443 + 0.1443i |
| | −0.0781 + 0.1886i | 0.1886 + 0.0781i | 0.1886 + 0.0781i |
| | 0.2041 | 0.2041 | −0.2041 |
| | −0.1886 + 0.0781i | −0.0781 − 0.1886i | 0.0781 + 0.1886i |
| | 0.1443 − 0.1443i | −0.1443 + 0.1443i | 0.1443 − 0.1443i |
| | −0.0781 + 0.1886i | 0.1886 + 0.0781i | −0.1886 − 0.0781i |
| ans(:, :, 3, 15) = | 0.2041 | 0.2041 | 0.2041 |
| | −0.0781 − 0.1886i | 0.1886 − 0.0781i | 0.1886 − 0.0781i |
| | −0.1443 + 0.1443i | 0.1443 − 0.1443i | 0.1443 − 0.1443i |
| | 0.1886 + 0.0781i | 0.0781 − 0.1886i | 0.0781 − 0.1886i |
| | 0.2041 | 0.2041 | −0.2041 |
| | −0.0781 − 0.1886i | 0.1886 − 0.0781i | −0.1886 + 0.0781i |
| | −0.1443 + 0.1443i | 0.1443 − 0.1443i | −0.1443 + 0.1443i |
| | 0.1886 + 0.0781i | 0.0781 − 0.1886i | −0.0781 + 0.1886i |
| ans(:, :, 4, 15) = | 0.2041 | 0.2041 | 0.2041 |
| | 0.1886 − 0.0781i | 0.0781 + 0.1886i | 0.0781 + 0.1886i |
| | 0.1443 − 0.1443i | −0.1443 + 0.1443i | −0.1443 + 0.1443i |
| | 0.0781 − 0.1886i | −0.1886 − 0.0781i | −0.1886 − 0.0781i |
| | 0.2041 | 0.2041 | −0.2041 |
| | 0.1886 − 0.0781i | 0.0781 + 0.1886i | −0.0781 − 0.1886i |
| | 0.1443 − 0.1443i | −0.1443 + 0.1443i | 0.1443 − 0.1443i |
| | 0.0781 − 0.1886i | −0.1886 − 0.0781i | 0.1886 + 0.0781i |
| ans(:, :, 1, 16) = | 0.2041 | 0.2041 | 0.2041 |
| | −0.1886 + 0.0781i | 0.0781 + 0.1886i | 0.0781 + 0.1886i |
| | 0.1443 − 0.1443i | −0.1443 + 0.1443i | −0.1443 + 0.1443i |
| | −0.0781 + 0.1886i | −0.1886 − 0.0781i | −0.1886 − 0.0781i |
| | 0.2041 | 0.2041 | −0.2041 |
| | −0.1886 + 0.0781i | 0.0781 + 0.1886i | −0.0781 − 0.1886i |
| | 0.1443 − 0.1443i | −0.1443 + 0.1443i | 0.1443 − 0.1443i |
| | −0.0781 + 0.1886i | −0.1886 − 0.0781i | 0.1886 + 0.0781i |
| ans(:, :, 2, 16) = | 0.2041 | 0.2041 | 0.2041 |
| | −0.0781 − 0.1886i | −0.1886 + 0.0781i | −0.1886 + 0.0781i |
| | −0.1443 + 0.1443i | 0.1443 − 0.1443i | 0.1443 − 0.1443i |
| | 0.1886 + 0.0781i | −0.0781 + 0.1886i | −0.0781 + 0.1886i |
| | 0.2041 | 0.2041 | −0.2041 |
| | −0.0781 − 0.1886i | −0.1886 + 0.0781i | 0.1886 − 0.0781i |
| | −0.1443 + 0.1443i | 0.1443 − 0.1443i | −0.1443 + 0.1443i |
| | 0.1886 + 0.0781i | −0.0781 + 0.1886i | 0.0781 − 0.1886i |
| ans(:, :, 3, 16) = | 0.2041 | 0.2041 | 0.2041 |
| | 0.1886 − 0.0781i | −0.0781 − 0.1886i | −0.0781 − 0.1886i |
| | 0.1443 − 0.1443i | −0.1443 + 0.1443i | −0.1443 + 0.1443i |
| | 0.0781 − 0.1886i | 0.1886 + 0.0781i | 0.1886 + 0.0781i |
| | 0.2041 | 0.2041 | −0.2041 |
| | 0.1886 − 0.0781i | −0.0781 − 0.1886i | 0.0781 + 0.1886i |
| | 0.1443 − 0.1443i | −0.1443 + 0.1443i | 0.1443 − 0.1443i |
| | 0.0781 − 0.1886i | 0.1886 + 0.0781i | −0.1886 − 0.0781i |
| ans(:, :, 4, 16) = | 0.2041 | 0.2041 | 0.2041 |
| | 0.0781 + 0.1886i | 0.1886 − 0.0781i | 0.1886 − 0.0781i |
| | −0.1443 + 0.1443i | 0.1443 − 0.1443i | 0.1443 − 0.1443i |
| | −0.1886 − 0.0781i | 0.0781 + 0.1886i | 0.0781 + 0.1886i |
| | 0.2041 | 0.2041 | −0.2041 |
| | 0.0781 + 0.1886i | 0.1886 − 0.0781i | −0.1886 + 0.0781i |
| | −0.1443 + 0.1443i | 0.1443 − 0.1443i | −0.1443 + 0.1443i |
| | −0.1886 − 0.0781i | 0.0781 + 0.1886i | −0.0781 + 0.1886i |

Rank 4

| | | |
|---|---|---|
| ans(:, :, 1, 1) = | | |
| columns 1-2 | 0.1768 | 0.1768 |
| | 0.1768 | 0.0000 + 0.1768i |
| | 0.1768 | −0.1768 + 0.0000i |
| | 0.1768 | −0.0000 − 0.1768i |
| | 0.1768 | 0.1768 |
| | 0.1768 | 0.0000 + 0.1768i |
| | 0.1768 | −0.1768 + 0.0000i |
| | 0.1768 | −0.0000 − 0.1768i |
| columns 3-4 | 0.1768 | 0.1768 |
| | 0.1768 | 0.0000 + 0.1768i |
| | 0.1768 | −0.1768 + 0.0000i |

-continued

|  | | |
|---|---|---|
| | −0.1768 | −0.1768 |
| | −0.1768 | −0.0000 − 0.1768i |
| | −0.1768 | 0.1768 − 0.0000i |
| | −0.1768 | 0.0000 + 0.1768i |
| ans(:, :, 2, 1) = | | |
| columns 1-2 | 0.1768 | 0.1768 |
| | 0 + 0.1768i | −0.1768 + 0.0000i |
| | −0.1768 | 0.1768 − 0.0000i |
| | 0 − 0.1768i | −0.1768 + 0.0000i |
| | 0.1768 | 0.1768 |
| | 0 + 0.1768i | −0.1768 + 0.0000i |
| | −0.1768 | 0.1768 − 0.0000i |
| | 0 − 0.1768i | −0.1768 + 0.0000i |
| Columns 3-4 | 0.1768 | 0.1768 |
| | 0 + 0.1768i | −0.1768 + 0.0000i |
| | −0.1768 | 0.1768 − 0.0000i |
| | 0 − 0.1768i | −0.1768 + 0.0000i |
| | −0.1768 | −0.1768 |
| | 0 − 0.1768i | 0.1768 − 0.0000i |
| | 0.1768 | −0.1768 + 0.0000i |
| | 0 + 0.1768i | 0.1768 − 0.0000i |
| ans(:, :, 3, 1) = | | |
| columns 1-2 | 0.1768 | 0.1768 |
| | −0.1768 | −0.0000 − 0.1768i |
| | 0.1768 | −0.1768 + 0.0000i |
| | −0.1768 | 0.0000 + 0.1768i |
| | 0.1768 | 0.1768 |
| | −0.1768 | −0.0000 − 0.1768i |
| | 0.1768 | −0.1768 + 0.0000i |
| | −0.1768 | 0.0000 + 0.1768i |
| Columns 3-4 | 0.1768 | 0.1768 |
| | −0.1768 | −0.0000 − 0.1768i |
| | 0.1768 | −0.1768 + 0.0000i |
| | −0.1768 | 0.0000 + 0.1768i |
| | −0.1768 | −0.1768 |
| | 0.1768 | 0.0000 + 0.1768i |
| | −0.1768 | 0.1768 − 0.0000i |
| | 0.1768 | −0.0000 − 0.1768i |
| ans(:, :, 4, 1) = | | |
| columns 1-2 | 0.1768 | 0.1768 |
| | 0 − 0.1768i | 0.1768 − 0.0000i |
| | −0.1768 | 0.1768 − 0.0000i |
| | 0 + 0.1768i | 0.1768 − 0.0000i |
| | 0.1768 | 0.1768 |
| | 0 − 0.1768i | 0.1768 − 0.0000i |
| | −0.1768 | 0.1768 − 0.0000i |
| | 0 + 0.1768i | 0.1768 − 0.0000i |
| Columns 3-4 | 0.1768 | 0.1768 |
| | 0 − 0.1768i | 0.1768 − 0.0000i |
| | −0.1768 | 0.1768 − 0.0000i |
| | 0 + 0.1768i | 0.1768 − 0.0000i |
| | −0.1768 | −0.1768 |
| | 0 + 0.1768i | −0.1768 + 0.0000i |
| | 0.1768 | −0.1768 + 0.0000i |
| | 0 − 0.1768i | −0.1768 + 0.0000i |
| ans(:, :, 1, 2) = | | |
| columns 1-2 | 0.1768 | 0.1768 |
| | 0.1768 | 0.0000 + 0.1768i |
| | 0.1768 | −0.1768 + 0.0000i |
| | 0.1768 | −0.0000 − 0.1768i |
| | 0 + 0.1768i | 0 + 0.1768i |
| | 0 + 0.1768i | −0.1768 + 0.0000i |
| | 0 + 0.1768i | −0.0000 − 0.1768i |
| | 0 + 0.1768i | 0.1768 − 0.0000i |
| Columns 3-4 | 0.1768 | 0.1768 |
| | 0.1768 | 0.0000 + 0.1768i |
| | 0.1768 | −0.1768 + 0.0000i |
| | 0.1768 | −0.0000 − 0.1768i |
| | 0 − 0.1768i | 0 − 0.1768i |
| | 0 − 0.1768i | 0.1768 − 0.0000i |
| | 0 − 0.1768i | 0.0000 + 0.1768i |
| | 0 − 0.1768i | −0.1768 + 0.0000i |
| ans(:, :, 2, 2) = | | |
| columns 1-2 | 0.1768 | 0.1768 |
| | 0 + 0.1768i | −0.1768 + 0.0000i |
| | −0.1768 | 0.1768 − 0.0000i |
| | 0 − 0.1768i | −0.1768 + 0.0000i |
| | 0 + 0.1768i | 0 + 0.1768i |

|              | -continued |                    |
|--------------|------------|--------------------|
|              | −0.1768    | −0.0000 − 0.1768i  |
|              | 0 − 0.1768i | 0.0000 + 0.1768i  |
|              | 0.1768     | −0.0000 − 0.1768i  |
| Columns 3-4  | 0.1768     | 0.1768             |
|              | 0 + 0.1768i | −0.1768 + 0.0000i |
|              | −0.1768    | 0.1768 − 0.0000i   |
|              | 0 − 0.1768i | −0.1768 + 0.0000i |
|              | 0 − 0.1768i | 0 − 0.1768i       |
|              | 0.1768     | 0.0000 + 0.1768i   |
|              | 0 + 0.1768i | −0.0000 − 0.1768i |
|              | −0.1768    | 0.0000 + 0.1768i   |
| ans(:, :, 3, 2) = |       |                    |
| columns 1-2  | 0.1768     | 0.1768             |
|              | −0.1768    | −0.0000 − 0.1768i  |
|              | 0.1768     | −0.1768 + 0.0000i  |
|              | −0.1768    | 0.0000 + 0.1768i   |
|              | 0 + 0.1768i | 0 + 0.1768i       |
|              | 0 − 0.1768i | 0.1768 − 0.0000i  |
|              | 0 + 0.1768i | −0.0000 − 0.1768i |
|              | 0 − 0.1768i | −0.1768 + 0.0000i |
| Columns 3-4  | 0.1768     | 0.1768             |
|              | −0.1768    | −0.0000 − 0.1768i  |
|              | 0.1768     | −0.1768 + 0.0000i  |
|              | −0.1768    | 0.0000 + 0.1768i   |
|              | 0 − 0.1768i | 0 − 0.1768i       |
|              | 0 + 0.1768i | −0.1768 + 0.0000i |
|              | 0 − 0.1768i | 0.0000 + 0.1768i   |
|              | 0 + 0.1768i | 0.1768 − 0.0000i  |
| ans(:, :, 4, 2) = |       |                    |
| columns 1-2  | 0.1768     | 0.1768             |
|              | 0 − 0.1768i | 0.1768 − 0.0000i  |
|              | −0.1768    | 0.1768 − 0.0000i   |
|              | 0 + 0.1768i | 0.1768 − 0.0000i  |
|              | 0 + 0.1768i | 0 + 0.1768i       |
|              | 0.1768     | 0.0000 + 0.1768i   |
|              | 0 − 0.1768i | 0.0000 + 0.1768i  |
|              | −0.1768    | 0.0000 + 0.1768i   |
| Columns 3-4  | 0.1768     | 0.1768             |
|              | 0 − 0.1768i | 0.1768 − 0.0000i  |
|              | −0.1768    | 0.1768 − 0.0000i   |
|              | 0 + 0.1768i | 0.1768 − 0.0000i  |
|              | 0 − 0.1768i | 0 − 0.1768i       |
|              | −0.1768    | −0.0000 − 0.1768i  |
|              | 0 + 0.1768i | −0.0000 − 0.1768i |
|              | 0.1768     | −0.0000 − 0.1768i  |
| ans(:, :, 1, 3) = |       |                    |
| columns 1-2  | 0.1768     | 0.1768             |
|              | 0.1633 + 0.0676i | −0.0676 + 0.1633i |
|              | 0.1250 + 0.1250i | −0.1250 − 0.1250i |
|              | 0.0676 + 0.1633i | 0.1633 − 0.0676i  |
|              | 0.1768     | 0.1768             |
|              | 0.1633 + 0.0676i | −0.0676 + 0.1633i |
|              | 0.1250 + 0.1250i | −0.1250 − 0.1250i |
|              | 0.0676 + 0.1633i | 0.1633 − 0.0676i  |
| Columns 3-4  | 0.1768     | 0.1768             |
|              | 0.1633 + 0.0676i | −0.0676 + 0.1633i |
|              | 0.1250 + 0.1250i | −0.1250 − 0.1250i |
|              | 0.0676 + 0.1633i | 0.1633 − 0.0676i  |
|              | −0.1768    | −0.1768            |
|              | −0.1633 − 0.0676i | 0.0676 − 0.1633i |
|              | −0.1250 − 0.1250i | 0.1250 + 0.1250i |
|              | −0.0676 − 0.1633i | −0.1633 + 0.0676i |
| ans(:, :, 2, 3) = |       |                    |
| columns 1-2  | 0.1768     | 0.1768             |
|              | −0.0676 + 0.1633i | −0.1633 − 0.0676i |
|              | −0.1250 − 0.1250i | 0.1250 + 0.1250i |
|              | 0.1633 − 0.0676i | −0.0676 − 0.1633i |
|              | 0.1768     | 0.1768             |
|              | −0.0676 + 0.1633i | −0.1633 − 0.0676i |
|              | −0.1250 − 0.1250i | 0.1250 + 0.1250i |
|              | 0.1633 − 0.0676i | −0.0676 − 0.1633i |

|  | -continued | |
|---|---|---|
| Columns 3-4 | 0.1768 | 0.1768 |
| | −0.0676 + 0.1633i | −0.1633 − 0.0676i |
| | −0.1250 − 0.1250i | 0.1250 + 0.1250i |
| | 0.1633 − 0.0676i | −0.0676 − 0.1633i |
| | −0.1768 | −0.1768 |
| | 0.0676 − 0.1633i | 0.1633 + 0.0676i |
| | 0.1250 + 0.1250i | −0.1250 − 0.1250i |
| | −0.1633 + 0.0676i | 0.0676 + 0.1633i |
| ans(:, :, 3, 3) = | | |
| columns 1-2 | 0.1768 | 0.1768 |
| | −0.1633 − 0.0676i | 0.0676 − 0.1633i |
| | 0.1250 + 0.1250i | −0.1250 − 0.1250i |
| | −0.0676 − 0.1633i | −0.1633 + 0.0676i |
| | 0.1768 | 0.1768 |
| | −0.1633 − 0.0676i | 0.0676 − 0.1633i |
| | 0.1250 + 0.1250i | −0.1250 − 0.1250i |
| | −0.0676 − 0.1633i | −0.1633 + 0.0676i |
| Columns 3-4 | 0.1768 | 0.1768 |
| | −0.1633 − 0.0676i | 0.0676 − 0.1633i |
| | 0.1250 + 0.1250i | −0.1250 − 0.1250i |
| | −0.0676 − 0.1633i | −0.1633 + 0.0676i |
| | −0.1768 | −0.1768 |
| | 0.1633 + 0.0676i | −0.0676 + 0.1633i |
| | −0.1250 − 0.1250i | 0.1250 + 0.1250i |
| | 0.0676 + 0.1633i | 0.1633 − 0.0676i |
| ans(:, :, 4, 3) = | | |
| columns 1-2 | 0.1768 | 0.1768 |
| | 0.0676 − 0.1633i | 0.1633 + 0.0676i |
| | −0.1250 − 0.1250i | 0.1250 + 0.1250i |
| | −0.1633 + 0.0676i | 0.0676 + 0.1633i |
| | 0.1768 | 0.1768 |
| | 0.0676 − 0.1633i | 0.1633 + 0.0676i |
| | −0.1250 − 0.1250i | 0.1250 + 0.1250i |
| | −0.1633 + 0.0676i | 0.0676 + 0.1633i |
| Columns 3-4 | 0.1768 | 0.1768 |
| | 0.0676 − 0.1633i | 0.1633 + 0.0676i |
| | −0.1250 − 0.1250i | 0.1250 + 0.1250i |
| | −0.1633 + 0.0676i | 0.0676 + 0.1633i |
| | −0.1768 | −0.1768 |
| | −0.0676 + 0.1633i | −0.1633 − 0.0676i |
| | 0.1250 + 0.1250i | −0.1250 − 0.1250i |
| | 0.1633 − 0.0676i | −0.0676 − 0.1633i |
| ans(:, :, 1, 4) = | | |
| columns 1-2 | 0.1768 | 0.1768 |
| | 0.1633 + 0.0676i | −0.0676 + 0.1633i |
| | 0.1250 + 0.1250i | −0.1250 − 0.1250i |
| | 0.0676 + 0.1633i | 0.1633 − 0.0676i |
| | 0 + 0.1768i | 0 + 0.1768i |
| | −0.0676 + 0.1633i | −0.1633 − 0.0676i |
| | −0.1250 + 0.1250i | 0.1250 − 0.1250i |
| | −0.1633 + 0.0676i | 0.0676 + 0.1633i |
| Columns 3-4 | 0.1768 | 0.1768 |
| | 0.1633 + 0.0676i | −0.0676 + 0.1633i |
| | 0.1250 + 0.1250i | −0.1250 − 0.1250i |
| | 0.0676 + 0.1633i | 0.1633 − 0.0676i |
| | 0 − 0.1768i | 0 − 0.1768i |
| | 0.0676 − 0.1633i | 0.1633 + 0.0676i |
| | 0.1250 − 0.1250i | −0.1250 + 0.1250i |
| | 0.1633 − 0.0676i | −0.0676 − 0.1633i |
| ans(:, :, 2, 4) = | | |
| columns 1-2 | 0.1768 | 0.1768 |
| | −0.0676 + 0.1633i | −0.1633 − 0.0676i |
| | −0.1250 − 0.1250i | 0.1250 + 0.1250i |
| | 0.1633 − 0.0676i | −0.0676 − 0.1633i |
| | 0 + 0.1768i | 0 + 0.1768i |
| | −0.1633 − 0.0676i | 0.0676 − 0.1633i |
| | 0.1250 − 0.1250i | −0.1250 + 0.1250i |
| | 0.0676 + 0.1633i | 0.1633 − 0.0676i |
| Columns 3-4 | 0.1768 | 0.1768 |
| | −0.0676 + 0.1633i | −0.1633 − 0.0676i |
| | −0.1250 − 0.1250i | 0.1250 + 0.1250i |
| | 0.1633 − 0.0676i | −0.0676 − 0.1633i |
| | 0 − 0.1768i | 0 − 0.1768i |
| | 0.1633 + 0.0676i | −0.0676 + 0.1633i |
| | −0.1250 + 0.1250i | 0.1250 − 0.1250i |
| | −0.0676 − 0.1633i | −0.1633 + 0.0676i |

-continued

| | | |
|---|---|---|
| ans(:, :, 3, 4) = | | |
| columns 1-2 | 0.1768 | 0.1768 |
| | −0.1633 − 0.0676i | 0.0676 − 0.1633i |
| | 0.1250 + 0.1250i | −0.1250 − 0.1250i |
| | −0.0676 − 0.1633i | −0.1633 + 0.0676i |
| | 0 + 0.1768i | 0 + 0.1768i |
| | 0.0676 − 0.1633i | 0.1633 + 0.0676i |
| | −0.1250 + 0.1250i | 0.1250 − 0.1250i |
| | 0.1633 − 0.0676i | −0.0676 − 0.1633i |
| Columns 3-4 | 0.1768 | 0.1768 |
| | −0.1633 − 0.0676i | 0.0676 − 0.1633i |
| | 0.1250 + 0.1250i | −0.1250 − 0.1250i |
| | −0.0676 − 0.1633i | −0.1633 + 0.0676i |
| | 0 − 0.1768i | 0 − 0.1768i |
| | −0.0676 + 0.1633i | −0.1633 − 0.0676i |
| | 0.1250 − 0.1250i | −0.1250 + 0.1250i |
| | −0.1633 + 0.0676i | 0.0676 + 0.1633i |
| ans(:, :, 4, 4) = | | |
| Columns 1-2 | 0.1768 | 0.1768 |
| | 0.0676 − 0.1633i | 0.1633 + 0.0676i |
| | −0.1250 − 0.1250i | 0.1250 + 0.1250i |
| | −0.1633 + 0.0676i | 0.0676 + 0.1633i |
| | 0 + 0.1768i | 0 + 0.1768i |
| | 0.1633 + 0.0676i | −0.0676 + 0.1633i |
| | 0.1250 − 0.1250i | −0.1250 + 0.1250i |
| | −0.0676 − 0.1633i | −0.1633 + 0.0676i |
| Columns 3-4 | 0.1768 | 0.1768 |
| | 0.0676 − 0.1633i | 0.1633 + 0.0676i |
| | −0.1250 − 0.1250i | 0.1250 + 0.1250i |
| | −0.1633 + 0.0676i | 0.0676 + 0.1633i |
| | 0 − 0.1768i | 0 − 0.1768i |
| | −0.1633 − 0.0676i | 0.0676 − 0.1633i |
| | −0.1250 + 0.1250i | 0.1250 − 0.1250i |
| | 0.0676 + 0.1633i | 0.1633 − 0.0676i |
| ans(:, :, 1, 5) = | | |
| Columns 1-2 | 0.1768 | 0.1768 |
| | 0.1250 + 0.1250i | −0.1250 + 0.1250i |
| | 0.0000 + 0.1768i | −0.0000 − 0.1768i |
| | −0.1250 + 0.1250i | 0.1250 + 0.1250i |
| | 0.1768 | 0.1768 |
| | 0.1250 + 0.1250i | −0.1250 + 0.1250i |
| | 0.0000 + 0.1768i | −0.0000 − 0.1768i |
| | −0.1250 + 0.1250i | 0.1250 + 0.1250i |
| Columns 3-4 | 0.1768 | 0.1768 |
| | 0.1250 + 0.1250i | −0.1250 + 0.1250i |
| | 0.0000 + 0.1768i | −0.0000 − 0.1768i |
| | −0.1250 + 0.1250i | 0.1250 + 0.1250i |
| | −0.1768 | −0.1768 |
| | −0.1250 − 0.1250i | 0.1250 − 0.1250i |
| | −0.0000 − 0.1768i | 0.0000 + 0.1768i |
| | 0.1250 − 0.1250i | −0.1250 − 0.1250i |
| ans(:, :, 2, 5) = | | |
| Columns 1-2 | 0.1768 | 0.1768 |
| | −0.1250 + 0.1250i | −0.1250 − 0.1250i |
| | −0.0000 − 0.1768i | 0.0000 + 0.1768i |
| | 0.1250 + 0.1250i | 0.1250 − 0.1250i |
| | 0.1768 | 0.1768 |
| | −0.1250 + 0.1250i | −0.1250 − 0.1250i |
| | −0.0000 − 0.1768i | 0.0000 + 0.1768i |
| | 0.1250 + 0.1250i | 0.1250 − 0.1250i |
| Columns 3-4 | 0.1768 | 0.1768 |
| | −0.1250 + 0.1250i | −0.1250 − 0.1250i |
| | −0.0000 − 0.1768i | 0.0000 + 0.1768i |
| | 0.1250 + 0.1250i | 0.1250 − 0.1250i |
| | −0.1768 | −0.1768 |
| | 0.1250 − 0.1250i | 0.1250 + 0.1250i |
| | 0.0000 + 0.1768i | −0.0000 − 0.1768i |
| | −0.1250 − 0.1250i | −0.1250 + 0.1250i |
| ans(:, :, 3, 5) = | | |
| Columns 1-2 | 0.1768 | 0.1768 |
| | −0.1250 − 0.1250i | 0.1250 − 0.1250i |
| | 0.0000 + 0.1768i | −0.0000 − 0.1768i |
| | 0.1250 − 0.1250i | −0.1250 − 0.1250i |
| | 0.1768 | 0.1768 |
| | −0.1250 − 0.1250i | 0.1250 − 0.1250i |
| | 0.0000 + 0.1768i | −0.0000 − 0.1768i |
| | 0.1250 − 0.1250i | −0.1250 − 0.1250i |

|  |  |  |
|---|---|---|
| Columns 3-4 | 0.1768 | 0.1768 |
|  | −0.1250 − 0.1250i | 0.1250 − 0.1250i |
|  | 0.0000 + 0.1768i | −0.0000 − 0.1768i |
|  | 0.1250 − 0.1250i | −0.1250 − 0.1250i |
|  | −0.1768 | −0.1768 |
|  | 0.1250 + 0.1250i | −0.1250 + 0.1250i |
|  | −0.0000 − 0.1768i | 0.0000 + 0.1768i |
|  | −0.1250 + 0.1250i | 0.1250 + 0.1250i |
| ans(:, :, 4, 5) = |  |  |
| Columns 1-2 | 0.1768 | 0.1768 |
|  | 0.1250 − 0.1250i | 0.1250 + 0.1250i |
|  | −0.0000 − 0.1768i | 0.0000 + 0.1768i |
|  | −0.1250 − 0.1250i | −0.1250 + 0.1250i |
|  | 0.1768 | 0.1768 |
|  | 0.1250 − 0.1250i | 0.1250 + 0.1250i |
|  | −0.0000 − 0.1768i | 0.0000 + 0.1768i |
|  | −0.1250 − 0.1250i | −0.1250 + 0.1250i |
| Columns 3-4 | 0.1768 | 0.1768 |
|  | 0.1250 − 0.1250i | 0.1250 + 0.1250i |
|  | −0.0000 − 0.1768i | 0.0000 + 0.1768i |
|  | −0.1250 − 0.1250i | −0.1250 + 0.1250i |
|  | −0.1768 | −0.1768 |
|  | −0.1250 + 0.1250i | −0.1250 − 0.1250i |
|  | 0.0000 + 0.1768i | −0.0000 − 0.1768i |
|  | 0.1250 + 0.1250i | 0.1250 − 0.1250i |
| ans(:, :, 1, 6) = |  |  |
| Columns 1-2 | 0.1768 | 0.1768 |
|  | 0.1250 + 0.1250i | −0.1250 + 0.1250i |
|  | 0.0000 + 0.1768i | −0.0000 − 0.1768i |
|  | −0.1250 + 0.1250i | 0.1250 + 0.1250i |
|  | 0 + 0.1768i | 0 + 0.1768i |
|  | −0.1250 + 0.1250i | −0.1250 − 0.1250i |
|  | −0.1768 + 0.0000i | 0.1768 − 0.0000i |
|  | −0.1250 − 0.1250i | −0.1250 + 0.1250i |
| Columns 3-4 | 0.1768 | 0.1768 |
|  | 0.1250 + 0.1250i | −0.1250 + 0.1250i |
|  | 0.0000 + 0.1768i | −0.0000 − 0.1768i |
|  | −0.1250 + 0.1250i | 0.1250 + 0.1250i |
|  | 0 − 0.1768i | 0 − 0.1768i |
|  | 0.1250 − 0.1250i | 0.1250 + 0.1250i |
|  | 0.1768 − 0.0000i | −0.1768 + 0.0000i |
|  | 0.1250 + 0.1250i | 0.1250 − 0.1250i |
| ans(:, :, 2, 6) = |  |  |
| Columns 1-2 | 0.1768 | 0.1768 |
|  | −0.1250 + 0.1250i | −0.1250 − 0.1250i |
|  | −0.0000 − 0.1768i | 0.0000 + 0.1768i |
|  | 0.1250 + 0.1250i | 0.1250 − 0.1250i |
|  | 0 + 0.1768i | 0 + 0.1768i |
|  | −0.1250 − 0.1250i | 0.1250 − 0.1250i |
|  | 0.1768 − 0.0000i | −0.1768 + 0.0000i |
|  | −0.1250 + 0.1250i | 0.1250 + 0.1250i |
| Columns 3-4 | 0.1768 | 0.1768 |
|  | −0.1250 + 0.1250i | −0.1250 − 0.1250i |
|  | −0.0000 − 0.1768i | 0.0000 + 0.1768i |
|  | 0.1250 + 0.1250i | 0.1250 − 0.1250i |
|  | 0 − 0.1768i | 0 − 0.1768i |
|  | 0.1250 + 0.1250i | −0.1250 + 0.1250i |
|  | −0.1768 + 0.0000i | 0.1768 − 0.0000i |
|  | 0.1250 − 0.1250i | −0.1250 − 0.1250i |
| ans(:, :, 3, 6) = |  |  |
| Columns 1-2 | 0.1768 | 0.1768 |
|  | −0.1250 − 0.1250i | 0.1250 − 0.1250i |
|  | 0.0000 + 0.1768i | −0.0000 − 0.1768i |
|  | 0.1250 − 0.1250i | −0.1250 − 0.1250i |
|  | 0 + 0.1768i | 0 + 0.1768i |
|  | 0.1250 − 0.1250i | 0.1250 + 0.1250i |
|  | −0.1768 + 0.0000i | 0.1768 − 0.0000i |
|  | 0.1250 + 0.1250i | 0.1250 − 0.1250i |
| Columns 3-4 | 0.1768 | 0.1768 |
|  | −0.1250 − 0.1250i | 0.1250 − 0.1250i |
|  | 0.0000 + 0.1768i | −0.0000 − 0.1768i |
|  | 0.1250 − 0.1250i | −0.1250 − 0.1250i |
|  | 0 − 0.1768i | 0 − 0.1768i |
|  | −0.1250 + 0.1250i | −0.1250 − 0.1250i |
|  | 0.1768 − 0.0000i | −0.1768 + 0.0000i |
|  | −0.1250 − 0.1250i | −0.1250 + 0.1250i |
| ans(:, :, 4, 6) = |  |  |
| Columns 1-2 | 0.1768 | 0.1768 |
|  | 0.1250 − 0.1250i | 0.1250 + 0.1250i |

|                    |                      |                      |
|--------------------|----------------------|----------------------|
|                    | −0.0000 − 0.1768i    | 0.0000 + 0.1768i     |
|                    | −0.1250 − 0.1250i    | −0.1250 + 0.1250i    |
|                    | 0 + 0.1768i          | 0 + 0.1768i          |
|                    | 0.1250 + 0.1250i     | −0.1250 + 0.1250i    |
|                    | 0.1768 − 0.0000i     | −0.1768 + 0.0000i    |
|                    | 0.1250 − 0.1250i     | −0.1250 − 0.1250i    |
| Columns 3-4        | 0.1768               | 0.1768               |
|                    | 0.1250 − 0.1250i     | 0.1250 + 0.1250i     |
|                    | −0.0000 − 0.1768i    | 0.0000 + 0.1768i     |
|                    | −0.1250 − 0.1250i    | −0.1250 + 0.1250i    |
|                    | 0 − 0.1768i          | 0 − 0.1768i          |
|                    | −0.1250 − 0.1250i    | 0.1250 − 0.1250i     |
|                    | −0.1768 + 0.0000i    | 0.1768 − 0.0000i     |
|                    | −0.1250 + 0.1250i    | 0.1250 + 0.1250i     |
| ans(:, :, 1, 7) =  |                      |                      |
| Columns 1-2        | 0.1768               | 0.1768               |
|                    | 0.0676 + 0.1633i     | −0.1633 + 0.0676i    |
|                    | −0.1250 + 0.1250i    | 0.1250 − 0.1250i     |
|                    | −0.1633 − 0.0676i    | −0.0676 + 0.1633i    |
|                    | 0.1768               | 0.1768               |
|                    | 0.0676 + 0.1633i     | −0.1633 + 0.0676i    |
|                    | −0.1250 + 0.1250i    | 0.1250 − 0.1250i     |
|                    | −0.1633 − 0.0676i    | −0.0676 + 0.1633i    |
| Columns 3-4        | 0.1768               | 0.1768               |
|                    | 0.0676 + 0.1633i     | −0.1633 + 0.0676i    |
|                    | −0.1250 + 0.1250i    | 0.1250 − 0.1250i     |
|                    | −0.1633 − 0.0676i    | −0.0676 + 0.1633i    |
|                    | −0.1768              | −0.1768              |
|                    | −0.0676 − 0.1633i    | 0.1633 − 0.0676i     |
|                    | 0.1250 − 0.1250i     | −0.1250 + 0.1250i    |
|                    | 0.1633 + 0.0676i     | 0.0676 − 0.1633i     |
| ans(:, :, 2, 7) =  |                      |                      |
| Columns 1-2        | 0.1768               | 0.1768               |
|                    | −0.1633 + 0.0676i    | −0.0676 − 0.1633i    |
|                    | 0.1250 − 0.1250i     | −0.1250 + 0.1250i    |
|                    | −0.0676 + 0.1633i    | 0.1633 + 0.0676i     |
|                    | 0.1768               | 0.1768               |
|                    | −0.1633 + 0.0676i    | −0.0676 − 0.1633i    |
|                    | 0.1250 − 0.1250i     | −0.1250 + 0.1250i    |
|                    | −0.0676 + 0.1633i    | 0.1633 + 0.0676i     |
| Columns 3-4        | 0.1768               | 0.1768               |
|                    | −0.1633 + 0.0676i    | −0.0676 − 0.1633i    |
|                    | 0.1250 − 0.1250i     | −0.1250 + 0.1250i    |
|                    | −0.0676 + 0.1633i    | 0.1633 + 0.0676i     |
|                    | −0.1768              | −0.1768              |
|                    | 0.1633 − 0.0676i     | 0.0676 + 0.1633i     |
|                    | −0.1250 + 0.1250i    | 0.1250 − 0.1250i     |
|                    | 0.0676 − 0.1633i     | −0.1633 − 0.0676i    |
| ans(:, :, 3, 7) =  |                      |                      |
| Columns 1-2        | 0.1768               | 0.1768               |
|                    | −0.0676 − 0.1633i    | 0.1633 − 0.0676i     |
|                    | −0.1250 + 0.1250i    | 0.1250 − 0.1250i     |
|                    | 0.1633 + 0.0676i     | 0.0676 − 0.1633i     |
|                    | 0.1768               | 0.1768               |
|                    | −0.0676 − 0.1633i    | 0.1633 − 0.0676i     |
|                    | −0.1250 + 0.1250i    | 0.1250 − 0.1250i     |
|                    | 0.1633 + 0.0676i     | 0.0676 − 0.1633i     |
| Columns 3-4        | 0.1768               | 0.1768               |
|                    | −0.0676 − 0.1633i    | 0.1633 − 0.0676i     |
|                    | −0.0676 − 0.1633i    | 0.1633 − 0.0676i     |
|                    | 0.1633 + 0.0676i     | 0.0676 − 0.1633i     |
|                    | −0.1768              | −0.1768              |
|                    | 0.0676 + 0.1633i     | −0.1633 + 0.0676i    |
|                    | 0.1250 − 0.1250i     | −0.1250 + 0.1250i    |
|                    | −0.1633 − 0.0676i    | −0.0676 + 0.1633i    |
| ans(:, :, 4, 7) =  |                      |                      |
| Columns 1-2        | 0.1768               | 0.1768               |
|                    | 0.1633 − 0.0676i     | 0.0676 + 0.1633i     |
|                    | 0.1250 − 0.1250i     | −0.1250 + 0.1250i    |
|                    | 0.0676 − 0.1633i     | −0.1633 − 0.0676i    |
|                    | 0.1768               | 0.1768               |
|                    | 0.1633 − 0.0676i     | 0.0676 + 0.1633i     |
|                    | 0.1250 − 0.1250i     | −0.1250 + 0.1250i    |
|                    | 0.0676 − 0.1633i     | −0.1633 − 0.0676i    |
| Columns 3-4        | 0.1768               | 0.1768               |
|                    | 0.1633 − 0.0676i     | 0.0676 + 0.1633i     |
|                    | 0.1250 − 0.1250i     | −0.1250 + 0.1250i    |
|                    | 0.0676 − 0.1633i     | −0.1633 − 0.0676i    |
|                    | −0.1768              | −0.1768              |

-continued

|  |  |  |
|---|---|---|
|  | −0.1633 + 0.0676i | −0.0676 − 0.1633i |
|  | −0.1250 + 0.1250i | 0.1250 − 0.1250i |
|  | −0.0676 + 0.1633i | 0.1633 + 0.0676i |
| ans(:, :, 1, 8) = |  |  |
| Columns 1-2 | 0.1768 | 0.1768 |
|  | 0.0676 + 0.1633i | −0.1633 + 0.0676i |
|  | −0.1250 + 0.1250i | 0.1250 − 0.1250i |
|  | −0.1633 − 0.0676i | −0.0676 + 0.1633i |
|  | −0.1633 + 0.0676i | −0.0676 − 0.1633i |
|  | 0 + 0.1768i | 0 + 0.1768i |
|  | −0.1250 − 0.1250i | 0.1250 + 0.1250i |
|  | 0.0676 − 0.1633i | −0.1633 − 0.0676i |
| Columns 3-4 | 0.1768 | 0.1768 |
|  | 0.0676 + 0.1633i | −0.1633 + 0.0676i |
|  | −0.1250 + 0.1250i | 0.1250 − 0.1250i |
|  | −0.1633 − 0.0676i | −0.0676 + 0.1633i |
|  | 0 − 0.1768i | 0 − 0.1768i |
|  | 0.1633 − 0.0676i | 0.0676 + 0.1633i |
|  | 0.1250 + 0.1250i | −0.1250 − 0.1250i |
|  | −0.0676 + 0.1633i | 0.1633 + 0.0676i |
| ans(:, :, 2, 8) = |  |  |
| Columns 1-2 | 0.1768 | 0.1768 |
|  | −0.1633 + 0.0676i | −0.0676 − 0.1633i |
|  | 0.1250 − 0.1250i | −0.1250 + 0.1250i |
|  | −0.0676 + 0.1633i | 0.1633 + 0.0676i |
|  | 0 + 0.1768i | 0 + 0.1768i |
|  | −0.0676 − 0.1633i | 0.1633 − 0.0676i |
|  | 0.1250 + 0.1250i | −0.1250 − 0.1250i |
|  | −0.1633 − 0.0676i | −0.0676 + 0.1633i |
| Columns 3-4 | 0.1768 | 0.1768 |
|  | −0.1633 + 0.0676i | −0.0676 − 0.1633i |
|  | 0.1250 − 0.1250i | −0.1250 + 0.1250i |
|  | −0.0676 + 0.1633i | 0.1633 + 0.0676i |
|  | 0 − 0.1768i | 0 − 0.1768i |
|  | 0.0676 + 0.1633i | −0.1633 + 0.0676i |
|  | −0.1250 − 0.1250i | 0.1250 + 0.1250i |
|  | 0.1633 + 0.0676i | 0.0676 − 0.1633i |
| ans(:, :, 3, 8) = |  |  |
| Columns 1-2 | 0.1768 | 0.1768 |
|  | −0.0676 − 0.1633i | 0.1633 − 0.0676i |
|  | −0.1250 + 0.1250i | 0.1250 − 0.1250i |
|  | 0.1633 + 0.0676i | 0.0676 − 0.1633i |
|  | 0 + 0.1768i | 0 + 0.1768i |
|  | 0.1633 − 0.0676i | 0.0676 + 0.1633i |
|  | −0.1250 − 0.1250i | 0.1250 + 0.1250i |
|  | −0.0676 + 0.1633i | 0.1633 + 0.0676i |
| Columns 3-4 | 0.1768 | 0.1768 |
|  | −0.0676 − 0.1633i | 0.1633 − 0.0676i |
|  | −0.1250 + 0.1250i | 0.1250 − 0.1250i |
|  | 0.1633 + 0.0676i | 0.0676 − 0.1633i |
|  | 0 − 0.1768i | 0 − 0.1768i |
|  | −0.1633 + 0.0676i | −0.0676 − 0.1633i |
|  | 0.1250 + 0.1250i | −0.1250 − 0.1250i |
|  | 0.0676 − 0.1633i | −0.1633 − 0.0676i |
| ans(:, :, 4, 8) = |  |  |
| Columns 1-2 | 0.1768 | 0.1768 |
|  | 0.1633 − 0.0676i | 0.0676 + 0.1633i |
|  | 0.1250 − 0.1250i | −0.1250 + 0.1250i |
|  | 0.0676 − 0.1633i | −0.1633 − 0.0676i |
|  | 0 + 0.1768i | 0 + 0.1768i |
|  | 0.0676 + 0.1633i | −0.1633 + 0.0676i |
|  | 0.1250 + 0.1250i | −0.1250 − 0.1250i |
|  | 0.1633 + 0.0676i | 0.0676 − 0.1633i |
| Columns 3-4 | 0.1768 | 0.1768 |
|  | 0.1633 − 0.0676i | 0.0676 + 0.1633i |
|  | 0.1250 − 0.1250i | −0.1250 + 0.1250i |
|  | 0.0676 − 0.1633i | −0.1633 − 0.0676i |
|  | 0 − 0.1768i | 0 − 0.1768i |
|  | −0.0676 − 0.1633i | 0.1633 − 0.0676i |
|  | −0.1250 − 0.1250i | 0.1250 + 0.1250i |
|  | −0.1633 − 0.0676i | −0.0676 + 0.1633i |

Rank 5

| | | | | |
|---|---|---|---|---|
| ans(:, :, 1) = |  |  |  |  |
| Colums 1-3 | 0.1581 | 0.1581 | 0.1581 |  |
|  | 0.1581 | 0.1581 | 0 + 0.1581i |  |
|  | 0.1581 | 0.1581 | −0.1581 |  |
|  | 0.1581 | 0.1581 | 0 − 0.1581i |  |

-continued

|  | | | |
|---|---|---|---|
| | 0.1581 | −0.1581 | 0.1581 |
| | 0.1581 | −0.1581 | 0 + 0.1581i |
| | 0.1581 | −0.1581 | −0.1581 |
| | 0.1581 | −0.1581 | 0 − 0.1581i |
| Colums 4-5 | 0.1581 | 0.1581 | |
| | 0 + 0.1581i | −0.1581 | |
| | −0.1581 | 0.1581 | |
| | 0 − 0.1581i | −0.1581 | |
| | −0.1581 | 0.1581 | |
| | 0 − 0.1581i | −0.1581 | |
| | 0.1581 | 0.1581 | |
| | 0 + 0.1581i | −0.1581 | |
| ans(:, :, 2) = | | | |
| Colums 1-3 | 0.1581 | 0.1581 | 0.1581 |
| | 0.1118 + 0.1118i | 0.1118 + 0.1118i | −0.1118 + 0.1118i |
| | 0.0000 + 0.1581i | 0.0000 + 0.1581i | −0.0000 − 0.1581i |
| | −0.1118 + 0.1118i | −0.1118 + 0.1118i | 0.1118 + 0.1118i |
| | 0.1581 | −0.1581 | 0.1581 |
| | 0.1118 + 0.1118i | −0.1118 − 0.1118i | −0.1118 − 0.1118i |
| | 0.0000 + 0.1581i | −0.0000 − 0.1581i | −0.0000 − 0.1581i |
| | −0.1118 + 0.1118i | 0.1118 − 0.1118i | 0.1118 + 0.1118i |
| Colums 4-5 | 0.1581 | 0.1581 | |
| | −0.1118 + 0.1118i | −0.1118 − 0.1118i | |
| | −0.0000 − 0.1581i | 0.0000 + 0.1581i | |
| | 0.1118 + 0.1118i | 0.1118 − 0.1118i | |
| | −0.1581 | 0.1581 | |
| | 0.1118 − 0.1118i | −0.1118 − 0.1118i | |
| | 0.0000 + 0.1581i | 0.0000 + 0.1581i | |
| | −0.1118 − 0.1118i | 0.1118 − 0.1118i | |
| ans(:, :, 3) = | | | |
| Colums 1-3 | 0.1581 | 0.1581 | 0.1581 |
| | 0.1461 + 0.0605i | 0.1461 + 0.0605i | −0.0605 + 0.1461i |
| | 0.1118 + 0.1118i | 0.1118 + 0.1118i | −0.1118 − 0.1118i |
| | 0.0605 + 0.1461i | 0.0605 + 0.1461i | 0.1461 − 0.0605i |
| | 0.1581 | −0.1581 | 0.1581 |
| | 0.1461 + 0.0605i | −0.1461 − 0.0605i | −0.0605 + 0.1461i |
| | 0.1118 + 0.1118i | −0.1118 − 0.1118i | −0.1118 − 0.1118i |
| | 0.0605 + 0.1461i | −0.0605 − 0.1461i | 0.1461 − 0.0605i |
| Colums 4-5 | 0.1581 | 0.1581 | |
| | −0.0605 + 0.1461i | −0.1461 − 0.0605i | |
| | −0.1118 − 0.1118i | 0.1118 + 0.1118i | |
| | 0.1461 − 0.0605i | −0.0605 − 0.1461i | |
| | −0.1581 | 0.1581 | |
| | 0.0605 − 0.1461i | −0.1461 − 0.0605i | |
| | 0.1118 + 0.1118i | 0.1118 + 0.1118i | |
| | −0.1461 + 0.0605i | −0.0605 − 0.1461i | |
| ans(:, :, 4) = | | | |
| Colums 1-3 | 0.1581 | 0.1581 | 0.1581 | 0.1581 | 0.1581 |
| | 0.0605 + 0.1461i | 0.0605 + 0.1461i | −0.1461 + 0.0605i | −0.1461 + 0.0605i | −0.0605 − 0.1461i |
| | −0.1118 + 0.1118i | −0.1118 + 0.1118i | 0.1118 − 0.1118i | | |
| | −0.1461 − 0.0605i | −0.1461 − 0.0605i | −0.0605 + 0.1461i | | |
| | 0.1581 | −0.1581 | 0.1581 | | |
| | 0.0605 + 0.1461i | −0.0605 − 0.1461i | −0.1461 + 0.0605i | | |
| | −0.1118 + 0.1118i | 0.1118 − 0.1118i | 0.1118 − 0.1118i | | |
| | −0.1461 − 0.0605i | 0.1461 + 0.0605i | −0.0605 + 0.1461i | | |
| Colums 4-5 | 0.1581 | 0.1581 | |
| | −0.1461 + 0.0605i | −0.0605 − 0.1461i | |
| | 0.1118 − 0.1118i | −0.1118 + 0.1118i | |
| | −0.0605 + 0.1461i | 0.1461 + 0.0605i | |
| | −0.1581 | 0.1581 | |
| | 0.1461 − 0.0605i | −0.0605 − 0.1461i | |
| | −0.1118 + 0.1118i | −0.1118 + 0.1118i | |
| | 0.0605 − 0.1461i | 0.1461 + 0.0605i | |

Rank 6

| | | | |
|---|---|---|---|
| ans(:, :, 1) = | | | |
| Colums 1-3 | 0.1443 | 0.1443 | 0.1443 |
| | 0.1443 | 0.1443 | 0 + 0.1443i |
| | 0.1443 | 0.1443 | −0.1443 |
| | 0.1443 | 0.1443 | 0 − 0.1443i |
| | 0.1443 | −0.1443 | 0.1443 |
| | 0.1443 | −0.1443 | 0 + 0.1443i |
| | 0.1443 | −0.1443 | −0.1443 |
| | 0.1443 | −0.1443 | 0 − 0.1443i |
| Colums 4-6 | 0.1443 | 0.1443 | 0.1443 |
| | 0 + 0.1443i | −0.1443 | −0.1443 |
| | −0.1443 | 0.1443 | 0.1443 |
| | 0 − 0.1443i | −0.1443 | −0.1443 |

-continued

|  |  |  |  |
|---|---|---|---|
|  | −0.1443 | 0.1443 | −0.1443 |
|  | 0 − 0.1443i | −0.1443 | 0.1443 |
|  | 0.1443 | 0.1443 | −0.1443 |
|  | 0 + 0.1443i | −0.1443 | 0.1443 |
| ans(:, :, 2) = |  |  |  |
| Columns 1-3 | 0.1443 | 0.1443 | 0.1443 |
|  | 0.1021 + 0.1021i | 0.1021 + 0.1021i | −0.1021 + 0.1021i |
|  | 0.0000 + 0.1443i | 0.0000 + 0.1443i | −0.0000 − 0.1443i |
|  | −0.1021 + 0.1021i | −0.1021 + 0.1021i | 0.1021 + 0.1021i |
|  | 0.1443 | −0.1443 | 0.1443 |
|  | 0.1021 + 0.1021i | −0.1021 − 0.1021i | −0.1021 + 0.1021i |
|  | 0.0000 + 0.1443i | −0.0000 − 0.1443i | −0.0000 − 0.1443i |
|  | −0.1021 + 0.1021i | 0.1021 − 0.1021i | 0.1021 + 0.1021i |
| Colums 4-6 | 0.1443 | 0.1443 | 0.1443 |
|  | −0.1021 + 0.1021i | −0.1021 − 0.1021i | −0.1021 − 0.1021i |
|  | −0.0000 − 0.1443i | 0.0000 + 0.1443i | 0.0000 + 0.1443i |
|  | 0.1021 + 0.1021i | 0.1021 − 0.1021i | 0.1021 − 0.1021i |
|  | −0.1443 | 0.1443 | −0.1443 |
|  | 0.1021 − 0.1021i | −0.1021 − 0.1021i | 0.1021 + 0.1021i |
|  | 0.0000 + 0.1443i | 0.0000 + 0.1443i | −0.0000 − 0.1443i |
|  | −0.1021 − 0.1021i | 0.1021 − 0.1021i | −0.1021 + 0.1021i |
| ans(:, :, 3) = |  |  |  |
| Columns 1-3 | 0.1443 | 0.1443 | 0.1443 |
|  | 0.1334 + 0.0552i | 0.1334 + 0.0552i | −0.0552 + 0.1334i |
|  | 0.1021 + 0.1021i | 0.1021 + 0.1021i | −0.1021 − 0.1021i |
|  | 0.0552 + 0.1334i | 0.0552 + 0.1334i | 0.1334 − 0.0552i |
|  | 0.1443 | −0.1443 | 0.1443 |
|  | 0.1334 + 0.0552i | −0.1334 − 0.0552i | −0.0552 + 0.1334i |
|  | 0.1021 + 0.1021i | −0.1021 − 0.1021i | −0.1021 − 0.1021i |
|  | 0.0552 + 0.1334i | −0.0552 − 0.1334i | 0.1334 − 0.0552i |
| Colums 4-6 | 0.1443 | 0.1443 | 0.1443 |
|  | −0.0552 + 0.1334i | −0.1334 − 0.0552i | −0.1334 − 0.0552i |
|  | −0.1021 − 0.1021i | 0.1021 + 0.1021i | 0.1021 + 0.1021i |
|  | 0.1334 − 0.0552i | −0.0552 − 0.1334i | −0.0552 − 0.1334i |
|  | −0.1443 | 0.1443 | −0.1443 |
|  | 0.0552 − 0.1334i | −0.1334 − 0.0552i | 0.1334 + 0.0552i |
|  | 0.1021 + 0.1021i | 0.1021 + 0.1021i | −0.1021 − 0.1021i |
|  | −0.1334 + 0.0552i | −0.0552 − 0.1334i | 0.0552 + 0.1334i |
| ans(:, :, 4) = |  |  |  |
| Columns 1-3 | 0.1443 | 0.1443 | 0.1443 |
|  | 0.0552 + 0.1334i | 0.0552 + 0.1334i | −0.1334 + 0.0552i |
|  | −0.1021 + 0.1021i | −0.1021 + 0.1021i | 0.1021 − 0.1021i |
|  | −0.1334 − 0.0552i | −0.1334 − 0.0552i | −0.0552 + 0.1334i |
|  | 0.1443 | −0.1443 | 0.1443 |
|  | 0.0552 + 0.1334i | −0.0552 − 0.1334i | −0.1334 + 0.0552i |
|  | −0.1021 + 0.1021i | 0.1021 − 0.1021i | 0.1021 − 0.1021i |
|  | −0.1334 − 0.0552i | 0.1334 + 0.0552i | −0.0552 + 0.1334i |
| Colums 4-6 | 0.1443 | 0.1443 | 0.1443 |
|  | −0.1334 + 0.0552i | −0.0552 − 0.1334i | −0.0552 − 0.1334i |
|  | 0.1021 − 0.1021i | −0.1021 + 0.1021i | −0.1021 + 0.1021i |
|  | −0.0552 + 0.1334i | 0.1334 + 0.0552i | 0.1334 + 0.0552i |
|  | −0.1443 | 0.1443 | −0.1443 |
|  | 0.1334 − 0.0552i | −0.0552 − 0.1334i | 0.0552 + 0.1334i |
|  | −0.1021 + 0.1021i | −0.1021 + 0.1021i | 0.1021 − 0.1021i |
|  | 0.0552 − 0.1334i | 0.1334 + 0.0552i | −0.1334 − 0.0552i |

Rank 7

| | | | | |
|---|---|---|---|---|
| ans(:, :, 1) = | | | | |
| Columns 1-3 | 0.1336 | 0.1336 | 0.1336 | |
| | 0.1336 | 0.1336 | 0 + 0.1336i | |
| | 0.1336 | 0.1336 | −0.1336 | |
| | 0.1336 | 0.1336 | 0 − 0.1336i | |
| | 0.1336 | −0.1336 | 0.1336 | |
| | 0.1336 | −0.1336 | 0 + 0.1336i | |
| | 0.1336 | −0.1336 | −0.1336 | |
| | 0.1336 | −0.1336 | 0 − 0.1336i | |
| Colums 4-7 | 0.1336 | 0.1336 | 0.1336 | 0.1336 |
| | 0 + 0.1336i | −0.1336 | −0.1336 | 0 − 0.1336i |
| | −0.1336 | 0.1336 | 0.1336 | −0.1336 |
| | 0 − 0.1336i | −0.1336 | −0.1336 | 0 + 0.1336i |
| | −0.1336 | 0.1336 | −0.1336 | 0.1336 |
| | 0 − 0.1336i | −0.1336 | 0.1336 | 0 − 0.1336i |
| | 0.1336 | 0.1336 | −0.1336 | −0.1336 |
| | 0 + 0.1336i | −0.1336 | 0.1336 | 0 + 0.1336i |
| ans(:, :, 2) = | | | | |
| Columns 1-3 | 0.1336 | 0.1336 | 0.1336 | |
| | 0.0945 + 0.0945i | 0.0945 + 0.0945i | −0.0945 + 0.0945i | |
| | 0.0000 + 0.1336i | 0.0000 + 0.1336i | −0.0000 − 0.1336i | |

-continued

|  |  |  |  |  |
|---|---|---|---|---|
|  | −0.0945 + 0.0945i | −0.0945 + 0.0945i | 0.0945 + 0.0945i |  |
|  | 0.1336 | −0.1336 | 0.1336 |  |
|  | 0.0945 + 0.0945i | −0.0945 − 0.0945i | −0.0945 + 0.0945i |  |
|  | 0.0000 + 0.1336i | −0.0000 − 0.1336i | −0.0000 − 0.1336i |  |
|  | −0.0945 + 0.0945i | 0.0945 − 0.0945i | 0.0945 + 0.0945i |  |
| Colums 4-7 | 0.1336 | 0.1336 | 0.1336 | 0.1336 |
|  | −0.0945 + 0.0945i | −0.0945 − 0.0945i | −0.0945 − 0.0945i | 0.0945 − 0.0945i |
|  | −0.0000 − 0.1336i | 0.0000 + 0.1336i | 0.0000 + 0.1336i | −0.0000 − 0.1336i |
|  | 0.0945 + 0.0945i | 0.0945 − 0.0945i | 0.0945 − 0.0945i | −0.0945 − 0.0945i |
|  | −0.1336 | 0.1336 | −0.1336 | 0.1336 |
|  | 0.0945 − 0.0945i | −0.0945 − 0.0945i | 0.0945 + 0.0945i | 0.0945 − 0.0945i |
|  | 0.0000 + 0.1336i | 0.0000 + 0.1336i | −0.0000 − 0.1336i | −0.0000 − 0.1336i |
|  | −0.0945 − 0.0945i | 0.0945 − 0.0945i | −0.0945 + 0.0945i | −0.0945 − 0.0945i |
| ans(:, :, 3) = |  |  |  |  |
| Columns 1-3 | 0.1336 | 0.1336 | 0.1336 |  |
|  | 0.1235 + 0.0511i | 0.1235 + 0.0511i | −0.0511 + 0.1235i |  |
|  | 0.0945 + 0.0945i | 0.0945 + 0.0945i | −0.0945 − 0.0945i |  |
|  | 0.0511 + 0.1235i | 0.0511 + 0.1235i | 0.1235 − 0.0511i |  |
|  | 0.1336 | −0.1336 | 0.1336 |  |
|  | 0.1235 + 0.0511i | −0.1235 − 0.0511i | −0.0511 + 0.1235i |  |
|  | 0.0945 + 0.0945i | −0.0945 − 0.0945i | −0.0945 − 0.0945i |  |
|  | 0.0511 + 0.1235i | −0.0511 − 0.1235i | 0.1235 − 0.0511i |  |
| Colums 4-7 | 0.1336 | 0.1336 | 0.1336 | 0.1336 |
|  | −0.0511 + 0.1235i | −0.1235 − 0.0511i | −0.1235 − 0.0511i | 0.0511 − 0.1235i |
|  | −0.0945 − 0.0945i | 0.0945 + 0.0945i | 0.0945 + 0.0945i | −0.0945 − 0.0945i |
|  | 0.1235 − 0.0511i | −0.0511 − 0.1235i | −0.0511 − 0.1235i | −0.1235 + 0.0511i |
|  | −0.1336 | 0.1336 | −0.1336 | 0.1336 |
|  | 0.0511 − 0.1235i | −0.1235 − 0.0511i | 0.1235 + 0.0511i | 0.0511 − 0.1235i |
|  | 0.0945 + 0.0945i | 0.0945 + 0.0945i | −0.0945 − 0.0945i | −0.0945 − 0.0945i |
|  | −0.1235 + 0.0511i | −0.0511 − 0.1235i | 0.0511 + 0.1235i | −0.1235 + 0.0511i |
| ans(:, :, 4) = |  |  |  |  |
| Columns 1-3 | 0.1336 | 0.1336 | 0.1336 |  |
|  | 0.0511 + 0.1235i | 0.0511 + 0.1235i | −0.1235 + 0.0511i |  |
|  | −0.0945 + 0.0945i | −0.0945 + 0.0945i | 0.0945 − 0.0945i |  |
|  | −0.1235 − 0.0511i | −0.1235 − 0.0511i | −0.0511 + 0.1235i |  |
|  | 0.1336 | −0.1336 | 0.1336 |  |
|  | 0.0511 + 0.1235i | −0.0511 − 0.1235i | −0.1235 + 0.0511i |  |
|  | −0.0945 + 0.0945i | 0.0945 − 0.0945i | 0.0945 − 0.0945i |  |
|  | −0.1235 − 0.0511i | 0.1235 + 0.0511i | −0.0511 + 0.1235i |  |
| Colums 4-7 | 0.1336 | 0.1336 | 0.1336 | 0.1336 |
|  | −0.1235 + 0.0511i | −0.0511 − 0.1235i | −0.0511 − 0.1235i | 0.1235 − 0.0511i |
|  | 0.0945 − 0.0945i | −0.0945 + 0.0945i | −0.0945 + 0.0945i | 0.0945 − 0.0945i |
|  | −0.0511 + 0.1235i | 0.1235 + 0.0511i | 0.1235 + 0.0511i | 0.0511 − 0.1235i |
|  | −0.1336 | 0.1336 | −0.1336 | 0.1336 |
|  | 0.1235 − 0.0511i | −0.0511 − 0.1235i | 0.0511 + 0.1235i | 0.1235 − 0.0511i |
|  | −0.0945 + 0.0945i | −0.0945 + 0.0945i | 0.0945 − 0.0945i | 0.0945 − 0.0945i |
|  | 0.0511 − 0.1235i | 0.1235 + 0.0511i | −0.1235 − 0.0511i | 0.0511 − 0.1235i |

| Rank 8 |  |  |  |  |
|---|---|---|---|---|
| ans(:, :, 1) = |  |  |  |  |
| Columns 1-4 | 0.1250 | 0.1250 | 0.1250 | 0.1250 |
|  | 0.1250 | 0.1250 | 0.1250i | 0.1250i |
|  | 0.1250 | 0.1250 | −0.1250 | −0.1250 |
|  | 0.1250 | 0.1250 | −0.1250i | −0.1250i |
|  | 0.1250 | −0.1250 | 0.1250 | −0.1250 |
|  | 0.1250 | −0.1250 | 0.1250i | −0.1250i |
|  | 0.1250 | −0.1250 | −0.1250 | 0.1250 |
|  | 0.1250 | −0.1250 | −0.1250i | 0.1250i |
| Columns 5-8 | 0.1250 | 0.1250 | 0.1250 | 0.1250 |
|  | −0.1250 | −0.1250 | −0.1250i | −0.1250i |
|  | 0.1250 | 0.1250 | −0.1250 | −0.1250 |
|  | −0.1250 | −0.1250 | 0.1250i | 0.1250i |
|  | 0.1250 | −0.1250 | 0.1250 | −0.1250 |
|  | −0.1250 | 0.1250 | −0.1250i | 0.1250i |
|  | 0.1250 | −0.1250 | −0.1250 | 0.1250 |
|  | −0.1250 | 0.1250 | 0.1250i | −0.1250i |

Figure 4:
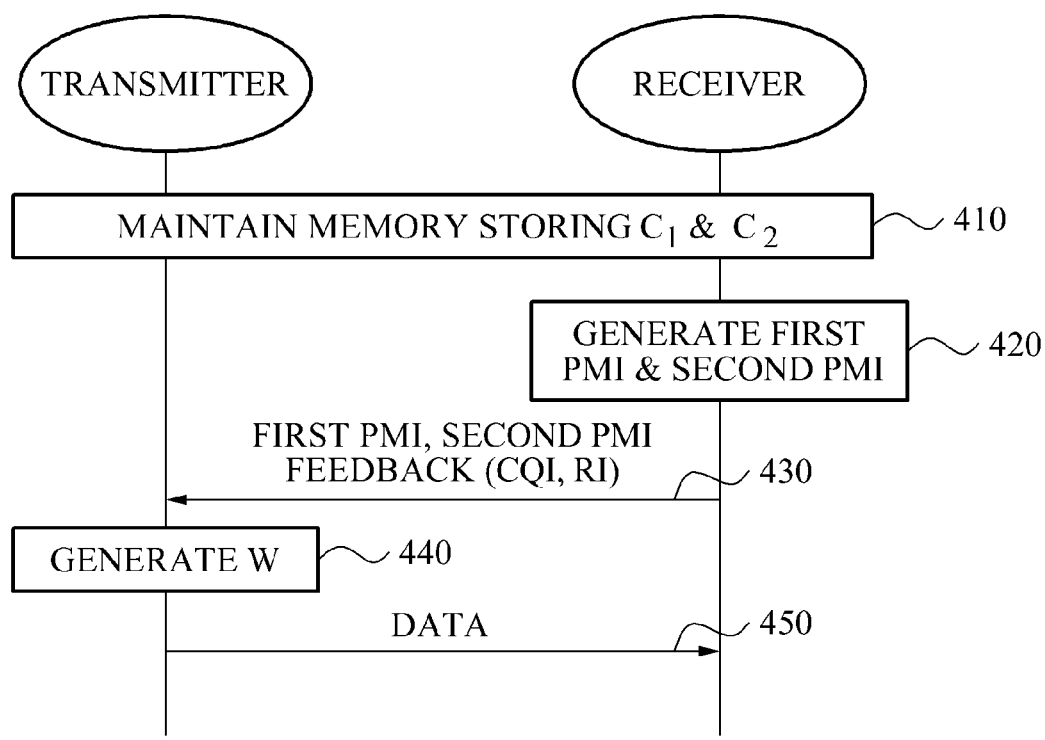
FIG. 4 is a diagram illustrating an example of a communication method of a receiver and a transmitter that share channel information using two codebooks.

FIG. 4 illustrates an example of a communication method of a receiver and a transmitter that share channel information using two codebooks.

Referring to FIG. 4, the transmitter and the receiver may maintain a memory storing a first codebook $C_1$ and a second codebook $C_2$.

At 420, the receiver may generate a first precoding matrix indicator from the first codebook $C_1$, and may generate a second precoding matrix indicator from the second codebook $C_2$ based on a state of a channel formed from the transmitter to the receiver. In this example, the first precoding matrix indicator may indicate one of first codewords included in the first codebook $C_1$, and the second precoding matrix indicator may indicate one of second codewords included in the second codebook $C_2$. A combination of the first precoding matrix indicator and the second precoding matrix indicator may indicate a recommended precoding matrix. For example, when the first precoding matrix indicator indicates $W_1$ and the second precoding matrix indicator indicates $W_2$, the recommended precoding matrix W may be calculated as $W_1 W_2$.

At 430, the receiver may transmit the first precoding matrix indicator and the second precoding matrix indicator to the transmitter. The receiver may further transmit channel quality information indicating the quality of the channel and a rank indicator indicating a preferred rank.

At 440, the transmitter may extract $W_1$ from the first codebook $C_1$, and extract $W_2$ from the second codebook $C_2$, based on the first precoding matrix indicator and the second precoding matrix indicator and then generate a precoding matrix W based on $W_1$ and $W_2$. As described above, W may correspond to a function of $W_1$ and $W_2$, for example, $W=W_1 W_2$.

At 450, the transmitter may precode at least one data stream based on the precoding matrix W and may transmit data. The transmitter may transmit the data using a plurality of transmit antennas, for example, 2, 4, 8, and the like.

An example in which the first codebook $C_1$ and the second codebook $C_2$ independently exist is described. As described above, the receiver may transmit, to the transmitter, the first precoding matrix indicator indicating the first codeword $W_1$ included in the first codebook $C_1$ and the second precoding matrix indicator indicating the second codeword $W_2$ included in the second codebook $C_2$. The transmitter may extract the first codeword $W_1$ from the first codebook $C_1$, and extract the second codeword $W_2$ from the second codebook $C_2$, based on the first precoding matrix indicator and the second precoding matrix indicator and then calculate the precoding matrix W according to a predetermined function, for example, $W=W_1 W_2$. The calculated precoding matrix may be used to precode a data stream.

As another example, the overall codebook C in which the first codebook $C_1$ and the second codebook $C_2$ are integrated may exist. That is, probable candidates of the precoding matrix W may be calculated and thereby be pre-stored as the overall codebook C. In this example, the precoding matrix candidates included in the overall codebook C may be indicated by the first precoding matrix indicator and the second precoding matrix indicator. To indicate one of the candidates included in the overall codebook C, the receiver may transmit the first precoding matrix indicator and the second precoding matrix indicator to the transmitter. The transmitter may extract one of the candidates based on the first precoding matrix indicator and the second precoding matrix. The extracted candidate may be used to precode a data stream as a precoding matrix.

Accordingly, an example in which the first codebook $C_1$ and the second codebook $C_2$ are stored in the transmitter and the receiver may exist. An example in which the overall codebook C instead of the first codebook $C_1$ and the second codebook $C_2$ is stored may exist. In the above examples, only difference lies in that the precoding matrix W is calculated by substantially using $W_1$ and $W_2$. Accordingly, to store the overall codebook C in the transmitter and the receiver may be understood to be substantially equivalent to store the first codebook $C_1$ and the second codebook $C_2$ in the transmitter and the receiver.

Figure 5:
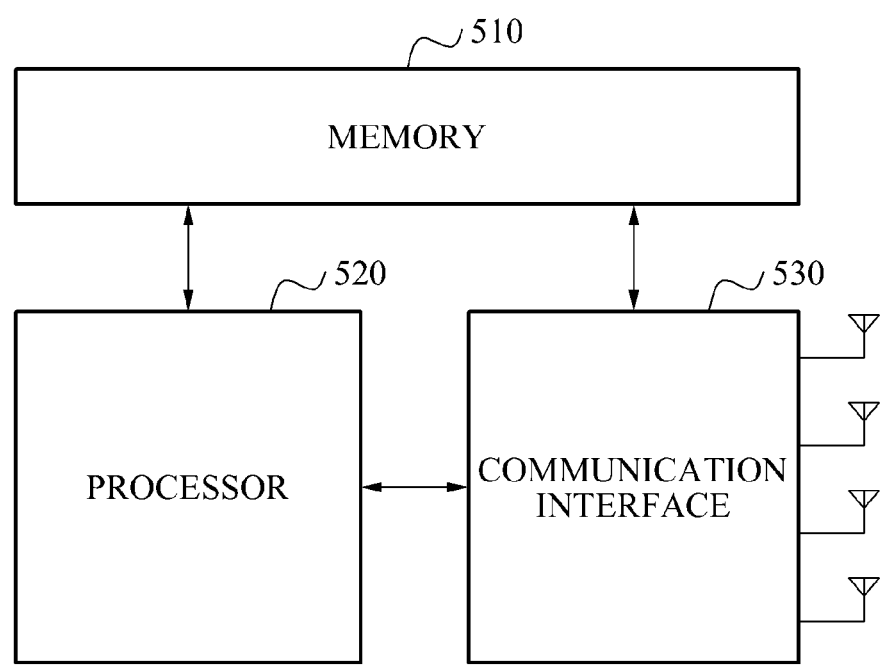
FIG. 5 is a diagram illustrating an example of a communication apparatus.

FIG. 5 illustrates an example of a communication apparatus.

The communication apparatus of FIG. 5 may be installed in any of a transmitter and a receiver.

Initially, an example of the communication apparatus of FIG. 5 installed in the transmitter will be described. A memory 510 may store a first codebook and a second codebook. When the receiver transmits a first precoding matrix indicator and a second precoding matrix indicator using a physical uplink control channel (PUCCH), a physical uplink shared channel (PUSCH), and the like, a communication interface 530 may receive the first precoding matrix indicator and the second precoding matrix indicator. The communication interface 530 may further receive channel quality information, a rank indicator, and the like in addition to the first precoding matrix indicator and the second precoding matrix indicator.

A processor 520 may extract codewords corresponding to the first precoding matrix indicator and the second precoding matrix indicator using a first codebook and a second codebook, and may generate or determine a precoding matrix based on the codewords corresponding to the first precoding matrix indicator and the second precoding matrix indicator.

The processor 520 may precode at least one data stream using the precoding matrix and transmit precoded data to the receiver via a plurality of transmit antenna of the communication apparatus.

Hereinafter, an example of the communication apparatus of FIG. 5 installed in the receiver will be described.

The codebook 510 may store the first codebook and the second codebook. When a well-known signal, for example, a pilot signal is received, the processor 520 may measure a channel formed between the transmitter and the receiver, and may generate the first precoding matrix indicator and the second precoding matrix indicator from the first codebook and the second codebook, respectively, based on the channel.

The communication interface 530 may transmit the first precoding matrix indicator and the second precoding matrix indicator to the transmitter via at least one antenna.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A communication method of a receiver, the communication method comprising:
   determining a first precoding matrix indicator (PMI) and a second precoding matrix indicator (PMI); and
   transmitting, to a transmitter, the first and the second PMIs as a feedback information,
   wherein a precoding matrix is determined comprising a plurality of 8×1 precoding matrixes comprising a 4×1 upper matrix A and a 4×1 lower matrix B·A for rank 1,
   wherein A is determined based on an equation expressed as:

$A=[(1 e^{j2\pi n/32} e^{j4\pi n/32} e^{j6\pi n/32}]^T$, where $n$ is determined based on the first PMI, and wherein B is determined to be one of 1, j, −1 and −j based on the second PMI, with j being an imaginary number.

2. The communication method of claim 1, further comprising transmitting, to the transmitter, at least one of a Channel Quality Indicator (CQI) and a Rank Indicator (RI).

3. The communication method of claim 1, wherein a dimension of the precoding matrix is dependent on a Rank of the transmitter.

4. The communication method of claim 3, wherein the Rank is corresponding to the number of layers of the transmitter.

5. The communication method of claim 1, wherein the first PMI is associated with a wideband channel status and the second PMI is associated with a subband channel status.

6. A non-transitory computer-readable medium storing instructions executable by a processor of an electronic device to cause the processor to control to:
- determine a first precoding matrix indicator (PMI) and a second precoding matrix indicator (PMI); and
- transmit to a transmitter the first and the second PMIs as a feedback information,
- wherein a precoding matrix is determined comprising a plurality of 8×1 precoding matrixes comprising a 4×1 upper matrix A and a 4×1 lower matrix B·A for rank 1,
- wherein A is determined based on an equation expressed as:

$$A = [(1\, e^{j2\pi n/32}\, e^{j4\pi n/32}\, e^{j6\pi n/32}]^T,\text{ where } n \text{ is determined based on the first PMI, and}$$

wherein B is determined to be one of 1, j, −1 and −j based on the second PMI, with j being an imaginary number.

7. A receiver comprising:
- a processor configured to determine a first precoding matrix indicator (PMI) and a second PMI; and
- a communication interface configured to transmit, to a transmitter, the first and the second PMIs as a feedback information,
- wherein a precoding matrix is determined comprising a plurality of 8×1 precoding matrixes comprising a 4×1 upper matrix A and a 4×1 lower matrix B·A for rank 1,
- wherein A is determined based on an equation expressed as:

$$A = [(1\, e^{j2\pi n/32}\, e^{j4\pi n/32}\, e^{j6\pi n/32}]^T,\text{ where } n \text{ is determined based on the first PMI, and}$$

wherein B is determined to be one of 1, j, −1 and −j based on the second PMI, with j being an imaginary number.

8. The receiver of claim 7, wherein the communication interface further configured to transmit, to the transmitter, at least one of a Channel Quality Indicator (CQI) and a Rank Indicator (RI).

9. The receiver of claim 7, wherein a dimension of the precoding matrix is dependent on a Rank of the transmitter.

10. The receiver of claim 9, wherein the Rank is corresponding to the number of layers of the transmitter.

11. The receiver of claim 7, wherein the first PMI is associated with a wideband channel status and the second PMI is associated with a subband channel status.

12. A communication method of a transmitter, the communication method comprising:
- receiving, from a receiver, a first precoding matrix indicator (PMI) and a second PMI; and
- determining a precoding matrix comprising a plurality of 8×1 precoding matrixes comprising a 4×1 upper matrix A and a 4×1 lower matrix B'A for rank 1,
- wherein A is determined based on an equation expressed as:

$$A = [(1\, e^{j2\pi n/32}\, e^{j4\pi n/32}\, e^{j6\pi n/32}]^T,\text{ where } n \text{ is determined based on the first PMI, and}$$

wherein B is determined to be one of 1, j, −1 and −j based on the second PMI, with j being an imaginary number.

13. The communication method of claim 12, wherein the receiving further comprises receiving, from the receiver, at least one of a Channel Quality Indicator (CQI) and a Rank Indicator (RI).

14. The communication method of claim 12, wherein a dimension of the precoding matrix is dependent on a Rank of the transmitter.

15. The communication method of claim 14, wherein the Rank is corresponding to the number of layers of the transmitter.

16. The communication method of claim 12, wherein the first PMI is associated with a wideband channel status and the second PMI is associated with a subband channel status.

* * * * *